US009447270B2

(12) United States Patent
Arayama et al.

(10) Patent No.: US 9,447,270 B2
(45) Date of Patent: Sep. 20, 2016

(54) DISPERSION COMPOSITION, AND CURABLE COMPOSITION, TRANSPARENT FILM, MICROLENS AND SOLID-STATE IMAGING DEVICE USING SAME, AND POLYMER COMPOUND

(71) Applicant: FUJIFILM Corporation, Tokyo (JP)

(72) Inventors: Kyouhei Arayama, Shizuoka (JP); Hiroaki Idei, Shizuoka (JP); Makoto Kubota, Shizuoka (JP); Hideki Takakuwa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/631,465

(22) Filed: Feb. 25, 2015

(65) Prior Publication Data

US 2015/0166780 A1 Jun. 18, 2015

Related U.S. Application Data

(63) Continuation of application No. PCT/JP2013/073227, filed on Aug. 29, 2013.

(30) Foreign Application Priority Data

Aug. 31, 2012 (JP) ................................ 2012-192557
Oct. 3, 2012 (JP) ................................ 2012-221610
Feb. 13, 2013 (JP) ................................ 2013-026066
Feb. 13, 2013 (JP) ................................ 2013-026069

(51) Int. Cl.

| | |
|---|---|
| ***C08F 2/46*** | (2006.01) |
| ***C08F 2/50*** | (2006.01) |
| ***C08G 61/04*** | (2006.01) |
| ***C08L 33/02*** | (2006.01) |
| ***C08F 2/44*** | (2006.01) |
| ***C09D 4/00*** | (2006.01) |
| ***C09D 5/02*** | (2006.01) |
| ***C08G 59/18*** | (2006.01) |
| ***C09D 7/12*** | (2006.01) |
| ***C08G 65/18*** | (2006.01) |
| ***C09D 201/02*** | (2006.01) |
| ***C09D 201/08*** | (2006.01) |
| ***C08L 101/02*** | (2006.01) |
| ***G02B 1/04*** | (2006.01) |
| ***G03F 7/00*** | (2006.01) |
| ***G03F 7/004*** | (2006.01) |
| ***G03F 7/027*** | (2006.01) |
| ***G03F 7/029*** | (2006.01) |
| ***G03F 7/031*** | (2006.01) |
| ***G03F 7/038*** | (2006.01) |
| ***C08K 9/04*** | (2006.01) |
| ***C08L 33/00*** | (2006.01) |
| ***C08L 101/08*** | (2006.01) |

(Continued)

(52) U.S. Cl.

CPC .................. *C08L 33/02* (2013.01); *C08F 2/44* (2013.01); *C08G 59/18* (2013.01); *C08G 65/18* (2013.01); *C08K 9/04* (2013.01); *C08L 33/00* (2013.01); *C08L 101/02* (2013.01); *C08L 101/08* (2013.01); *C09D 4/00* (2013.01); *C09D 5/028* (2013.01); *C09D 7/1266* (2013.01); *C09D 201/02* (2013.01); *C09D 201/08* (2013.01); *G02B 1/04* (2013.01); *G03F 7/0007* (2013.01); *G03F 7/0047* (2013.01); *G03F 7/027* (2013.01); *G03F 7/029* (2013.01); *G03F 7/031* (2013.01); *G03F 7/038* (2013.01); *C08K 3/22* (2013.01); *C09D 133/06* (2013.01)

(58) Field of Classification Search

CPC ....... C08L 33/02; C08L 101/02; C08K 9/04; C08K 3/22; G03F 7/0027; G03F 7/027; G03F 7/031; G03F 7/038; G03F 7/0047; G03F 7/029; G02B 1/04; C08F 2/44; C09D 5/028; C09D 7/1266; C09D 201/02; C09D 4/00; C09D 201/08; C08G 59/18; C08G 65/18

USPC ............... 522/39, 33, 6, 71, 189, 184; 520/1

See application file for complete search history.

(56) References Cited

U.S. PATENT DOCUMENTS

2009/0068575 A1* 3/2009 Fujimaki ............. C09B 67/0013 430/7
2010/0104842 A1 4/2010 Suzuki et al.
2010/0233595 A1 9/2010 Takahashi et al.

(Continued)

FOREIGN PATENT DOCUMENTS

JP 2007277514 A 10/2007
JP 2008185683 A 8/2008

(Continued)

OTHER PUBLICATIONS

Office Action dated Jul. 14, 2015, issued by the Japanese Intellectual Property Office in counterpart Japanese Application No. 2013-026069.

(Continued)

*Primary Examiner* — Ling Choi
*Assistant Examiner* — Jessica E Whiteley
(74) *Attorney, Agent, or Firm* — Sughrue Mion, PLLC

(57) ABSTRACT

There is provided a dispersion composition containing (A) a metal oxide particle having a primary particle diameter of 1 nm to 100 nm, (B) a polymer compound represented by the specific formula having a weight average molecular weight of 5,000 to 8,000 and an acid value of 70 to 90 mgKOH/g, and (C) a solvent, and a curable composition containing the dispersion composition and (D) a polymerizable compound.

30 Claims, 2 Drawing Sheets

(51) Int. Cl.

| | |
|---|---|
| *C08K 3/22* | (2006.01) |
| *C09D 133/06* | (2006.01) |

(56) References Cited

U.S. PATENT DOCUMENTS

| | | | | |
|---|---|---|---|---|
| 2011/0118361 | A1 | 5/2011 | Matoishi et al. | |
| 2011/0318249 | A1 | 12/2011 | Nakayama et al. | |
| 2012/0257283 | A1 | 10/2012 | Maruyama et al. | |
| 2015/0166783 | A1* | 6/2015 | Arayama | G03F 7/0047 522/39 |
| 2015/0166816 | A1* | 6/2015 | Arayama | C09D 4/00 524/556 |

FOREIGN PATENT DOCUMENTS

| | | | |
|---|---|---|---|
| JP | 2008239923 | A | 10/2008 |
| JP | 2009079148 | A | 4/2009 |
| JP | 2009179678 | A | 8/2009 |
| JP | 2011127096 | A | 6/2011 |
| JP | 2012082294 | A | 4/2012 |
| JP | 2012251125 | A | 12/2012 |
| WO | 2009087961 | A1 | 7/2009 |
| WO | 2010103856 | A1 | 9/2010 |

OTHER PUBLICATIONS

English translation PCT/IPEA/409 Communication issued on Apr. 8, 2014 by the International Searching Authority in related Application No. PCT/JP2013/073227.

Written Opinion (PCT/ISA/237) issued Nov. 5, 2013, in related International Application No. PCT/JP2013/073227.

ISR (PCT/ISA/210) issued Nov. 5, 2013, in related International Application No. PCT/JP2013/073227.

Office Action issued on Nov. 6, 2015 by the Korean Intellectual Property Office in corresponding Korean Application No. 10-2015-7004956.

Office Action issued on Nov. 4, 2015 by the Japanese Patent Office in corresponding Japanese Application No. 2013-175872.

Office Action dated Feb. 3, 2016, issued by the State Intellectual Property Office of the People's Republic of China in counterpart Chinese Application No. 201380045144.2.

* cited by examiner

DISPERSION COMPOSITION, AND CURABLE COMPOSITION, TRANSPARENT FILM, MICROLENS AND SOLID-STATE IMAGING DEVICE USING SAME, AND POLYMER COMPOUND

CROSS REFERENCE TO RELATED APPLICATION

This is a continuation of International Application No. PCT/JP2013/073227 filed on Aug. 29, 2013, and claims priority from Japanese Patent Application No. 2012-192557 filed on Aug. 31, 2012, Japanese Patent Application No. 2012-221610 filed on Oct. 3, 2012, Japanese Patent Application No. 2013-026066 filed on Feb. 13, 2013, Japanese Patent Application No. 2013-026069 filed on Feb. 13, 2013, the entire disclosures of which are incorporated therein by reference.

TECHNICAL FIELD

The present invention relates to a dispersion composition; a curable composition, a transparent film, a microlens and a solid-state imaging device each using the dispersion composition; and a polymer compound.

BACKGROUND ART

A transparent member-forming composition capable of forming, for example, a fine transparent film with a high refractive index or a transparent wiring is required, aiming at its application as a microlens for an optical image forming system of an on-chip color filter used in an electronic copying machine, a solid-state imaging device, etc. or as an optical wiring to replace a copper wiring.

Among others, with the progress in miniaturization of a solid-state imaging device, the microlens used in a solid-state imaging device is required to be finer and at the same time, to have a high refractive index so as to realize more efficient light collection. For example, a composition using a silica-coated titanium oxide particle for forming a high-refractive-index microlens or forming a solid-state imaging device has been disclosed (see, for example, Patent Documents 1 and 2). In particular, the recent increase in the number of pixels is associated with the requirement that the size of one pixel be very small and light be collected more efficiently. For this purpose, a microlens having a higher refractive index is demanded. Furthermore, in order to fabricate a larger number of devices by one production, the size of the wafer used is increasing, and in this case, the coated surface state tends to be deteriorated.

On the other hand, Patent Document 3 discloses a dispersion resin having a specific structure for a color filter, which can enhance the dispersibility of an organic pigment. In addition, Patent Document 4 discloses a composition for the formation of a high-refractive-index material, in which the above-described dispersion resin having a specific structure is contained together with an inorganic fine particle.

RELATED ART

Patent Document

Patent Document 1: JP-A-2009-179678 (the term "JP-A" as used herein means an "unexamined published Japanese patent application")

Patent Document 2: JP-A-2008-185683

Patent Document 3: JP-A-2007-277514

Patent Document 4: JP-A-2008-239923

SUMMARY OF THE INVENTION

Problems that the Invention is to Solve

However, the above-described composition for the formation of a high-refractive-index material is required to contain an inorganic fine particle at a high content for achieving a high refractive index. In a composition containing an inorganic fine particle at a high content, dispersibility is bad due to aggregation, etc. of the inorganic fine particle, and the viscosity may be increased to obstruct the formation of a coated film. The problem to be solved is to develop a dispersant ensuring good dispersibility of an inorganic fine particle even at a high content and enabling decrease in the viscosity of a composition.

The present invention has been made by taking into account the above-described problem, and an object of the present invention is to provide a dispersion composition having a high refractive index and a low viscosity, and a curable composition, a transparent film, a microlens and a solid-state imaging device each using the dispersion composition.

Another object of the present invention is to provide a compound able to afford a dispersion composition having a high refractive index and giving an excellent surface state to a film after coating and drying and maintain the dispersion stability of particles.

Means for Solving the Problems

Specific means for solving the above-described problem are as follows.

[1] A dispersion composition containing:

(A) a metal oxide particle having a primary particle diameter of 1 nm to 100 nm, (B) a polymer compound represented by the following formula (1) having a weight average molecular weight of 5,000 to 8,000 and an acid value of 70 to 90 mgKOH/g, and (C) a solvent:

formula (1)

$$(A^1-R^2)_n R^1 (P^1)_m$$

in formula (1), $R^1$ represents an (m+n)-valent linking group represented by any one of the following formulae (1) to (17), $R^2$ represents a single bond or a divalent linking group, $A^1$ represents a monovalent substituent having at least one group selected from the group consisting of an acid group, a urea group, a urethane group, a coordinating oxygen atom-containing group, a basic nitrogen atom-containing group, a phenol group, an alkyl group, an aryl group, an alkyleneoxy chain-containing group, an imide group, an alkyloxycarbonyl group, an alkylaminocarbonyl group, a carboxylate group, a sulfonamide group, a heterocyclic group, an alkoxysilyl group, an epoxy group, an isocyanate group and a hydroxyl group, n number of $A^1$ or $R^2$ may be the same or different from each other, m represents a positive number of 8 or less, n represents from 1 to 9, m+n satisfies the range of 3 to 10, $P^1$ represents a polymer chain, and m number of $P^1$ may be the same or different from each other:

(1)
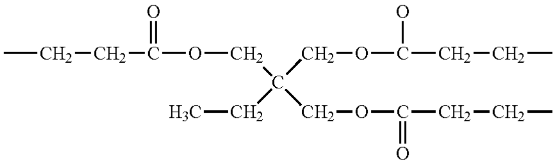
(2)
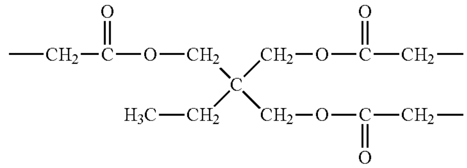
(3)
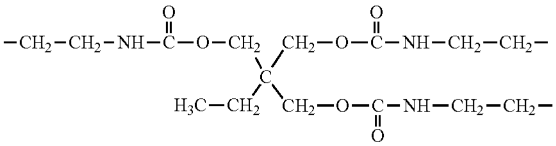
(4)
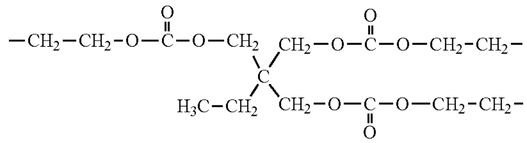
(5)
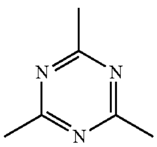
(6)
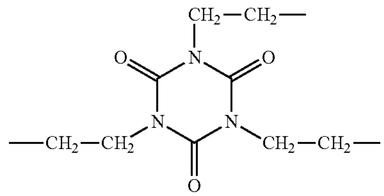
(7)
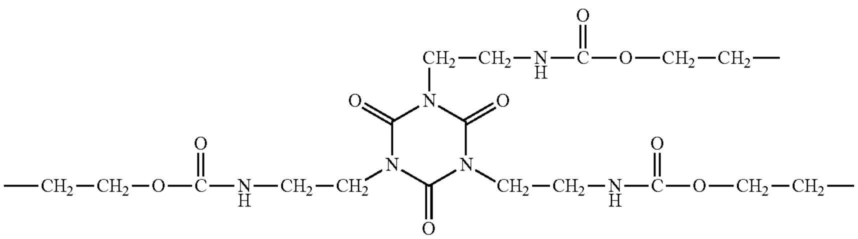
(8)
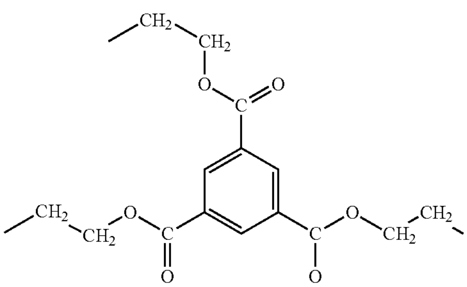
(9)
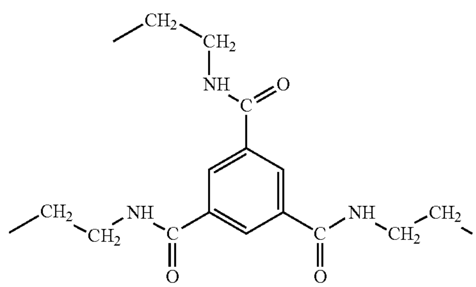
(10)
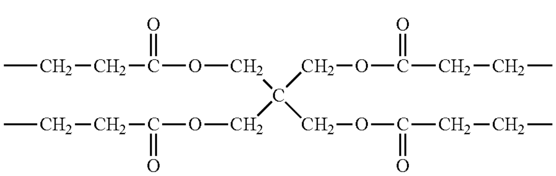
(11)
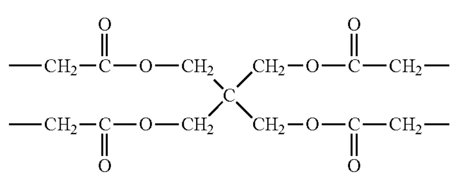
(12)
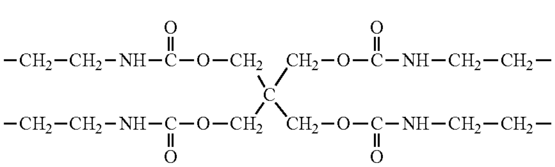
(13)
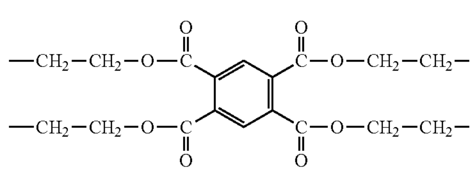

-continued (14)

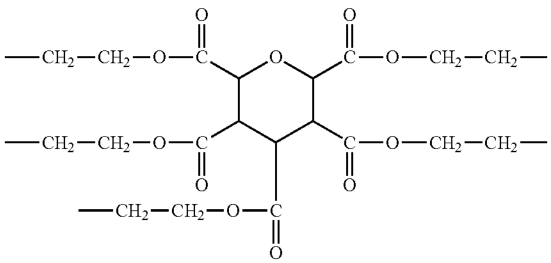

(15)

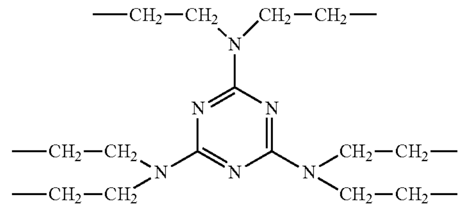

(16)

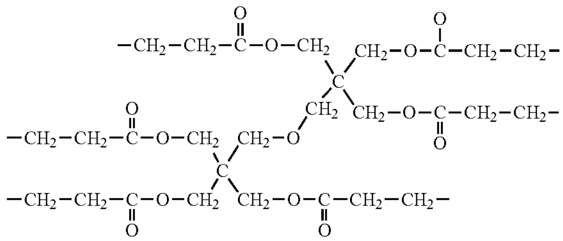

(17)

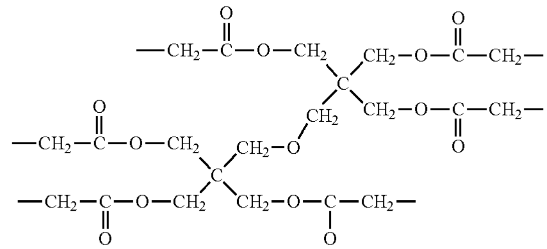

[2] The dispersion composition as described in [1], wherein the metal oxide particle (A) is a particle surface-treated with an organic compound.

[3] The dispersion composition as described in [2], wherein the organic compound is a fatty acid.

[4] The dispersion composition as described in any one of [1] to [3], wherein the content of the metal oxide particle (A) is 65 mass % or more based on the total solid content of the dispersion composition.

[5] The dispersion composition as described in any one of [1] to [4], wherein the polymer compound (B) is a polymer compound represented by the following formula (2):

formula (2)

$$(A^2-R^4-S\overline{)_n}R^3\overline{(}S-R^5-P^2)_m$$

in formula (2), $R^3$ represents an (m+n)-valent linking group represented by any one of the following formulae (1) to (17), each of $R^4$ and $R^5$ independently represents a single bond or a divalent linking group, $A^2$ represents a monovalent substituent having at least one group selected from the group consisting of an acid group, a urea group, a urethane group, a coordinating oxygen atom-containing group, a basic nitrogen atom-containing group, a phenol group, an alkyl group, an aryl group, an alkyleneoxy chain-containing group, an imide group, an alkyloxycarbonyl group, an alkylaminocarbonyl group, a carboxylate group, a sulfonamide group, a heterocyclic group, an alkoxysilyl group, an epoxy group, an isocyanate group and a hydroxyl group, n number of $A^2$ or $R^4$ may be the same or different from each other, m represents a positive number of 8 or less, n represents from 1 to 9, m+n satisfies the range of 3 to 10, $P^2$ represents a polymer chain, and m number of $P^2$ or $R^5$ may be the same or different from each other:

(1)

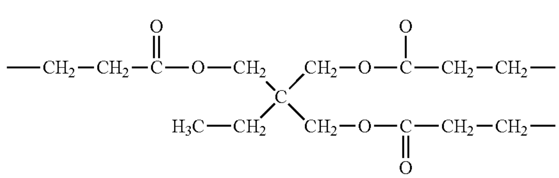

(2)

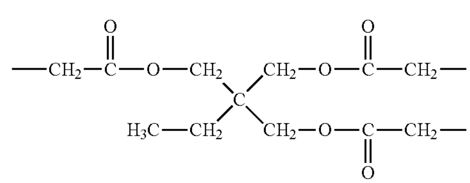

(3)

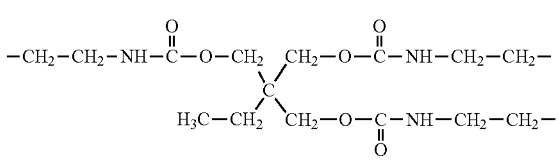

(4)

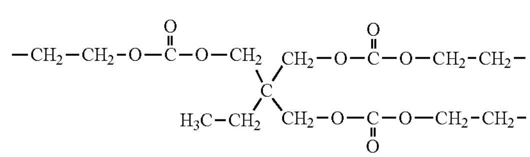

-continued
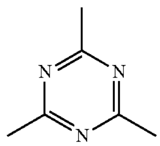
(5)
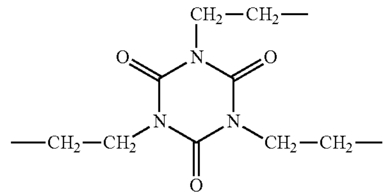
(6)
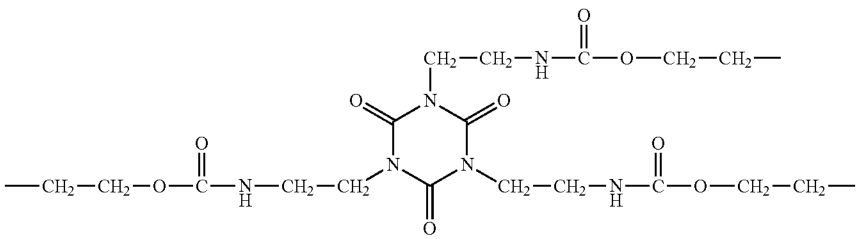
(7)
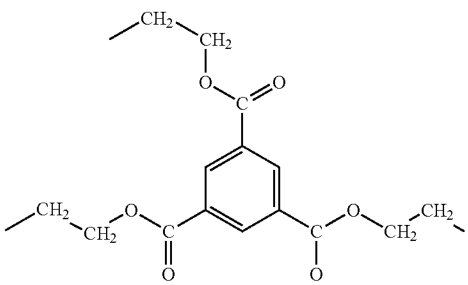
(8)
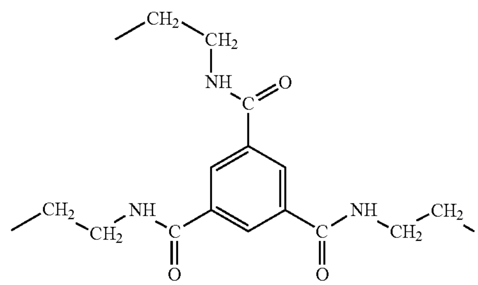
(9)
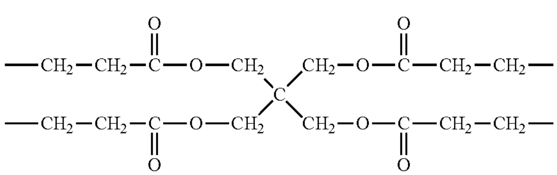
(10)
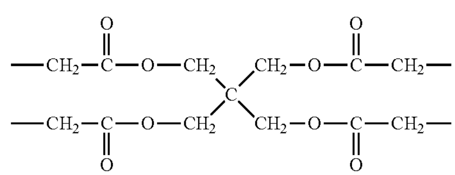
(11)
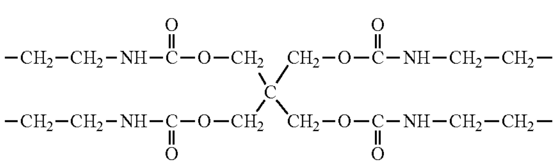
(12)
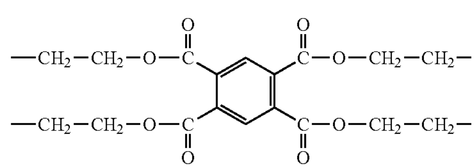
(13)
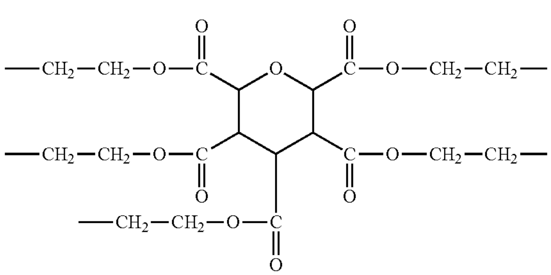
(14)
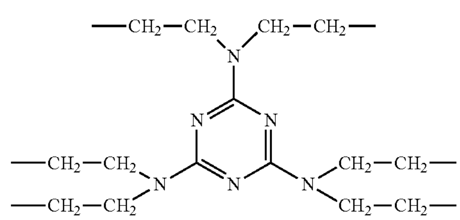
(15)

-continued (16)

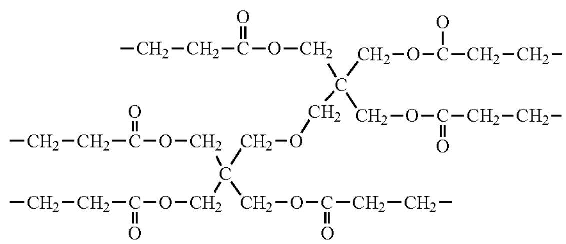

(17)

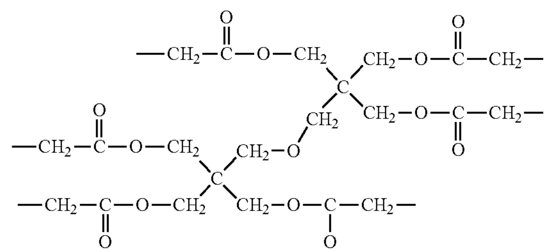

[6] The dispersion composition as described in any one of [1] to [5], wherein $A^1$ in formula (1) or $A^2$ in formula (2) is a monovalent substituent having at least one group selected from the group consisting of an acid group, a phenol group, an alkyl group, an aryl group, an alkyleneoxy chain-containing group, a hydroxyl group, a urea group, a urethane group, a sulfonamide group, an imide group and a coordinating oxygen atom-containing group.

[7] The dispersion composition as described in any one of [1] to [5], wherein $A^1$ in formula (1) or $A^2$ in formula (2) is a monovalent substituent having at least one functional group with a pKa of 5 or more.

[8] The dispersion composition as described in [7], wherein the functional group with a pKa of 5 or more is a coordinating oxygen atom-containing group, a basic nitrogen atom-containing group, a phenol group, a urea group, a urethane group, an alkyl group, an aryl group, an alkyloxycarbonyl group, an alkylaminocarbonyl group, an alkyleneoxy chain-containing group, an imide group, a carboxylate group, a sulfonamide group, a hydroxyl group or a heterocyclic group.

[9] The dispersion composition as described in any one of [1] to [8], wherein the polymer chain represented by $P^1$ or $P^2$ is a polymer chain derived from at least one member selected from a polymer or copolymer of a vinyl monomer, an ester-based polymer, an ether-based polymer, a urethane-based polymer, an amide-based polymer, an epoxy-based polymer, a silicone-based polymer, and a modification product or copolymer thereof.

[10] The dispersion composition as described in any one of [1] to [9], wherein the polymer chain represented by $P^1$ or $P^2$ contains at least one repeating unit and the repetition number k of the at least one repeating unit is from 3 to 50.

[11] The dispersion composition as described in any one of [1] to [10], wherein the polymer compound (B) is a polymer compound represented by the following formula (5):

$$(A^3—R^7—S \overline{)_{n1}} R^6 \overline{(} S—R^9—P^3)_m \quad \text{with } (A^4—R^8—S)_{n2} \text{ also bonded to } R^6 \tag{5}$$

in formula (5), $R^6$ represents an (m+n1+n2)-valent linking group represented by any one of the following formulae (1) to (17), each of $R^7$ to $R^9$ independently represents a single bond or a divalent linking group, $A^3$ represents a monovalent substituent having at least one acid group, $A^4$ represents a monovalent substituent different from $A^3$, n1 number of $A^3$ or $R^7$ may be the same or different from each other, n2 number of $A^4$ or $R^8$ may be the same or different from each other, m represents a positive number of 8 or less, n1 represents from 1 to 8, n2 represents from 1 to 8, m+n1+n2 satisfies the range of 3 to 10, $P^3$ represents a polymer chain, and m number of $P^3$ or $R^9$ may be the same or different from each other:

(1)

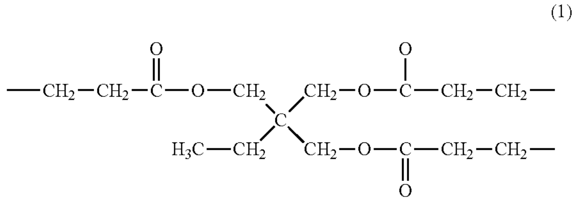

(2)

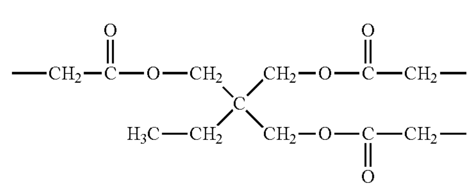

(3)

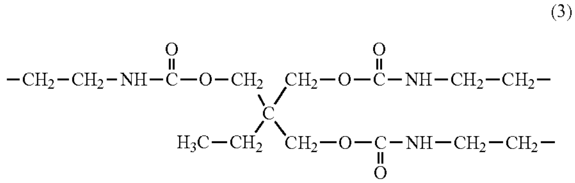

(4)

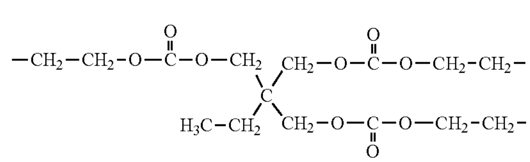

-continued
(5)
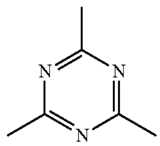
(6)
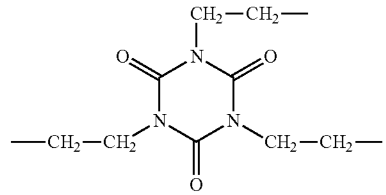
(7)
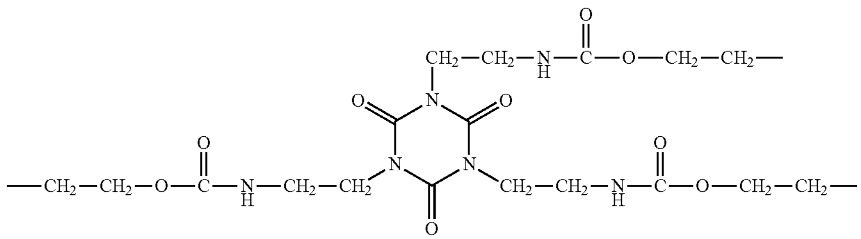
(8)
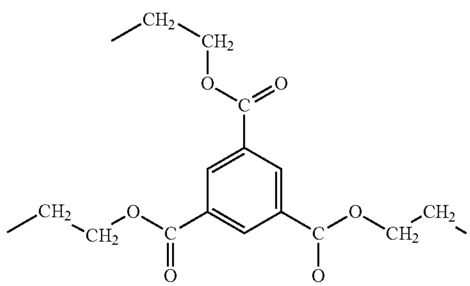
(9)
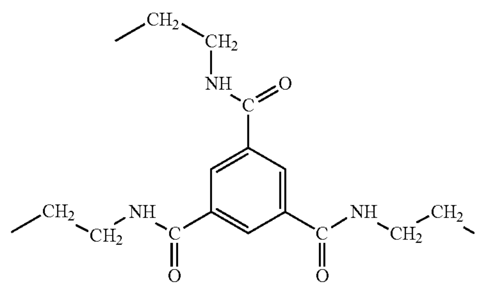
(10)
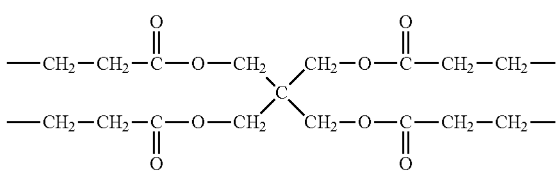
(11)
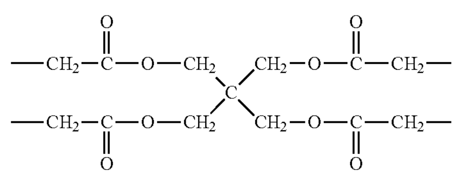
(12)
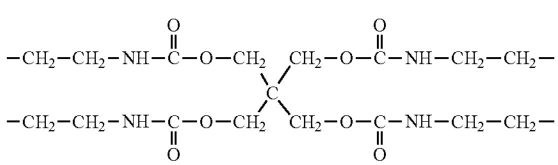
(13)
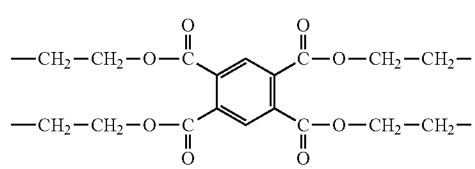
(14)
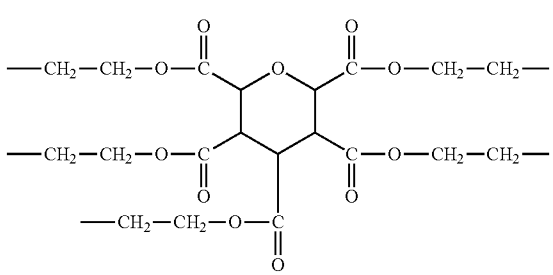
(15)
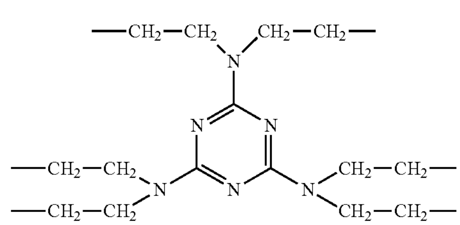

-continued (16)

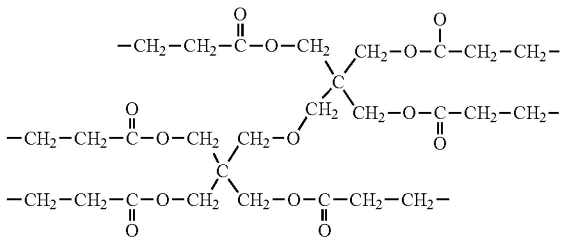

(17)

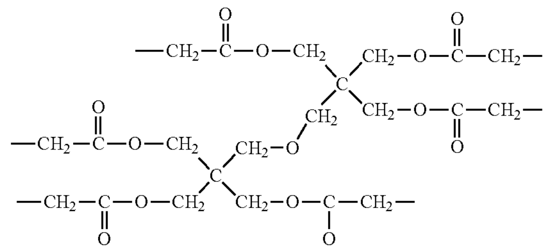

[12] A curable composition containing the dispersion composition described in any one of [1] to [11] and (D) a polymerizable compound.

[13] The curable composition as described in [12], wherein the polymerizable compound (D) is at least one member selected from the group consisting of a compound having two or more epoxy groups or oxetanyl groups in the molecule and a compound having two or more terminal ethylenically unsaturated bonds.

[14] The curable composition as described in [12] or [13], further containing at least one member selected from the group consisting of (E) a polymerization initiator and a binder polymer.

[15] The curable composition as described in [14], wherein the polymerization initiator (E) is an oxime-based polymerization initiator.

[16] The curable composition as described in any one of [12] to [15], which is used for the formation of a microlens or for the formation of an undercoat film of a color filter.

[17] A transparent film formed using the curable composition described in any one of [12] to [16].

[18] A microlens formed using a transparent film obtained from the curable composition described in [16].

[19] A solid-state imaging device having the microlens described in [18].

[20] A method for producing the dispersion composition described in any one of [1] to [11].

[21] A polymer compound represented by the following formula (5):

$$(A^3-R^7-S\!\!\rightarrow_{n1}R^6\leftarrow\!\!S-R^9-P^3)_m \quad \text{with } (A^4-R^8-S)_{n2} \text{ bonded to } R^6 \tag{5}$$

in formula (5), $R^6$ represents an (m+n1+n2)-valent linking group represented by any one of the following formulae (1) to (17), each of $R^7$ to $R^9$ independently represents a single bond or a divalent linking group, $A^3$ represents a monovalent substituent having at least one acid group with a pKa of less than 5, $A^4$ represents a monovalent substituent different from $A^3$ and having at least one functional group with a pKa of 5 or more, n1 number of $A^3$ or $R^7$ may be the same or different from each other, n2 number of $A^4$ or $R^8$ may be the same or different from each other, m represents a positive number of 8 or less, n1 represents from 1 to 8, n2 represents from 1 to 8, m+n1+n2 satisfies the range of 3 to 10, $P^3$ represents a polymer chain, and m number of $P^3$ or $R^9$ may be the same or different from each other:

(1)

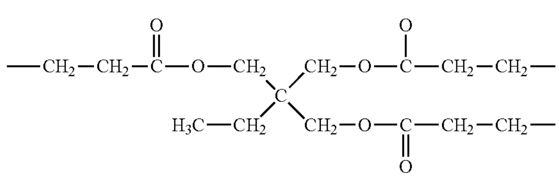

(2)

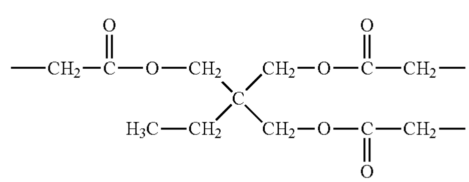

(3)

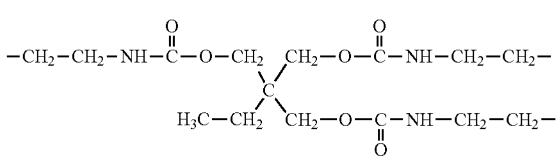

(4)

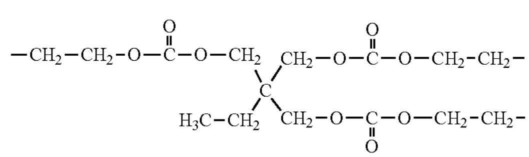

(5)

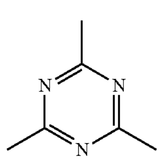

(6)

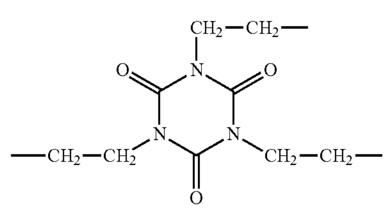

-continued
(7)
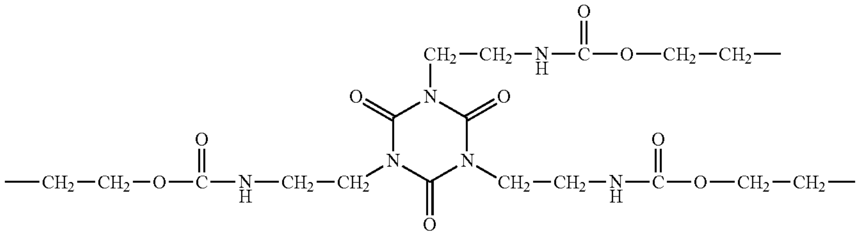
(8)
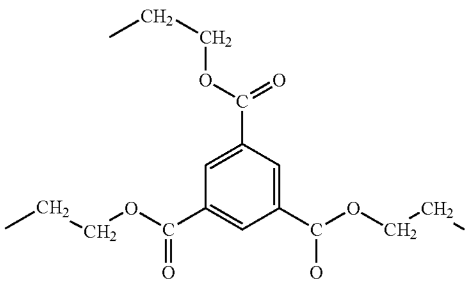
(9)
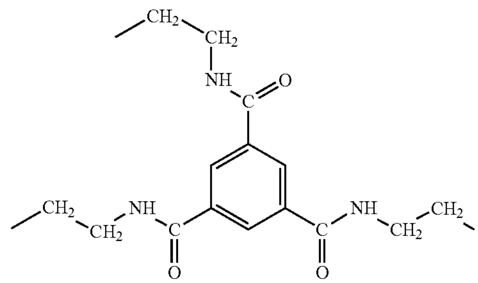
(10)
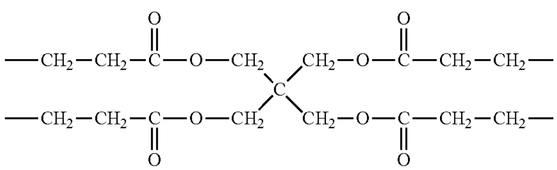
(11)
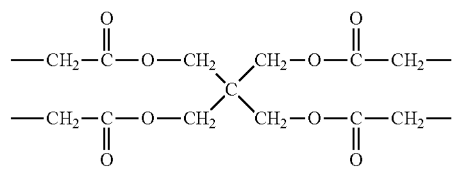
(12)
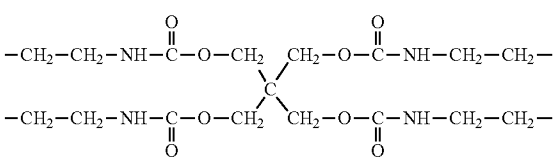
(13)
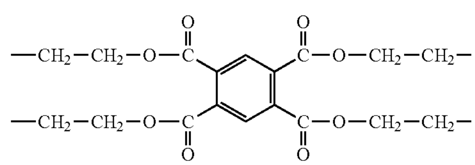
(14)
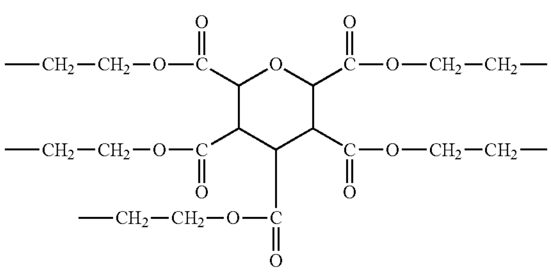
(15)
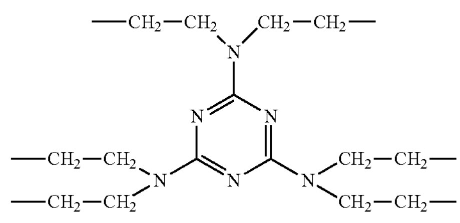
(16)
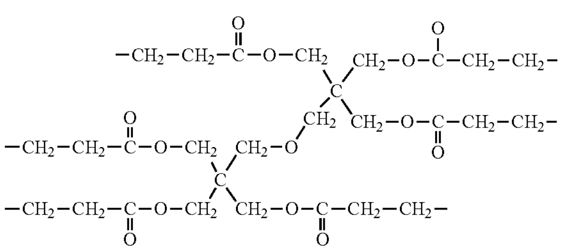
(17)
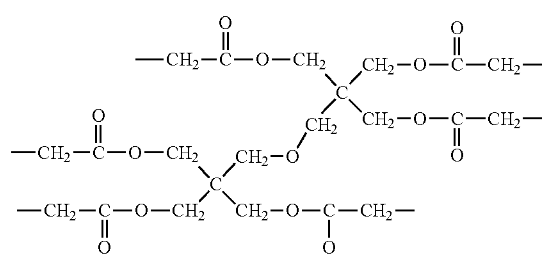

[22] A polymer compound represented by the following formula (5) having a weight average molecular weight of 5,000 to 8,000 and an acid value of 70 to 90 mgKOH/g:

(5)

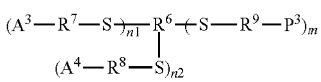

in formula (5), $R^6$ represents an (m+n1+n2)-valent linking group represented by any one of the following formulae (1) to (17), each of $R^7$ to $R^9$ independently represents a single bond or a divalent linking group, $A^3$ represents a monovalent substituent having at least one acid group, $A^4$ represents a monovalent substituent different from $A^3$, n1 number of $A^3$ or $R^7$ may be the same or different from each other, n2 number of $A^4$ or $R^8$ may be the same or different from each other, m represents a positive number of 8 or less, n1 represents from 1 to 8, n2 represents from 1 to 8, m+n1+n2 satisfies the range of 3 to 10, $P^3$ represents a polymer chain, and m number of $P^3$ or $R^9$ may be the same or different from each other:

(1)

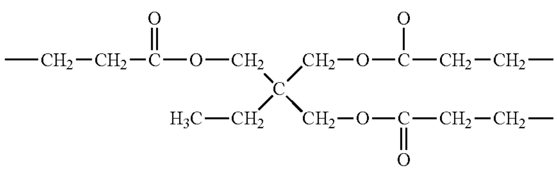

(2)

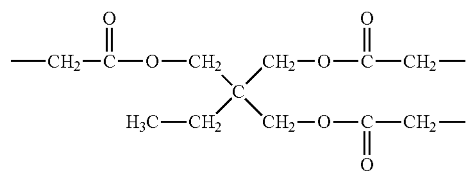

(3)

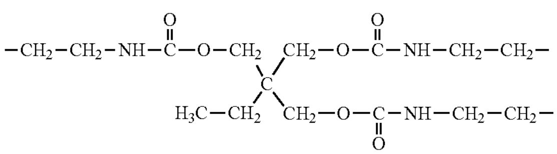

(4)

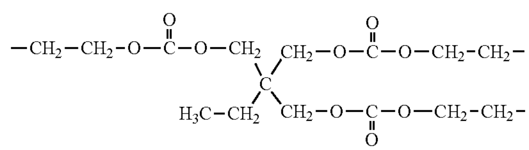

(5)

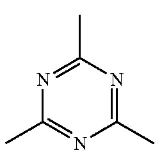

(6)

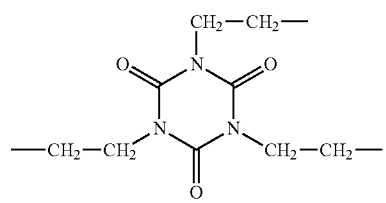

(7)

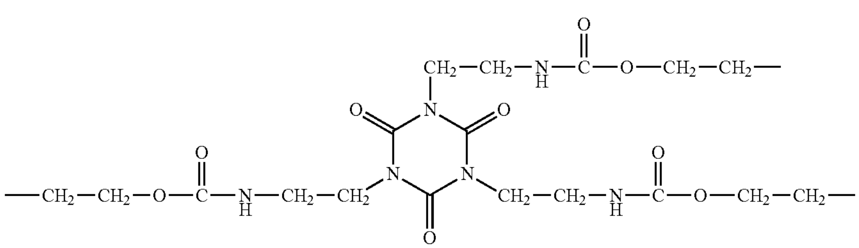

(8)

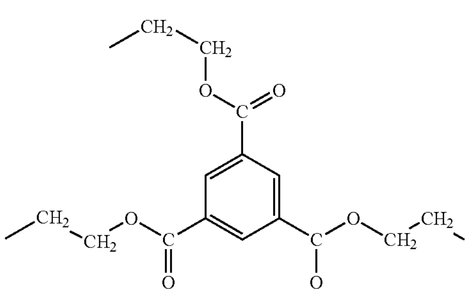

(9)

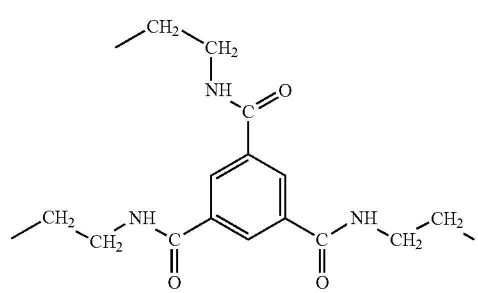

-continued (10)

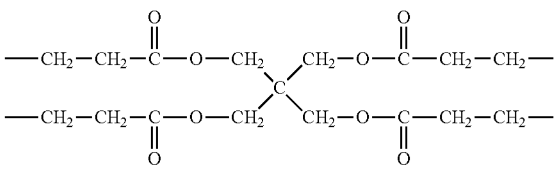

(11)

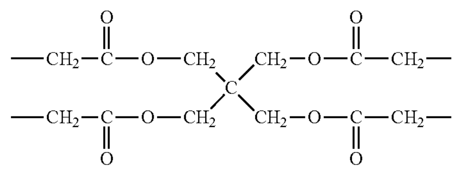

(12)

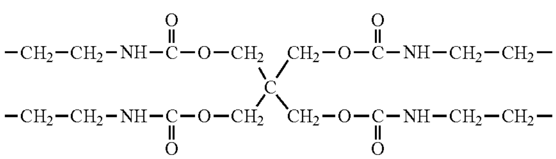

(13)

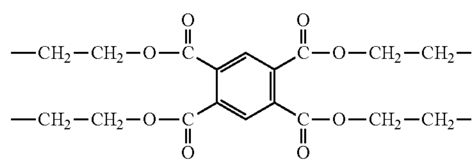

(14)

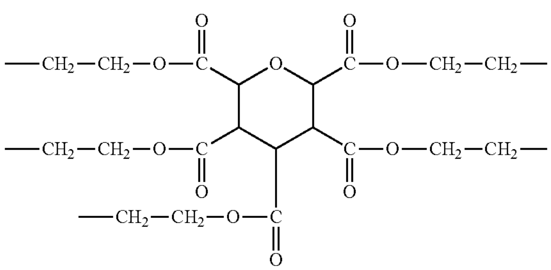

(15)

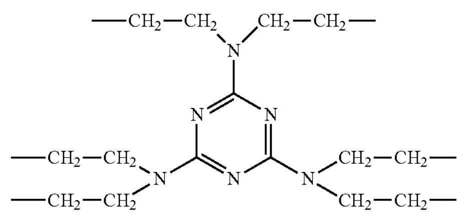

(16)

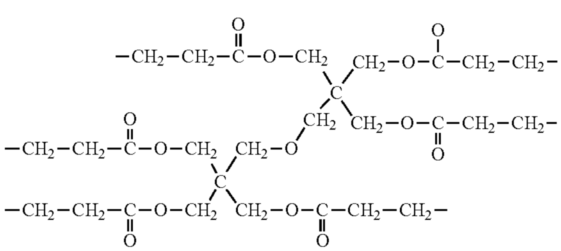

(17)

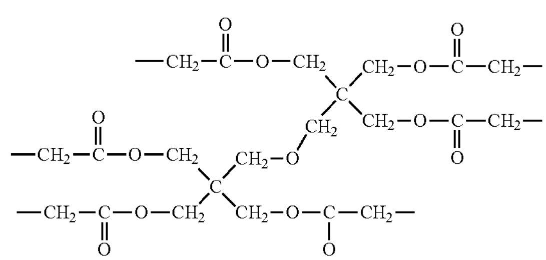

[23] The polymer compound as described in [22], wherein the substituent $A^3$ is a monovalent substituent having at least one acid group with a pKa of less than 5, and the substituent $A^4$ is a monovalent substituent having at least one functional group with a pKa of 5 or more.

[24] The polymer compound as described in any one of [21] to [23], wherein the substituent $A^3$ is a monovalent substituent having at least one group selected from the group consisting of a carboxylic acid group, a sulfonic acid group, a phosphoric acid group, a phosphoric acid group and a phosphinic acid group, and the substituent $A^4$ different from $A^3$ is a monovalent substituent having at least one group selected from the group consisting of a coordinating oxygen atom-containing group, a basic nitrogen atom-containing group, a phenol group, a urea group, a urethane group, an alkyl group, an aryl group, an alkyloxycarbonyl group, an alkylaminocarbonyl group, an alkyleneoxy chain-containing group, an imide group, a carboxylate group, a sulfonamide group, a hydroxyl group and a heterocyclic group.

[25] The polymer compound as described in any one of [21] to [24], wherein the substituent $A^3$ is a carboxylic acid group.

[26] The polymer compound as described in any one of [21] to [25], wherein the substituent $A^4$ is an alkyl group, an aryl group, a coordinating oxygen atom-containing group, a urea group or a urethane group.

[27] The polymer compound as described in any one of [21] to [26], wherein the polymer chain represented by $P^3$ is a polymer chain derived from at least one member selected from a polymer or copolymer of a vinyl monomer, an ester-based polymer, an ether-based polymer, a urethane-based polymer, an amide-based polymer, an epoxy-based polymer, a silicone-based polymer, and a modification product or copolymer thereof.

[28] The polymer compound as described in any one of [21] to [27], wherein the polymer chain represented by $P^3$ contains at least one repeating unit and the repetition number k of said at least one repeating unit is from 3 to 50.

[29] The polymer compound as described in [21], wherein the weight average molecular weight is 10,000 or less.

The present invention refers to the above [1] to [29]. For a reference, other matters (for examples, the matters described in the following <1> to <32> and the like) are also described.

<1> A dispersion composition containing:

(A) a metal oxide particle having a primary particle diameter of 1 to 100 nm, (B) a polymer compound represented by the following formula (1) having a weight average molecular weight of 10,000 or less, and (C) a solvent:

[Chem. 1]

$$(A^1-R^2)_n R^1 (P^1)_m \qquad \text{formula (1)}$$

in formula (1), $R^1$ represents an (m+n)-valent linking group, $R^2$ represents a single bond or a divalent linking group, $A^1$ represents a monovalent substituent having at least one group selected from the group consisting of an acid group, a urea group, a urethane group, a coordinating oxygen atom-containing group, a basic nitrogen atom-containing group, a phenol group, an alkyl group, an aryl group, an alkyleneoxy chain-containing group, an imide group, an alkyloxycarbonyl group, an alkylaminocarbonyl group, a carboxylate group, a sulfonamide group, a heterocyclic group, an alkoxysilyl group, an epoxy group, an isocyanate group and a hydroxyl group, n number of $A^1$ or $R^2$ may be the same or different from each other, m represents a positive number of 8 or less, n represents from 1 to 9, m+n satisfies the range of 3 to 10, $P^1$ represents a polymer chain, and m number of $P^1$ may be the same or different from each other.

<2> The dispersion composition as described in <1>, wherein the weight average molecular weight of the polymer compound (B) is from 5,000 to 8,000.

<3> The dispersion composition as described in <1> or <2>, wherein the acid value of the polymer compound (B) is from 70 to 90 mgKOH/g.

<4> The dispersion composition as described in any one of <1> to <3>, wherein the content of the metal oxide particle (A) is 65 mass % or more based on the total solid content of the dispersion composition.

<5> The dispersion composition as described in any one of <1> to <4>, wherein the polymer compound (B) is a polymer compound represented by the following formula (2):

[Chem. 2]

$$(A^2-R^4-S)_n R^3 (S-R^5-P^2)_m \qquad \text{formula (2)}$$

in formula (2), $R^3$ represents an (m+n)-valent linking group, each of $R^4$ and $R^5$ independently represents a single bond or a divalent linking group, $A^2$ represents a monovalent substituent having at least one group selected from the group consisting of an acid group, a urea group, a urethane group, a coordinating oxygen atom-containing group, a basic nitrogen atom-containing group, a phenol group, an alkyl group, an aryl group, an alkyleneoxy chain-containing group, an imide group, an alkyloxycarbonyl group, an alkylaminocarbonyl group, a carboxylate group, a sulfonamide group, a heterocyclic group, an alkoxysilyl group, an epoxy group, an isocyanate group and a hydroxyl group, n number of $A^2$ or $R^4$ may be the same or different from each other, m represents a positive number of 8 or less, n represents from 1 to 9, m+n satisfies the range of 3 to 10, $P^2$ represents a polymer chain, and m number of $P^2$ or $R^5$ may be the same or different from each other.

<6> The dispersion composition as described in any one of <1> to <5>, wherein $A^1$ in formula (1) or $A^2$ in formula (2) is a monovalent substituent having at least one group selected from the group consisting of an acid group, a phenol group, an alkyl group, an aryl group, an alkyleneoxy chain-containing group, a hydroxyl group, a urea group, a urethane group, a sulfonamide group, an imide group and a coordinating oxygen atom-containing group.

<7> The dispersion composition as described in any one of <1> to <5>, wherein $A^1$ in formula (1) or $A^2$ in formula (2) is a monovalent substituent having at least one functional group with a pKa of 5 or more.

<8> The dispersion composition as described in <7>, wherein the functional group with a pKa of 5 or more is a coordinating oxygen atom-containing group, a basic nitrogen atom-containing group, a phenol group, a urea group, a urethane group, an alkyl group, an aryl group, an alkyloxycarbonyl group, an alkylaminocarbonyl group, an alkyleneoxy chain-containing group, an imide group, a carboxylate group, a sulfonamide group, a hydroxyl group or a heterocyclic group.

<9> The dispersion composition as described in any one of <1> to <8>, wherein the polymer chain represented by $P^1$ or $P^2$ is a polymer chain derived from at least one member selected from a polymer or copolymer of a vinyl monomer, an ester-based polymer, an ether-based polymer, a urethane-based polymer, an amide-based polymer, an epoxy-based polymer, a silicone-based polymer, and a modification product or copolymer thereof.

<10> The dispersion composition as described in any one of <1> to <9>, wherein the polymer chain represented by $P^1$ or $P^2$ contains at least one repeating unit and the repetition number k of the at least one repeating unit is from 3 to 50.

<11> The dispersion composition as described in any one of <1> to <10>, wherein $R^1$ in formula (1) or $R^3$ in formula (2) is a group represented by any one of the following formulae:

[Chem. 3]

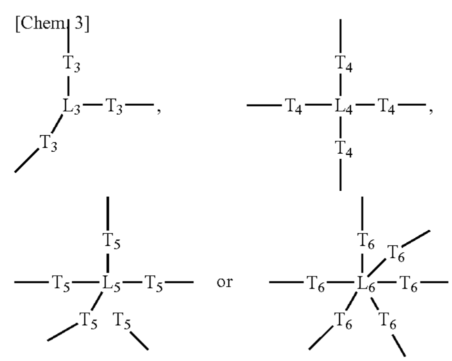

in these formulae, $L_3$ represents a trivalent group, $T_3$ represents a single bond or a divalent linking group, and three $T_3$ may be the same or different from each other;

$L_4$ represents a tetravalent group, $T_4$ represents a single bond or a divalent linking group, and four $T_4$ may be the same or different from each other;

$L_5$ represents a pentavalent group, $T_5$ represents a single bond or a divalent linking group, and five $T_5$ may be the same or different from each other;

$L_6$ represents a hexavalent group, $T_6$ represents a single bond or a divalent linking group, and six $T_6$ may be the same or different from each other.

<12> The dispersion composition as described in any one of <1> to <11>, wherein the polymer compound (B) is a polymer compound represented by the following formula (5):

[Chem. 4]

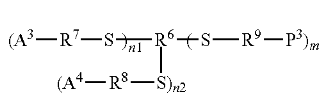

(5)

in formula (5), $R^6$ represents an (m+n1+n2)-valent linking group, each of $R^7$ to $R^9$ independently represents a single bond or a divalent linking group, $A^3$ represents a monovalent substituent having at least one acid group, $A^4$ represents a monovalent substituent different from $A^3$, n1 number of $A^3$ or $R^7$ may be the same or different from each other, n2 number of $A^4$ or $R^8$ may be the same or different from each other, m represents a positive number of 8 or less, n1 represents from 1 to 8, n2 represents from 1 to 8, m+n1+n2 satisfies the range of 3 to 10, $P^3$ represents a polymer chain, and m number of $P^3$ or $R^9$ may be the same or different from each other.

<13> A curable composition containing the dispersion composition described in any one of <1> to <12> and (D) a polymerizable compound.

<14> The curable composition as described in <13>, wherein the polymerizable compound (D) is at least one member selected from the group consisting of a compound having two or more epoxy groups or oxetanyl groups in the molecule and a compound having two or more terminal ethylenically unsaturated bonds.

<15> The curable composition as described in <13> or <14>, further containing at least one member selected from the group consisting of (E) a polymerization initiator and a binder polymer.

<16> The curable composition as described in <15>, wherein the polymerization initiator (E) is an oxime-based polymerization initiator.

<17> The curable composition as described in any one of <13> to <16>, which is used for the formation of a microlens or for the formation of an undercoat film of a color filter.

<18> A transparent film formed using the curable composition described in any one of <13> to <17>.

<19> A microlens formed using a transparent film obtained from the curable composition described in <17>.

<20> A solid-state imaging device having the microlens described in <19>.

<21> A method for producing the dispersion composition described in any one of <1> to <12>.

<22> A polymer compound represented by the following formula (5):

[Chem. 5]

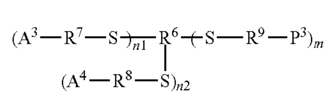

(5)

in formula (5), $R^6$ represents an (m+n1+n2)-valent linking group, each of $R^7$ to $R^9$ independently represents a single bond or a divalent linking group, $A^3$ represents a monovalent substituent having at least one acid group, $A^4$ represents a monovalent substituent different from $A^3$, n1 number of $A^3$ or $R^7$ may be the same or different from each other, n2 number of $A^4$ or $R^8$ may be the same or different from each other, m represents a positive number of 8 or less, n1 represents from 1 to 8, n2 represents from 1 to 8, m+n1+n2 satisfies the range of 3 to 10, $P^3$ represents a polymer chain, and m number of $P^3$ or $R^9$ may be the same or different from each other.

<23> The polymer compound as described in <22>, wherein the substituent $A^3$ is a monovalent substituent having at least one acid group with a pKa of less than 5, and the substituent $A^4$ is a monovalent substituent having at least one functional group with a pKa of 5 or more.

<24> The polymer compound as described in <22> or <23>, wherein the substituent $A^3$ is a monovalent substituent having at least one group selected from the group consisting of a carboxylic acid group, a sulfonic acid group, a phosphoric acid group, a phosphonic acid group and a phosphinic acid group, and the substituent $A^4$ different from $A^3$ is a monovalent substituent having at least one group selected from the group consisting of a coordinating oxygen atom-containing group, a basic nitrogen atom-containing group, a phenol group, a urea group, a urethane group, an alkyl group, an aryl group, an alkyloxycarbonyl group, an alkylaminocarbonyl group, an alkyleneoxy chain-containing group, an imide group, a carboxylate group, a sulfonamide group, a hydroxyl group and a heterocyclic group.

<25> The polymer compound as described in any one of <22> to <24>, wherein the substituent $A^3$ is a carboxylic acid group.

<26> The polymer compound as described in any one of <22> to <25>, wherein the substituent $A^4$ is an alkyl group, an aryl group, a coordinating oxygen atom-containing group, a urea group or a urethane group.

<27> The polymer compound as described in any one of <22> to <26>, wherein the polymer chain represented by $P^3$ is a polymer chain derived from at least one member selected from a polymer or copolymer of a vinyl monomer, an ester-based polymer, an ether-based polymer, a urethane-based polymer, an amide-based polymer, an epoxy-based polymer, a silicone-based polymer, and a modification product or copolymer thereof.

<28> The polymer compound as described in any one of <22> to <27>, wherein the polymer chain represented by $P^3$ contains at least one repeating unit and the repetition number k of the at least one repeating unit is from 3 to 50.

<29> The polymer compound as described in any one of <22> to <28>, wherein the weight average molecular weight is 10,000 or less.

The present invention preferably further includes the following configurations.

<30> A method for producing a transparent film, comprising:

a step of coating the curable composition described in any one of <13> to <17> on a wafer, subsequently, a first heating step, and further subsequently, a second heating step at a temperature higher than the temperature in the first heating step.

<31> A method for producing a microlens, comprising a step of post-baking and thereby shaping the transparent film described in <18>, and a dry etching step.

<32> A method for manufacturing a solid-state imaging device, comprising:

a step of forming a red pixel, a blue pixel and a green pixel on a solid-state imaging device substrate having thereon at least a photodiode, a light-shielding film and a device protective film, a step of coating and heating the curable composition described in any one of <13> to <17>, a step of forming a resist pattern, a step of applying a post-baking treatment, thereby shaping the formed resist pattern in a lens shape, and a dry etching step.

Advantage of the Invention

According to the present invention, a dispersion composition having a high refractive index and a low viscosity, and a curable composition, a transparent film, a microlens and a solid-state imaging device each using the dispersion composition can be provided.

In addition, according to the present invention, a compound able to afford a dispersion composition having a high refractive index and giving an excellent surface state to a film after coating and drying and maintain the dispersion stability of particles can be provided.

MODE FOR CARRYING OUT THE INVENTION

Figure 1:
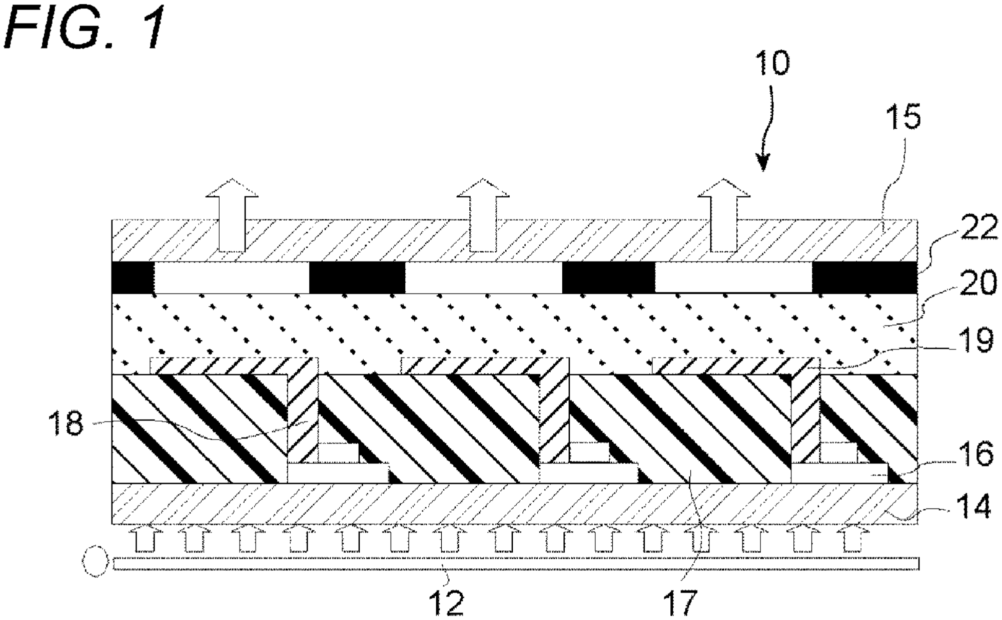
FIG. 1 is a conceptual cross-sectional view depicting one example of the liquid crystal display device of an active matrix system.

In this description, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

The constituent element is sometimes described below based on a representative embodiment of the present invention, but the present invention is not limited thereto. In this description, the numerical value range expressed by using "(numerical value) to (numerical value)" means a range including the numerical values before and after "to" as a lower limit and an upper limit.

In this description, the "(meth)acrylate" represents acrylate and methacrylate, the "(meth)acryl" represents acryl and methacryl, and the "(meth)acryloyl" represents acryloyl and methacryloyl. Also, in this description, the "monomeric substance" and the "monomer" have the same meaning. The monomer in the present invention is distinguished from an oligomer and a polymer and indicates a compound having a mass average molecular weight of 2,000 or less. In the description of the present invention, the polymerizable compound indicates a compound having a polymerizable group and may be a monomer or a polymer. The polymerizable group indicates a group participating in a polymerization reaction.

In the description of the present invention, unless otherwise indicated, the "refractive index" indicates a refractive index for light having a wavelength of 635 nm.

<Dispersion Composition>

The dispersion composition of the present invention contains (A) a metal oxide particle having a primary particle diameter of 1 to 100 nm, (B) a polymer compound represented by the following formula (1) having a weight average molecular weight of 10,000 or less, and (C) a solvent.

[Chem. 6]

$$(A^1-R^2)_n R^1(P^1)_m \qquad \text{formula (1)}$$

In formula (1), $R^1$ represents an (m+n)-valent linking group, $R^2$ represents a single bond or a divalent linking group, and $A^1$ represents a monovalent substituent having at least one group selected from the group consisting of an acid group, a urea group, a urethane group, a coordinating oxygen atom-containing group, a basic nitrogen atom-containing group, a phenol group, an alkyl group, an aryl group, an alkyleneoxy chain-containing group, an imide group, an alkyloxycarbonyl group, an alkylaminocarbonyl group, a carboxylate group, a sulfonamide group, a heterocyclic group, an alkoxysilyl group, an epoxy group, an isocyanate group and a hydroxyl group.

n number of $A^1$ or $R^2$ may be the same or different from each other.

m represents a positive number of 8 or less, n represents from 1 to 9, and m+n satisfies the range of 3 to 10.

$P^1$ represents a polymer chain, and m number of $P^1$ may be the same or different from each other.

In the dispersion composition of the present invention, the substituent $A^1$ in the polymer compound (B) can interact with the metal oxide particle (A) and therefore, by virtue of having n (from 1 to 9) number of substituent $A^1$, the polymer compound (B) can strongly interact with the metal oxide particle (A). In addition, m number of polymer chain $P^1$ in the polymer compound (B) can function as a steric repulsive group and by virtue of having m number, a good steric repulsive force can be exerted to uniformly disperse metal oxide particles. Furthermore, the molecular structure of the polymer compound (B) infers that a problem such as aggregation of particles due to crosslinking between particles, which may be caused by a conventional dispersant having a graft or random structure, does not arise.

<(A) Metal Oxide Particle Having a Primary Particle Diameter of 1 to 100 nm>

The metal oxide particle (A) for use in the present invention is preferably a colorless, white or transparent inorganic particle having a high refractive index and includes an oxide particle of titanium (Ti), zirconium (Zr), aluminum (Al), silicon (Si), zinc (Zn) or magnesium (Mg). The metal oxide particle is preferably a titanium dioxide ($TiO_2$) particle, a zirconium dioxide ($ZrO_2$) particle or a silicon dioxide ($SiO_2$) particle, more preferably a titanium dioxide particle (hereinafter, sometimes simply referred to as "titanium dioxide").

The titanium dioxide particle for use in the present invention can be represented by chemical formula of $TiO_2$ and preferably has a purity of 70% or more, more preferably a purity of 80% or more, still more preferably a purity of 85% or more. The content of a low-order titanium oxide represented by formula of $Ti_nO_{2n-1}$ (n represents a number of 2 to 4), titanium oxynitride, etc., is preferably 30 mass % or less, more preferably 20 mass % or less, still more preferably 15 mass % or less.

The metal oxide particle for use in the present invention is not particularly limited as long as the primary particle diameter is from 1 nm to 100 nm, and for example, the metal oxide particle used may be appropriately selected from commercially available metal oxide particles.

The primary particle diameter of the metal oxide particle is from 1 nm to 100 nm but is preferably from 1 nm to 80 nm, more preferably from 1 nm to 50 nm, still more preferably from 10 nm to 30 nm. If the primary particle diameter of the metal oxide particle exceeds 100 nm, the refractive index and transmittance may decrease. If the primary particle diameter is less than 1 nm, the dispersibility may be reduced due to aggregation.

In the present invention, an average particle diameter may also be used as an indicator of the primary particle diameter. The average particle diameter of the metal oxide particle for use in the present invention means a value obtained by 80-fold diluting a mixed solution or dispersion liquid containing the metal oxide particle with propylene glycol monomethyl ether acetate, and measuring the resulting diluted solution by a dynamic scattering method.

This measurement is performed using MICROTRACK UPA-EX150 manufactured by Nikkiso Co., Ltd. to obtain a number average particle diameter.

In the present invention, the refractive index of the metal oxide particle is not particularly limited but from the standpoint of obtaining a high refractive index, is preferably from 1.75 to 2.70, more preferably from 1.90 to 2.70.

The specific surface area of the metal oxide particle is preferably from 10 to 400 $m^2/g$, more preferably from 20 to 200 $m^2/g$, still more preferably from 30 to 150 $m^2/g$, and most preferably from 40 to 70 $m^2/g$.

The metal oxide particle is not particularly limited in its shape and may have, for example, a rice grain shape, a spherical shape, a cubic shape, a spindle shape or an indefinite shape.

The metal oxide particle of the present invention may be a metal oxide particle surface-treated with an organic compound. Examples of the organic compound used for the surface treatment include a polyol, an alkanolamine, a fatty acid (preferably stearic acid), a silane coupling agent, and a titanate coupling agent. Among these, a fatty acid (preferably stearic acid) or a silane coupling agent is preferred, and a fatty acid is more preferred.

The surface treatment may be performed using one surface treating agent alone or using two or more kinds of surface treating agents in combination.

It is also preferred that the metal oxide particle surface is coated with an oxide such as aluminum, silicon and zirconia. By this coating, the weather resistance is more enhanced.

As the metal oxide particle for use in the present invention, a commercially available product may be preferably used.

The commercially available titanium dioxide particle includes TTO series (e.g., TTO-51(A), TTO-51(C)), TTO-S and V series (e.g., TTO-S-1, TTO-S-2, TTO-V-3), produced by Ishihara Sangyo Kaisha, Ltd.; and MT series (e.g., MT-01, MT-05) produced by Tayca Corporation).

The commercially available zirconium dioxide particle includes, for example, UEP (produced by Daiichi Kigenso Kagaku Kogyo Co., Ltd.); PCS (produced by Nippon Denko Co., Ltd.); 3S-01, JS-03 and JS-04 (produced by Nippon Denko Co., Ltd.); and UEP-100 (produced by Daiichi Kigenso Kagaku Kogyo Co., Ltd.).

The commercially available silicon dioxide particle includes, for example, OG502-31 produced by Clariant Co.

In the present invention, one of these metal oxide particles may be used alone, or two or more thereof may be used in combination.

The content of the metal oxide particle in the dispersion composition of the present invention is, from the standpoint of obtaining a high refractive index, preferably 65 mass % or more, more preferably 70 mass % or more, based on the total solid content of the dispersion composition.

The upper limit of the content is not particularly limited but is preferably 90 mass % or less, more preferably 85 mass % or less, based on the total solid content of the dispersion composition.

<(B) Polymer Compound Represented by Formula (1) Having a Weight Average Molecular Weight of 10,000 or Less>

In the present invention, the weight average molecular weight of the polymer compound (B) represented by formula (1) is 10,000 or less, preferably 8,000 or less.

It is considered that if the weight average molecular weight is too large, the particle diameter of a metal oxide particle (A)-polymer compound (B) composite in the dispersion composition (curable composition) becomes large and particles are not closely packed in the obtained film, making it difficult to increase the refractive index. On the other hand, in the present invention, the weight average molecular weight is set to the above-described range, and this is thought to allow for keeping the particle diameter of a metal oxide particle (A)-polymer compound (B) composite small, closely packing the particles in the obtained film, and increasing the refractive index. In addition, although the reason is not clearly known, it is believed that by setting the weight average molecular weight to the range above, the dispersibility can also be enhanced and the viscosity can be reduced.

The lower limit of the weight average molecular weight is not particularly limited but from the standpoint of bringing out the function as a dispersant and in turn, more reliably achieving the effects of the present invention, is preferably 1,000 or more, more preferably 3,000 or more.

Among others, the weight average molecular weight of the polymer compound (B) is preferably from 5,000 to 8,000, because, as described later, when a cured film is formed, the visible light transmittance of the cured film is excellent.

Each group in formula (1) is described in detail below.

$A^1$ represents a monovalent substituent containing at least one functional group having adsorbability to the metal oxide particle (A), such as acid group, basic nitrogen atom-containing group, urea group, urethane group, coordinating oxygen atom-containing group, phenol group, alkyl group, aryl group, alkyleneoxy chain-containing group, imide group, alkyloxycarbonyl group, alkylaminocarbonyl group, carboxylate group, sulfonamide group, alkoxysilyl group, epoxy group, isocyanate group and hydroxyl group, or at least one structure capable of having adsorbability to the metal oxide particle (A), such as heterocyclic structure.

In the following description, the moieties (the above-described functional group and structure) having adsorbability to the metal oxide particle (A) are appropriately referred to by the generic term "adsorption moiety".

It may be sufficient if one $A^1$ contains at least one adsorption moiety, and two or more adsorption moieties may also be contained.

The embodiment where two or more adsorption moieties are contained in one $A^1$ includes an embodiment where two or more adsorption moieties are bonded through a chain saturated hydrocarbon group (may be linear or branched, preferably having a carbon number of 1 to 10), a cyclic saturated hydrocarbon group (preferably having a carbon number of 3 to 10), an aromatic group (preferably having a carbon number of 5 to 10, e.g., phenylene group), etc. to form a monovalent substituent $A^1$, and an embodiment where two or more adsorption moieties are connected through a chain saturated hydrocarbon group to form a monovalent substituent $A^1$ is preferred.

In the case where the adsorption moiety itself constitutes a monovalent substituent, the adsorption moiety itself may be a monovalent substituent represented by $A^1$.

First, the adsorption moiety constituting $A^1$ is described below.

Preferred examples of the "acid group" include a carboxylic acid group, a sulfonic acid group, a monosulfuric acid ester group, a phosphoric acid group, a monophosphoric acid ester group, a phosphonic acid group, a phosphinic acid group, and a boric acid group. Of these, a carboxylic acid group, a sulfonic acid group, a monosulfuric acid ester group, a phosphoric acid group, a monophosphoric acid ester group, a phosphonic acid group and a phosphinic acid group are more preferred, a carboxylic acid group, a sulfonic acid group, a phosphoric acid group, a phosphonic acid group and a phosphinic acid group are still more preferred, and a carboxylic acid is yet still more preferred.

Preferred examples of the "urea group" include —$NR^{15}CONR^{16}R^{17}$ (wherein each of $R^{15}$, $R^{16}$ and $R^{17}$ independently represents a hydrogen atom, an alkyl group having a carbon number of 1 to 20, an aryl group having a carbon number of 6 or more, or an aralkyl group having a carbon number of 7). Of these, —$NR^{15}CONHR^{17}$ (wherein each of $R^{15}$ and $R^{17}$ independently represents a hydrogen atom, an alkyl group having a carbon number of 1 to 10, an aryl group having a carbon number of 6 or more, or an aralkyl group having a carbon number of 7 or more) is more preferred, and —$NHCONHR^{17}$ (wherein $R^{17}$ represents a hydrogen atom, an alkyl group having a carbon number of 1 to 10, an aryl group having a carbon number of 6 or more, or an aralkyl group having a carbon number of 7 or more) is still more preferred.

Preferred examples of the "urethane group" include —$NHCOOR^{18}$, —$NR^{19}COOR^{21}$, —$OCONHR^{21}$, and —$OCONR^{22}R^{23}$ (wherein each of $R^{18}$, $R^{19}$, $R^{20}$, $R^{21}$, $R^{22}$ and $R^{23}$ independently represents an alkyl group having a carbon number of 1 to 20, an aryl group having a carbon number of 6 or more, or an aralkyl group having a carbon number of 7 or more). Of these, —$NHCOOR^{18}$, —$OCONHR^{21}$ (wherein each of $R^{18}$ and $R^{21}$ independently represents an alkyl group having a carbon number of 1 to 20, an aryl group having a carbon number of 6 or more, or an aralkyl group having a carbon number of 7 or more), etc. are more preferred, and —$NHCOOR^{18}$, —$OCONHR^{21}$ (wherein each of $R^{18}$ and $R^{21}$ independently represents an alkyl group having a carbon number of 1 to 10, an aryl group having a carbon number of 6 or more, or an aralkyl group having a carbon number of 7 or more), etc. are still more preferred.

The "coordinating oxygen atom-containing group" includes, for example, an acetylacetonate group and a crown ether.

Preferred examples of the "basic nitrogen atom-containing group" include an amino group (—$NH_2$), a substituted imino group (—$NHR^8$ and —$NR^9R^{10}$ wherein each of $R^8$, $R^9$ and $R^{10}$ independently represents an alkyl group having a carbon number of 1 to 20, an aryl group having a carbon number of 6 or more, or an aralkyl group having a carbon number of 7 or more), a guanidyl group represented by the following formula (a1), and an amidinyl group represented by the following formula (a2):

[Chem. 7]

(a1)

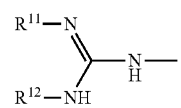

(a2)

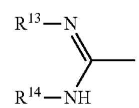

In formula (a1), each of $R^{11}$ and $R^{12}$ independently represents an alkyl group having a carbon number of 1 to 20, an aryl group having a carbon number of 6 or more, or an aralkyl group having a carbon number of 7 or more.

In Formula (a2), each of $R^{13}$ and $R^{14}$ independently represents an alkyl group having a carbon number of 1 to 20, an aryl group having a carbon number of 6 or more, or an aralkyl group having a carbon number of 7 or more.

Among these, an amino group (—$NH_2$), a substituted imino group (—$NHR^8$ and —$NR^9R^{10}$ wherein each of $R^8$, $R^9$ and $R^{10}$ independently represents an alkyl group having a carbon number of 1 to 10, a phenyl group or a benzyl group), a guanidyl group represented by formula (a1) [in formula (a1), each of $R^{11}$ and $R^{12}$ independently represents an alkyl group having a carbon number of 1 to 10, a phenyl group, or a benzyl group], an amidinyl group represented by formula (a2) [in formula (a2), each of $R^{13}$ and $R^{14}$ independently represents an alkyl group having a carbon number of 1 to 10, a phenyl group, or a benzyl group], etc. are more preferred.

In particular, an amino group (—$NH_2$), a substituted imino group (—$NHR^8$ and —$NR^9R^{10}$) wherein each of $R^8$, $R^9$ and $R^{10}$ independently represents an alkyl group having a carbon number of 1 to 5, a phenyl group or a benzyl group), a guanidyl group represented by formula (a1) [in formula (a1), each of $R^{11}$ and $R^{12}$ independently represents an alkyl group having a carbon number of 1 to 5, a phenyl group or a benzyl group], an amidinyl group represented by formula (a2) [in formula (a2), each of $R^{13}$ and $R^{14}$ independently represents an alkyl group having a carbon number of 1 to 5, a phenyl group or a benzyl group], etc. are still more preferably used.

The alkyl group as the substituent $A^1$ may be linear or branched and is preferably an alkyl group having a carbon number of 1 to 40, more preferably an alkyl group having a carbon number of 4 to 30, still more preferably an alkyl group having a carbon number of 10 to 18.

The aryl group as the substituent $A^1$ is preferably an aryl group having a carbon number of 6 to 10.

The "alkyleneoxy chain-containing group" preferably forms, at the terminal, an alkyloxy group, more preferably an alkyloxy group having a carbon number of 1 to 20. The alkyleneoxy chain is not particularly limited as long as the chain has at least one alkyleneoxy group, but the chain is preferably composed of an alkyleneoxy group having a carbon number of 1 to 6. The alkyleneoxy group includes, for example, $—CH_2CH_2O—$ and $—CH_2CH_2CH_2O—$.

The alkyl group moiety in the "alkyloxycarbonyl group" is preferably an alkyl group having a carbon number of 1 to 20.

The alkyl group moiety in the "alkylaminocarbonyl group" is preferably an alkyl group having a carbon number of 1 to 20.

The "carboxylate group" includes, for example, a group composed of an ammonium salt of carboxylic acid.

In the "sulfonamide group", the hydrogen atom bonded to nitrogen atom may be substituted by an alkyl group (e.g., methyl group), an acyl group (e.g., acetyl group, trifluoroacetyl group), etc.

Preferred examples of the "heterocyclic structure" include thiophene, furan, xanthene, pyrrole, pyrroline, pyrrolidine, dioxolane, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolone, benzothiazole, hydantoin, indole, quinoline, carbazole, acridine, acridone, and anthraquinone.

The "imide group" includes succinimide, phthalimide, naphthalimide, etc.

Each of the "heterocyclic structure" and the "imide group" may further have a substituent, and the substituent includes, for example, an alkyl group having a carbon number of 1 to 20, such as methyl group and ethyl group, an aryl group having a carbon number of 6 to 16, such as phenyl group and naphthyl group, a hydroxyl group, an amino group, a carboxyl group, a sulfonamide group, an N-sulfonylamide group, an acyloxy group having a carbon number of 1 to 6, such as acetoxy group, an alkoxy group having a carbon number of 1 to 20, such as methoxy group and ethoxy group, a halogen atom such as chlorine and bromine, an alkoxycarbonyl group having a carbon number of 2 to 7, such as methoxycarbonyl group, ethoxycarbonyl group and cyclohexyloxycarbonyl group, a cyano group, and a carbonic acid ester group such as tert-butyl carbonate.

The "alkoxysilyl group" may be a monoalkoxysilyl group, a dialkoxysilyl group or a trialkoxysilyl group but is preferably a trialkoxysilyl group, and examples thereof include a trimethoxysilyl group and a triethoxysilyl group.

The "epoxy group" includes a substituted or unsubstituted oxirane group (ethylene oxide group).

Among others, from the standpoint of achieving good interaction with the metal oxide particle (A) and increasing the refractive index as well as decreasing the viscosity of the composition, $A^1$ is preferably a monovalent substituent having at least one functional group with a pKa of 5 or more, more preferably a monovalent substituent having at least one functional group with a pKa of 5 to 14.

The "pKa" as used herein is as defined in *Chemical Handbook* (*II*) (4th Revised Edition, 1993, compiled by The Chemical Society of Japan, Maruzen).

The functional group with a pKa of 5 or more includes a coordinating oxygen atom-containing group, a basic nitrogen atom-containing group, a phenol group, a urea group, a urethane group, an alkyl group, an aryl group, an alkyloxycarbonyl group, an alkylaminocarbonyl group, an alkyleneoxy chain-containing group, an imide group, a carboxylate group, a sulfonamide group, a hydroxyl group, a heterocyclic group, etc.

Specifically, the functional group with a pKa of 5 or more includes, for example, a phenol group (pKa: approximately from 8 to 10), an alkyl group (pKa: approximately from 46 to 53), an aryl group (pKa: approximately from 40 to 33), a urea group (pKa: approximately from 12 to 14), a urethane group (pKa: approximately from 11 to 13), $—COCH_2CO—$ as a coordinating oxygen atom (pKa: approximately from 8 to 10), a sulfonamide group (pKa: approximately from 9 to 11), a hydroxyl group (pKa: approximately from 15 to 17), and a heterocyclic group (pKa: approximately from 12 to 30).

Among these, $A^1$ is preferably a monovalent substituent having at least one group selected from the group consisting of an acid group, a phenol group, an alkyl group, an aryl group, an alkyleneoxy chain-containing group, a hydroxyl group, a urea group, a urethane group, a sulfonamide group, an imide group and a coordinating oxygen atom-containing group.

In formula (1), $R^2$ represents a single bond or a divalent linking group. n number of $R^2$ may be the same or different.

The divalent linking group represented by $R^2$ includes a group made up of from 1 to 100 carbon atoms, from 0 to 10 nitrogen atoms, from 0 to 50 oxygen atoms, from 1 to 200 hydrogen atoms, and from 0 to 20 sulfur atoms and may be unsubstituted or may further have a substituent.

$R^2$ is preferably a single bond or a divalent linking group made up of from 1 to 10 carbon atoms, from 0 to 5 nitrogen atoms, from 0 to 10 oxygen atoms, from 1 to 30 hydrogen atoms, and from 0 to 5 sulfur atoms.

$R^2$ is more preferably a group selected from the group consisting of a chain saturated hydrocarbon group (may be linear or branched, preferably having a carbon number of 1 to 20), a cyclic saturated hydrocarbon group (preferably having a carbon number of 3 to 20), an aromatic group (preferably having a carbon number of 5 to 20, e.g., phenylene group), a thioether bond, an ester bond, an amide bond, an ether bond, a nitrogen atom and a carbonyl group, or a group formed by combining two or more thereof; still more preferably a group selected from the group consisting of a chain saturated hydrocarbon group, a cyclic saturated hydrocarbon group, an aromatic group, a thioether bond, an ester bond, an ether bond and an amide bond, or a group formed by combining two or more thereof; and yet still more preferably a group selected from the group consisting of a chain saturated hydrocarbon group, a thioether bond, an ester bond, an ether bond and an amide bond, or a group formed by combining two or more thereof.

Of these, in the case where the divalent linking group represented by $R^2$ has a substituent, the substituent includes, for example, an alkyl group having a carbon number of 1 to 20, such as methyl group and ethyl group, an aryl group having a carbon number of 6 to 16, such as phenyl group and naphthyl group, a hydroxyl group, an amino group, a carboxyl group, a sulfonamide group, an N-sulfonylamide group, an acyloxy group having a carbon number of 1 to 6, such as acetoxy group, an alkoxy group having a carbon number of 1 to 6, such as methoxy group and ethoxy group, a halogen atom such as chlorine and bromine, an alkoxycarbonyl group having a carbon number of 2 to 7, such as methoxycarbonyl group, ethoxycarbonyl group and cyclohexyloxycarbonyl group, a cyano group, and a carbonic acid ester group such as tert-butyl carbonate.

In formula (1), $R^1$ represents an (m+n)-valent linking group, and m+n satisfies the range of 3 to 10.

The (m+n)-valent linking group represented by $R^1$ includes a group made up of from 1 to 100 carbon atoms, from 0 to 10 nitrogen atoms, from 0 to 50 oxygen atoms, from 1 to 200 hydrogen atoms, and from 0 to 20 sulfur atoms and may be unsubstituted or may further have a substituent.

The (m+n)-valent linking group represented by $R^1$ is preferably a group represented by any one of the following formulae:

[Chem. 8]

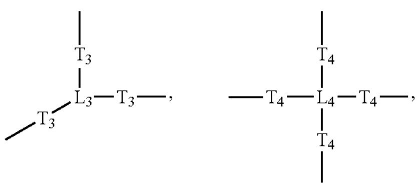

-continued

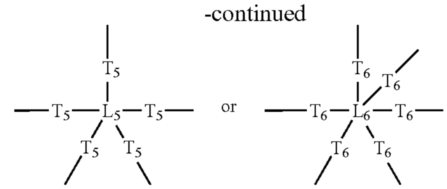

In these formulae, $L_3$ represents a trivalent group, $T_3$ represents a single bond or a divalent linking group, and three $T_3$ may be the same or different from each other;

$L_4$ represents a tetravalent group, $T_4$ represents a single bond or a divalent linking group, and four $T_4$ may be the same or different from each other;

$L_5$ represents a pentavalent group, $T_5$ represents a single bond or a divalent linking group, and five $T_s$ may be the same or different from each other; and $L_6$ represents a hexavalent group, $T_6$ represents a single bond or a divalent linking group, and six $T_6$ may be the same or different from each other.

Specific examples of the (m+n)-valent linking group represented by $R^1$ [Specific Examples (1) to (17)] are illustrated below. However, the present invention is not limited thereto.

[Chem. 9]

(1)

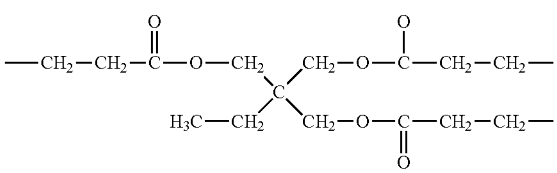

(2)

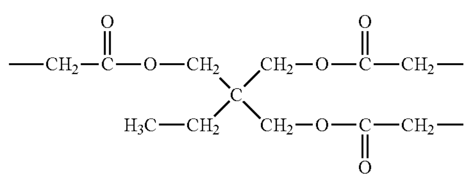

(3)

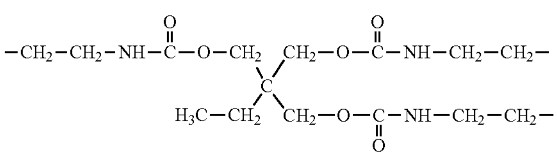

(4)

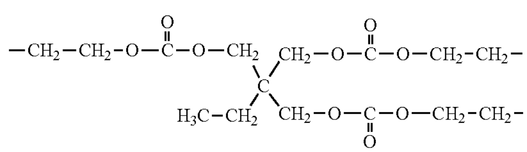

(5)

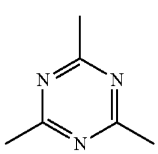

(6)

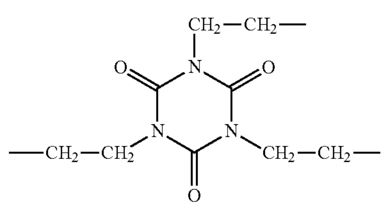

(7)

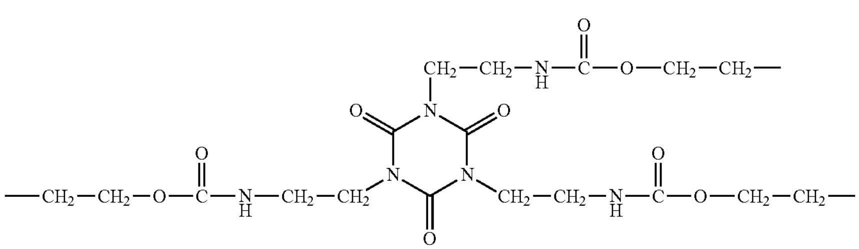

-continued
(8)
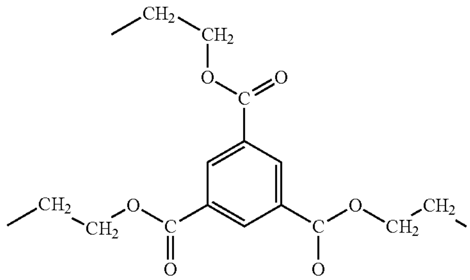
(9)
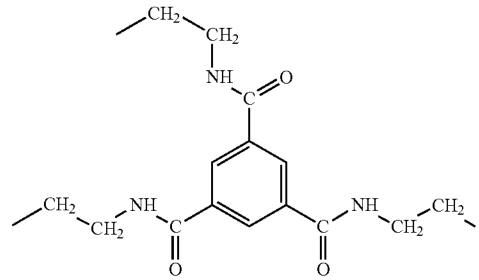
[Chem. 10]
(10)
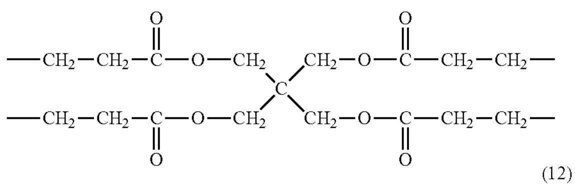
(11)
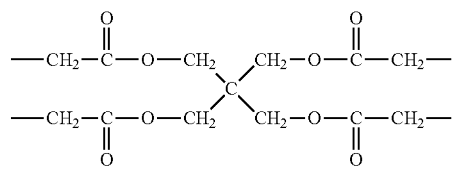
(12)
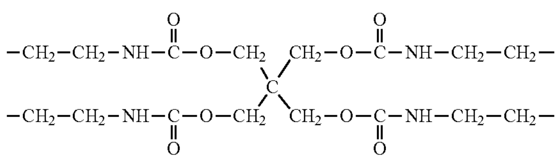
(13)
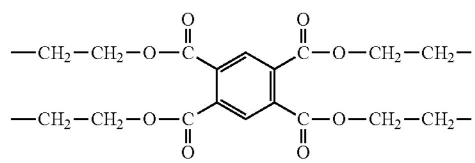
(14)
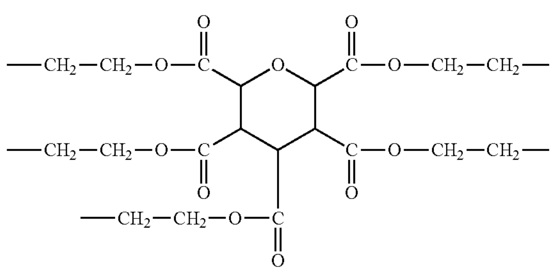
(15)
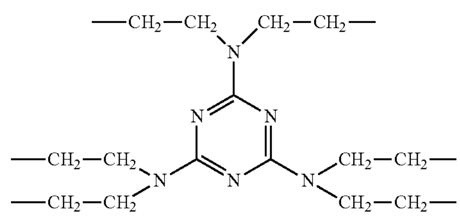
(16)
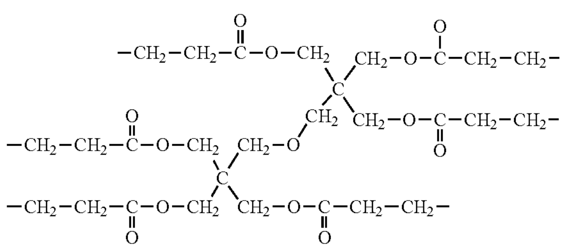
(17)
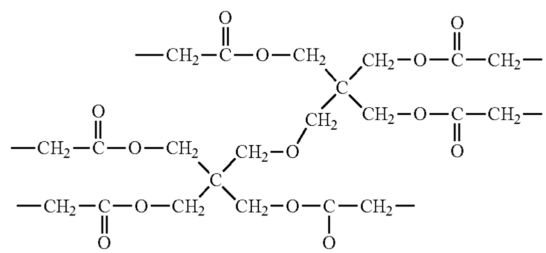
Among these specific examples, in view of availability of the raw material and ease of synthesis as well as solubility in various solvents, the following groups (1), (2), (10), (11), (16) and (17) are most preferred as the (m+n)-valent linking group.
[Chem. 11]
(1)
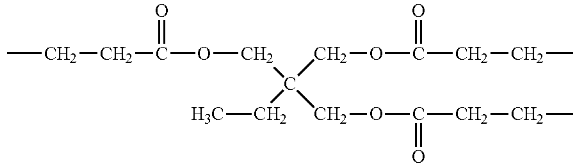

-continued

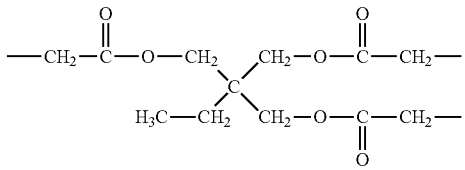
(2)

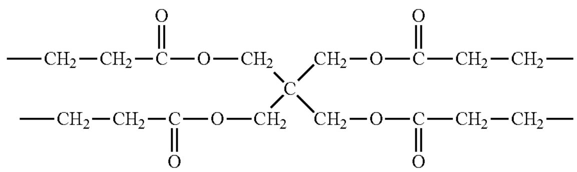
(10)

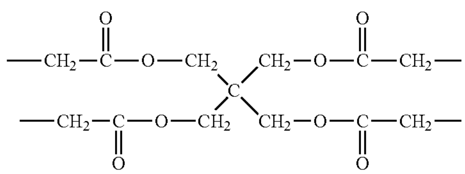
(11)

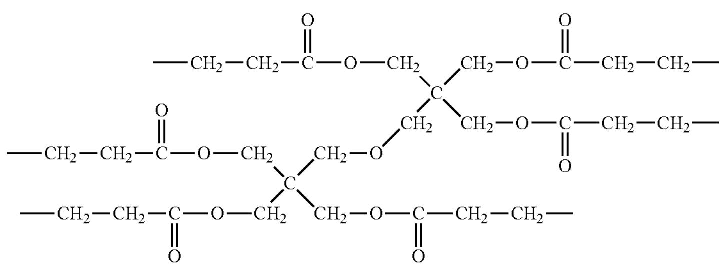
(16)

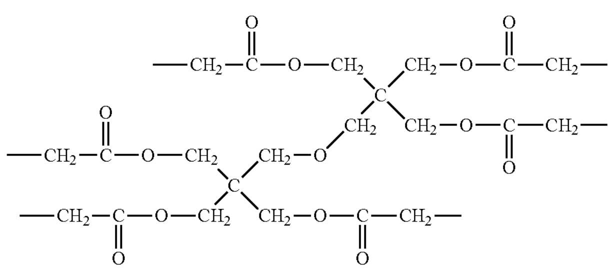
(17)

In formula (1), m represents a positive number of 8 or less. m is preferably from 0.5 to 5, more preferably from 1 to 4, still more preferably from 1 to 3.

In formula (1), n represents from 1 to 9. n is preferably from 2 to 8, more preferably from 2 to 7, still more preferably from 3 to 6.

In formula (1), $P^1$ represents a polymer chain and may be selected, for example, from known polymers according to the purpose, etc. m number of $P^1$ may be same or different.

Among polymers, the polymer for constituting the polymer chain is preferably at least one member selected from the group consisting of a polymer or copolymer of a vinyl monomer, an ester-based polymer, an ether-based polymer, a urethane-based polymer, an amide-based polymer, an epoxy-based polymer, a silicone-based polymer, and a modification product or copolymer thereof [including, for example, a polyether/polyurethane copolymer and a copolymer of a polymer of polyether/vinyl monomer (may be any of a random copolymer, a block copolymer and a graft copolymer)], more preferably at least one member selected from the group consisting of a polymer or a copolymer of a vinyl monomer, an ester-based polymer, an ether-based polymer, a urethane-based polymer, and a modification product or copolymer thereof, still more preferably a polymer or copolymer of a vinyl monomer.

The polymer or copolymer of a vinyl monomer, the ester-based polymer and the ether-based polymer, which may be contained in the polymer chain $P^1$, preferably have structures represented by the following formulae (L), (M) and (N), respectively:

[Chem. 12]

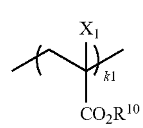
(L)

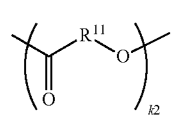
(M)

-continued (N)

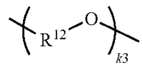

In the formulae, $X^1$ represents a hydrogen atom or a monovalent group and because of limitations in the synthesis, is preferably a hydrogen atom or an alkyl group having a carbon number of 1 to 12, more preferably a hydrogen atom or a methyl group, still more preferably a methyl group.

$R^{10}$ represents a hydrogen atom or a monovalent organic group and is not particularly limited in terms of structure but is preferably a hydrogen atom, an alkyl group, an aryl group or a heteroaryl group, more preferably a hydrogen atom or an alkyl group. In the case where $R^{10}$ is an alkyl group, the alkyl group is preferably a linear alkyl group having a carbon number of 1 to 20, a branched alkyl group having a carbon number of 3 to 20, or a cyclic alkyl group having a carbon number of 5 to 20, more preferably a linear alkyl group having a carbon number of 1 to 20, still more preferably a linear alkyl group having a carbon number of 1 to 6. In formula (L), two or more $R^{10}$ differing in the structure may be contained.

Each of $R^{11}$ and $R^{12}$ represents a branched or linear alkylene group (preferably having a carbon number of 1 to 10, more preferably from 2 to 8, still more preferably from 3 to 6). In each formula, two or more $R^{11}$ or $R^{12}$ differing in the structure may be contained.

Each of k1, k2 and k3 independently represents a number of 5 to 140.

The polymer chain $P^1$ preferably contains at least one repeating unit.

From the standpoint of bringing out a steric repulsive force to enhance the dispersibility and achieving a high refractive index and a low viscosity, the repetition number k of the above-described at least one repeating unit in the polymer chain $P^1$ is preferably 3 or more, more preferably 5 or more.

In addition, from the standpoint of keeping the polymer compound (B) less bulky to achieve a low viscosity and allowing the metal oxide particle (A) to densely exist in the cured film (transparent film) so as to achieve a high refractive index, the repeating unit number k of the above-described at least one repeating unit is preferably 50 or less, more preferably 40 or less, still more preferably 30 or less.

The polymer is preferably soluble in an organic solvent. If the affinity for an organic solvent is low, the affinity for a dispersion medium is weakened, and an adsorption layer sufficient for dispersion stabilization may not be ensured.

The vinyl monomer is not particularly limited but is, for example, preferably (meth)acrylic acid esters, crotonic acid esters, vinyl esters, an acid group-containing vinyl monomer, maleic acid diesters, fumaric acid diesters, itaconic acid diesters, (meth)acrylamides, styrenes, vinyl ethers, vinyl ketones, olefins, maleimides or a (meth)acrylonitrile, more preferably (meth)acrylic acid esters, crotonic acid esters, vinyl esters or an acid group-containing vinyl monomer, still more preferably (meth)acrylic acid esters or crotonic acid esters.

Preferred examples of these vinyl monomers include the vinyl monomers described in JP-A-2007-277514, paragraphs 0089 to 0094, 0096 and 0097 (in the corresponding U.S. Patent Application Publication No. 2010/233595, paragraphs 0105 to 0117 and 0119 to 0120), the contents of which are incorporated in the description of the present invention.

Other than the compounds described above, for example, a vinyl monomer having a functional group such as urethane group, urea group, sulfonamide group, phenol group and imide group, may also be used. Such a monomer having a urethane group or a urea group may be appropriately synthesized, for example, by utilizing an addition reaction of an isocyanate group with a hydroxyl group or an amino group. Specifically, the monomer may be appropriately synthesized, for example, by an addition reaction of an isocyanate group-containing monomer with a compound containing one hydroxyl group or a compound containing one primary or secondary amino group, or an addition reaction of a hydroxyl group-containing monomer or a primary or secondary amino group-containing monomer with monoisocyanate.

Among polymer compounds (B) represented by formula (1), a polymer compound represented by the following formula (2) is preferred:

[Chem. 13]

formula (2)

$$(A^2-R^4-S)_{\overline{n}}R^3\!\!-\!\!(S-R^5-P^2)_m$$

In formula (2), $A^2$ has the same meaning as $A^1$ in formula (1), and the preferred embodiment is also the same. n number of $A^2$ may be the same or different.

In formula (2), each of $R^4$ and $R^5$ independently represents a single bond or a divalent linking group. n number of $R^4$ may be the same or different, and m number of $R^5$ may be the same or different.

As for the divalent linking groups represented by $R^4$ and $R^5$, the same as those recited as the divalent linking group represented by $R^2$ in formula (1) are used, and the preferred embodiment is also the same.

Among others, the divalent linking group represented by $R^4$ and $R^5$ is preferably a group selected from the group consisting of a chain saturated hydrocarbon group (may be linear or branched, preferably having a carbon number of 1 to 20), a cyclic saturated hydrocarbon group (preferably having a carbon number of 3 to 20), an aromatic group (preferably having a carbon number of 5 to 20, e.g., phenylene group), an ester bond, an amide bond, an ether bond, a nitrogen atom and a carbonyl group, or a group formed by combining two or more thereof; more preferably a group selected from the group consisting of a chain saturated hydrocarbon group, a cyclic saturated hydrocarbon group, an aromatic group, an ester bond, an ether bond and an amide bond, or a group formed by combining two or more thereof; and still more preferably a group selected from the group consisting of a chain saturated hydrocarbon group, an ester bond, an ether bond and an amide bond, or a group formed by combining two or more thereof.

In formula (2), $R^3$ represents an (m+n)-valent linking group, and m+n satisfies the range of 3 to 10.

The (m+n)-valent linking group represented by $R^3$ may be unsubstituted or may further have a substituent. The same as those recited as the (m+n)-valent linking group represented by $R^1$ in formula (1) are used, and the preferred embodiment is also the same.

In formula (2), m and n have the same meanings as m and n in formula (1), respectively, and the preferred embodiments are also the same.

In formula (2), $P^2$ has the same meaning as $P^1$ in formula (1), and the preferred embodiment is also the same. m number of $P^2$ may be the same or different.

Among the polymer compounds represented by formula (2), a compound satisfying all of the following $R^3$, $R^4$, $R^5$, $P^2$, m and n is most preferred.

$R^3$: Specific Example (1), (2), (10), (11), (16) or (17)

$R^4$: A single bond, a group selected from the group consisting of a chain saturated hydrocarbon group, a cyclic saturated hydrocarbon group, an aromatic group, an ester bond, an amide bond, an ether bond, a nitrogen atom and a carbonyl group, or a group formed by combining two or more thereof.

$R^5$: A single bond, an ethylene group, a propylene group, the following group (a) or the following group (b)

In the following groups, $R^{12}$ represents a hydrogen atom or a methyl group, and 1 represents 1 or 2.

[Chem. 14]

(a)

(b)

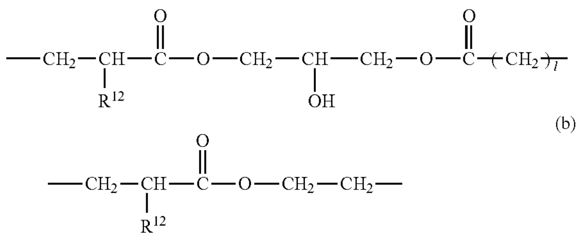

$P^2$: A polymer or copolymer of a vinyl monomer, an ester-based polymer, an ether-based polymer, a urethane-based polymer, or a modification product thereof m: From 1 to 3 n: From 3 to 6

Among the polymer compounds (B) represented by formula (1) or (2), in view of dispersion stability, coated surface state, etc. a polymer compound represented by the following formula (5) is more preferred:

[Chem. 15]

(5)

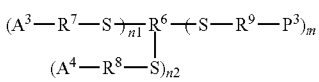

In formula (5), $R^6$ represents an (m+n1+n2)-valent linking group, each of $R^7$ to $R^9$ independently represents a single bond or a divalent linking group, $A^3$ represents a monovalent substituent having at least one acid group, $A^4$ represents a monovalent substituent different from $A^3$, n1 number of $A^3$ or $R^7$ may be the same or different from each other, n2 number of $A^4$ or $R^8$ may be the same or different from each other, m has the same meaning as m in formula (1), the preferred embodiment is also the same, n1 represents from 1 to 8, n2 represents from 1 to 8, m+n1+n2 satisfies the range of 3 to 10, $P^3$ has the same meaning as $P^2$ in formula (2), the preferred embodiment is also the same, and m number of $P^3$ or $R^9$ may be the same or different from each other.

As for the (m+n1+n2)-valent linking group of $R^6$, the same as those recited as the (m+n)-valent linking group represented by $R^1$ in formula (1) or $R^3$ in formula (2) are used, and the preferred embodiment is also the same.

As for the divalent linking group of $R^7$ to $R^9$, the same as those recited as the divalent linking group represented by $R^4$ and $R^5$ in formula (2) are used, and the preferred embodiment is also the same.

Specific examples and preferred examples of the acid group that may be contained in the substituent $A^3$ are the same as specific examples and preferred examples described above with regard to the acid group in formula (1).

The substituent $A^3$ is preferably a monovalent substituent having at least one acid group with a pKa of less than 5, more preferably a monovalent substituent having at least one group selected from the group consisting of a carboxylic acid group, a sulfonic acid group, a phosphoric acid group, a phosphonic acid group and a phosphinic acid group, and most preferably a carboxylic acid group.

Specific examples and preferred examples of the monovalent substituent $A^4$ different from $A^3$ include the same groups except for an acid group out of specific examples and preferred examples described above with regard to $A^1$ in formula (1). Among others, the substituent $A^4$ is preferably a monovalent substituent having at least one functional group with a pKa of 5 or more, more preferably a monovalent substituent having at least one group selected from the group consisting of a coordinating oxygen atom-containing group, a basic nitrogen atom-containing group, a phenol group, a urea group, a urethane group, an alkyl group, an aryl group, an alkyloxycarbonyl group, an alkylaminocarbonyl group, an alkyleneoxy chain-containing group, an imide group, a carboxylate group, a sulfonamide group, a hydroxyl group and a heterocyclic group, still more preferably an alkyl group, an aryl group, a coordinating oxygen atom-containing group, a basic nitrogen atom-containing group, a urea group or a urethane group.

With regard to the combination of the substituent $A^3$ and the substituent $A^4$, it is preferred that the substituent $A^3$ is a monovalent substituent having at least one functional group with a pKa of less than 5 and the substituent $A^4$ is a monovalent substituent having at least one functional group with a pKa of 5 or more.

It is more preferred that the substituent $A^3$ is a monovalent substituent having at least one group selected from the group consisting of a carboxylic acid group, a sulfonic acid group, a phosphoric acid group, a phosphoric acid group and a phosphinic acid group and the substituent $A^4$ is a monovalent substituent having at least one group selected from the group consisting of a coordinating oxygen atom-containing group, a basic nitrogen atom-containing group, a phenol group, a urea group, a urethane group, an alkyl group, an aryl group, an alkyloxycarbonyl group, an alkylaminocarbonyl group, an alkyleneoxy chain-containing group, an imide group, a carboxylate group, a sulfonamide group, a hydroxyl group and a heterocyclic group.

It is still more preferred that the substituent $A^3$ is a monovalent substituent having a carboxylic acid group and the substituent $A^4$ is an alkyl group, an aryl group, a coordinating oxygen atom-containing group, a basic nitrogen atom-containing group, a urea group or a urethane group.

From the standpoint that the adsorption between the later-described metal oxide particle (A) (among others, a titanium dioxide particle) and an alkyl group of the substituent $A^3$ is good, it is yet still more preferred that the substituent $A^3$ is a carboxylic acid group and the substituent $A^4$ is an alkyl group.

The adsorption between a titanium dioxide particle and an alkyl group of the substituent $A^4$ is presumed to be good because, for example, in the case where the titanium dioxide particle is surface-treated with a steric acid, an alkyl group of the stearic acid interacts with an alkyl group of the substituent $A^4$.

The acid value of the polymer compound (B) is not particularly limited, but in view of viscosity or dispersibility, the acid value is preferably 400 mgKOH/g or less, more preferably 300 mgKOH/g or less, still more preferably 250 mgKOH/g or less.

The lower limit of the acid value is not particularly limited but in view of dispersion stability of the metal oxide particle, is preferably 5 mgKOH/g or more, more preferably 10 mgKOH/g or more.

Above all, the acid value of the polymer compound (B) is preferably from 70 to 90 mgKOH/g, because, as described later, when a cured film is formed, the visible light transmittance of the cured film is particularly excellent.

Here, the acid value of the polymer compound (B) is a solid content acid value of the polymer compound (B).

In the present invention, the acid value of the polymer compound (B) can be calculated, for example, from the average acid group content in the polymer compound (B). The acid value of the polymer compound (B) can be adjusted by appropriately controlling the amount of an acid group in the polymer compound (B) and the amount of the above-described functional group with a pKa of 5 or more. For example, at the time of synthesis of the polymer compound (B), the charge amount of a compound having an acid group and a carbon-carbon double bond, the charge amount of a compound having a functional group with a pKa of 5 or more and a carbon-carbon double bond, and the charge amount of a vinyl monomer having an acid group are appropriately controlled, whereby a polymer compound (B) having a desired acid value can be synthesized.

(Synthesis Method of Polymer Compound (B))

Although not particularly limited, the polymer compound represented by formula (1) or (2) can be synthesized according to the synthesis method described in JPA-2007-277514, paragraphs 0114 to 0140 and 0266 to 0348 (in the corresponding U.S. Patent Application Publication No. 2010/233595, paragraphs 0145 to 0173 and 0289 to 0429).

Above all, the polymer compound (B) represented by formula (1) or (2) is preferably synthesized by a method of radical-polymerizing a vinyl monomer in the presence of a mercaptan compound having a plurality of the above-described adsorption moieties As for the vinyl monomer, only one monomer may be polymerized, or two or more monomers may be used in combination and copolymerized.

Specific Examples (M-1) to (M-9) and (M-14) to (M-16) of the vinyl monomer are illustrated below, but the present invention is not limited thereto.

[Chem. 16]

(M-1)

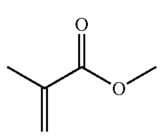

(M-2)

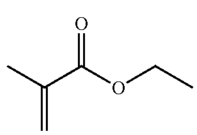

(M-3)

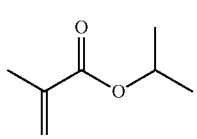

(M-4)

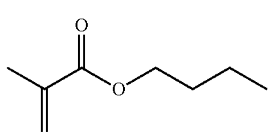

(M-5)

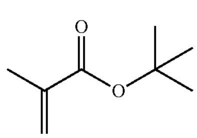

-continued (M-6)

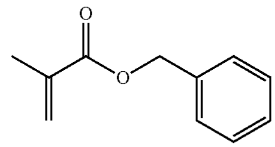

(M-7)

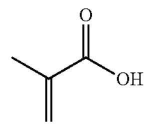

(M-8)

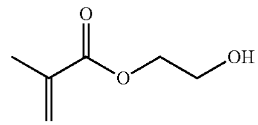

(M-9)

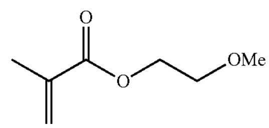

(M-14)

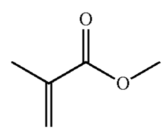

(M-15)

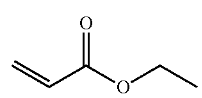

(M-16)

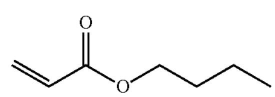

More specifically, the synthesis method of the polymer compound (B) represented by formula (1) or (2) is preferably a method of radical-polymerizing a vinyl monomer in the presence of a compound represented by the following formula (3):

[Chem. 17]

formula (3)

$$(A^3—R^7—S)_n R^6 (SH)_m$$

In formula (3), $R^6$, $R^7$, $A^3$, m and n have the same meanings as $R^3$, $R^4$, $A^2$, m and n in formula (2), respectively, and their preferred embodiments are also the same.

As the synthesis method of the polymer compound (B) represented by formula (1) or (2), a method of allowing the addition of a compound represented by formula (3) and a macromonomer having a carbon-carbon double bond (thiol-ene reaction method) to proceed is also preferred. A radical generator or a base is preferably used as the catalyst for the reaction.

Specific examples of the macromonomer having a carbon-carbon double bond are illustrated below, but the present invention is not limited thereto. In the following specific examples, the repeating unit number k is an integer of 3 to 50.

[Chem. 18]

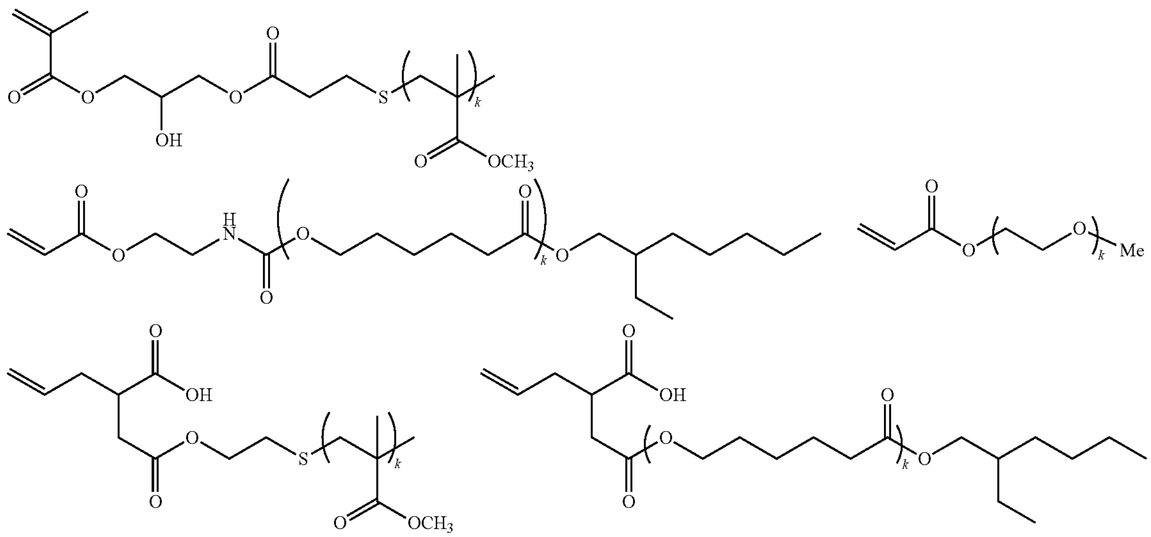

In addition, as the synthesis method of the polymer compound (B) represented by formula (1) or (2), a method of forming a thioester group via a dehydration condensation reaction of a compound represented by formula (3) and a polymer compound having a carboxylic acid group is also preferred.

Specific examples of the polymer compound having a carboxylic acid group are illustrated below, but the present invention is not limited thereto. In the following specific examples, the repeating unit number k is an integer of 3 to 50.

[Chem. 19]

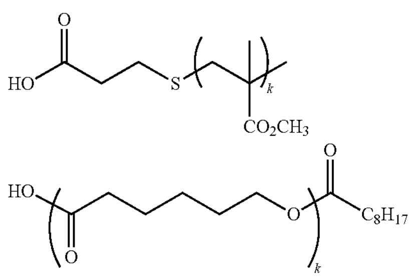

-continued

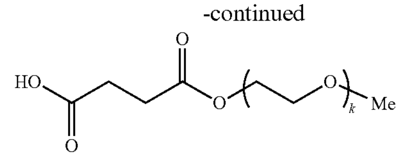

As the synthesis method of the polymer compound (B) represented by formula (1) or (2), a method of forming a thioether group via a nucleophilic substitution reaction of a compound represented by formula (3) and a polymer compound having a leaving group is also preferred. The leaving group is preferably a halogen such as iodine, bromine and chlorine, or a sulfonic acid ester such as tosylate, mesylate or trifluoromethanesulfonate.

Specific examples of the polymer compound having a leaving group are illustrated below, but the present invention is not limited thereto. In the following specific examples, the repeating unit number k is an integer of 3 to 50.

[Chem. 20]

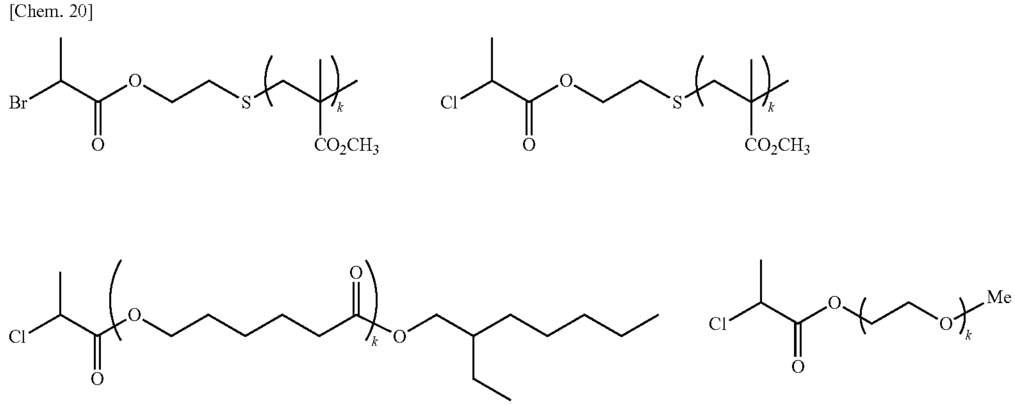

-continued

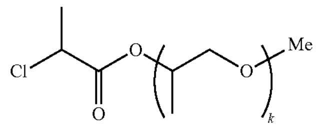

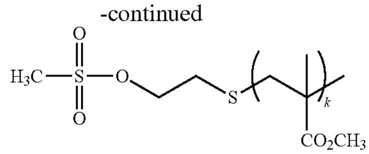

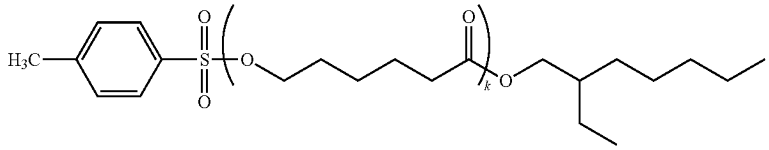

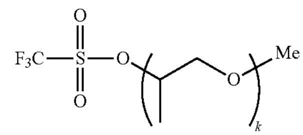

The compound represented by formula (3) is preferably synthesized by the following method:

a method of addition-reacting a compound having from 3 to 10 mercapto groups per molecule and a compound having the above-described adsorption moiety and having a carbon-carbon double bond capable of reacting with a mercapto group.

In particular, the addition reaction is preferably a radical addition reaction. In view of reactivity with a mercapto group, the carbon-carbon double bond is preferably a mono-substituted or disubstituted vinyl group.

Specific examples of the compound having from 3 to 10 mercapto groups per molecule include the following compounds [Specific Examples (18) to (34)].

[Chem. 21]

(18)

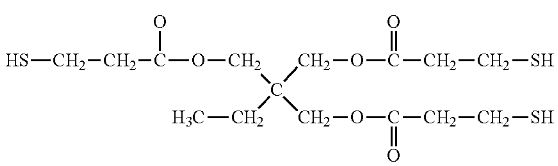

(19)

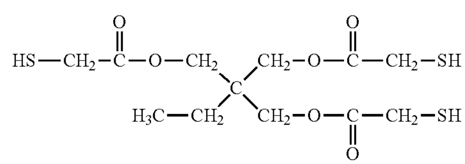

(20)

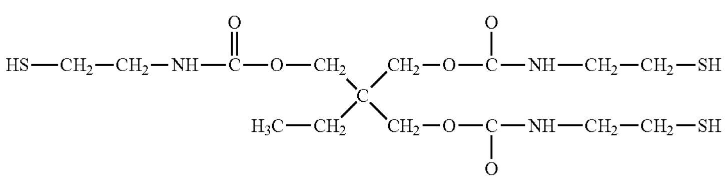

(21)

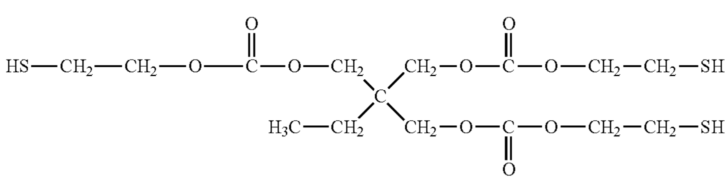

(22)

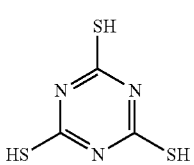

(23)

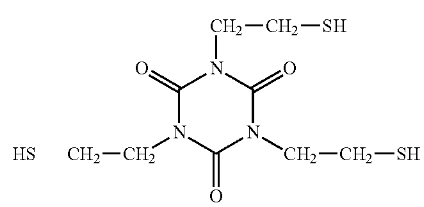

(24)

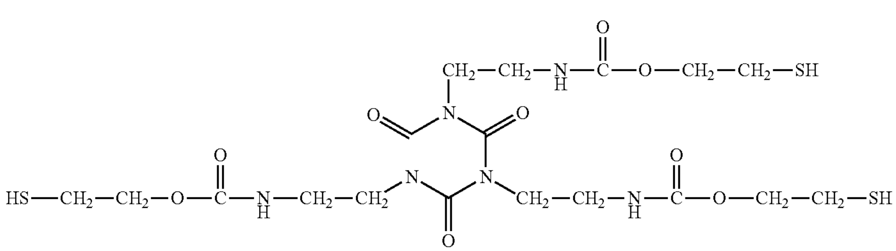

-continued
(25)
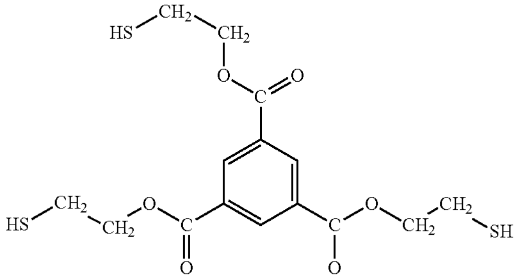
(26)
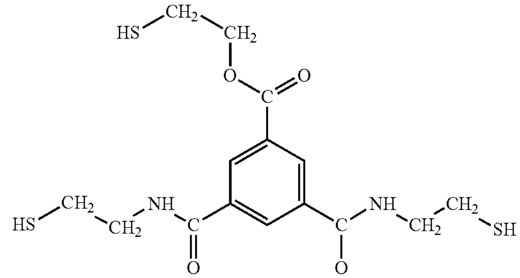
[Chem. 22]
27
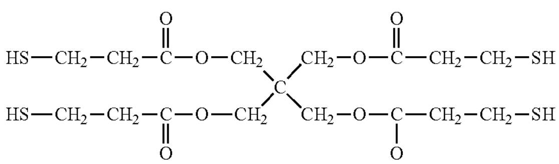
28
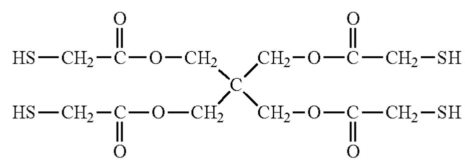
29
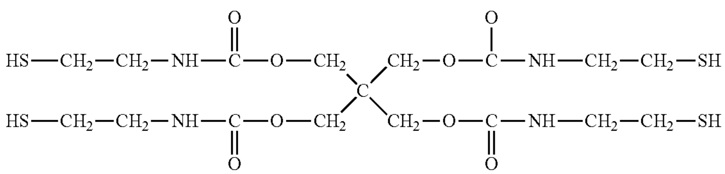
30
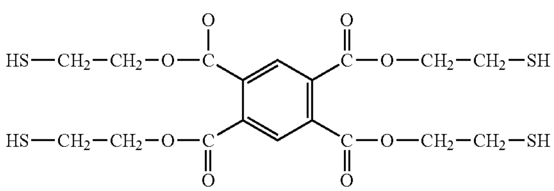
31
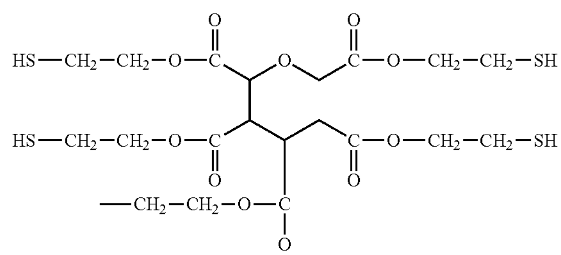
32
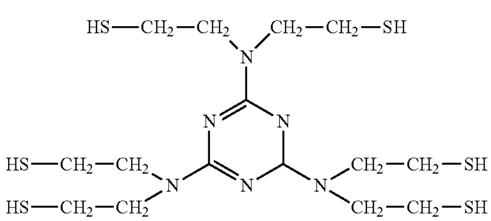
33
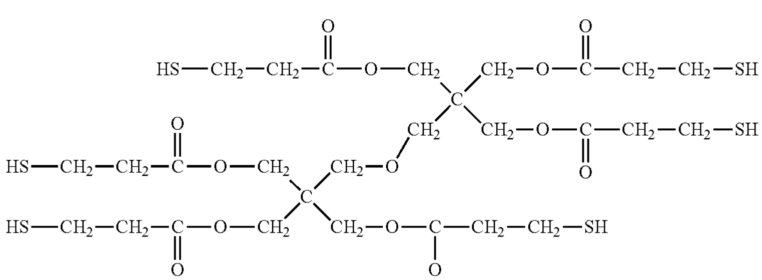

-continued
34
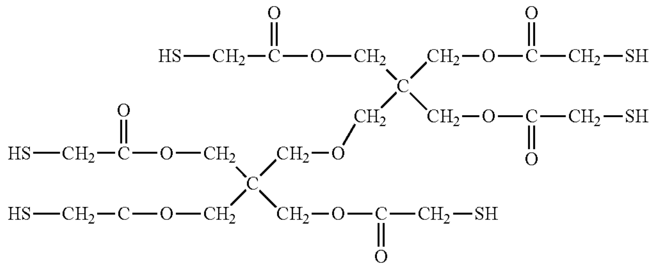
Among these, in view of availability of the raw material and ease of synthesis as well as solubility in various solvents, preferable compounds are the following compounds.
[Chem. 23]
(18)
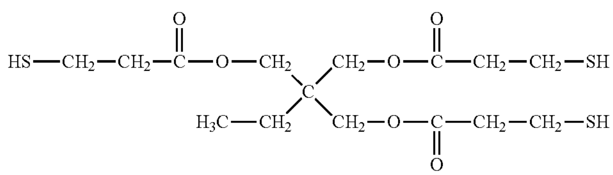
(19)
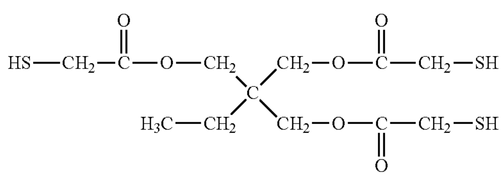
(27)
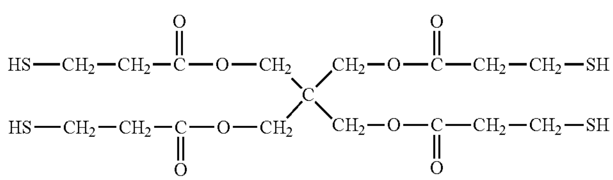
(28)
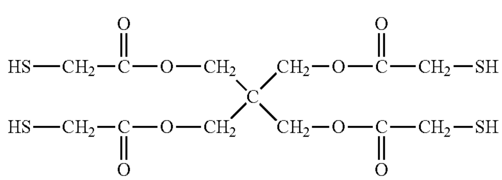
(33)
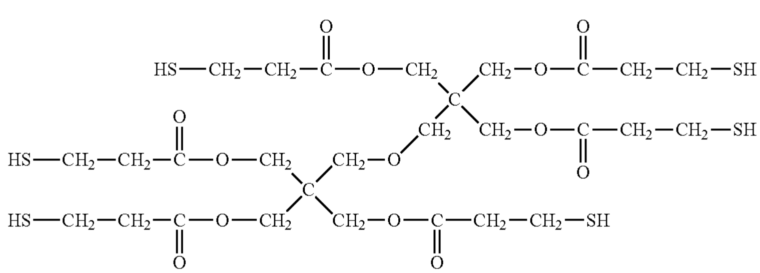

-continued

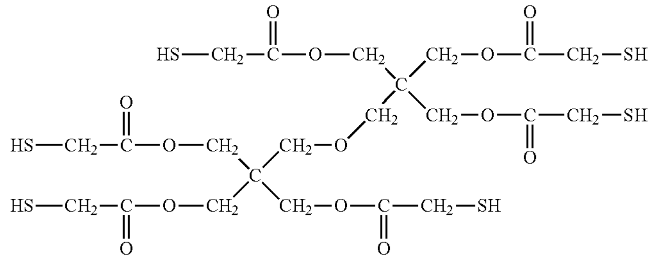

(34)

The above-described compounds are available as a commercial product (for example, (33) is dipentaerythritol hexakis(3-mercaptopropionate: produced by Sakai Chemical Industry Co., Ltd.).

The compound having the above-described adsorption moiety and having a carbon-carbon double bond (specifically, a compound having at least one member selected from the group consisting of an acid group, a urea group, a urethane group, a coordinating oxygen atom-containing group, a basic nitrogen atom-containing group, a phenol group, an alkyl group, an aryl group, an alkyleneoxy chain-containing group, an imide group, an alkyloxycarbonyl group, an alkylaminocarbonyl group, a carboxylate group, a sulfonamide group, a heterocyclic group, an alkoxysilyl group, an epoxy group, an isocyanate group and a hydroxyl group, and having a carbon-carbon double bond) is not particularly limited but includes the followings:

[Chem. 24]

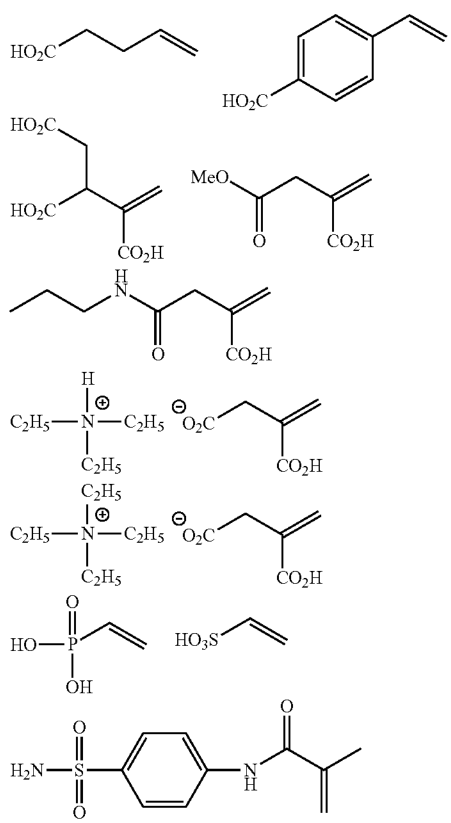

-continued

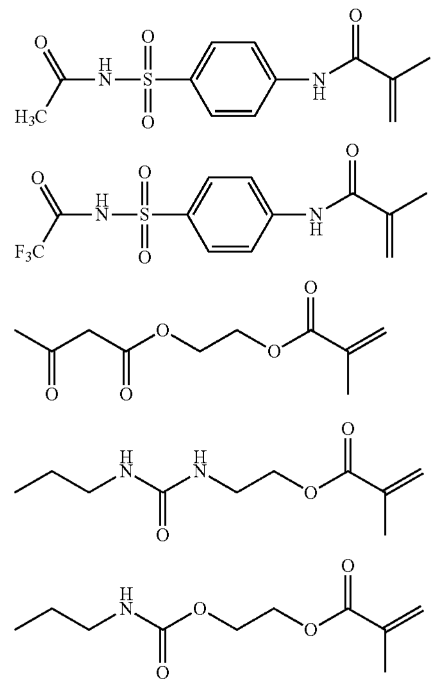

[Chem. 25]

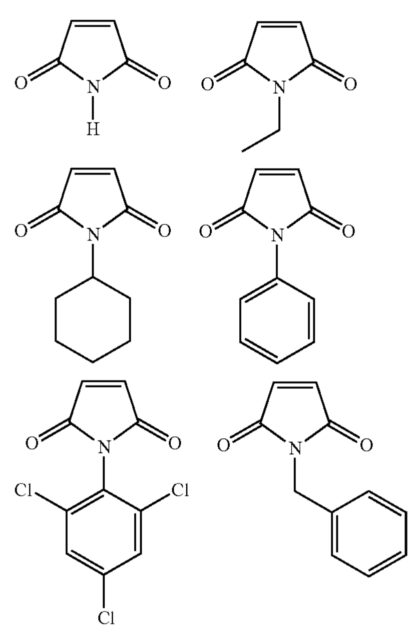

-continued
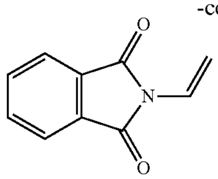
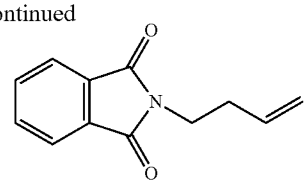
[Chem. 26]
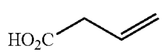
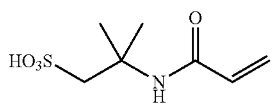
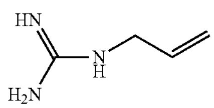
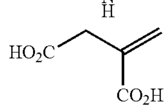
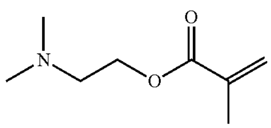
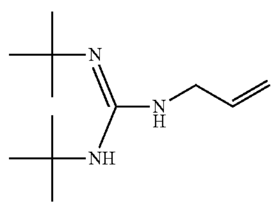
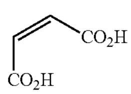
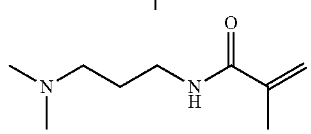
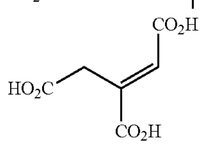
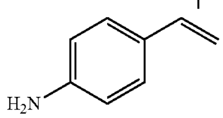
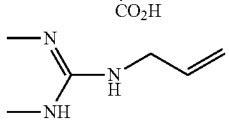
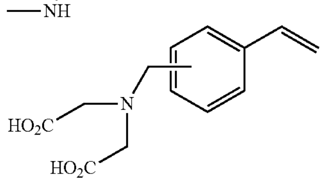
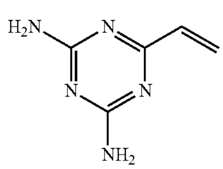
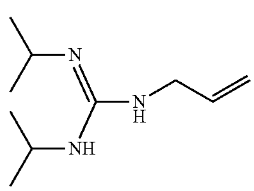
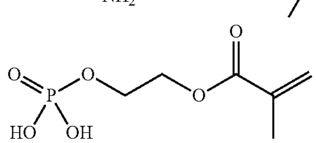
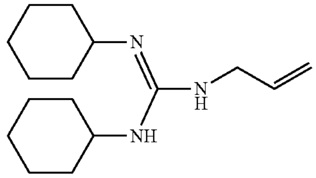
[Chem. 27]
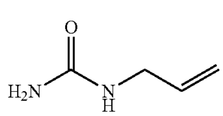
-continued
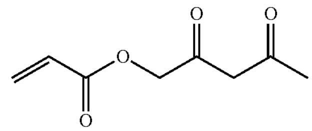
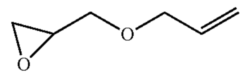
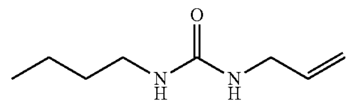
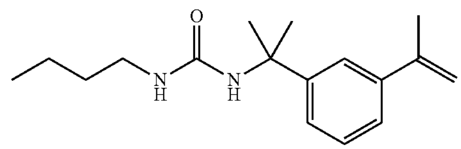
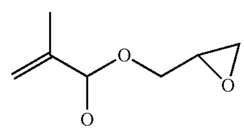
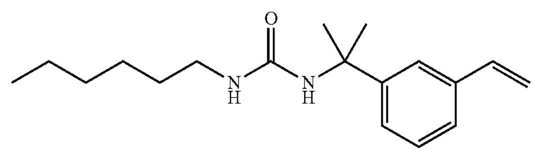
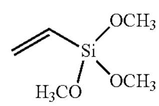
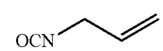
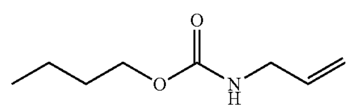
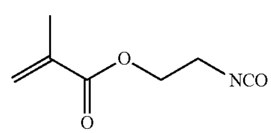
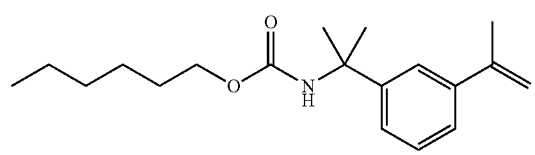
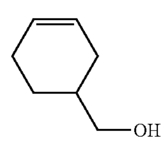
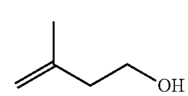
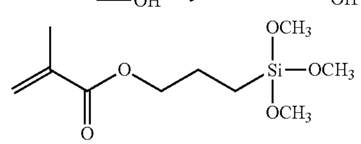
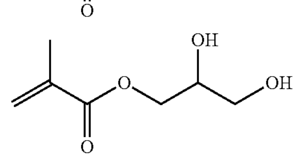

-continued

[Chem. 28]

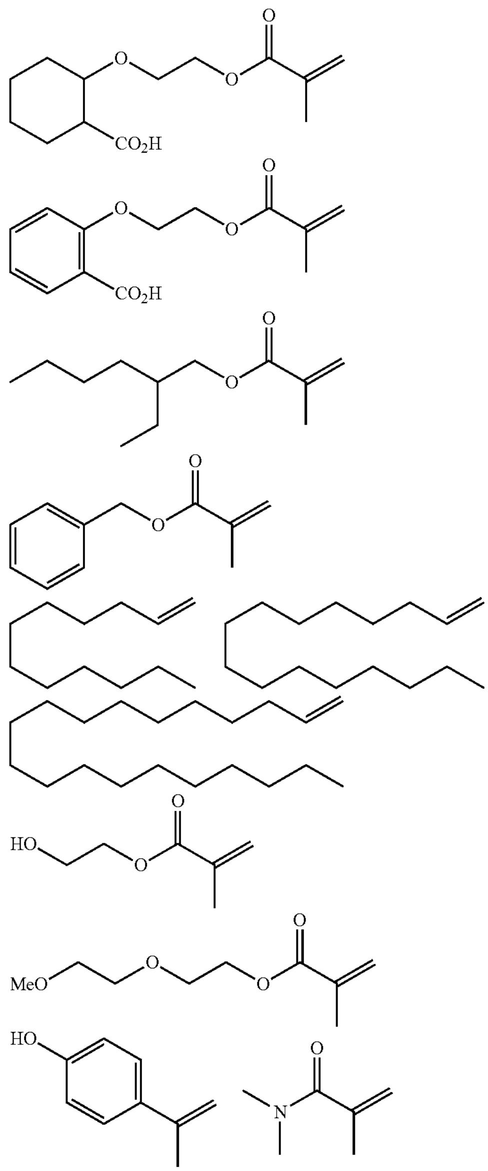

The radical addition reaction product of "a compound having from 3 to 10 mercapto groups per molecule" and "a compound having the above-described adsorption moiety and having a carbon-carbon double bond" is obtained, for example, by utilizing a method of dissolving the "compound having from 3 to 10 mercapto groups per molecule" and the "compound having the above-described adsorption moiety and having a carbon-carbon double bond" in an appropriate solvent, adding a radical generator thereto, and allowing the addition to proceed at about 50 to 100° C. (thiol-ene reaction method).

The suitable solvent used in the thiol-ene reaction method may be arbitrarily selected, for example, according to the solubility of the "compound having from 3 to 10 mercapto groups per molecule" and "compound having the above-described adsorption moiety and having a carbon-carbon double bond" used and the solubility of the "radical addition reaction product produced".

Examples thereof include methanol, ethanol, propanol, isopropanol, 1-methoxy-2-propanol, 2-ethyl hexanol, 1-methoxy-2-propyl acetate, acetone, methyl ethyl ketone, methyl isobutyl ketone, methoxypropyl acetate, ethyl lactate, ethyl acetate, acetonitrile, tetrahydrofuran, dimethylformamide, chloroform, and toluene. Two or more of these solvents may be mixed and used.

As the radical generator, for example, an azo compound such as 2,2'-azobis(isobutyronitrile) (AIBN), 2,2'-azobis-(2,4'-dimethylvaleronitrile) and dimethyl 2,2'-azobisisobutyrate [V-601, produced by Wako Pure Chemical Industries, Ltd.], a peroxide such as benzoyl peroxide, and a persulfate such as potassium persulfate and ammonium persulfate, may be used.

The polymer compound of the present invention is preferably a compound obtained using such a vinyl monomer and a compound represented by formula (3) by performing the polymerization by a known method in a conventional manner. Here, the compound represented by formula (3) for use in the present invention functions as a chain transfer agent and, hereinafter, is sometimes simply referred to as "chain transfer agent".

For example, the polymer compound is obtained by utilizing a method of dissolving such a vinyl monomer and the chain transfer agent in an appropriate solvent, adding a radical polymerization initiator thereto, and performing the polymerization at about 50 to 220° C. in the solution (solution polymerization method).

The suitable solvent used in the solution polymerization method may be arbitrarily selected, for example, according to the solubility of the monomer used and the copolymer produced. Examples thereof include methanol, ethanol, propanol, isopropanol, 1-methoxy-2-propanol, 2-ethylhexanol, 1-methoxy-2-propyl acetate, acetone, methyl ethyl ketone, methyl isobutyl ketone, methoxypropyl acetate, ethyl lactate, ethyl acetate, acetonitrile, tetrahydrofuran, dimethylformamide, chloroform, and toluene. Two or more of these solvents may be mixed and used.

As the radical polymerization initiator, for example, an azo compound such as 2,2'-azobis(isobutyronitrile) (AIBN), 2,2'-azobis-(2,4'-dimethylvaleronitrile) and dimethyl 2,2'-azobisisobutyrate [V-601, produced by Wako Pure Chemical Industries, Ltd.], a peroxide such as benzoyl peroxide, and a persulfate such as potassium persulfate and ammonium persulfate, may be used.

In the dispersion composition of the present invention, as the polymer compound (B), one compound may be used alone, or two or more compounds may be used in combination.

The content of the polymer compound (B) based on the total solid content of the dispersion composition (or the later-described curable composition) of the present invention is, in view of dispersibility, high refractive index and coated surface state, preferably from 5 to 40 mass %, more preferably from 10 to 35 mass %, still more preferably from 12 to 30 mass %.

—Other Dispersion Resin—

The dispersion composition of the present invention may contain a dispersion resin (hereinafter, sometimes referred to as "other dispersion resin") other than the above-described specific resin, for the purpose of, for example, adjusting the dispersibility of the metal oxide particle.

The other dispersion resin that can be used in the present invention includes a polymeric dispersant [for example, a polyamideamine or a salt thereof, a polycarboxylic acid or a salt thereof, a high-molecular-weight unsaturated acid ester, a modified polyurethane, a modified polyester, a modified poly(meth)acrylate, a (meth)acrylic copolymer, and a naphthalenesulfonic acid-formalin condensate], a polyoxyethylene alkylphosphoric acid ester, a polyoxyethylene alkylamine, an alkanolamine, a pigment derivative, etc.

The other dispersion resin may be further classified by its structure into a linear polymer, a terminal-modified polymer, a graft-type polymer, and a block-type polymer.

The other dispersion resin adsorbs to the surface of the metal oxide particle and acts to prevent re-aggregation. Therefore, preferred structures include a terminal-modified polymer, a graft-type polymer and a block-type polymer, each having an anchoring site to the metal oxide particle surface.

Meanwhile, the other dispersion resin has an effect of promoting the adsorption of the dispersion resin by modifying the metal oxide particle surface.

Specific examples of the other dispersion resin include "DISPERBYK-101 (polyamidoamine phosphate), 107 (carboxylic acid ester), 110, 180 (acid group-containing copolymers), 130 (polyamide), 161, 162, 163, 164, 165, 166, 170 (high molecular copolymers)", "BYK-P104, P105 (high-molecular-weight unsaturated polycarboxylic acids)" all produced by BYK Chemie; "EFKA 4047, 4050, 4010, 4165 (polyurethane type), EFKA 4330, 4340 (block copolymers), 4400, 4402 (modified polyacrylates), 5010 (polyester amide), 5765 (high-molecular-weight polycarboxylate), 6220 (fatty acid polyester), 6745 (phthalocyanine derivative), 6750 (azo pigment derivative)" all produced by EFKA; "AJISPER PB821, PB822" produced by Ajinomoto Fine Techno Co., Inc.; "FLOWLEN TG-710 (urethane oligomer)", "POLYFLOW No. 50E, No. 300 (acrylic copolymers)" all produced by Kyoeisha Chemical Co., Ltd.; "DISPARLON KS-860, 873SN, 874, #2150 (aliphatic polyvalent carboxylic acids), #7004 (polyether ester), DA-703-50, DA-705, DA-725" all produced by Kusumoto Chemicals, Ltd.; "DEMOL RN, N (naphthalenesulfonic acid-formalin polycondensates), MS, C, SN-B (aromatic sulfonic acid-formalin polycondensates)", "HOMOGENOL L-18 (high molecular polycarboxylic acid)", "EMULGEN 920, 930, 935, 985 (polyoxyethylene nonylphenyl ethers)", "ACETAMIN 86 (stearylamine acetate)" all produced by Kao Corporation; "SOLSPERSE 5000 (phthalocyanine derivative) 22000 (azo pigment derivative), 13240 (polyester amine), 3000, 17000, 27000 (polymers having a functional moiety at a terminal), 24000, 28000, 32000, 38500 (graft-type polymers)" all produced by Lubrizol Corporation; and "NIKKOL T106 (polyoxyethylene sorbitan monooleate), MYS-IEX (polyoxyethylene monostearate)" both produced by Nikko Chemicals Co., Ltd.

In addition, the other dispersion resin includes polymers obtained by polymerization, using as an essential monomer component, a compound represented by formula (ED) (sometimes referred to as an ether dimer) in JP-A-2012-208494, paragraph 0562 (in the corresponding U.S. Patent Application Publication No. 2012/235099, [0692]) et seq., the contents of which are incorporated in the description of the present invention.

With regard to specific examples of the ether dimer, the description of the ether dimer in JP-A-2012-208494, paragraph 0565 (in the corresponding U.S. Patent Application Publication No. 2012/235099, [0694]), may be taken into consideration, the contents of which are incorporated in the description of the present invention.

Specific examples of the polymer obtained by polymerization using a compound represented by formula (ED) as an essential monomer component are the same as specific examples of the polymer described later in the paragraph of binder polymer, which is obtained by polymerization using a compound represented by formula (ED) as an essential monomer component.

One of these other resins may be used alone, or two or more thereof may be used in combination.

The dispersion composition (or the later-described curable composition) of the present invention may or may not contain the other dispersion resin, but in the case of containing the other dispersion resin, the content thereof is preferably from 1 to 20 mass %, more preferably from 1 to 10 mass %, based on the total solid content of the dispersion composition (or the later-described curable composition) of the present invention.

<(C) Solvent>

The dispersion composition of the present invention contains a solvent, and the solvent may be composed using various organic solvents.

The organic solvent that can be used here includes acetone, methyl ethyl ketone, cyclohexane, ethyl acetate, ethylene dichloride, tetrahydrofuran, toluene, ethylene glycol monomethyl ether, ethylene glycol mono ethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate.

These organic solvents may be used individually or as a mixture. The solid content concentration in the dispersion composition of the present invention is preferably from 2 to 60 mass %.

The production method of the dispersion composition of the present invention is not particularly limited, and a production method commonly employed for a dispersion composition may be applied. For example, the dispersion composition can be produced by mixing the metal oxide particle (A), the polymer compound (B) and the solvent (C) and subjecting the mixture to a dispersion treatment using a circulation-type disperser (bead mill), etc.

Incidentally, the present invention also relates to the production method of the dispersion composition above, as well as relates to the production method of the below-described curable composition.

<Curable Composition>

The curable composition of the present invention is preferably a curable composition composed by containing the above-described dispersion composition of the present invention and (D) a polymerizable compound and, if desired, containing other components.

A curable composition is made up of the above-described dispersion composition, whereby a cured film (transparent film) having a high refractive index can be formed.

The present invention also relates to a transparent film formed using the curable composition of the present invention.

The refractive index of the cured film obtained from the curable composition (a film obtained by forming a film from the curable composition and subjecting the film to a curing reaction) is preferably from 1.85 to 2.60, more preferably from 1.90 to 2.60.

The physical property that the refractive index of the cured film is from 1.85 to 2.60 may be suitably achieved by containing the polymer compound (B) in the curable composition of the present invention and may be achieved by further using any means but can be more unfailingly achieved as well, for example, by adjusting the kind and content of the polymerizable compound (D) or the binder polymer that may be further added, or by not only containing the metal oxide particle (A) in the curable composition but also adjusting the kind and content of the metal oxide particle.

Above all, the physical property above can be preferably achieved by using the above-described preferred examples of the metal oxide particle.

The composition of the present invention is preferably a transparent composition and more specifically, a composition ensuring that when a cured film having a thickness of 1.0 μm is formed from the composition, the light transmittance in the thickness direction of the cured film is 90% or more over the entirety of the wavelength region of 400 to 700 nm.

That is, the transparent film of the present invention indicates a film where with a film thickness of 1.0 μm, the light transmittance in the thickness direction of the film is 90% or more over the entirety of the wavelength region of 400 to 700 nm.

Such a light transmittance may be achieved by any means as long as the curable composition contains the dispersion composition of the present invention and (D) a polymerizable compound, but this physical property is suitably achieved, for example, by adjusting the kind and content of the polymerizable compound (D) or the binder polymer that may be further added. In addition, the above-described physical property regarding light transmittance may also be suitably achieved by adjusting the particle diameter of the metal oxide particle (A) and the kind and amount added of the polymer compound (B).

Above all, it is preferred that the weight average molecular weight of the polymer compound (B) is from 5,000 to 8,000 and the acid value thereof is from 70 to 90 mgKOH/g, because when a cured film is formed, the light transmittance of the cured film is particularly excellent.

A large metal oxide particle content sometimes gives rise to a problem in the transparency of the cured film, but in the present invention, a cured film with excellent transparency can be obtained by using such a polymer compound (B).

As regards the curable composition and transparent film of the present invention, the property that the light transmittance is 90% or more over the entirety of the wavelength region of 400 to 700 nm is an important factor for, among others, a microlens or an undercoat film of a color filter to exert its required characteristics.

The light transmittance is, over the entirety of the wavelength region of 400 to 700 nm, preferably 95% or more, more preferably 99% or more, and most preferably 100%.

From this aspect, the curable composition of the present invention contains substantially no coloring agent (the content of the coloring agent is preferably 0 mass % based on the total solid content of the composition).

(D) Polymerizable Compound

In the present invention, from the perspective of solvent resistance of the cured film (transparent film) at the time of production of a microlens or production of a solid-state imaging device, a "compound having two or more epoxy groups or oxetanyl groups in the molecule" is preferably used as the polymerizable compound (D).

—Compound Having Two or More Epoxy Groups (Oxiranyl Groups) or Oxetanyl Groups in the Molecule—Specific examples of the compound having two or more epoxy groups in the molecule, as the polymerizable compound (D), include a bisphenol A-type epoxy resin, a bisphenol F-type epoxy resin, a phenol novolak-type epoxy resin, a cresol novolak-type epoxy resin, and an aliphatic epoxy resin.

These are available as a commercial product. For example, the bisphenol A-type epoxy resin includes JER-827, JER-828, JER-834, JER-1001, JER-1002, JER-1003, JER-1055, JER-1007 JER-1009, JER-1010 (all produced by Mitsubishi Chemical Corp.), EPICLON 860, EPICLON 1050, EPICLON 1051, EPICLON 1055 (all produced by DIC Corp.), etc.; the bisphenol F-type epoxy resin includes JER-806, JER-807, JER-4004, JER-4005, JER-4007, JER-4010 (all produced by Mitsubishi Chemical Corp.), EPICLON 830, EPICLON 835 (both produced by DIC Corp.), LCE-21, RE-602S (both produced by Nippon Kayaku Co., Ltd.), etc.; the phenol novolak-type epoxy resin includes JER-152, JER-154, JER-157570, JER-157S65 (all produced by Mitsubishi Chemical Corp.), EPICLON N-740, EPICLON N-740, EPICLON N-770, EPICLON N-775 (all produced by DIC Corp.), etc.; the cresol novolak-type epoxy resin includes EPICLON N-660, EPICLON N-665, EPICLON N-670, EPICLON N-673, EPICLON N-680, EPICLON N-690, EPICLON N-695 (all produced by DIC Corp.), EOCN-1020 (produced by Nippon Kayaku Co., Ltd.), etc.; and the aliphatic epoxy resin includes ADEKA RESIN EP-4080S, ADEKA RESIN EP-4085S, ADEKA RESIN EP-4088S (all produced by ADEKA Corp.), CELLOXIDE 2021P, CELLOXIDE 2081, CELLOXIDE 2083, CELLOXIDE 2085, EHPE-3150, EPOLEAD PB 3600, EPOLEAD PB 4700 (all produced by Daicel Corp.), DENACOL EX-211L, EX-212L, EX-214L, EX-216L, EX-321L, EX-850L (all produced by Nagase ChemteX Corp.), etc. In addition, ADEKA RESIN EP-4000S, ADEKA RESIN EP-4003S, ADEKA RESIN EP-4010S, ADEKA RESIN EP-4011S (all produced by ADEKA Corp.), NC-2000, NC-3000, NC-7300, XD-1000, EPPN-501, EPPN-502 (all produced by ADEKA Corp.), JER-1031S (produced by Mitsubishi Chemical Corp.), etc. are available.

One of these may be used alone, or two or more thereof may be used in combination.

With regard to specific examples of the compound having two or more oxetanyl groups in the molecule, ARON OXETANE OXT-121, OXT-221, OX-SQ and PNOX (all produced by Toagosei Co., Ltd.) may be used.

The compound containing an oxetanyl group is preferably used by itself or as a mixture with a compound containing an epoxy group.

An addition-polymerizable compound having at least one ethylenically unsaturated double bond may also be used as the polymerizable compound (D), and a compound having at least one, preferably two or more, terminal ethylenically unsaturated bonds is preferably used.

In the present invention, the polymerizable compound (D) is more preferably at least one member selected from the group consisting of the above-described compound having two or more epoxy groups or oxetanyl groups in the molecule and a compound having two or more terminal ethylenically unsaturated bonds.

The addition-polymerizable compound having at least one ethylenically unsaturated double bond is widely known in this technical field, and these compounds may be used in the present invention without any particular limitation.

In the case of using such a compound as the polymerizable compound (D), the curable composition of the present invention preferably further contains (E) the later-described polymerization initiator.

The addition-polymerizable compound having at least one ethylenically unsaturated double bond takes a chemical form of, for example, a monomer, a prepolymer (i.e., dimer, trimer or oligomer), or a mixture or copolymer thereof. Examples of the monomer and a copolymer thereof include an unsaturated carboxylic acid (e.g., acrylic acid, methacrylic acid, itaconic acid, crotonic acid, isocrotonic acid, maleic acid), and esters and amides thereof. An ester of an unsaturated carboxylic acid and an aliphatic polyhydric alcohol compound, and amides of an unsaturated carboxylic acid and an aliphatic polyvalent amine compound are preferably used. In addition, for example, an addition reaction product of unsaturated carboxylic acid esters or amides each having a nucleophilic substituent such as hydroxyl group, amino group and mercapto group, with monofunctional or polyfunctional isocyanates or epoxies, and a dehydration condensation reaction product with a monofunctional or polyfunctional carboxylic acid, are also suitably used.

Furthermore, an addition reaction product of an unsaturated carboxylic acid ester or unsaturated carboxylic acid amides, each having an electrophilic substituent such as isocyanate group and epoxy group, with monofunctional or polyfunctional alcohols, amines or thiols; and a substitution reaction product of an unsaturated carboxylic acid ester or unsaturated carboxylic acid amides, each having a leaving substituent such as halogen group and tosyloxy group, with monofunctional or polyfunctional alcohols, amines or thiols, are also suitable.

As another example, it is also possible to use compounds in which the unsaturated carboxylic acid is replaced by an unsaturated phosphonic acid, styrene, vinyl ether, etc.

With regard to specific compounds thereof, the compounds described in JP-A-2009-288705, paragraphs 0095 to 0108, may be suitably used also in the present invention.

As the polymerizable compound (D) (hereinafter, sometimes simply referred to as "polymerizable monomer, etc." or "polymerizable monomer"), an ethylenically unsaturated group-containing compound having at least one addition-polymerizable ethylene group and having a boiling point of 100° C. or more under ordinary pressure is also preferred. Examples thereof include a monofunctional acrylate or methacrylate such as polyethylene glycol mono(meth)acrylate, polypropylene glycol mono(meth)acrylate and phenoxyethyl (meth)acrylate; a polyfunctional acrylate or methacrylate, e.g., polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth) acrylate, trimethylolpropane tri(acryloyloxypropyl)ether, tri (acyloyloxyethyl)isocyanurate, a compound obtained by adding ethylene oxide or propylene oxide to a polyfunctional alcohol such as glycerin or trimethylolethane and (meth)acrylating the adduct, urethane (meth)acrylates described in JP-B-48-41708 (the term "JP-B" as used herein means an "examined Japanese patent publication"), JP-B-50-6034 and JP-A-51-37193, polyester acrylates described in JP-A-48-64183, JP-B-49-43191 and JP-B-52-30490, and epoxy acrylates as a reaction product of an epoxy polymer and a (meth)acrylic acid; and a mixture thereof.

Other examples include a polyfunctional (meth)acrylate obtained by reacting a polyfunctional carboxylic acid with a compound having a cyclic ether group and an ethylenically unsaturated group, such as glycidyl (meth)acrylate.

As other preferred polymerizable monomers, etc., compounds having a fluorene ring and a bi- or higher functional ethylenically unsaturated group, described, for example, in JP-A-2010-160418, JP-A-2010-129825 and Japanese Patent No. 4364216, and a cardo polymer may also be used.

As the compound having a boiling point of 100° C. or more under ordinary pressure and having at least one addition-polymerizable ethylenically unsaturated group, the compounds described in JP-A-2008-292970, paragraphs [0254] to [0257] are also suitable.

In addition, a compound obtained by adding ethylene oxide or propylene oxide to the above-described polyfunctional alcohol and then (meth)acrylating the adduct, described as formulae (1) and (2) together with their specific examples in JP-A-10-62986, may also be used as the polymerizable monomer.

Furthermore, it is also preferred that the polymerizable monomer for use in the present invention is a polymerizable monomer represented by formulae (MO-1) to (MO-6) described in JP-A-2012-215806, paragraphs 0297 to 0300.

With regard to specific examples of the radical polymerizable monomers represented by formulae (MO-1) to (MO-6), the compounds described in JP-A-2007-269779, paragraphs 0248 to 0251, may be suitably used also in the present invention.

Among others, dipentaerythritol triacrylate (as a commercial product, KAYARAD D-330, produced by Nippon Kayaku Co., Ltd.), dipentaerythritol tetraacrylate (as a commercial product, KAYARAD D-320, produced by Nippon Kayaku Co., Ltd.), dipentaerythritol penta(meth)acrylate (as a commercial product, KAYARAD D-310, produced by Nippon Kayaku Co., Ltd.), dipentaerythritol hexa(meth) acrylate (as a commercial product, KAYARAD DPHA, produced by Nippon Kayaku Co., Ltd.), a structure having such a (meth)acryloyl group through an ethylene glycol or propylene glycol residue, and a glycerin EO (ethylene oxide)-modified (meth)acrylate (as a commercial product, M-460, produced by Toagosei Co., Ltd.) are preferred. An oligomer type thereof may also be used.

Examples thereof include RP-1040 (produced by Nippon Kayaku Co., Ltd.).

The polymerizable monomer, etc. may be a polyfunctional monomer and may have an acid group such as carboxyl group, sulfonic acid group and phosphoric acid group. Accordingly, when an ethylenic compound has an unreacted carboxyl group as in the case of the above-described mixture, the compound may be used as it is, but, if desired, an acid group may be introduced by reacting a non-aromatic carboxylic anhydride with a hydroxyl group of the ethylenic compound above. In this case, specific examples of the non-aromatic carboxylic anhydride include tetrahydrophthalic anhydride, an alkylated tetrahydrophthalic anhydride, hexahydrophthalic anhydride, an alkylated hexahydrophthalic anhydride, succinic anhydride, and maleic anhydride.

In the present invention, the acid group-containing monomer is preferably a polyfunctional monomer which is an ester of an aliphatic polyhydroxy compound and an unsaturated carboxylic acid and in which an acid group is introduced by reacting a non-aromatic carboxylic anhydride with an unreacted hydroxyl group of the aliphatic polyhydroxy compound; more preferably a monomer where in the ester above, the aliphatic polyhydroxy compound is pentaerythritol and/or dipentaerythritol. The commercial product thereof includes, for example, Aronix Series of M-305, M-510 and M-520, which are polybasic acid-modified acryl oligomers, produced by Toagosci Co., Ltd.

The acid value of the polyfunctional monomer having an acid group is preferably from 0.1 to 40 mg-KOH/g, more preferably from 5 to 30 mg-KOH/g. In the case where two or more polyfunctional monomers differing in the acid group are used in combination or where a polyfunctional monomer having no acid group is used in combination, the monomers must be prepared such that the acid value as the entire polyfunctional monomer falls in the range above.

As the polymerizable monomer, etc., polyfunctional monomers having a caprolactone-modified structure described in JP-A-2012-215806, paragraphs 0306 to 0313, may also be used.

The polyfunctional monomer having a caprolactone-modified structure is available on the market, for example, as KAYARAD DPCA series from Nippon Kayaku Co., Ltd. and includes DPCA-20, DPCA-30, DPCA-60, DPCA-120, etc.

In the present invention, as for the polyfunctional monomer having a caprolactone-modified structure, one monomer may be used alone, or two or more monomers may be mixed and used.

As the polymerizable monomer, etc. for use in the present invention, the compounds represented by formula (Z-4) or (Z-5) described in JP-A-2012-215806, paragraphs 0314 to 0324, may also be used.

The commercial product of the polymerizable monomer, etc. represented by formulae (Z-4) and (Z-5) includes, for example, SR-494 as a tetrafunctional acrylate having four ethyleneoxy chains produced by Sartomer Company; and DPCA-60 as a hexafunctional acrylate having six pentyleneoxy chains, and TPA-330 as a trifunctional acrylate having three isobutyleneoxy chains, both produced by Nippon Kayaku Co., Ltd.

In addition, urethane acrylates described in JP-B-48-41708, JP-A-51-37193, JP-B-2-32293 and JP-B-2-16765, and urethane compounds having an ethylene oxide-based skeleton described in JP-B-58-49860, JP-B-56-17654, JP-B-62-39417 and JP-B-62-39418 are also suitable as the polymerizable compound, etc. Furthermore, a curable composition very excellent in the photosensitive speed can be obtained by using, as the polymerizable compound, etc., addition-polymerizable monomers having an amino structure or sulfide structure in the molecule described in JP-A-63-277653, JP-A-63-260909 and JP-A-1-105238.

The commercial product of the polymerizable monomer, etc. includes, for example, urethane oligomers UAS-10, UAB-140 (produced by Sanyo Kokusaku Pulp Co., Ltd.), UA-7200 (produced by Shin-Nakamura Chemical Co., Ltd.), DPHA-40H (produced by Nippon Kayaku Co., Ltd.), UA-306H, UA-306T, UA-306I, AH-600, T-600 and AI-600 (produced by Kyoeisha Chemical Co., Ltd.).

As the polymerizable monomer, etc., polyfunctional thiol compounds having two or more mercapto (SH) groups in the same molecule described in JP-A-2012-150468, paragraphs 0216 to 0220, may also be used.

Specific examples of the monomer of an amide of an aliphatic polyvalent amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine tris-acrylamide, xylylene bis-acrylamide, and xylylene bis-methacrylamide.

Other preferred examples of the amide-based monomer include those having a cyclohexylene structure described in JP-B-B-54-21726.

A urethane-based addition-polymerizable compound produced using an addition reaction of an isocyanate and a hydroxyl group is also suitable, and specific examples thereof include a vinyl urethane compound having two or more polymerizable vinyl groups per molecule, which is obtained by adding a hydroxyl group-containing vinyl monomer represented by the following formula (V) to a polyisocyanate compound having two or more isocyanate groups per molecule described in JP-B-48-41708.

In the following formula (V), each of $R^7$ and $R^8$ each independently represents a hydrogen atom or a methyl group.

[Chem. 29]

$$H_2C{=}C(R^7)COOCH_2CH(R^8)OH \qquad \text{formula (V)}$$

In addition, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are also suitable. Furthermore, a curable composition very excellent in the photosensitive speed can be obtained by using a polymerizable compound having an amino structure or sulfide structure in the molecule described in JP-A-63-277653, JP-A-63-260909 and JP-A-1-105238.

Other examples include a polyfunctional acrylate or methacrylate such as polyester acrylates described in JP-A-48-64183, JP-B-49-43191 and JP-B-52-30490 and epoxy acrylates obtained by reacting an epoxy resin with a (meth) acrylic acid and also include specific unsaturated compounds described in JP-B-46-43946, JP-B-1-40337 and JP-B-1-40336, and a vinyl phosphonic acid-based compound described in JP-A-2-25493. In some cases, a perfluoroalkyl group-containing structure described in JP-A-61-22048 is suitably used. Furthermore, a photocurable monomer or oligomer described in *Journal of the Adhesion Society of Japan*, Vol. 20, No. 7, pp. 300-308 (1984) may also be used.

Details of the use method of these polymerizable compounds, for example, the structure, whether used individually or in combination, and the amount added, may be arbitrarily determined in accordance with the final design performance of the curable compound. For example, the use method is selected from the following viewpoints.

In view of sensitivity, a structure having a large unsaturated group content per one molecule is preferred, and in many cases, a bi- or higher functional group is preferred. In order to increase the strength of a cured film, a tri- or higher functional group is preferred, and it is also an effective method to use different functional numbers/different polymerizable groups (e.g., acrylic acid ester, methacrylic acid ester, styrene-based compound, vinyl ether-based compound) in combination to control both sensitivity and strength.

The selection and usage of the polymerizable compound are important factors for compatibility with other components (e.g., a polymerization initiator, a metal oxide particle) contained in the curable composition. For example, compatibility can be sometimes improved by using a low purity compound or two or more other components in combination. It is also possible to select a specific structure for the purpose of improving the adherence to a hard surface of a substrate, etc.

The content of the polymerizable compound (D) is preferably from 1 to 40 mass %, more preferably from 3 to 35 mass %, still more preferably from 5 to 30 mass %, based on the total solid content of the curable composition.

Within this range, good curability is advantageously obtained without reducing the refractive index.

The curable composition of the present invention preferably further contains at least one member selected from (E) the below-described polymerization initiator and a binder polymer.

(E) Polymerization Initiator

From the standpoint of more enhancing the curability, the curable composition of the present invention preferably further contains a polymerization initiator.

As the polymerization initiator for use in the present invention, the following compounds known as a polymerization initiator may be used.

The polymerization initiator is not particularly limited as long as it has an ability of initiating the polymerization of the polymerizable compound, and may be appropriately selected from known polymerization initiators.

For example, in view of good curing in the exposure step by irradiation with radiation, such as step (ii) (b), a compound having radiation sensitivity to light in the range from ultraviolet to visible region is preferred. In addition, the initiator may be an activating agent capable of somehow acting with a photo-excited sensitizer to produce an active radical or may be an initiator capable of initiating cationic polymerization according to the kind of the monomer.

The polymerization initiator preferably contains at least one compound having a molecular extinction coefficient of about 50 in the range of approximately from 300 to 800 nm (more preferably from 330 to 500 nm).

The polymerization initiator includes, for example, a halogenated hydrocarbon derivative (e.g., those having a triazine skeleton, those having an oxadiazole skeleton); an acylphosphine compound such as acylphosphine oxide; hexaarylbiimidazole; an oxime compound such as oxime derivative; an organic peroxide; a thio compound; a ketone compound; an aromatic onium salt; a ketooxime ether; an aminoacetophenone compound; and hydroxyacetophenone.

The halogenated hydrocarbon compound having a triazine skeleton includes, for example, compounds described in Wakabayashi et. al., *Bull. Chem. Soc. Japan,* 42, 2924 (1969), compounds described in British Patent No. 1388492, compounds described in JP-A-53-133428, compounds described in German Patent No. 3337024, compounds described in F. C. Schaefer et. al., *J. Org. Chem.,* 29, 1527 (1964), compounds described in JP-A-62-58241, compounds described in JP-A-5-281728, compounds described in JP-A-5-34920, and compounds described in U.S. Pat. No. 4,212,976.

The polymerization initiator other than those described above includes, for example, an acridine derivative (e.g., 9-phenylacridine, 1,7-bis(9,9'-acridinyl)heptane), N-phenylglycine, a polyhalogen compound (e.g., carbon tetrabromide, phenyltribromomethylsulfone, and phenyl trichloromethyl ketone), coumarins (e.g., 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, coumarin compounds described in JP-A-5-19475, JP-A-7-271028, JP-A-2002-363206, JP-A-2002-363207, JP-A-2002-363208 and JP-A-2002-363209, etc.), acylphosphine oxides (e.g., bis(2,4,6-trimethylbenzoyl)phenylphosphine oxide, bis(2,6-dimethoxybenzoyl)-2,4,4-trimethyl-pentylphenylphosphine oxide, Lucirin TPO), metallocenes (e.g., bis(η5-2,4-cyclopentadien-1-yl)-bis(2,6-difluoro-3-(1H-pyrrol-1-yl)phenyl)titanium, η5-cyclopentadienyl-η6-cumenyl-iron(1+)-hexafluorophosphate(1−)), and compounds described in JP-A-53-133428, JP-B-57-1819, JP-B-57-6096 and U.S. Pat. No. 3,615,455, etc.

The ketone compound includes, for example, compounds described in JPA-2011-252945, paragraph 0084, the contents of which are incorporated in the description of the present invention.

As the polymerization initiator, a hydroxyacetophenone compound, an aminoacetophenone compound, and an acylphosphine compound may also be suitably used. More specifically, for example, an aminoacetophenone-based initiator described in JP-A-10-291969, and an acylphosphine oxide-based initiator described in Japanese Patent No. 4225898 may also be used.

As the hydroxyacetophenone-based initiator, IRGACURE-184, DAROCUR-1173, IRGACURE-500, IRGACURE-2959, and IRGACURE-127 (trade names, all produced by BASF) may be used. As the aminoacetophenone-based initiator, commercial products IRGACURE-907, IRGACURE-369, and IRGACURE-379 (trade names, all produced by BASF) may be used. In addition, as the aminoacetophenone-based initiator, a compound whose absorption wavelength is matched to a long wavelength light source of 365 nm, 405 nm, etc., described in JP-A-2009-191179 may also be used. As the acylphosphine-based initiator, commercial products IRGACURE-819 and DAROCUR-TPO (trade names, both produced by BASF) may be used.

An oxime-based compound may also be suitably used as the polymerization initiator. With regard to specific examples of the oxime-based initiator, compounds described in JP-A-2001-233842, compounds described in JP-A-2000-80068, and compounds described in JP-A-2006-342166 may be used.

The oxime compound such as oxime derivative that is suitably used as the polymerization initiator in the present invention includes, for example, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

As the oxime ester compound, commercial products such as TRONLY TR-PBG-304, TRONLY TR-PBG-309, TRONLY TR-PBG-305 (CHANGZHOU TRONLY NEW ELECTRONIC MATERIALS CO., LTD.) may be used. In addition, description of the polymerization initiator in JP-A-2012-113104, paragraphs 0092 to 0096, may be taken into consideration, the contents of which are incorporated in the description of the present invention. By using such an oxime compound, a curable composition having high curing sensitivity and good developability can be provided. The above-described oxime compounds are the compounds described in JP-A-2012-113104, paragraph 0030 et seq. As for the formula, the compound is represented by formula (I) in claim 1, more preferably formula (I-A) in claim 3, of JP-A-2012-113104. These descriptions can be taken into consideration, the contents of which are incorporated in the description of the present invention. Other examples include compounds described in *J.C.S. Perkin II* (1979), pp. 1653-1660, *J.C.S. Perkin II* (1979), pp. 156-162, *Journal of Photopolymer*

*Science and Technology* (1995), pp. 202-232, *Journal of Applied Polymer Science* (2012), pp. 725-731, and JP-A-2000-66385; and compounds described in JP-A-2000-80068, paragraphs 0218 to 0281, JP-T-2004-534797 (the term "JP-T" as used herein means a published Japanese translation of a PCT patent application), paragraphs 0242 to 0251, and JP-A-2006-342166.

With regard to the commercial product, IRGACURE-OXE01 (produced by BASF) and IRGACURE-OXE02 (produced by BASF) may also suitably used.

As the oxime ester compound other than those described above, for example, a compound in which oxime is linked to the N-position of carbazole, described in JP-T-2009-519904; a compound in which a hetero substituent is introduced into a benzophenone moiety, described in U.S. Pat. No. 7,626,957; a compound in which a nitro group is introduced into a dye moiety, described in JP-A-2010-15025 and U.S. Patent Application Publication No. 2009-292039; a ketooxime-based compound described in International Publication No. 2009/131189; a compound containing a triazine skeleton and an oxime skeleton in the same molecule, described in U.S. Pat. No. 7,556,910; and a compound having an absorption maximum at 405 nm and having good sensitivity to a g-line light source, described in JP-A-2009-221114, may be used.

Furthermore, cyclic oxime compounds described in JP-A-2007-231000 and JP-A-2007-322744 may also be suitably used. Among the cyclic oxime compounds, a cyclic oxime compound condensed to a carbazole dye, described in JP-A-2010-32985 and JP-A-2010-185072, has high light absorptivity and is preferred from the standpoint of elevating the sensitivity.

In addition, a compound having an unsaturated bond at a specific moiety of an oxime compound, described in JP-A-2009-242469, can achieve high sensitivity by regenerating an active radical from a polymerization inactive radical and may also be suitably used.

Other examples include an oxime compound having a specific substituent described in JP-A-2007-269779, and an oxime compound having a thioaryl group described in JP-A-2009-191061.

Specifically, a compound represented by the following formula (OX-1) is also preferred. The compound may be an oxime compound in which the N—O bond of oxime is (E) form, an oxime compound in which the bond is (Z) form, or a compound in which the bond is a mixture of (E) form and (Z) form.

[Chem. 30]

(0X-1)

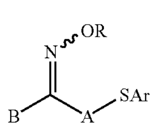

(In formula (OX-1), each of R and B independently represents a monovalent substituent, A represents a divalent organic group, and Ar represents an aryl group.)

In formula (OX-1), the monovalent substituent represented by R is preferably a monovalent nonmetallic atomic group.

The monovalent nonmetallic atomic group includes an alkyl group, an aryl group, an acyl group, an alkoxycarbonyl group, an aryloxycarbonyl group, a heterocyclic group, an alkylthiocarbonyl group, an arylthiocarbonyl group, etc. These groups may have one or more substituents. In addition, the substituent may be further substituted with another substituent.

The substituent includes a halogen atom, an aryloxy group, an alkoxycarbonyl group, an aryloxycarbonyl group, an acyloxy group, an acyl group, an alkyl group, and an aryl group.

The alkyl group is preferably an alkyl group having a carbon number of 1 to 30. Specifically, the description in JP-A-2012-032556, paragraph 0026, etc., may be taken into consideration, the contents of which are incorporated in the description of the present invention.

The aryl group is preferably an aryl group having a carbon number of 6 to 30. Specifically, the description in JP-A-2012-032556, paragraph 0027, etc., may be taken into consideration, the contents of which are incorporated in the description of the present invention.

The acyl group is preferably an acyl group having a carbon number of 2 to 20. Specifically, the description in JP-A-2012-032556, paragraph 0028, etc., may be taken into consideration, the contents of which are incorporated in the description of the present invention.

The alkoxycarbonyl group is preferably an alkoxycarbonyl group having a carbon number of 2 to 20. Specifically, the description in JP-A-2012-032556, paragraph 0029, etc., may be taken into consideration, the contents of which are incorporated in the description of the present invention.

As for the aryloxycarbonyl group, specifically, the description in JP-A-2012-032556, paragraph 0030, etc., may be taken into consideration, the contents of which are incorporated in the description of the present invention.

The heterocyclic group is preferably an aromatic or aliphatic heterocyclic ring containing a nitrogen atom, an oxygen atom, a sulfur atom or a phosphorus atom. Specifically, the description in JP-A-2012-032556, paragraph 0031, etc., may be taken into consideration, the contents of which are incorporated in the description of the present invention.

As for the alkylthiocarbonyl, specifically, the description in JP-A-2012-032556, paragraph 0032, etc., may be taken into consideration, the contents of which are incorporated in the description of the present invention.

As for the arylthiocarbonyl, specifically, the description in JP-A-2012-032556, paragraph 0033, etc., may be taken into consideration, the contents of which are incorporated in the description of the present invention.

In formula (OX-1), the monovalent substituent represented by B is an aryl group, a heterocyclic group, an arylcarbonyl group or a heterocyclic carbonyl group. These groups may have one or more substituents. Examples of the substituent include the above-described substituents. The above-described substituent may be further substituted with another substituent.

Among others, structures shown below are preferred.

In the following structures, Y, X and n have the same meanings as Y, X and n in formula (OX-2), respectively, and preferred examples are also the same.

[Chem. 31]

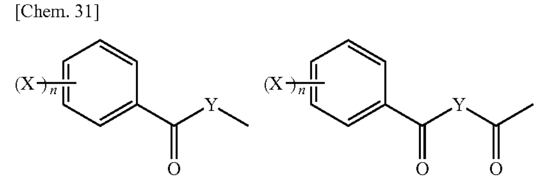

In formula (OX-1), the divalent organic group represented by A includes an alkylene group having a carbon number of 1 to 12, a cycloalkylene group, an alkynylene group, etc. These groups may have one or more substituents. Examples of the substituent include the above-described substituents. The above-described substituent may be further substituted with another substituent.

Among others, from the standpoint of increasing the sensitivity and suppressing coloring due to heat-aging, A in formula (OX-1) is preferably an unsubstituted alkylene group, an alkylene group substituted with an alkyl group (e.g., methyl group, ethyl group, tert-butyl group, dodecyl group), an alkylene group substituted with an alkenyl group (e.g., vinyl group, allyl group), or an alkylene group substituted with an aryl group (e.g., phenyl group, p-tolyl group, xylyl group, cumenyl group, naphthyl group, anthryl group, phenanthryl group, styryl group).

In formula (OX-1), the aryl group represented by Ar is preferably an aryl group having a carbon number of 6 to 30 and may have a substituent. Examples of the substituent are the same as those of the substituent introduced into the substituted aryl group recited above as specific examples of the aryl group that may have a substituent.

Among others, from the standpoint of increasing the sensitivity and suppressing coloring due to heat-aging, a substituted or unsubstituted phenyl group is preferred.

In formula (OX-1), the structure of "SAr" formed by Ar and adjacent S in formula (OX-1) is preferably a structure described, for example, in JP-A-2012-032556, paragraph 0040, the contents of which are incorporated in the description of the present invention.

The oxime compound represented by formula (OX-1) is preferably a compound represented by the following formula (OX-2):

[Chem. 32]

(OX-2)

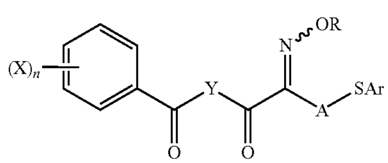

(In formula (OX-2), each of R and X independently represents a monovalent substituent, each of A and Y independently represents a divalent organic group, Ar represents an aryl group, n represents an integer of 0 to 5, and when a plurality of X are present, the plurality of X may be the same or different.)

R, A and Ar in formula (OX-2) have the same meanings as R, A and Ar in formula (OX-1), respectively, and preferred examples are also the same.

In formula (OX-2), the monovalent substituent represented by X includes an alkyl group, an aryl group, an alkoxy group, an aryloxy group, an acyloxy group, an acyl group, an alkoxycarbonyl group, an amino group, a heterocyclic group, and a halogen atom. These groups may have one or more substituents. Examples of the substituents include the above-described substituents. The above-described substituent may be further substituted with another substituent.

Among these, in view of solubility in solvent and improvement of absorption efficiency in a long wavelength region, X in formula (OX-2) is preferably an alkyl group.

In addition, n in formula (2) represents an integer of 0 to 5 and is preferably an integer of 0 to 2.

In formula (OX-2), the divalent organic group represented by Y includes the following structures Sub-1 to Sub-11. In the groups shown below, "*" indicates a bonding site at which Y is bonded to the adjacent carbon atom in formula (OX-2). Among others, in view of high sensitivity, structures Sub-1 and Sub-2 are preferred.

[Chem. 33]

Sub-1

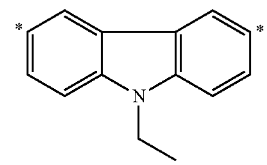

Sub-2

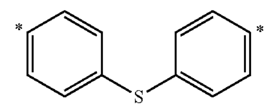

Sub-3

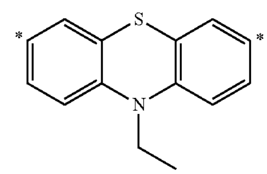

Sub-4

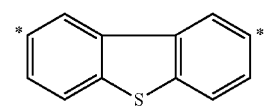

Sub-5

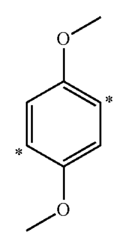

Sub-6

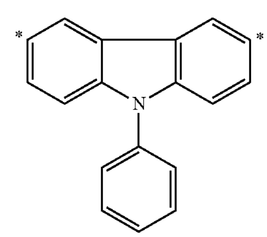

Sub-7

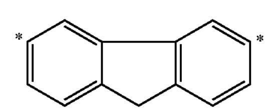

Sub-8

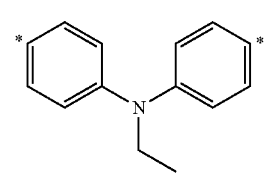

-continued

Sub-9

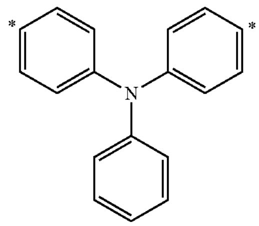

Sub-10

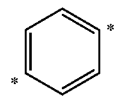

Sub-11

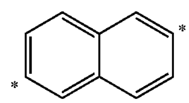

Furthermore, the oxime compound represented by formula (OX-2) is preferably a compound represented by the following formula (OX-3):

[Chem. 34]

(OX-3)

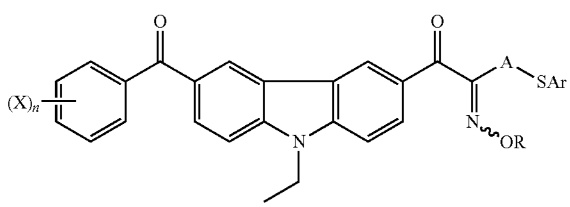

(In formula (OX-3), each of R and X independently represents a monovalent substituent, A represents a divalent organic group, Ar represents an aryl group, n represents an integer of 0 to 5, and when a plurality of X are present, the plurality of X may be the same or different.)

R, X, A, Ar and n in formula (OX-3) have the same meanings as R, X, A, Ar and n in formula (OX-2), respectively, and preferred examples are also the same.

Specific Examples (Plox-1) to (Plox-13) of the oxime compound that is suitably used are illustrated below, but the present invention is not limited thereto.

[Chem. 35]

Plox-1

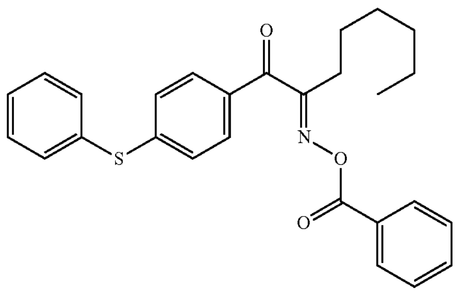

-continued

Plox-2

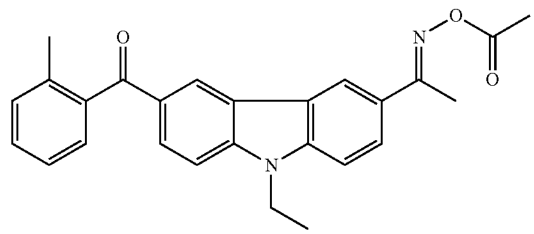

Plox-3

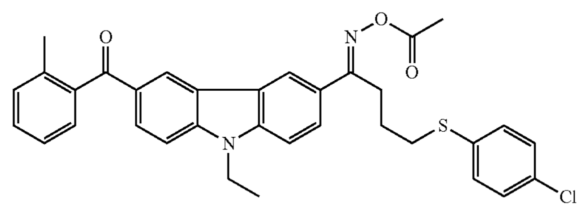

Plox-4

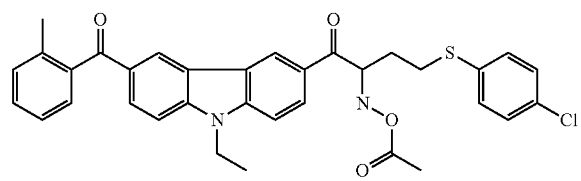

Plox-5

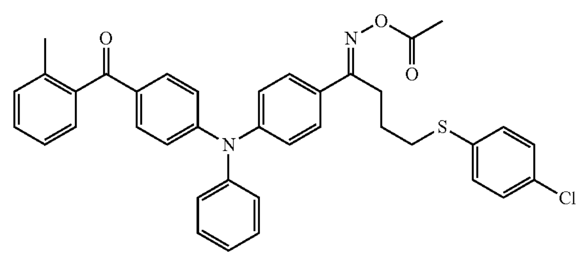

Plox-6

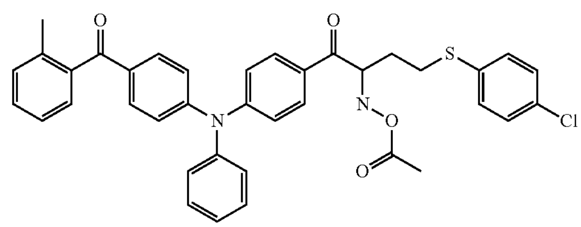

Plox-7

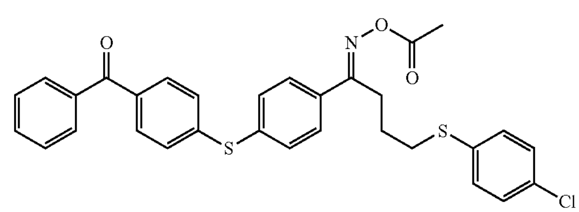

Plox-8

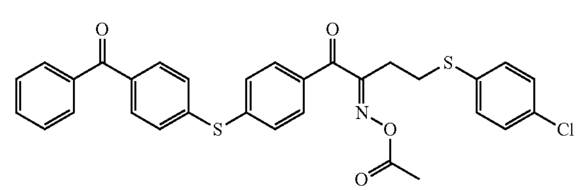

-continued

Plox-9

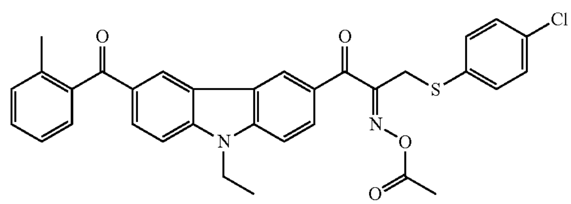

Plox-10

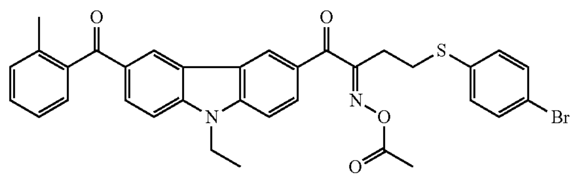

Plox-11

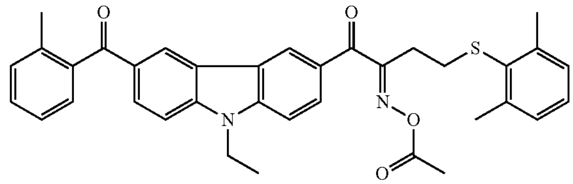

Plox-12

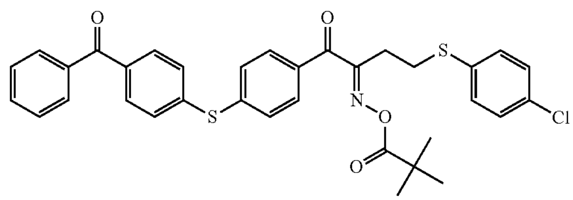

Plox-13

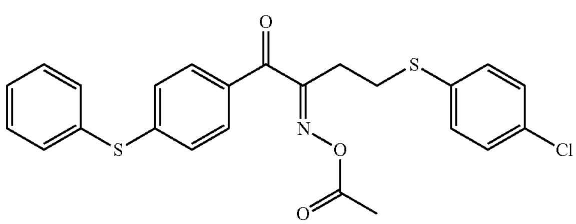

The oxime compound is a compound having a maximum absorption wavelength in a wavelength region of 350 to 500 nm, preferably a compound having an absorption wavelength in a wavelength region of 360 to 480 nm, still more preferably a compound having high absorbance at 365 nm and 455 nm.

The molar extinction coefficient of the oxime compound at 365 nm or 405 nm is, in view of sensitivity, preferably from 1,000 to 300,000, more preferably from 2,000 to 300,000, still more preferably from 5,000 to 200,000.

The molar extinction coefficient of a compound may be measured by a known method and specifically, the measurement is preferably performed, for example, by means of an ultraviolet/visible light spectrophotometer (Carry-5 spectrophotometer, manufactured by Varian) at a concentration of 0.01 g/L by using an ethyl acetate solvent.

In the present invention, two or more polymerization initiators may be used in combination, if desired.

In view of curability, the polymerization initiator (E) used in the curable composition of the present invention is preferably a compound selected from the group consisting of a trihalomethyl triazine compound, a benzyl dimethyl ketal compound, an α-hydroxy ketone compound, an α-aminoketone compound, an acylphosphine compound, a phosphine oxide compound, a metallocene compound, an oxime compounds, a triallylimidazole dimer, an onium compound, a benzothiazole compound, a benzophenone compound, an acetophenone compound and a derivative thereof, a cyclopentadiene-benzene-iron complex and a salt thereof, a halomethyloxadiazole compound, and a 3-aryl-substituted coumarin compound.

A trihalomethyl triazine compound, an α-aminoketone compound, an acylphosphine compound, a phosphine oxide compound, an oxime compound, a triallylimidazole dimer, an onium compound, a benzophenone compound and an acetophenone compound are more preferred, and at least one compound selected from the group consisting of a trihalomethyl triazine compound, an α-aminoketone compound, an oxime compound, a triallylimidazole dimer and a benzophenone compound is most preferred.

Above all, in the case of fabricating a microlens by providing the curable composition of the present invention on a color filter of a solid-state imaging device, a fine pattern must be formed in a sharp shape and therefore, as well as the curability, a property of being developed with no remaining of a residue in the unexposed area is important. From this viewpoint, an oxime compound is preferably used as the polymerization initiator. Above all, in the case of forming a fine pattern in a solid-state imaging device, the exposure apparatus used for curing is a stepper exposure apparatus and since this exposure apparatus is sometimes damaged by halogen, the amount of the polymerization initiator added must be kept low. Considering these points, it is most preferable to use an oxime compound as the polymerization initiator (E) to form a fine pattern as in a solid-state imaging device.

The content of the polymerization initiator (E) contained in the curable composition of the present invention (in the case of containing two or more polymerization initiators, the total content) is preferably from 0.1 to 40 mass %, more preferably from 0.5 to 20 mass %, still more preferably from 1 to 15 mass %, based on the total solid content of the curable composition. Within this range, good curability as well as good sensitivity and pattern formability are obtained The curable composition of the present invention may further contain, if desired, optional components described in detail below.

[Sensitizer]

The curable composition of the present invention may contain a sensitizer for the purpose of improving the radical generation efficiency of the photopolymerization initiator (E) and shifting the sensitive wavelength to a longer wavelength.

The sensitizer that can be used in the present invention is preferably a sensitizer capable of sensitizing the polymerization initiator (E) by an electron transfer mechanism or an energy transfer mechanism.

The sensitizer includes those belonging to the compound groups recited below and having an absorption wavelength in the wavelength region of 300 to 450 nm.

That is, the sensitizer includes, for example, polynuclear aromatics (e.g., phenanthrene, anthracene, pyrene, perylene, triphenylene, 9,10-dialkoxyanthracene), xanthenes (e.g., fluorescein, eosin, erythrosine, Rhodamine B, Rose Bengal), thioxanthones (isopropylthioxanthone, diethylthioxanthone, chlorothioxanthone), cyanines (e.g., thiacarbocyanine, oxacarbocyanine), merocyanines (e.g., merocyanine, carbomerocyanine), phthalocyanines, thiazines (e.g., thionine, Methylene Blue, Toluidine Blue), acridines (e.g., Acridine Orange, chloroflavin, acriflavine), anthraquinones (e.g., anthraquinone), squaryliums (e.g., squarylium), Acridine Orange, coumarins (e.g., 7-diethylamino-4-methylcoumarin), ketocoumarin, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxanthone and Michler's ketone, and heterocyclic compounds such as N-aryloxazolidinone.

The sensitizer further includes, for example, compounds described in European Patent No. 568,993, U.S. Pat. Nos. 4,508,811 and 5,227,227, JP-A-2001-125255, JP-A-11-271969, etc.

From the viewpoint of light absorption efficiency in the deep part and decomposition efficiency of the initiator, the content of the sensitizer in the curable composition is, in terms of the solid content, preferably from 0.1 to 20 mass %, more preferably from 0.5 to 15 mass %.

One sensitizer may be used alone, or two or more sensitizers may be used in combination.

[Co-Sensitizer]

It is also preferred that the curable composition of the present invention further contains a co-sensitizer.

The co-sensitizer for use in the present invention has actions of for example, more improving the actinic radiation sensitivity of the polymerization initiator (E) or the sensitizer or preventing the polymerization of the polymerizable compound (D) from inhibition by oxygen.

Examples of such a co-sensitizer include amines, e.g., compounds described in M. R. Sander et al., *Journal of Polymer Society*, Vol. 10, page 3173 (1972), JP-B-44-20189, JP-A-51-82102, JP-A-52-134692, JP-A-59-138205, JP-A-60-84305, JP-A-62-18537, JP-A-64-33104, and *Research Disclosure* No. 33825, specifically, triethanolamine, p-dimethylaminobenzoic acid ethyl ester, p-formyldimethylaniline, p-methylthiodimethylaniline, etc.

Other examples of the co-sensitizer include thiols and sulfides, e.g., thiol compounds described in JP-A-53-702, JP-B-55-500806 and JP-A-5-142772 and disulfide compounds described in JP-A-56-75643, specifically, 2-mercaptobenzothiazole, 2-mercaptobenzoxazole, 2-mercaptobenzimidazole, 2-mercapto-4(3H)-quinazoline, β-mercaptonaphthalene, etc.

In addition, other examples of the co-sensitizer include an amino acid compound (e.g., N-phenylglycine), an organometallic compound described in JP-B-48-42965 (e.g., tributyltin acetate), a hydrogen donor described in JP-B-55-34414, and a sulfur compound described in JP-A-6-308727 (e.g., trithiane).

One co-sensitizer may be used alone, or two or more co-sensitizers may be used in combination.

From the standpoint of enhancing the curing rate by balancing the polymer growth rate and the chain transfer, the content of the co-sensitizer is preferably from 0.1 to 30 mass %, more preferably from 1 to 25 mass %, still more preferably from 1.5 to 20 mass %, based on the total solid content of the curable composition.

[Polymerization Inhibitor]

In the present invention, a polymerization inhibitor is preferably added for inhibiting a polymerizable compound having an ethylenically unsaturated double bond from undergoing unnecessary polymerization during the production or storage of the curable composition.

The polymerization inhibitor that can be used in the present invention includes, for example, a phenolic hydroxyl group-containing compound, N-oxide compounds, piperidine 1-oxyl free radical compounds, pyrrolidine 1-oxyl free radical compounds, N-nitrosophenylhydroxylamines, diazonium compounds, cationic dyes, sulfide group-containing compounds, nitro group-containing compounds, and transition metal compounds such as $FeCl_3$ and $CuCl_2$.

More preferred embodiments are as follows.

The phenolic hydroxyl group-containing compound is preferably a compound selected from the group consisting of hydroquinone, p-methoxyphenol, di-tert-butyl-p-cresol, pyrogallol, tert-butyl catechol, benzoquinone, 4,4-thiobis(3-methyl-6-tert-butylphenol), 2,2'-methylenebis(4-methyl-6-tert-butylphenol), 2,6-di-tert-butyl-4-methylphenol (BHT), phenol resins, and cresol resins.

The N-oxide compounds are preferably a compound selected from the group consisting of 5,5-dimethyl-1-pyrroline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide.

The piperidine 1-oxyl free radical compounds are preferably a compound selected from the group consisting of piperidine 1-oxyl free radical, 2,2,6,6-tetramethylpiperidine 1-oxyl free radical, 4-oxo-2,2,6,6-tetramethylpiperidine 1-oxyl free radical, 4-hydroxy-2,2,6,6-tetramethylpiperidine 1-oxyl free radical, 4-acetamide-2,2,6,6-tetramethylpiperidine 1-oxyl free radical, 4-maleimide-2,2,6,6-tetramethylpiperidine 1-oxyl free radical, and 4-phosphonoxy-2,2,6,6-tetramethylpiperidine 1-oxyl free radical.

The pyrrolidine 1-oxyl free radical compounds are preferably a 3-carboxyproxyl free radical (3-carboxy-2,2,5,5-tetramethylpyrrolidine 1-oxyl free radical).

The N-nitrosophenylhydroxylamines are preferably a compound selected from the group consisting of N-nitrosophenylhydroxylamine cerous salt and N-nitrosophenylhydroxylamine aluminum salt.

The diazonium compounds are preferably a compound selected from the group consisting of 4-diazophenyldimethylamine hydrogensulfate, 4-diazodiphenylamine tetrafluoroborate and 3-methoxy-4-diazodiphenylamine hexafluorophosphate.

Among others, a phenolic hydroxyl group-containing compound such as hydroquinone, p-methoxyphenol, di-tert-butyl-p-cresol, pyrogallol, tert-butyl catechol, benzoquinone, 4,4-thiobis(3-methyl-6-tert-butylphenol) and 2,2'-methylene-bis(4-methyl-6-tert-butylphenol), piperidine 1-oxyl free radical compounds, a piperidine 1-oxyl free radical compound such as 2,2,6,6-tetramethylpiperidine 1-oxyl free radical, 4-oxo-2,2,6,6-tetramethyl piperidine 1-oxyl free radical, 4-hydroxy-2,2,6,6-tetramethylpiperidine 1-oxyl free radical, 4-acetamide-2,2,6,6-tetramethylpiperidine 1-oxyl free radical, 4-maleimide-2,2,6,6-tetramethylpiperidine 1-oxyl free radical and 4-phosphonoxy-2,2,6,6-tetramethylpiperidine 1-oxyl free radical, and an N-nitrosophenylhydroxylamine compound such as N-nitrosophenylhydroxylamine cerous salt and N-nitrosophenylhydroxylamine aluminum salt, are preferred; a piperidine 1-oxyl free radical compound such as 2,2,6,6-tetramethylpiperidine 1-oxyl free radical, 4-oxo-2,2,6,6-tetramethylpiperidine 1-oxyl free radical, 4-hydroxy-2,2,6,6-tetramethylpiperidine 1-oxyl free radical, 4-acetamide-2,2,6,6-tetramethylpiperidine 1-oxyl free radical, 4-maleimide-2,2,6,6-tetramethylpiperidine 1-oxyl free radical and 4-phosphonoxy-2,2,6,6-tetramethylpiperidine 1-oxyl free radical, and an N-nitrosophenylhydroxylamine compound such as N-nitrosophenylhydroxylamine cerous salt and N-nitrosophenylhydroxylamine aluminum salt, are more preferred; and an N-nitrosophenylhydroxylamine compound such as -nitrosophenylhydroxylamine cerous salt and N-nitrosophenylhydroxylamine aluminum salt is still more preferred.

One polymerization inhibitor may be used alone, or two or more polymerization inhibitors may be used in combination.

The amount of the polymerization inhibitor added is preferably from 0.01 to 10 parts by mass, more preferably from 0.01 to 8 parts by mass, and most preferably from 0.05 to parts by mass, per 100 parts by mass of the polymerization initiator (E).

Within this range, a curing reaction is sufficiently suppressed in the non-image area and sufficiently promoted in the image area, as a result, the image formability and sensitivity are improved.

[Binder Polymer]

From the standpoint of improving the film properties, the curable composition of the present invention preferably further contains a binder polymer.

As the binder polymer, a linear organic polymer is preferably used. As for the linear organic polymer, a known polymer may be arbitrarily used. In order to enable water development or weakly alkaline water development, a linear organic polymer soluble or swellable in water or weakly alkaline water is preferably selected. The linear organic polymer is not only used as a film-forming agent but also is selected in accordance with the usage as a water, weakly alkaline water or organic solvent developer. For example, use of a water-soluble organic polymer enables water development. Such a linear organic polymer includes, for example, a radical polymer having a carboxylic acid group in the side chain, e.g., those described in JP-A-59-44615, JP-B-54-34327, JP-B-58-12577, JP-B-54-25957, JP-A-54-92723, JP-A-59-53836 and JP-A-59-71048, more specifically, a resin obtained by homopolymerizing or copolymerizing a monomer having a carboxyl group, a resin obtained by hydrolyzing, half-esterifying or half-amidating an acid anhydride unit resulting from homopolymerization or copolymerization of a monomer having an acid anhydride, an epoxy acrylate obtained by modifying an epoxy resin with an unsaturated monocarboxylic acid and an acid anhydride, etc. The monomer having a carboxyl group includes an acrylic acid, a methacrylic acid, an itaconic acid, a crotonic acid, a maleic acid, a fumaric acid, a 4-carboxylstyrene, etc., and the monomer having an acid anhydride includes a maleic anhydride, etc.

In addition, the organic polymer includes an acidic cellulose derivative similarly having a carboxylic acid group in the side chain. Other than these, for example, a polymer obtained by adding a cyclic acid anhydride to a polymer having a hydroxyl group is also useful.

In the present invention, in the case of using a copolymer as the binder polymer, a monomer other than the monomers described above may also be used as a compound to be copolymerized. Examples of the other monomer include the compounds of (1) to (12) below:

(1) aliphatic hydroxyl group-containing acrylic acid esters or methacrylic acid esters, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate;

(2) an alkyl acrylate such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, and propargyl acrylate;

(3) an alkyl methacrylate such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate and propargyl methacrylate;

(4) an acrylamide or methacrylamide, such as acrylamide, methacrylamide, N-methylolacrylamide, N-ethyl acrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinyl acrylamide, vinyl methacrylamide, N,N-diallylacrylamide; N,N-diallylmethacrylamide, allylacrylamide and allylmethaciylamide;

(5) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) vinyl esters such as vinyl acetate, vinyl chloroacetate, vinyl butyrate and vinyl benzoate;

(7) styrenes such as styrene, α-methylstyrene, methylstyrene, chloromethylstyrene and p-acetoxystyrene;

(8) vinyl ketones such as methyl vinyl ketone, ethyl vinyl ketone, propyl vinyl ketone and phenyl vinyl ketone;

(9) olefins such as ethylene, propylene, isobutylene, butadiene and isoprene;

(10) N-vinylpyrrolidone, acrylonitrile, methacrylonitrile, etc.;

(11) an unsaturated imide such as maleimide, N-acryloylacrylamide, N-acetylmethacrylamide, N-propionylmethacrylamide and N-(p-chlorobenzoyl)methacrylamide; and

(12) a methacrylic acid-based monomer in which a heteroatom is bonded to the α-position, for example, compounds described in JP-A-2002-309057, JP-A-2002-311569, etc.

In the present invention, these monomers may be combined with no particular limitation within the scope of the present invention and thereby applied to the synthesis of a copolymer. One example of a copolymer obtained by polymerizing monomer components containing such a monomer is illustrated below, but the present invention is not limited thereto. The compositional ratio of the compound illustrated below is in mol %.

[Chem. 36]

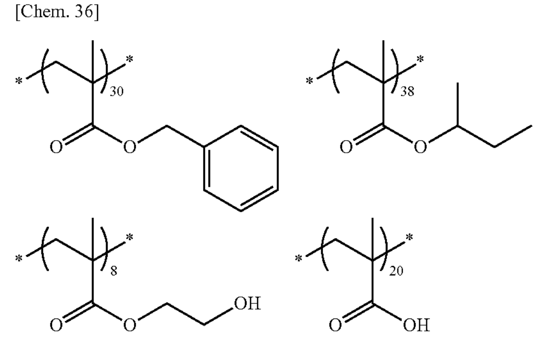

-continued

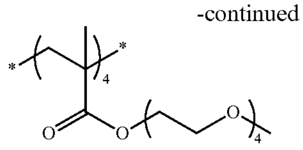

Mw: 10,000

As for the binder polymer, the description of a polymer obtained by the polymerization using, as an essential monomer component, a compound represented by formula (ED) (sometimes referred to as an ether dimer) in JP-A-2012-208494, paragraph 0562 (in the corresponding U.S. Patent Application Publication No. 2012/235099, [0692]) et seq. may be taken into consideration, the contents of which are incorporated in the description of the present invention.

With regard to specific examples of the ether dimer, the description of an ether dimer in JP-A-2012-208494, paragraph 0565 (in the corresponding U.S. Patent Application Publication No. 2012/235099, [0694]) et seq. may be taken into consideration, the contents of which are incorporated in the description of the present invention.

In addition, specific examples of the polymer obtained by the polymerization using, as an essential monomer component, a compound represented by formula (ED) are illustrated below, but the present invention is not limited thereto. The compositional ratio of the compound illustrated below is in mol %.

[Chem. 37]

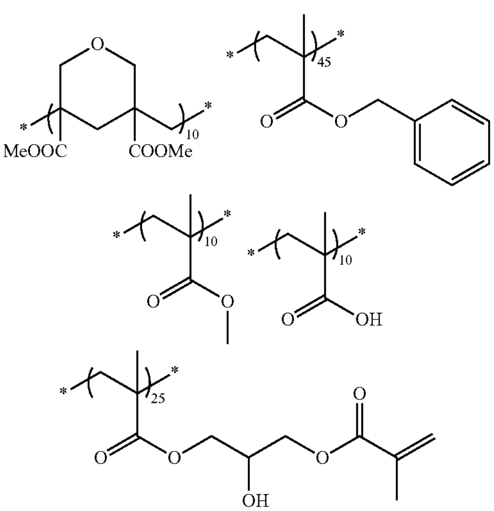

Mw = 12000

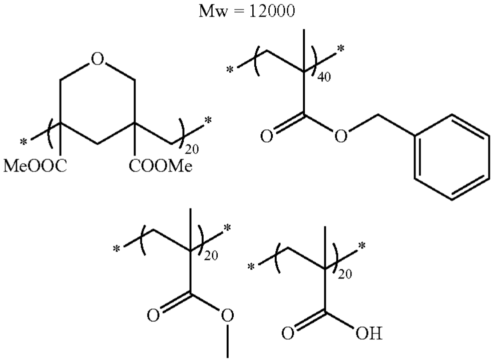

Mw = 17000

-continued

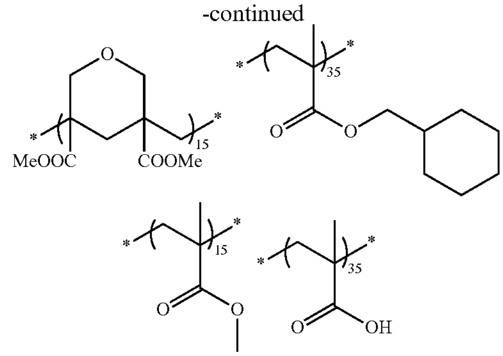

Mw = 18000

[Chem. 38]

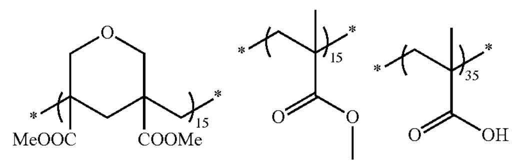

Mw = 18000

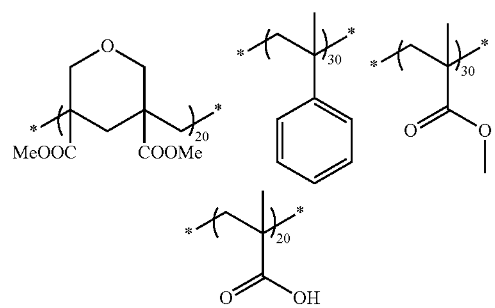

Mw = 18000

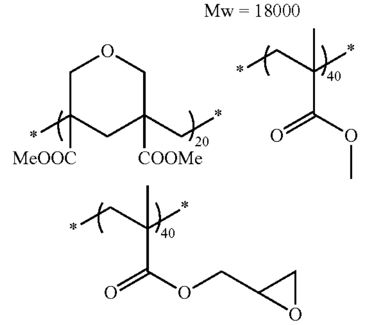

Mw = 19000

In the present invention, among others, a polymer obtained by copolymerizing dimethyl-2,2'-[oxybis(methylene)]bis-2-propenoate (hereinafter referred to as "DM"), benzyl methacrylate (hereinafter referred to as "BzMA"), methyl methacrylate (hereinafter referred to as "MMA"), methacrylic acid (hereinafter referred to as "MAA") and glycidyl methacrylate (hereinafter referred to as "GMA") is preferred. In particular, the molar ratio of DM:BzMA:MMA:MAA:GMA is preferably 5 to 15:40 to 50:5 to 15:5 to 15:20 to 30. These components preferably account for 95 mass % or more in the components constituting the copolymer for use in the present invention. The weight average molecular weight of such a polymer is preferably from 9,000 to 20,000.

The polymer for use in the present invention preferably has a weight average molecular weight (in terms of polystyrene as measured by GPC method) of 1,000 to $2\times10^5$, more preferably from 2,000 to $1\times10^5$, still more preferably from 5,000 to $5\times10^4$.

Among these, a (meth)acrylic resin containing, in the side chain, an allyl group or vinyl ester group and a carboxyl group, an alkali-soluble resin having a double bond in the side chain described in JP-A-2000-187322 and JP-A-2002-62698, and an alkali-soluble resin having an amide group in the side chain described in JP-A-2001-242612 are excellent in the balance of film strength, sensitivity and developability and are suitable. Examples of the polymer above include DIANAL NR series (produced by Mitsubishi Rayon Co., Ltd.), Photomer 6173 (a COOH-containing polyurethane acrylic oligomer, produced by Diamond Shamrock Co., Ltd.), Viscoat R-264, KS Resist-106 (both produced by Osaka Organic Chemical Industry Ltd.), CYCLOMER P series such as CYCLOMER P ACA230AA, PLACCEL CF200 series (all produced by Daicel Chemical Industries, Ltd.), and Ebecryl 3800 (produced by Daicel-UCB Company Ltd.).

In addition, an acid group-containing urethane-based binder polymer described in JP-B-7-12004, JP-B-7-120041, JP-B-7-120042, JP-B-842424, JP-A-63-287944, JP-A-63-287947 and JP-A-1-271741, and a urethane-based binder polymer having, in the side chain, an acid group and a double bond described in JP-A-2002-107918 are very excellent in the strength and are advantageous in terms of film strength.

An acid group-containing acetal-modified polyvinyl alcohol-based binder polymer described in European Patent Nos. 993966 and 1204000, JP-A-2001-318463, etc. is also excellent in the film strength and is suitable.

Other than these, polyvinylpyrrolidone, polyethylene oxide, etc. are useful as the water-soluble linear organic polymer. Furthermore, for example, an alcohol-soluble nylon and a polyether of 2,2-bis(4-hydroxyphenyl)-propane and epichlorohydrin are also useful for increasing the strength of the cured film.

The weight average molecular weight (in terms of polystyrene as measured by GPC method) of the binder polymer that can be used in the curable composition of the present invention is preferably 5,000 or more, more preferably from 10,000 to 300,000, and the number average molecular weight is preferably 1,000 or more, more preferably from 2,000 to 250,000. The polydispersity (weight average molecular weight/number average molecular weight) is preferably 1 or more, more preferably from 1.1 to 10.

The binder polymer may be any of a random polymer, a block polymer, a graft polymer, etc.

The binder polymer usable in the present invention can be synthesized by a conventionally known method. The solvent used at the time of synthesis includes, for example, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, and water. One of these solvents is used alone, or two or more thereof are mixed and used.

The radical polymerization initiator used at the time of synthesis of the binder polymer usable in the curable composition of the present invention includes conventionally known compounds such as azo-based initiator and peroxide initiator.

In the curable composition of the present invention, one binder polymer may be used alone, or two or more binder polymers may be used in combination.

The curable composition of the present invention may or may not contain a binder polymer, but in the case of containing a binder polymer, the content thereof is preferably from 1 to 40 mass %, more preferably from 3 to 30 mass %, still more preferably from 4 to 20 mass %, based on the total solid content of the curable composition.

[Surfactant]

From the standpoint of more enhancing the coatability, various surfactants may be added to the curable composition of the present invention. As the surfactant, various surfactants such as fluorine-containing surfactant, nonionic surfactant, cationic surfactant, anionic surfactant and silicone-containing surfactant may be used.

Among others, when the curable composition of the present invention contains a fluorine-containing surfactant, the liquid characteristics (particularly fluidity) of a coating solution prepared are more enhanced, so that the coating thickness uniformity or the liquid saving can be more improved.

That is, in the case of forming a film by using a coating solution to which a photosensitive transparent composition containing a fluorine-containing surfactant is applied, the interface tension between the coating surface and the coating solution is reduced, whereby wettability to the coating surface is improved and the coatability on the coating surface is enhanced. This is effective in that even when a thin film of about several μm is formed with a small liquid volume, formation of a film having a uniform thickness with little thickness unevenness can be more suitably performed.

The fluorine content percentage in the fluorine-containing surfactant is preferably from 3 to 40 mass %, more preferably from 5 to 30 mass %, still more preferably from 7 to 25 mass %. A fluorine-containing surfactant having a fluorine content percentage in the range above is effective in terms of thickness uniformity of the coated film and liquid saving and also has good solubility in the curable composition.

The fluorine-containing surfactant includes, for example, Megaface F171, Megaface F172, Megaface F173, Megaface F176, Megaface F177, Megaface F141, Megaface F142, Megaface F143, Megaface F144, Megaface R30, Megaface F437, Megaface F475, Megaface F479, Megaface F482, Megaface F554, Megaface F780, Megaface F781 (all produced by DIC Corp.), Florad FC430, Florad FC431, Florad FC171 (all produced by Sumitomo 3M Ltd.), Surflon S-382, Surflon SC-101, Surflon SC-103, Surflon SC-104, Surflon SC-105, Surflon SC-1068, Surflon SC-381, Surflon SC-383, Surflon S393, Surflon KH-40 (all produced by Asahi Glass Co., Ltd.), PF636, PF656, PF6320, PF6520, and PF7002 (produced by OMNOVA).

The nonionic surfactant specifically includes nonionic surfactants described, for example, in JP-A-2012-201643, paragraph 0252, the contents of which are incorporated in the description of the present invention.

The cationic surfactant specifically includes cationic surfactants described, for example, in JP-A-2012-201643, paragraph 0253, the contents of which are incorporated in the description of the present invention.

The anionic surfactant specifically includes WO04, WO05, WO17 (produced by Yusho Co., Ltd.), etc.

The silicone-containing surfactant includes, for example, "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", and "Toray Silicone SH8400", produced by Dow Corning Toray Silicone Co., Ltd.; "TSF-4440", "TSF-4300", "TSF-4445", "TSF-4460", and "TSF-4452", produced by Momentive Performance Materials; "KP341", "KF6001", and "KF6002", produced by Shin-Etsu Silicone Co., Ltd.; and "BYK307", "BYK323", and BYK330, produced by Byk Chemie.

Only one surfactant may be used, or two or more kinds of surfactants may be combined.

The curable composition may or may not contain a surfactant but in the case of containing a surfactant, the amount added thereof is preferably from 0.001 to 2.0 mass %, more preferably from 0.005 to 1.0 mass %, based on the total mass of the curable composition.

[Other Additives]

In the curable composition, known additives such as plasticizer and sensitizing agent may be further added so as to improve the physical properties of the cured film.

As for other additives, only one additive may be used, or two or more kinds of additives may be combined.

The plasticizer includes, for example, dioctyl phthalate, didodecyl phthalate, triethylene glycol dicaprylate, dimethyl glycol phthalate, tricresyl phosphate, dioctyl adipate, dibutyl sebacate, and triacetyl glycerol, and when a binder polymer is used, the plasticizer may be added in an amount of 10 mass % or less based on the total mass of the polymerizable compound and the binder polymer.

[Ultraviolet Absorber]

The curable composition of the present invention may contain an ultraviolet absorber. The ultraviolet absorber is preferably, among others, a compound represented by the following general formula (I) that is a conjugated diene compound:

[Chem. 39]

formula (I)

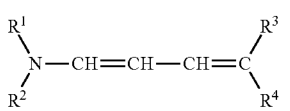

In formula (I), each of $R^1$ and $R^2$ independently represents a hydrogen atom, an alkyl group having from 1 to 20 carbon atoms, or an aryl group having from 6 to 20 carbon atoms, and $R^1$ and $R^2$ may be the same as or different from each other but are not a hydrogen atom at the same time.

In addition, $R^1$ and $R^2$ may form a cyclic amino group together with the nitrogen atom to which $R^1$ and $R^2$ are bonded. The cyclic amino group includes, for example, a piperidino group, a morpholino group, a pyrrolidino group, a hexahydroazepino group, and a piperazino group.

In formula (I), each of $R^3$ and $R^4$ represents an electron-withdrawing group. The electron-withdrawing group as used here is an electron-withdrawing group having a Hammett's substituent constant $\sigma_p$ value (hereinafter, simply referred to as "$\sigma_p$ value") of 0.20 to 1.0, preferably an electron-withdrawing group having a $\sigma_p$ value of 0.30 to 0.8.

The Hammett's rule is an empirical rule advocated by L.P. Hammett in 1935 so as to quantitatively discuss the effect of a substituent on the reaction or equilibrium of a benzene derivative and its propriety is widely admitted at present. The substituent constant determined by the Hammett's rule includes a $\sigma_p$ value and a $\sigma_m$ value, and these values can be found in a large number of general publications and are described in detail, for example, in J. A. Dean (compiler), *Lange's Handbook of Chemistry,* 12th ed., McGraw-Hill (1979), *Kagakuno Ryoiki* (*Chemistry Region*), *special number*, No. 122, pp. 96-103, Nankodo (1979), and *Chemical Reviews*, Vol. 91, pp. 165-195 (1991). In the present invention, it is not meant that the substituent is limited only to those having a known value which can be found in the above-described publications, and needless to say, the substituent includes a substituent whose value is not known in publications but when measured based on the Hammett's rule, falls in the range.

Specific examples of the electron-withdrawing group having a $\sigma_p$ value of 0.20 to 1.0 include an acyl group, an acyloxy group, a carbamoyl group, an alkyloxycarbonyl group, an aryloxycarbonyl group, a cyano group, a nitro group, a dialkylphosphono group, a diarylphosphono group, a diarylphosphinyl group, an alkylsulfinyl group, an arylsulfinyl group, an alkylsulfonyl group, an arylsulfonyl group, a sulfonyloxy group, an acylthio group, a sulfamoyl group, a thiocyanate group, a thiocarbonyl group, an alkyl group substituted with at least two or more halogen atoms, an alkoxy group substituted with at least two or more halogen atoms, an aryloxy group substituted with at least two or more halogen atoms, an alkylamino group substituted with at least two or more halogen atoms, an alkylthio group substituted with at least two or more halogen atoms, an aryl group substituted with another electron-withdrawing group having a $\sigma_p$ value of 0.20 or more, a heterocyclic group, a chlorine atom, a bromine atom, an azo group and a selenocyanate group.

$R^3$ and $R^4$ may combine with each other to form a ring.

At least one of $R^1$, $R^2$, $R^3$ and $R^4$ may be in the form of a polymer derived from a monomer bonded to a vinyl group through a linking group or may be a copolymer with another monomer. In the case of a copolymer, the another monomer includes, for example, an acrylic acid, an α-chloroacrylic acid, α-alacrylic acid (for example, an ester derived from acrylic acids such as methacrylic acid, preferably a lower alkyl ester or amide, e.g., acrylamide, methacrylamide, tert-butylacrylamide, methyl acrylate, methyl methacrylate, ethyl acrylate, ethyl methacrylate, n-propyl acrylate, n-butyl acrylate, 2-ethylhexyl acrylate, n-hexyl acrylate, octyl methacrylate, lauryl methacrylate, methylenebisacrylamide), a vinyl ester (e.g., vinyl acetate, vinyl propionate, vinyl laurate), acrylonitrile, methacrylonitrile, an aromatic vinyl compound (for example, styrene and its derivative, e.g., vinyltoluene, divinylbenzene, vinylacetophenone, sulfostyrene, styrenesulfinic acid), itaconic acid, citraconic acid, crotonic acid, vinylidene chloride, a vinyl alkyl ether (e.g., vinyl ethyl ether), a maleic acid ester, N-vinyl-2-pyrrolidone, N-vinylpyridine, and 2- or 4-vinylpyridine.

Two or more of these other monomer compounds may be used in combination. For example, n-butyl acrylate and divinylbenzene, styrene and methyl methacrylate, or methyl acrylate and methacrylate, can be used in combination.

The ultraviolet absorber represented by formula (I) can be synthesized by the methods described in JP-B-44-29620, JP-A-53-128333, JP-A-61-169831, JP-A-63-53543, JP-A-63-53544, JP-A-63-56651, and WO2009/123109, pamphlet. Specifically, Compound (1) illustrated above can be synthesized by the method described in WO2009/123109, pamphlet, paragraph 0040.

The curable composition of the present invention may or may not contain an ultraviolet absorber but in the case of containing an ultraviolet absorber, the content thereof is preferably from 0.1 to 10 mass %, more preferably from 0.1 to 5 mass %, still more preferably from 0.1 to 3 mass %, based on the total solid content of the composition.

In the present invention, one of these various ultraviolet absorbers may be used alone, or two or more thereof may be used in combination.

The curable composition of the present invention is preferably filtered through a filter for the purpose of removing foreign substances or reducing defects. A filter conventionally used for filtration, etc. can be used without any particular limitation. The filter includes those made of, for example, a fluororesin such as PTFE (polytetrafluoroethylene), a polyamide-based resin such as nylon-6 and nylon 6,6, and a polyolefin resin (including a high-density polyolefin and an ultrahigh-molecular weight polyolefin) such as polyethylene and polypropylene (PP). Among these materials, polypropylene (including a high-density polypropylene) is preferred.

The pore size of the filter is suitably on the order of 0.01 to 7.0 μm, preferably approximately from 0.01 to 2.5 μm, more preferably approximately from 0.01 to 1.5 μm. Within this range, it becomes possible to unfailingly remove fine foreign substances which are mixed in a dissolved pigment, etc. and inhibit the preparation of a uniform and smooth curable composition in a later step.

At the time of use of a filter, different filters may be combined. In this case, filtering through a first filter may be performed once or two or more times. In the case of performing filtering two or more times by combining different filters, the pore size in the second or later filtering is preferably larger than the pore size in the first filtering. It may be also possible to combine first filters having different pore sizes within the above-described range. The nominal values of the filter makers can be referred to for the pore size used herein. As to the commercially available filter, the filter may be selected from various filters offered, for example, by Japan Pall Co., Ltd., Advantec Toyo Co., Ltd., Nihon Entegris K. K. (the former Nihon Mykrolis Ltd.) or Kitz Micro Filter Corp.

As the second filter, a filter made of the same material, etc. as the first filter may be used. The pore size of the second filter is suitably on the order of 0.5 to 7.0 μm, preferably on the order of 2.5 to 7.0 μm, more preferably on the order of 4.5 to 6.0 μm. Within this range, foreign substances which are mixed in a mixed solution and inhibit the preparation of a uniform and smooth curable composition in a later step can be removed while allowing for remaining of the component particles contained in the mixed solution.

For example, it may be possible to perform the filtering through a first filter only for a dispersion liquid and after mixing other components, perform the second filtering.

<Cured Film>

The cured film of the present invention is a cured film obtained by curing the above-described curable composition.

The cured film of the present invention can be suitably used as an interlayer insulating film. In addition, the cured film of the present invention is preferably a cured film obtained by the later-described production method of a cured film of the present invention.

An interlayer insulating film having excellent insulating property and even when baked at a high temperature, ensuring high transparency is obtained from the curable composition of the present invention. The interlayer insulating film formed using the curable composition of the present invention has high transparency and excellent cured film properties and therefore, is useful for the usage in an organic EL display device or a liquid crystal display device.

The cured film of the present invention can be suitably used as an optical member such as microlens, optical waveguide, antireflection film, LED encapsulant and LED chip coat material, or as a cured product for the reduction in visibility of wiring electrodes laid in a touch panel.

In addition, the cured film of the present invention can be suitably used, for example, as a flattening film or interlayer insulating film in a liquid crystal display device, an organic EL device, etc., a protective film of a color filter, a spacer for keeping constant the thickness of a liquid crystal layer in a liquid crystal display device, or a structural member of an MEMS (Micro Electro Mechanical Systems) device, which are described later.

[Production Method of Transparent Film (Cured Film)]

The production method of a transparent film of the present invention includes:

a step of coating the above-described curable composition on a wafer by a spray method, a roll coating method, a spin coating method, a bar coating method, etc., subsequently, a first heating step, and further subsequently, a second heating step at a higher temperature.

The conditions in the first heating step are the same as the conditions described later as the pre-baking conditions of the step (i) in the production method of a microlens.

The conditions in the second heating step are the same as the conditions described later as the post-baking conditions of the step (iv) in the production method of a microlens.

<Microlens>

The curable composition of the present invention can form a transparent film with high refractive index and high transmittance and therefore, can be very suitably used for the formation of, for example, a microlens or a microlens array.

That is, the curable composition of the present invention is preferably a composition for the formation of a microlens.

The present invention also relates to a microlens formed using a transparent film that is formed by using the curable composition of the present invention.

[Production Method of Microlens]

The method for producing a microlens by using the curable composition of the present invention is not particularly limited, and a commonly employed method can be applied. The method includes, for example, a method involving a step of post-baking and thereby shaping the above-described transparent film, and a dry etching step.

The step of post-baking and thereby shaping the transparent film is the same as that described in detail later regarding the step (f).

The dry etching step is the same as that described in detail later regarding the step (g).

One preferred embodiment of the method for producing a microlens by using the curable composition of the present invention includes a production method involving at least the following steps (i) to (iv):

(i) a step of forming a coating film of the curable composition of the present invention on a substrate, (ii) a step of irradiating at least a part of the coating film with radiation, (iii) a step of developing the coating film after the irradiation, and (iv) a step of heating the coating film after the development.

These steps are described below.

Step (i):

In this step, the curable composition is, preferably as a liquid composition, coated on the surface of a substrate, and the solvent is removed by pre-baking to form a coating film on the substrate.

The substrate includes, for example, a glass substrate, a silicon wafer, a substrate obtained by forming various metal layers on the surface of such a substrate, and a substrate coated with an on-chip color filter for image-sensors.

The coating method is not particularly limited and, for example, an appropriate method such as spray method, roll coating method, spin coating method and bar coating method may be employed.

The pre-baking conditions may vary depending on the kind, amount used, etc. of each component but are usually from 60 to 120° C. and approximately from 30 seconds to 15 minutes. The thickness of the coating film formed is, as a value after pre-baking, preferably approximately from 0.5 to 20 μm.

Step (ii):

In this step, at least a part of the formed coating film is irradiated with radiation.

At the time of irradiation of only a part of the coating film with radiation, the irradiation is performed through a mask having a predetermined pattern.

The radiation that can be used for irradiation includes, for example, an ultraviolet ray such as g-line and i-line, a far ultraviolet ray such as KrF excimer laser and ArF excimer laser, an X ray such as synchrotron radiation, and a charged particle beam such as electron beam. Among these, an ultraviolet ray is preferred.

The exposure dose can be appropriately selected according to the configuration, etc. of the curable composition but is preferably on the order of 50 $J/m^2$ to 2,000 $J/m^2$.

Step (iii):

In this step, the coating film after exposure is developed with a developer, preferably an alkaline developer, to remove the radiation-unirradiated portion and thereby form a pattern having a predetermined profile.

The alkali developer includes, for example, an aqueous alkaline solution of inorganic alkalis such as sodium hydroxide, potassium hydroxide, sodium carbonate, sodium silicate, sodium metasilicate and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, tetraalkylammonium hydroxides such as tetramethylammonium hydroxide, tetraethyl ammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide and dibutyldipentylammonium hydroxide, quaternary ammonium salts such as trimethylphenylammonium hydroxide, trimethylbenzylammonium hydroxide and triethylbenzylammonium hydroxide, and cyclic amines such as pyrrole and piperidine. One of these aqueous alkaline solutions may be used alone, or two or more thereof may be mixed and used. In addition, the alkali developer may be used after adding thereto a water-soluble organic solvent such as methanol or ethanol, a surfactant, or various organic solvents.

As the development method, an appropriate method, such as puddling, dipping, shaking immersion and showering, can be used. After the development with an alkaline developer, the coating film is usually washed, for example, with running water, etc.

The development time may vary depending on the configuration of the curable composition and the configuration of the developer but is usually on the order of 30 to 120 seconds at room temperature.

Step (iv):

In this step, the coating film after development is heated (post-baked) by means of a heating device such as hot plate or oven, whereby the coating film is cured.

In the post-baking, the heating temperature is usually from 120 to 250° C., preferably from 160 to 230° C. The heating time may vary depending on the heating unit, but in the case of heating on a hot plate, the heating time is usually approximately from 5 to 30 minutes, and in the case of heating in an oven, the heating time is usually approximately from 30 to 90 minutes.

At the time of post-baking, for example, a step baking method of heating the coating film two or more times may also be employed.

Another preferred embodiment of the method for producing a microlens by using the curable composition of the present invention includes a formation method involving at least the following steps (a) to (g):

(a) a step of forming a coated film on a base material such as color filter by using the curable composition of the present invention, (b) a step of obtaining a high-refractive-index film (transparent film) by at least either heating the coated film to dry (or dry and cure) the coated film or exposing the coated film to a light source (e.g., g-line, i-line) having an appropriate wavelength to cure the coated film, (c) a step of forming a resist coating film on the high-refractive-index film after the heating, (d) a step of exposing the resist coating film to a light source (e.g., g-line, i-line) having an appropriate wavelength, (e) a step of developing the resist coating film after the exposure to form a resist pattern, (f) a step of shaping the resist pattern in a lens shape by post-heating, (g) a step of applying dry etching to remove the resist pattern and a part of the high-refractive-index film, thereby shaping the high-refractive-index film in a lens shape.

These steps are described below.

—Step (a)—In this step, the curable composition of the present invention is coated on a base material such as color filter to form a coated film.

As for the coating method, the same methods as in the step (i) above are recited.

—Step (b)—

In this step, one preferred embodiment of the heating of the coated film includes a two-step heating treatment involving pre-baking and post-baking.

The pre-baking conditions may vary depending on the kind, amount used, etc. of each component but are usually from 60 to 120° C. and approximately from 30 seconds to 15 minutes. The thickness of the coating film formed is, as a value after pre-baking, preferably approximately from 0.5 to 20 μm. This pre-baking step is sometimes omitted.

Subsequently, the coated film is heated (post-baked) using a heating device such as hot plate or oven and is thereby cured. The post-baking conditions are usually from 120 to 300° C. and approximately from 30 seconds to 60 minutes. In this connection, the curing may be promoted by performing exposure before the post-baking step.

In the case of curing the coated film by exposure to a light source (e.g., g-line, line) having an appropriate wavelength, as for the radiation irradiated, the same radiation species and exposure dose as in the step (ii) above are referred to.

—Step (c)—

In this step, a resist coating film is formed on a high-refractive-index film. As the resist here, a resist commercially available in general and capable of forming a pattern by ultraviolet exposure can be used. The resist coating film is pre-baked, similarly to the step (a).

—Step (d)—

In this step, the coating film is patternwise exposed using a mask. As for the radiation irradiated, the same radiation species and exposure dose as in the step (ii) above are referred to.

—Step (e)—In this step, the resist coating film after exposure is developed with a developer, preferably an alkali developer, to remove the radiation-unirradiated portion or irradiated portion and thereby form a pattern having a predetermined profile.

As for the alkali developer, the same alkali developers as in the step (iii) above are recited.

As for the developing method, the same methods as the methods described above regarding the step (iii) are recited.

The development time is the same as that described above regarding the step (iii).

—Step (f)—

In this step, the resist after the pattern formation above is post-heated (post-baked) by means of a heating device such as hot plate or oven and is thereby deformed into a lens shape. The post-baking conditions are usually from 120 to 300° C. and approximately from 30 seconds to 60 minutes. In addition, for the deformation into a lens shape, for example, a step baking method of heating the resist two or more times may also be employed.

—Step (g)—

The dry etching can be carried out by a known method (for example, JP-A-2010-204154).

As the gas for dry etching, for example, the following etching gases are preferably used: $CF_4$, $CHF_3$, $SF_6$, $Cl_2$, $C_2F_6$, $C_4F_6$, $C_4F_8$, $C_5F_8$, $H_2$, $N_2$, and $NH_3$. One gas may be selected from these gases and used, or two or more gases may be used in combination. Among others, from the standpoint of maintaining the rectangularity of the etched portion, the fluorine-based gas is preferably at least one or more members selected from the group consisting of $CF_4$, $C_4F_6$, $C_2F_6$, $C_4F_8$ and $CHF_3$, more preferably $CF_4$ or $C_4F_6$, and most preferably a mixed gas of $CF_4$ and $C_4F_6$.

In addition, from the standpoint of maintaining the partial pressure control stability of etching plasma and the perpendicularity of etched profile, the mixed gas used for dry etching preferably contains another gas, in addition to the above-described fluorine-based gas and oxygen gas. As the another gas, it is preferable to contain at least one gas selected from the group consisting of a rare gas such as helium (He), neon (Ne), argon (Ar), krypton (Kr) and xenon (Xe), a halogen-based gas containing a halogen atom such as chlorine atom, fluorine atom and bromine atom (e.g., $CCl_4$, $CClF_3$, $AlF_3$, $AlCl_3$), $N_2$, CO and $CO_2$; it is more preferable to contain at least one gas selected from the group consisting of He, Ar, Kr, $N_2$ and Xe; and it is still more preferable to contain at least one gas selected from the group consisting of He, Ar and Xe.

In the case where the partial pressure control stability of etching plasma and the perpendicularity of etched profile can be maintained, the mixed gas used for dry etching may be a mixed gas composed of only a fluorine-based gas and an oxygen gas.

In this way, the desired microlens can be produced.

According to the production method of a microlens of the present invention, a high-definition microlens and a microlens array each having excellent characteristics (for example, a high refractive index and a high transmittance) can be easily formed at a high product yield.

<Undercoat Film of Color Filter>

The curable composition of the present invention can also be used as an undercoat film of a color filter. The curable composition of the present invention can form a transparent and flat coating film and therefore, may be suitably used as an undercoat film.

That is, it is also preferred that the curable composition of the present invention is used for the formation of an undercoat film of a color filter.

The undercoat film is preferably an undercoat film of a color filter formed through the following steps:

(i') a step of forming a coated film on a substrate having formed thereon a device, by using the curable composition of the present invention, (ii') a step of heating the coated film and thereby drying (or drying and curing) the coated film to obtain a transparent film, and (iii') a step of forming a color filter on the transparent film by a known method. The formation of the coated film and transparent film can be performed according to the method described above in <Microlens>.

In the present invention, the microlens and the undercoat film of a color filter are fowled of the curable composition of the present invention and excellent in the balance of characteristics and therefore, can be very suitably used for, e.g., various OA devices, a liquid crystal display device such as liquid crystal television, cellular phone and projector, an imaging optical system of an on-chip color filter in facsimiles, electronic copiers, solid-state imaging devices, etc., and an optical fiber connector.

<Solid-Stage Imaging Device>

The solid-state imaging device of the present invention is characterized by having a microlens formed using the above-described curable composition of the present invention.

The solid-state imaging device of the present invention is provided with a microlens having a high refractive index and a high transmittance and therefore, can reduce the noise and exhibit excellent color reproducibility.

The solid-state imaging device of the present invention has a configuration where a microlens formed using the curable composition of the present invention is provided, and the configuration is not particularly limited as long as it functions as a solid-stage imaging device. The configuration includes, for example, a configuration having, on a substrate, a plurality of photodiodes constituting the light-receiving area of a solid-state imaging device (e.g., a CCD image sensor, a CMOS image sensor) and a light-receiving element composed of polysilicon, etc., in which the above-described undercoat film is provided below a color filter; and a configuration in which the above-described microlens is provided on a color filter.

The method for manufacturing the solid-state imaging device of the present invention is not particularly limited, but in one preferred embodiment, the method includes:

a step of forming a red pixel, a blue pixel and a green pixel on a solid-state imaging device substrate having thereon at least a photodiode, a light-shielding film and a device protective film, a step of coating and heating the above-described curable composition, a step of forming a resist pattern, a step of applying a post-baking treatment, thereby shaping the formed resist pattern in a lens shape, and a dry etching step.

The step of coating and heating the curable composition is the same as the step of forming a coated film on a base material and the step of heating the coated film to dry (or dry and cure) the coated film in the step (a) and step (b) in the production method of a microlens.

The step of forming a resist pattern is the same as the step (d) and step (e) in the production method of a microlens.

The step of applying a post-baking treatment, thereby shaping the formed resist pattern in a lens shape, is the same as the step (f) in the production method of a microlens.

The dry etching step is the same as the step (g) in the production method of a microlens.

<Liquid Crystal Display Device>

The liquid crystal display device of the present invention is characterized by having the above-described cured film of the present invention.

The liquid crystal display device of the present invention is not particularly limited except for having a flattening film or interlayer insulating film formed using the curable composition of the present invention, and the liquid crystal display device includes known liquid crystal display devices taking various structures.

Specific examples of TFT (Thin-Film Transistor) used for the liquid crystal display device of the present invention include amorphous silicon-TFT, low temperature polysilicon-TFT, and oxide semiconductor TFT. The cured film of the present invention is excellent in the electrical characteristics and therefore, can be suitably used in combination with such TFT.

The liquid crystal drive mode that may be taken by the liquid crystal display device of the present invention includes TN (Twisted Nematic) mode, VA (Vertical Alignment) mode, IPS (In-Place-Switching) mode, FFS (Fringe Field Switching) mode, OCB (Optical Compensated Bend) mode, etc.

In a panel configuration, the cured film of the present invention can be used even in a COA (Color Filter on Allay)-mode liquid crystal display device and may be used, for example, as an organic insulating film (115) described in JP-A-2005-284291 or an organic insulating film (212) described in JP-A-2005-346054.

The alignment method for the liquid crystal orientation film that may be employed in the liquid crystal display device of the present invention specifically includes rubbing alignment, photo-alignment, etc. Furthermore, a polymer alignment support may also be formed by the PSA (Polymer Sustained Alignment) technique described in JP-A-2003-149647 or JP-A-2011-257734.

FIG. 1 is a conceptual cross-sectional view depicting one example of the liquid crystal display device 10 of an active matrix system. The color liquid crystal display device 10 is a liquid crystal panel having a backlight unit 12 on the back surface, and the liquid crystal panel has TFT 16 elements arranged to correspond to all pixels disposed between two glass substrates 14 and 15 to which a polarizing film is laminated. In each element formed on the glass substrate, an ITO transparent electrode 19 forming a pixel electrode is wired through a contact hole 18 formed in a cured film 17. An RGB color filter 22 having arranged therein a liquid crystal 20 layer and a black matrix is provided on the ITO transparent electrode 19.

The light source for backlight is not particularly limited, and a known light source may be used. Examples thereof include a white LED, a multicolor LED such as blue, red and green, a fluorescent lamp (cold cathode tube), and an organic EL.

The liquid crystal display device may also be of a 3D (stereovision) type or a touch panel type. Furthermore, the liquid crystal display device may be of a flexible type, and the cured film can be used as a second interphase insulating film (48) described in JPA-2011-145686 or an interphase insulating film (520) described in JP-A-2009-258758.

<Organic EL Display Device>

The organic EL display device of the present invention is characterized by having the above-described cured film of the present invention.

The organic EL display device of the present invention is not particularly limited except for having a flattening film or interlayer insulating film formed using the curable composition of the present invention, and the display device includes known various organic EL display devices or liquid crystal display devices taking various structures.

Specific examples of TFT (Thin-Film Transistor) used for the organic EL display device of the present invention include amorphous silicon-TFT, low temperature polysilicon-TFT, and oxide semiconductor TFT. The cured film of the present invention is excellent in the electrical characteristics and therefore, can be suitably used in combination with such TFT.

Figure 2:
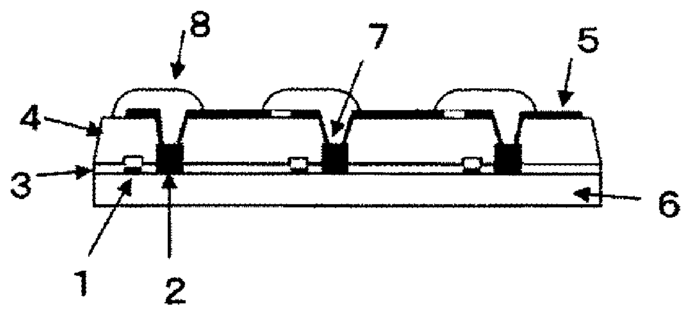
FIG. 2 is a conceptual view of the configuration in one example of the organic EL display device.

FIG. 2 is a conceptual view of the configuration in one example of the organic EL display device. A schematic cross-sectional view of the substrate in a bottom emission-type organic EL display device is depicted, and the substrate has a flattening film 4.

A bottom gate-type TFT 1 is formed on a glass substrate 6, and an insulating film 3 composed of $Si_3N_4$ is formed to cover the TFT 1. A contact hole not shown is formed in the insulating film 3 and thereafter, a wiring 2 (height: 1.0 μm) to be connected to TFT 1 through the contact hole is formed on the insulating film 3. The wiring 2 is formed to connect between TFTs 1 or connect an organic EL element formed in the later step and TFT 1.

Furthermore, for flattening the unevenness due to formation of the wiring 2, a flattening layer 4 is formed on the insulating film 3 to bury the unevenness caused by the wiring 2.

A bottom emission-type organic EL element is formed on the flattening film 4. That is, on the flattening film 4, a first electrode 5 composed of ITO is formed to connect with the wiring 2 though the contact hole 7. The first electrode 5 corresponds to the anode of an organic EL element.

An insulating film 8 in the form of covering the marginal edge of the first electrode 5 is formed, and by providing this insulating film 8, a short circuit between the first electrode 5 and a second electrode formed in the following step can be prevented.

Furthermore, although not depicted in FIG. 2, a hole transport layer, an organic light-emitting layer, and an electron transport layer are sequentially provided by vapor deposition through a desired pattern mask, a second electrode composed of Al is formed throughout the surface above the substrate, and these are laminated with a sealing glass plate by using an ultraviolet-curable epoxy resin and thereby encapsulated to obtain an active matrix-type organic EL display device in which each organic EL element is connected with TFT 1 for driving the element.

The curable composition of the present invention is excellent in the curability and cured film properties and therefore, is used as a structural member of an MEMS device by allowing a resist pattern formed using the curable composition of the present invention to be incorporated as a partition wall or a part of mechanical drive components. The MEMS device includes, for example, a SAW (surface acoustic wave) filter, a BAW (bulk acoustic wave) filter, and a part of gyrosensors, microshutters for display, image sensors, electronic papers, inkjet heads, biochips, sealants, etc. More specific examples are illustrated in JP-T-2007-522531, JP-A-2008-250200, JP-A-2009-263544, etc.

Figure 3:
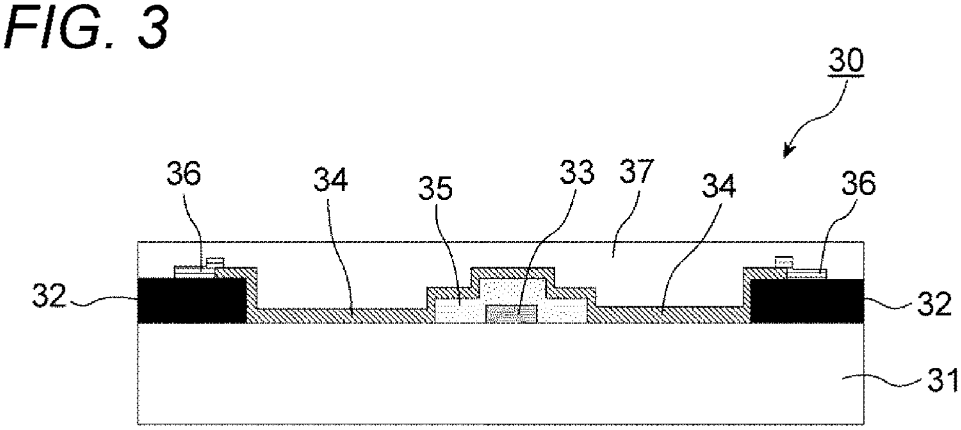
FIG. 3 is a cross-sectional view depicting the configuration of a capacitance-type input device.

The curable composition of the present invention is excellent in the flatness and transparency and therefore, can also be used for the formation of a bank layer (16) and a flattening film (57) depicted in FIG. 2 of JP-A-2011-107476, a partition wall (12) and a flattening film (102) depicted in FIG. 4(a) of JP-A-2010-9793, a bank layer (221) and a third interlayer insulating film (216b) depicted in FIG. 10 of JP-A-2010-27591, a second interlayer-insulating layer (125) and a third interlayer insulating film (126) depicted in FIG. 4(a) of JP-A-2009-128577, a flattening film (12) and a pixel separation insulating film (14) depicted in FIG. 3 of JP-A-2010-182638, etc.

<Touch Panel Display Device>

The touch panel display device of the present invention is equipped with a capacitance-type input device having the cured film of the present invention. Also, the capacitance-type input device of the present invention is characterized by having the cured film of the present invention.

The capacitance-type input device of the present invention of the present invention has a front plate and, on the non-contact side of the front plate, at least the following elements (1) to (5), where (4) is preferably the cured product of the present invention:

(1) a mask layer (2) a plurality of first transparent electrode patterns having a plurality of pad portions that are formed to extend in a first direction through connecting portions, (3) a plurality of second transparent electrode patterns electrically insulated from the first transparent electrode pattern and composed of a plurality of pad portions that are formed to extend in a direction intersecting the first direction, (4) an insulating layer electrically insulating the first transparent electrode pattern and the second transparent electrode pattern, and (5) an electroconductive element that is electrically connected to at least either one of the first transparent electrode pattern and the second transparent electrode pattern and different from the first transparent electrode pattern and the second transparent electrode pattern.

In the capacitance-type input device of the present invention, it is preferred that a transparent protective film is further provided to cover all or a part of the elements (1) to (5), and it is more preferred that the transparent protective film is the cured film of the present invention.

First, the configuration of the capacitance-type input device is described. FIG. 3 is a cross-sectional view depicting the configuration of a capacitance-type input device. In FIG. 3, the capacitance-type input device 30 consists of a front plate 31, a mask layer 32, a first transparent electrode pattern 33, a second transparent electrode pattern 34, an insulating layer 35, an electroconductive element 36, and a transparent protective layer 37.

The front plate 31 is composed of a light-transmitting substrate such as glass substrate, and, for example, toughened glass represented by Gorilla Glass of Corning Inc. may be used. In FIG. 3, the side of the front plate 31, where respective elements are provided, is referred to as a non-contact surface. In the capacitance-type input device 30 of the present invention, input is performed by touching the contact surface (the surface opposite the non-contact surface) of the front plate 31 with a finger, etc. Hereinafter, the front plate is sometimes referred to as "base material".

The mask layer 32 is provided on the non-contact surface of the front plate 31. The mask layer 32 is in a flame pattern surrounding the display region formed on the non-contact surface of the front plate of the touch panel and is formed to hide a routed wiring, etc.

Figure 4:
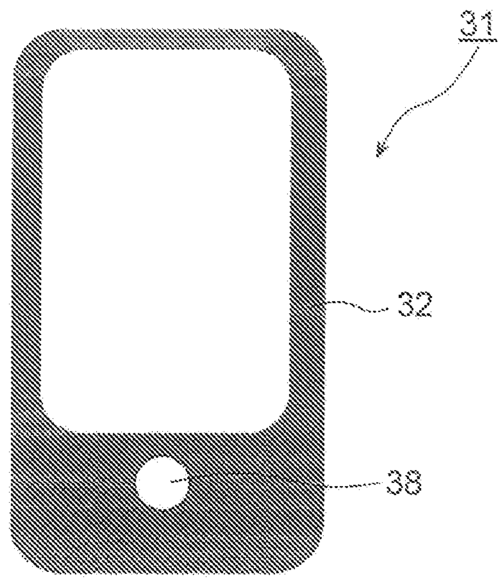
FIG. 4 is a schematic view depicting the configuration of a capacitance-type input device.

In the capacitance-type input device of the present invention, as shown in FIG. 4, the mask layer 32 is formed to cover a partial region of the front plate 31 (in FIG. 4, the region other than the input surface). Furthermore, as shown in FIG. 4, an opening 38 may be provided in a part of the front plate 31. A mechanical push switch may be provided in the opening 38.

Figure 5:
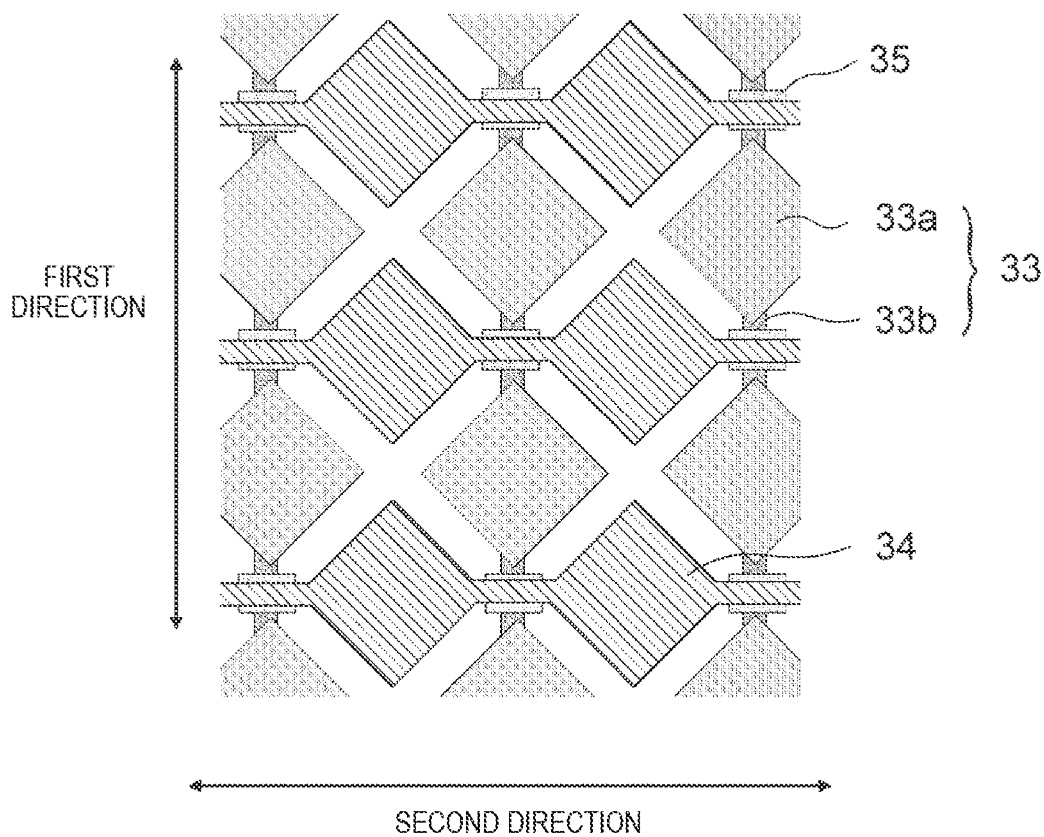
FIG. 5 is an explanatory view depicting one example of the first transparent electrode pattern and the second transparent electrode pattern in the present invention.

As shown in FIG. 5, on the contact surface of the front plate 31, a plurality of first transparent electrode patterns 33 having a plurality of pad portions that are formed to extend in a first direction through connecting portions, a plurality of second transparent electrode patterns 34 electrically insulated from the first transparent electrode pattern 33 and composed of a plurality of pad portions that are formed to extend in a direction intersecting the first direction, and an insulating layer 35 electrically insulating the first transparent electrode pattern 33 and the second transparent electrode pattern 34, are formed. The first transparent electrode pattern 33, the second transparent electrode pattern 34 and the later-described electroconductive element 36 may be produced using a light-transmitting electroconductive metal oxide film such as ITO (Indium Tin Oxide) and IZO (Indium Zinc Oxide). Such a metal film includes, for example, an ITO film; a metal film such as Al, Zn, Cu, Fe, Ni, Cr and Mo; and a metal oxide film such as $SiO_2$. At this time, the film thickness of each element may be from 10 to 200 nm. In addition, an amorphous ITO film is converted to a polycrystalline ITO film by firing and therefore, it is also possible to reduce the electric resistance. The first transparent electrode pattern 33, the second transparent electrode pattern 34, and the later-described electroconductive element 36 may also be produced using a photocurable transfer material having a photocurable composition using the above-described electroconductive fiber. In the case of forming, for example, the first transparent electrode pattern from ITO, etc., reference may be made to paragraphs [0014] to [0016] of Japanese Patent No. 4,506,785.

At least either one of the first transparent electrode pattern 33 and the second transparent electrode pattern 34 may be provided over both regions, i.e., the non-contact surface of the front plate 31 and the mask layer 32 surface opposite the front plate 31. In FIG. 3, a configuration where the second transparent electrode pattern is provided over both regions, i.e., the non-contact surface of the front plate 31 and the mask layer 32 surface opposite the front plate 31, is depicted.

The first transparent electrode pattern 33 and the second transparent electrode pattern 34 are described below by referring to FIG. 5. FIG. 5 is an explanatory view depicting one example of the first transparent electrode pattern and the second transparent electrode pattern in the present invention. As shown in FIG. 5, in the first transparent electrode pattern 33, pad portions 33*a* are formed to extend in a first direction through connecting portions 33*b*. The second transparent electrode pattern 34 is electrically insulated from the first transparent electrode pattern 33 by an insulating layer 35 and composed of a plurality of pad portions that are formed to extend in a direction intersecting the first direction (a second direction in FIG. 5). In the case of forming the first transparent electrode pattern 33, the pad portion 33*a* and the connecting portion 33*b* may be integrally produced, or after producing only the connecting portion 33*b*, the pad portion 33*a* and the second transparent electrode pattern 34 may be integrally produced (patterned). In the case of integrally producing (patterning) the pad portion 33*a* and the second transparent electrode pattern 34, respective layers are formed such that, as shown in FIG. 5, a part of the connecting portion 33*b* and a part of the pad portion 33*a* are connected and at the same time, the first transparent electrode pattern 33 and the second transparent electrode pattern 34 are electrically insulated by the insulating layer 35.

In FIG. 3, an electroconductive element 36 is provided on the mask layer 32 surface opposite the front plate 31. The electroconductive element 36 is an element electrically connected to at least either one of the first transparent electrode pattern 33 and the second transparent electrode pattern 34 and at the same time, different from the first transparent electrode pattern 33 and the second transparent electrode pattern 34. In FIG. 3, a configuration where the electroconductive element 36 is connected to the second transparent electrode pattern 34 is depicted.

Furthermore, in FIG. 3, a transparent protective layer 37 is provided to cover all of the constituent elements. The transparent protective layer 37 may be configured to cover only a part of the constituent elements. The insulating layer 35 and the transparent protective layer 37 may be formed of the same material or different materials.

<Capacitance-Type Input Device and Touch Panel Display Device Having Capacitance-Type Input Device>

With regard to the capacitance-type input device obtained by the production method of the present invention and the touch panel display device having the capacitance-type input device as a constituent element, the configurations disclosed, for example, in *Saishin Touch Panel Gijutsu* (*Newest Touch Panel Technology*), published by Techno Times, Jul. 6, 2009; Yuji Mitani (supervisor), *Touch Panel no Gijutsu to Kaihatsu* (*Technology and Development of Touch Panels*), CMC Publishing Co., Ltd., December 2004; and textbook for lecture in FPD International 2009 Forum T-11, Cypress Semiconductor Corporation, Application Note AN2292, may be applied.

EXAMPLES

The present invention is described in greater detail below by referring to Examples, but the present invention is not limited to these Examples. Unless otherwise indicated, the "parts" and "%" are on the mass basis.

In Examples, the acid value was determined by a potentiometric method (solvent: tetrahydrofuran/water =54/6 (by volume), titrant: an aqueous 0.1 N sodium hydroxide solution (acid value)).

In the following, the measurement of the weight average molecular weight was performed by directly connecting HPC-8220GPC (manufactured by Tosoh Corp.), guard column: TSKguardcolumn SuperHZ-L, column: TSKgel SuperHZM-M, TSKgel SuperHZ4000, TSKgel SuperHZ3000, and TSKgel SuperHZ2000, injecting 10 μl of a tetrahydrofuran solution with a sample concentration of 0.1 mass % at a column temperature of 40° C., flowing tetrahydrofuran as the eluting solvent at a flow rate of 0.35 ml per minute, and detecting the sample peak by an $R^1$ detector. The weight average molecular weight was calculated using a calibration curve prepared by use of standard polystyrene.

Synthesis Example 1

Synthesis of Polymer Compound (C-1)

Polymer Compound (C-1) was synthesized in accordance with the synthesis method described in JP-A-2007-277514, paragraphs 0266 to 0348 (in the corresponding U.S. Patent Application Publication No. 2010/233595, paragraphs 0289 to 0429). Specifically, the compound was synthesized as follows.

100 Parts of dipentaerythritol hexakis(3-mercaptopropionate) [(33): produced by Sakai Chemical Industry Co., Ltd.] and 91.38 parts of Compound (A-3) shown below having an adsorption moiety and having a carbon-carbon double bond were dissolved in 446.6 parts of 1-methoxy-2-propanol, and this solution was heated at 90° C. in a nitrogen stream. The charge ratio here was 1.0:5.5 by mol.

0.81 Parts of dimethyl 2,2'-azobis(2-methylpropionate) [V-601, produced by Wako Pure Chemical Industries, Ltd.] was added thereto, and this mixture was heated for 2 hours. Furthermore, 0.81 parts of V-601 was added, and the reaction was allowed to proceed at 90° C. for 2 hours in a nitrogen stream. The reaction solution was cooled to room temperature (25° C.), thereby obtaining a 30 mass % solution of Mercaptan Compound (B-1) where a part of sulfur atoms of Compound (33) were added to Compound (A-3).

[Chem. 40]

B-1

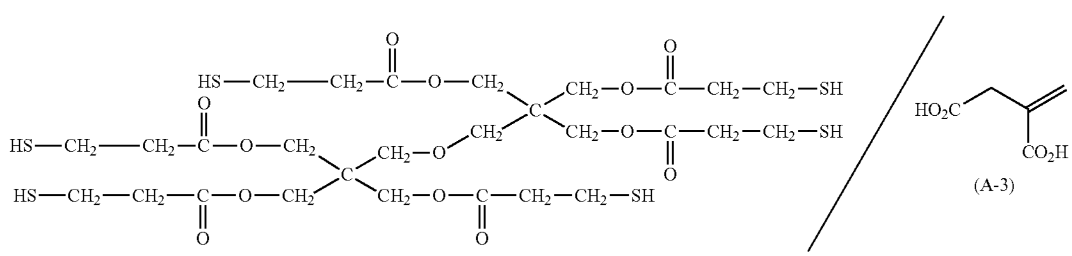

(33) (A-3)

A mixed solution containing 499.57 parts of the 30 mass % solution of Mercaptan Compound (B-1) and 100.13 parts of Methyl Methacrylate (M-1) was heated at 90° C. in a nitrogen stream. A solution prepared by dissolving 0.681 parts of dimethyl 2,2'-azobis(2-methylpropionate) [V-601, produced by Wako Pure Chemical Industries, Ltd.] in 72.73 parts of propylene glycol 1-monomethyl ether 2-acetate was added dropwise thereto over 2 hours, and the resulting solution was heated at 90° C. for 2 hours. Furthermore, 0.230 parts of V-601 was added, followed by reaction at 90° C. for 2 hours in a nitrogen steam, and 0.230 parts of V-601 was again added, followed by reaction at 90° C. for 2 hours in a nitrogen stream. Thereafter, 160.9 parts of propylene glycol 1-monomethyl ether 2-acetate was added, and the reaction solution was cooled to room temperature, thereby obtaining a 30 mass % solution of the polymer compound shown below (C-1: weight average molecular weight in terms of polystyrene: 3,300, acid value: 241 mgKOH/g).

[Chem. 41]

(C-1)

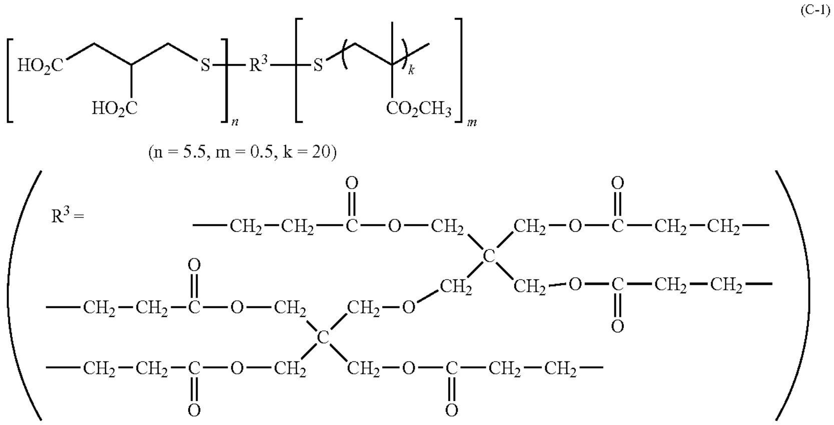

Synthesis Example 2

Synthesis of Polymer Compound (C-34)

Polymer Compound (C-34) was synthesized in accordance with the synthesis method described in JP-A-2007-277514, paragraphs 0266 to 0348 (in the corresponding U.S. Patent Application Publication No. 2010/233595, paragraphs 0289 to 0429). Specifically, the compound was synthesized as follows.

65.0 Parts of dipentaerythritol hexakis(3-mercaptopropionate) [(33): produced by Sakai Chemical Industry Co., Ltd.], 44.5 parts of Compound (A-16) shown below, and 27.0 parts of Compound (A-3) shown below, which are a compound having an adsorption moiety and having a carbon-carbon double bond, were dissolved in 318.4 parts of 1-methoxy-2-propanol, and this solution was heated at 90° C. in a nitrogen stream. The charge ratio of (33), (A-16) and (A-3) here was 1.0:2.5:2.5 by mol.

0.478 Parts of dimethyl 2,2'-azobis(2-methylpropionate) [V-601, produced by Wako Pure Chemical Industries, Ltd.] was added thereto, and this mixture was heated for 2 hours. Furthermore, 0.478 parts of V-601 was added, and the reaction was allowed to proceed at 90° C. for 2 hours in a nitrogen stream. The reaction solution was cooled to room temperature, thereby obtaining a 30 mass % solution of Mercaptan Compound (B-34) where a part of sulfur atoms of Compound (33) were added to Compounds (A-3) and (A-16).

[Chem. 42]

B-34

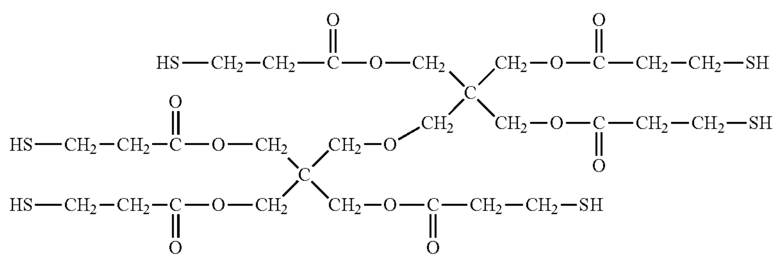

(33)

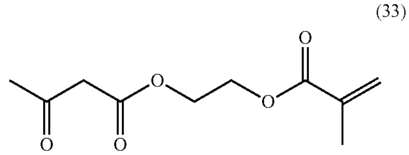

(A-16)

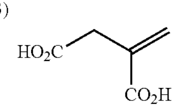

(A-3)

A mixed solution containing 150.3 parts of the 30 mass % solution of Mercaptan Compound (B-34) and 54.9 parts of Methyl Methacrylate (M-1) was heated at 90° C. in a nitrogen stream. A solution prepared by dissolving 0.379 parts of dimethyl 2,2'-azobis(2-methylpropionate) [V-601, produced by Wako Pure Chemical Industries, Ltd.] in 39.9 parts of propylene glycol 1-monomethyl ether 2-acetate was added dropwise thereto over 2 hours, and the resulting solution was heated at 90° C. for 2 hours. Furthermore, 0.126 parts of V-601 was added, followed by reaction at 90° C. for 2 hours in a nitrogen stream, and 0.126 parts of V-601 was again added, followed by reaction at 90° C. for 2 hours in a nitrogen stream. Thereafter, 88.3 parts of propylene glycol 1-monomethyl ether 2-acetate was added, and the reaction solution was cooled to room temperature, thereby obtaining a 30 mass % solution of the polymer compound shown below (C-34: weight average molecular weight in terms of polystyrene: 4,400, acid value: 77 mgKOH/g).

[Chem. 43]

(C-34)

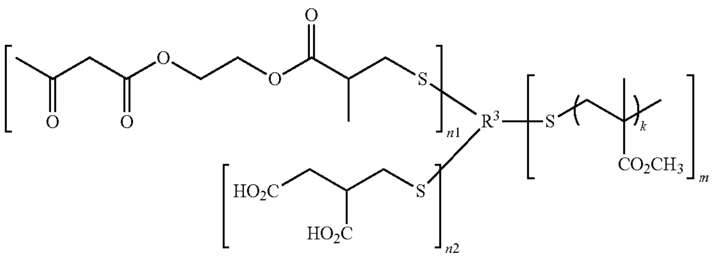

(n1 + n2 = 5, m = 1, k = 20, n1/n2 = 1/1)

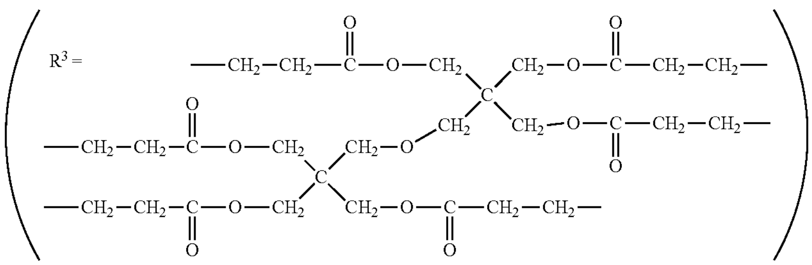

Synthesis Example 3

Synthesis of Polymer Compound (C-35)

Polymer Compound (C-35) was synthesized in accordance with the synthesis method described in JP-A-2007-277514, paragraphs 0266 to 0348 (in the corresponding U.S. Patent Application Publication No. 2010/233595, paragraphs 0289 to 0429). Specifically, the compound was synthesized as follows.

70.0 Parts of dipentaerythritol hexakis(3-mercaptopropionate) [(33): produced by Sakai Chemical Industry Co., Ltd.], 19.2 parts of Compound (A-16) shown below, and 46.5 parts of Compound (A-3) shown below, which are a compound having an adsorption moiety and having a carbon-carbon double bond, were dissolved in 316.6 parts of 1-methoxy-2-propanol, and this solution was heated at 90° C. in a nitrogen stream. The charge ratio of (33), (A-16) and (A-3) here was 1.0:1.0:4.0 by mol.

0.515 Parts of dimethyl 2,2'-azobis(2-methylpropionate) [V-601, produced by Wako Pure Chemical Industries, Ltd.] was added thereto, and this mixture was heated for 2 hours. Furthermore, 0.515 parts of V-601 was added, and the reaction was allowed to proceed at 90° C. for 2 hours in a nitrogen stream. The reaction solution was cooled to room temperature, thereby obtaining a 30 mass % solution of Mercaptan Compound (B-35) where a part of sulfur atoms of Compound (33) were added to Compounds (A-3) and (A-16).

[Chem. 43]

B-35

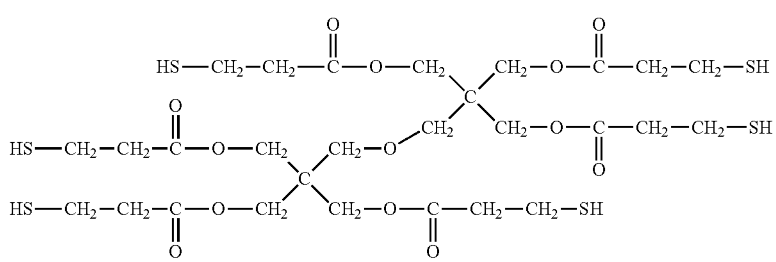

(33)

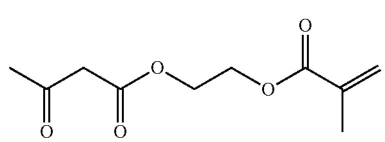

(A-16)

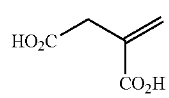

(A-3)

A mixed solution containing 143.7 parts of the 30 mass % solution of Mercaptan Compound (B-35) and 56.9 parts of Methyl Methacrylate (M-1) was heated at 90° C. in a nitrogen stream. A solution prepared by dissolving 0.392 parts of dimethyl 2,2'-azobis(2-methylpropionate) [V-601, produced by Wako Pure Chemical Industries, Ltd.] in 41.3 parts of propylene glycol 1-monomethyl ether 2-acetate was added dropwise thereto over 2 hours, and the resulting solution was heated at 90° C. for 2 hours. Furthermore, 0.131 parts of V-601 was added, followed by reaction at 90° C. for 2 hours in a nitrogen stream, and 0.131 parts of V-601 was again added, followed by reaction at 90° C. for 2 hours in a nitrogen stream. Thereafter, 91.4 parts of propylene glycol 1-monomethyl ether 2-acetate was added, and the reaction solution was cooled to room temperature, thereby obtaining a 30 mass % solution of the polymer compound shown below (C-35: weight average molecular weight in terms of polystyrene: 4,500, acid value: 128 mgKOH/g).

[Chem. 45]

(C-35)

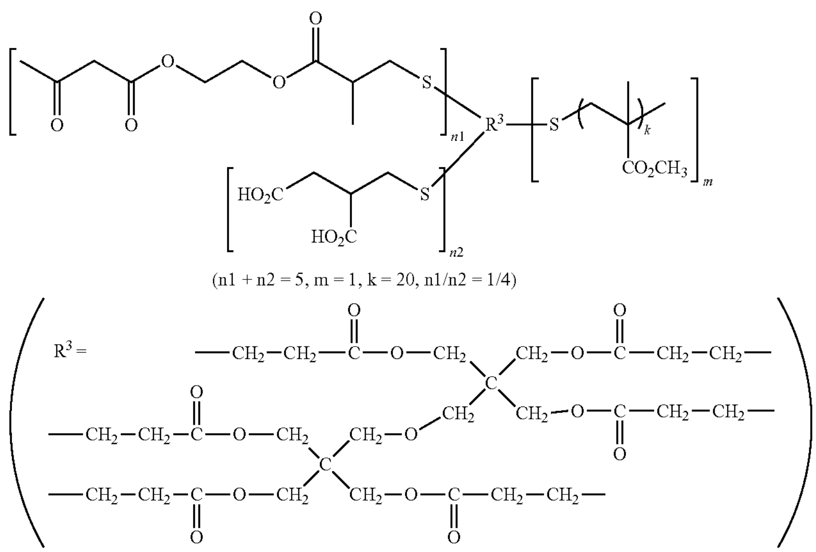

Synthesis Example 4

Synthesis of Polymer Compound (C-36)

Polymer Compound (C-36) was synthesized in accordance with the synthesis method described in JP-A-2007-277514, paragraphs 0266 to 0348 (in the corresponding U.S. Patent Application Publication No. 2010/233595, paragraphs 0289 to 0429). Specifically, the compound was synthesized as follows.

65.0 Parts of dipentaerythritol hexakis(3-mercaptopropionate) [(33): produced by Sakai Chemical Industry Co., Ltd.], 44.5 parts of Compound (A-17) shown below, and 27.0 parts of Compound (A-3) shown below, which are a compound having an adsorption moiety and having a carbon-carbon double bond, were dissolved in 318.4 parts of 1-methoxy-2-propanol, and this solution was heated at 90° C. in a nitrogen stream. The charge ratio of (33), (A-17) and (A-3) here was 1.0:2.5:2.5 by mol.

0.478 Parts of dimethyl 2,2'-azobis(2-methylpropionate) [V-601, produced by Wako Pure Chemical Industries, Ltd.] was added thereto, and this mixture was heated for 2 hours. Furthermore, 0.478 parts of V-601 was added, and the reaction was allowed to proceed at 90° C. for 2 hours in a nitrogen stream. The reaction solution was cooled to room temperature, thereby obtaining a 30 mass % solution of Mercaptan Compound (B-36) where a part of sulfur atoms of Compound (33) were added to Compounds (A-3) and (A-17).

[Chem. 46]

B-36

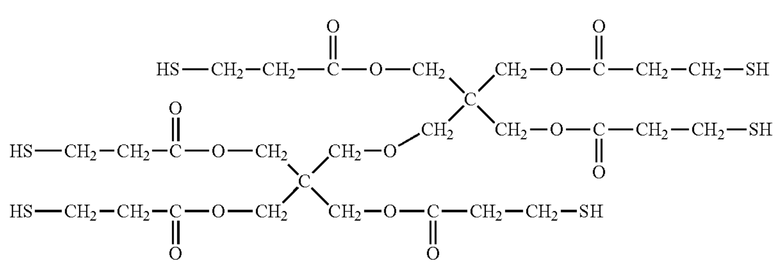

(33)

-continued

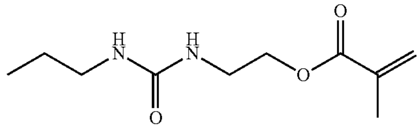

(A-17)

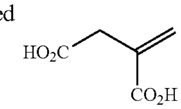

(A-3)

A mixed solution containing 150.3 parts of the 30 mass % solution of Mercaptan Compound (B-36) and 54.9 parts of Methyl Methacrylate (M-1) was heated at 90° C. in a nitrogen stream. A solution prepared by dissolving 0.379 parts of dimethyl 2,2'-azobis(2-methylpropionate) [V-601, produced by Wako Pure Chemical Industries, Ltd.] in 39.9 parts of propylene glycol 1-monomethyl ether 2-acetate was added dropwise thereto over 2 hours, and the resulting solution was heated at 90° C. for 2 hours. Furthermore, 0.126 parts of V-601 was added, followed by reaction at 90° C. for 2 hours in a nitrogen stream, and 0.126 parts of V-601 was again added, followed by reaction at 90° C. for 2 hours in a nitrogen stream. Thereafter, 88.3 parts of propylene glycol 1-monomethyl ether 2-acetate was added, and the reaction solution was cooled to room temperature, thereby obtaining a 30 mass % solution of the polymer compound shown below (C-36: weight average molecular weight in terms of polystyrene: 4,300, acid value: 77 mgKOH/g).

[Chem. 47]

(C-36)

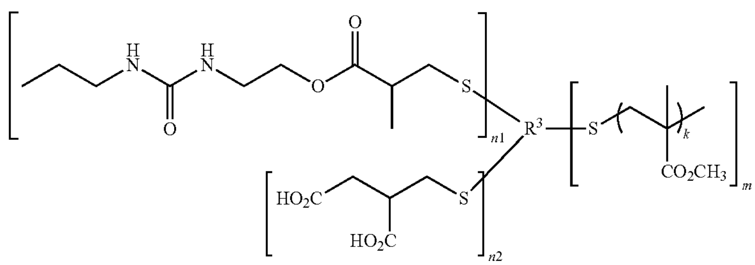

(n1 + n2 = 5, m = 1, k = 20, n1/n2 = 1/1)

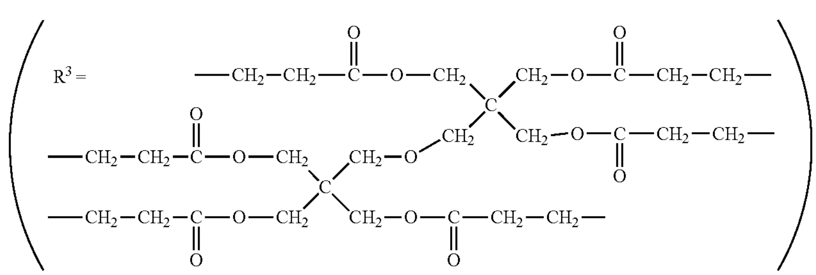

Synthesis Example 5

Synthesis of Polymer Compound (C-37)

Polymer Compound (C-37) was synthesized in accordance with the synthesis method described in JP-A-2007-277514, paragraphs 0266 to 0348 (in the corresponding U.S. Patent Application Publication No. 2010/233595, paragraphs 0289 to 0429). Specifically, the compound was synthesized as follows.

70.0 Parts of dipentaerythritol hexakis(3-mercaptopropionate) [(33): produced by Sakai Chemical Industry Co., Ltd.], 19.2 parts of Compound (A-17) shown below, and 46.5 parts of Compound (A-3) shown below, which are a compound having an adsorption moiety and having a carbon-carbon double bond, were dissolved in 316.6 parts of 1-methoxy-2-propanol, and this solution was heated at 90° C. in a nitrogen stream. The charge ratio of (33), (A-17) and (A-3) here was 1.0:1.0:4.0 by mol.

0.515 Parts of dimethyl 2,2'-azobis(2-methylpropionate) [V-601, produced by Wako Pure Chemical Industries, Ltd.] was added thereto, and this mixture was heated for 2 hours. Furthermore, 0.515 parts of V-601 was added, and the reaction was allowed to proceed at 90° C. for 2 hours in a nitrogen stream. The reaction solution was cooled to room temperature, thereby obtaining a 30 mass % solution of Mercaptan Compound (B-37) where a part of sulfur atoms of Compound (33) were added to Compounds (A-3) and (A-17).

[Chem. 48]

B-37

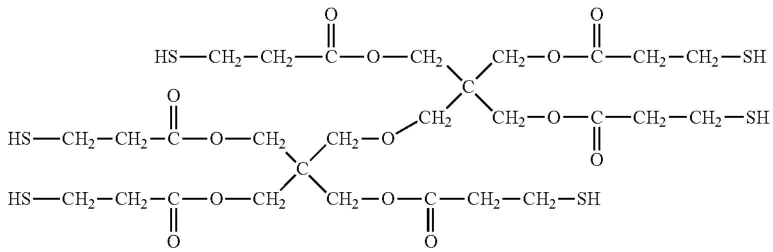

(33)

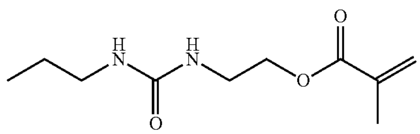

(A-17)

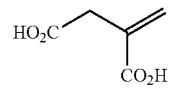

(A-3)

A mixed solution containing 143.7 parts of the 30 mass % solution of Mercaptan Compound (B-37) and 56.9 parts of Methyl Methacrylate (M-1) was heated at 90° C. in a nitrogen stream. A solution prepared by dissolving 0.392 parts of dimethyl 2,2'-azobis(2-methylpropionate) [V-601, produced by Wako Pure Chemical Industries, Ltd.] in 41.3 parts of propylene glycol 1-monomethyl ether 2-acetate was added dropwise thereto over 2 hours, and the resulting solution was heated at 90° C. for 2 hours. Furthermore, 0.131 parts of V-601 was added, followed by reaction at 90° C. for 2 hours in a nitrogen stream, and 0.131 parts of V-601 was again added, followed by reaction at 90° C. for 2 hours in a nitrogen stream. Thereafter, 91.4 parts of propylene glycol 1-monomethyl ether 2-acetate was added, and the reaction solution was cooled to room temperature, thereby obtaining a 30 mass % solution of the polymer compound shown below (C-37: weight average molecular weight in terms of polystyrene: 5,500, acid value: 127 mgKOH/g).

Synthesis Example 6

Synthesis of Polymer Compound (C-62)

Polymer Compound (C-62) was synthesized in accordance with the synthesis method described in JP-A-2007-277514, paragraphs 0266 to 0348 (in the corresponding U.S. Patent Application Publication No. 2010/233595, paragraphs 0289 to 0429). Specifically, the compound was synthesized as follows.

70.0 Parts of dipentaerythritol hexakis(3-mercaptopropionate) [(33): produced by Sakai Chemical Industry Co., Ltd.], 17.7 parts of Compound (A-23) shown below, and 46.5 parts of Compound (A-3) shown below, which are a compound having an adsorption moiety and having a carbon-carbon double bond, were dissolved in 313.2 parts of 1-methoxy-2-propanol, and this solution was heated at 90° C. in a nitrogen stream. The charge ratio of (33), (A-23) and (A-3) here was 1.0:1.0:4.0 by mol.

[Chem. 49]

(C-37)

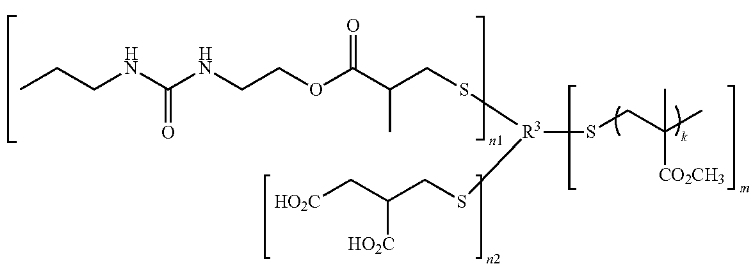

(n1 + n2 = 5, m = 1, k = 20, n1/n2 = 1/4)

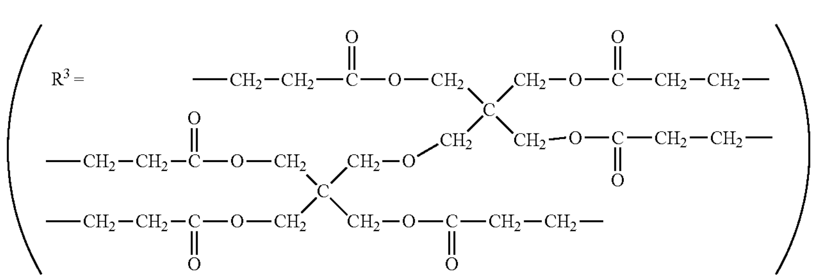

0.515 Parts of dimethyl 2,2'-azobis(2-methylpropionate) [V-601, produced by Wako Pure Chemical Industries, Ltd.] was added thereto, and this mixture was heated for 2 hours. Furthermore, 0.515 parts of V-601 was added, and the reaction was allowed to proceed at 90° C. for 2 hours in a nitrogen stream. The reaction solution was cooled to room temperature, thereby obtaining a 30 mass % solution of Mercaptan Compound (B-62) where a part of sulfur atoms of Compound (33) were added to Compounds (A-3) and (A-23).

[Chem. 50]

B-62

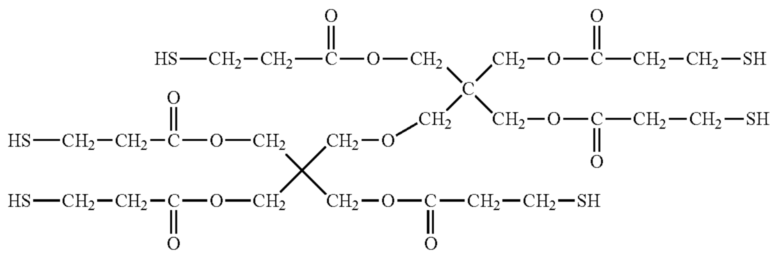

(33)

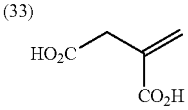

(A-3)

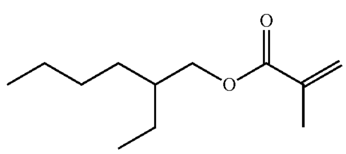

(A-23)

A mixed solution containing 200.0 parts of the 30 mass % solution of Mercaptan Compound (B-62) and 80.0 parts of Methyl Methacrylate (M-1) was heated at 90° C. in a nitrogen stream. A solution prepared by dissolving 0.552 parts of dimethyl 2,2'-azobis(2-methylpropionate) [V-601, produced by Wako Pure Chemical Industries, Ltd.] in 58.1 parts of propylene glycol 1-monomethyl ether 2-acetate was added dropwise thereto over 2 hours, and the resulting solution was heated at 90° C. for 2 hours. Furthermore, 0.184 parts of V-601 was added, followed by reaction at 90° C. for 2 hours in a nitrogen stream, and 0.184 parts of V-601 was again added, followed by reaction at 90° C. for 2 hours in a nitrogen stream. Thereafter, 128.6 parts of propylene glycol 1-monomethyl ether 2-acetate was added, and the reaction solution was cooled to room temperature, thereby obtaining a 30 mass % solution of the polymer compound shown below (C-62: weight average molecular weight in terms of polystyrene: 4,700, acid value: 128 mgKOH/g).

[Chem. 51]

(C-62)

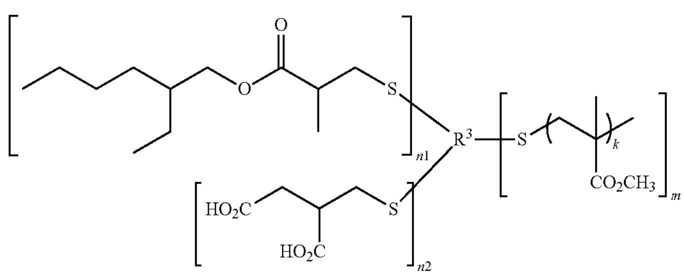

(n1 + n2 = 5, m = 1, k = 20, n1/n2 = 1/4)

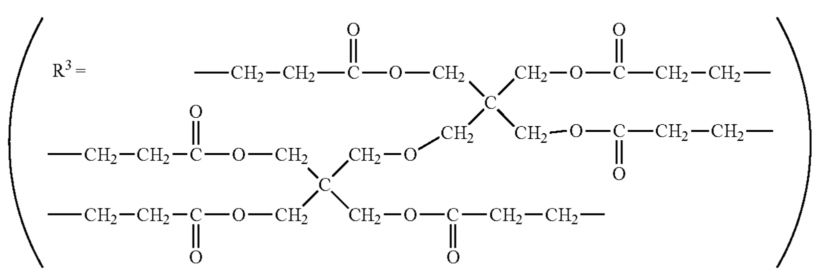

Synthesis Example 7

Synthesis of Polymer Compound (C-63)

A mixed solution containing 155.6 parts of the 30 mass % solution of Mercaptan Compound (B-62) and 93.3 parts of Methyl Methacrylate (M-1) was heated at 90° C. in a nitrogen stream. A solution prepared by dissolving 0.644 parts of dimethyl 2,2'-azobis(2-methylpropionate) [V-601, produced by Wako Pure Chemical Industries, Ltd.] in 67.8 parts of propylene glycol 1-monomethyl ether 2-acetate was added dropwise thereto over 2 hours, and the resulting solution was heated at 90° C. for 2 hours. Furthermore, 0.215 parts of V-601 was added, followed by reaction at 90° C. for 2 hours in a nitrogen stream, and 0.215 parts of V-601 was again added, followed by reaction at 90° C. for 2 hours in a nitrogen stream. Thereafter, 150.0 parts of propylene glycol 1-monomethyl ether 2-acetate was added, and the reaction solution was cooled to room temperature, thereby obtaining a 30 mass % solution of the polymer compound shown below (C-63: weight average molecular weight in terms of polystyrene: 6,400, acid value: 99 mgKOH/g).

Synthesis Example 8

Synthesis of Polymer Compound (C-68)

Polymer Compound (C-68) was synthesized in accordance with the synthesis method described in JP-A-2007-277514, paragraphs 0266 to 0348 (in the corresponding U.S. Patent Application Publication No. 2010/233595, paragraphs 0289 to 0429). Specifically, the compound was synthesized as follows.

31.0 Parts of dipentaerythritol hexakis(3-mercaptopropionate) [(33): produced by Sakai Chemical Industry Co., Ltd.], 8.88 parts of Compound (A-26) shown below, and 26.0 parts of Compound (A-3) shown below, which are a compound having an adsorption moiety and having a carbon-carbon double bond, were dissolved in 141.1 parts of 1-methoxy-2-propanol, and this solution was heated at 90° C. in a nitrogen stream. The charge ratio of (33), (A-26) and (A-3) here was 1.0:1.0:4.0 by mol.

0.228 Parts of dimethyl 2,2'-azobis(2-methylpropionate) [V-601, produced by Wako Pure Chemical Industries, Ltd.] was added thereto, and this mixture was heated for 2 hours. Furthermore, 0.228 parts of V-601 was added, and the reaction was allowed to proceed at 90° C. for 2 hours in a nitrogen stream. The reaction solution was cooled to room temperature, thereby obtaining a 30 mass % solution of Mercaptan Compound (B-68) where a part of sulfur atoms of Compound (33) were added to Compounds (A-3) and (A-26).

[Chem. 52]

(C-63)

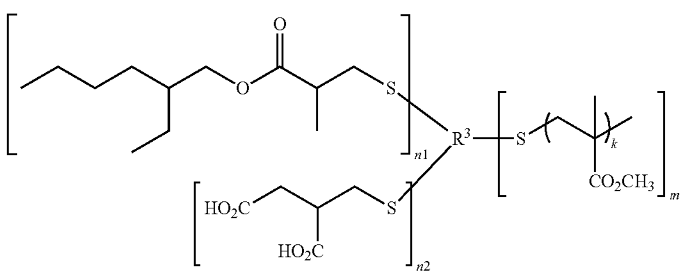

(n1 + n2 = 5, m = 1, k = 20, n1/n2 = 1/4)

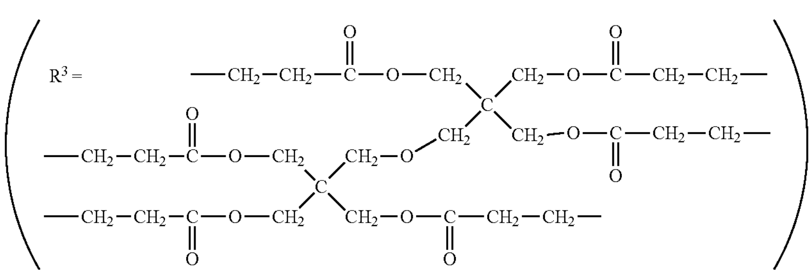

[Chem. 53]

B-68

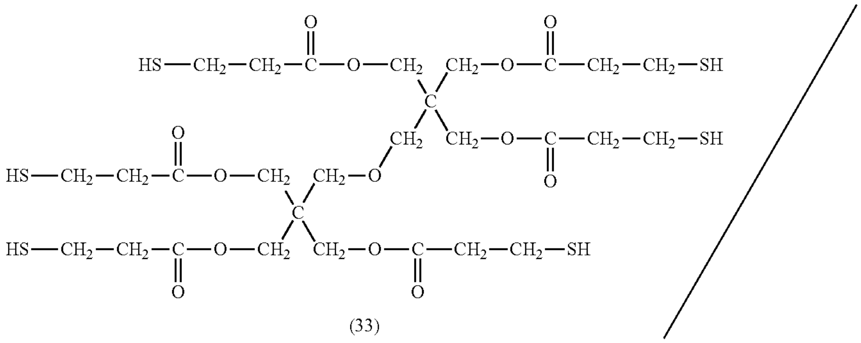

(33)

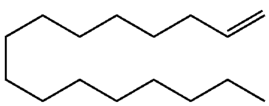

(A-26)

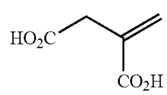

(A-3)

A mixed solution containing 202.0 parts of the 30 mass % solution of Mercaptan Compound (B-68) and 79.4 parts of Methyl Methacrylate (M-1) was heated at 90° C. in a nitrogen stream. A solution prepared by dissolving 0.548 parts of dimethyl 2,2'-azobis(2-methylpropionate) [V-601, produced by Wako Pure Chemical Industries, Ltd.] in 57.7 parts of propylene glycol 1-monomethyl ether 2-acetate was added dropwise thereto over 2 hours, and the resulting solution was heated at 90° C. for 2 hours. Furthermore, 0.183 parts of V-601 was added, followed by reaction at 90° C. for 2 hours in a nitrogen stream, and 0.183 parts of V-601 was again added, followed by reaction at 90° C. for 2 hours in a nitrogen stream. Thereafter, 127.6 parts of propylene glycol 1-monomethyl ether 2-acetate was added, and the reaction solution was cooled to room temperature, thereby obtaining a 30 mass % solution of the polymer compound shown below (C-68: weight average molecular weight in terms of polystyrene: 4,900, acid value: 127 mgKOH/g).

[Chem. 54]

(C-68)

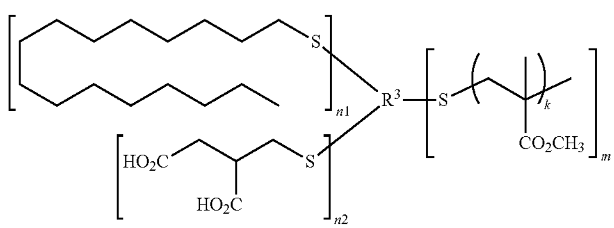

(n1 + n2 = 5, m = 1, k = 20, n1/n2 = 1/4)

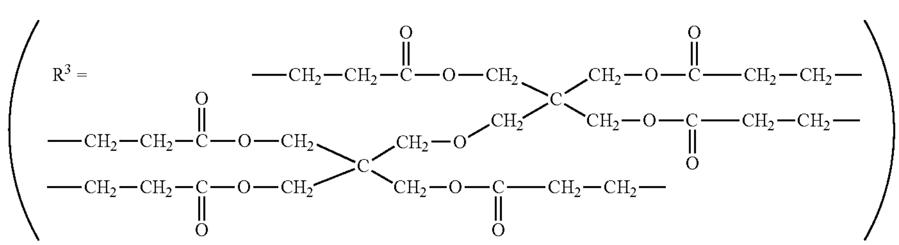

Synthesis Example 9

Synthesis of Polymer Compound (C-69)

A mixed solution containing 157.4 parts of the 30 mass % solution of Mercaptan Compound (B-68) and 92.8 parts of Methyl Methacrylate (M-1) was heated at 90° C. in a nitrogen stream. A solution prepared by dissolving 0.640 parts of dimethyl 2,2'-azobis(2-methylpropionate) [V-601, produced by Wako Pure Chemical Industries, Ltd.] in 67.40 parts of propylene glycol 1-monomethyl ether 2-acetate was added dropwise thereto over 2 hours, and the resulting solution was heated at 90° C. for 2 hours. Furthermore, 0.213 parts of V-601 was added, followed by reaction at 90° C. for 2 hours in a nitrogen stream, and 0.213 parts of V-601 was again added, followed by reaction at 90° C. for 2 hours in a nitrogen stream. Thereafter, 149.1 parts of propylene glycol 1-monomethyl ether 2-acetate was added, and the reaction solution was cooled to room temperature, thereby obtaining a 30 mass % solution of the polymer compound shown below (C-69: weight average molecular weight in terms of polystyrene: 6,600, acid value: 99 mgKOH/g).

[Chem. 55]

(C-69)

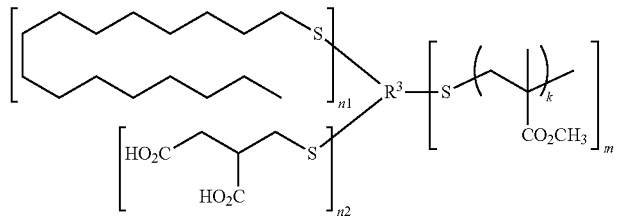

(n1 + n2 = 5, m = 1, k = 30, n1/n2 = 1/4)

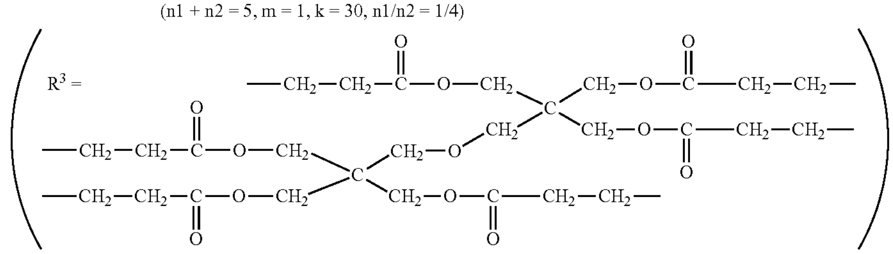

Synthesis Example 10

Synthesis of Polymer Compound (C-72)

Polymer Compound (C-72) was synthesized in accordance with the synthesis method described in JP-A-2007-277514, paragraphs 0266 to 0348 (in the corresponding U.S. Patent Application Publication No. 2010/233595, paragraphs 0289 to 0429). Specifically, the compound was synthesized as follows.

70.0 Parts of dipentaerythritol hexakis(3-mercaptopropionate) [(33): produced by Sakai Chemical Industry Co., Ltd.], 11.6 parts of Compound (A-28) shown below, and 46.5 parts of Compound (A-3) shown below, which are a compound having an adsorption moiety and having a carbon-carbon double bond, were dissolved in 299.0 parts of 1-methoxy-2-propanol, and this solution was heated at 90° C. in a nitrogen stream. The charge ratio of (33), (A-28) and (A-3) here was 1.0:1.0:4.0 by mol.

0.515 Parts of dimethyl 2,2'-azobis(2-methylpropionate) [V-601, produced by Wako Pure Chemical Industries, Ltd.] was added thereto, and this mixture was heated for 2 hours. Furthermore, 0.515 parts of V-601 was added, and the reaction was allowed to proceed at 90° C. for 2 hours in a nitrogen stream. The reaction solution was cooled to room temperature, thereby obtaining a 30 mass % solution of Mercaptan Compound (B-72) where a part of sulfur atoms of Compound (33) were added to Compounds (A-3) and (A-28).

[Chem. 56]

B-72

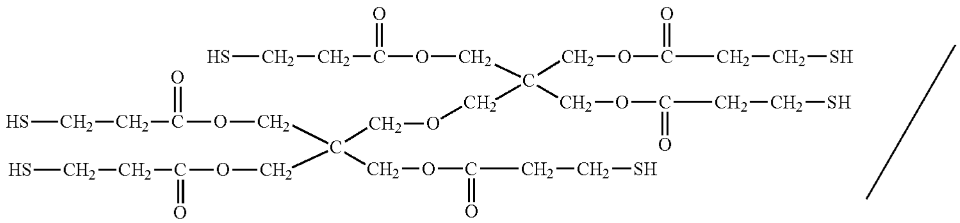

(33)

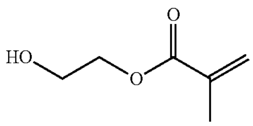

(A-28)

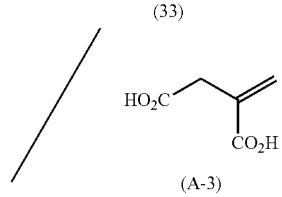

(A-3)

A mixed solution containing 194.7 parts of the 30 mass % solution of Mercaptan Compound (B-72) and 81.6 parts of Methyl Methacrylate (M-1) was heated at 90° C. in a nitrogen stream. A solution prepared by dissolving 0.563 parts of dimethyl 2,2'-azobis(2-methylpropionate) [V-601, produced by Wako Pure Chemical Industries, Ltd.] in 59.3 parts of propylene glycol 1-monomethyl ether 2-acetate was added dropwise thereto over 2 hours, and the resulting solution was heated at 90° C. for 2 hours. Furthermore, 0.188 parts of V-601 was added, followed by reaction at 90° C. for 2 hours in a nitrogen stream, and 0.188 parts of V-601 was again added, followed by reaction at 90° C. for 2 hours in a nitrogen stream. Thereafter, 131.1 parts of propylene glycol 1-monomethyl ether 2-acetate was added, and the reaction solution was cooled to room temperature, thereby obtaining a 30 mass % solution of the polymer compound shown below (C-72: weight average molecular weight in terms of polystyrene: 4,800, acid value: 131 mgKOH/g).

Synthesis Example 11

Synthesis of Polymer Compound (C-73)

A mixed solution containing 150.8 parts of the 30 mass % solution of Mercaptan Compound (B-72) and 94.8 parts of Methyl Methacrylate (M-1) was heated at 90° C. in a nitrogen stream. A solution prepared by dissolving 0.654 parts of dimethyl 2,2'-azobis(2-methylpropionate) [V-601, produced by Wako Pure Chemical Industries, Ltd.] in 68.8 parts of propylene glycol 1-monomethyl ether 2-acetate was added dropwise thereto over 2 hours, and the resulting solution was heated at 90° C. for 2 hours. Furthermore, 0.218 parts of V-601 was added, followed by reaction at 90° C. for 2 hours in a nitrogen stream, and 0.218 parts of V-601 was again added, followed by reaction at 90° C. for 2 hours in a nitrogen stream. Thereafter, 152.3 parts of propylene glycol 1-monomethyl ether 2-acetate was added, and the reaction solution was cooled to room temperature, thereby obtaining a 30 mass % solution of the polymer compound shown below (C-73: weight average molecular weight in terms of polystyrene: 6,400, acid value: 99 mgKOH/g).

[Chem. 57]

(C-72)

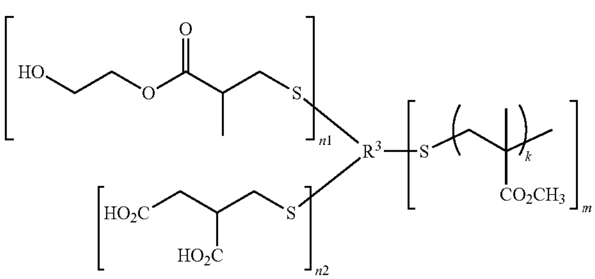

(n1 + n2 = 5, m = 1, k = 20, n1/n2 = 1/4)

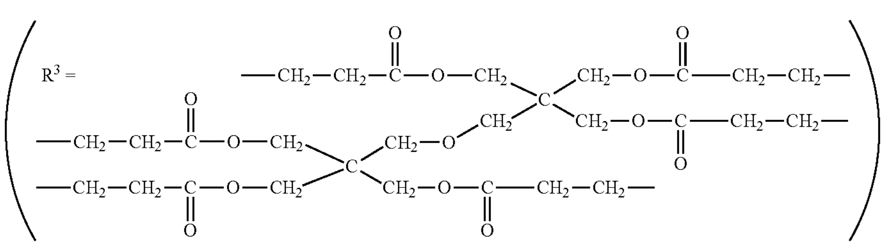

[Chem. 58]

(C-73)

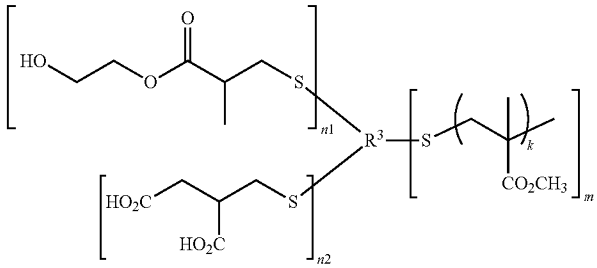

(n1 + n2 = 5, m = 1, k = 30, n1/n2 = 1/4)

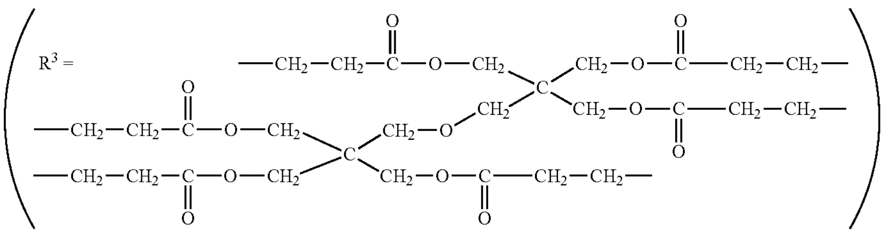

Polymer Compounds (C-2) to (C-33), (C-38) to (C-61), (C-64) to (C-67), (C-70), (C-71) and (C-74) to (C-99) were also synthesized in accordance with the synthesis method described in JP-A-2007-277514, paragraphs 0266 to 0348 (in the corresponding U.S. Patent Application Publication No. 2010/233595, paragraphs 0289 to 0429). Specifically, Polymer Compounds (C-2) to (C-33), (C-38) to (C-61), (C-64) to (C-67), (C-70), (C-71), (C-74) to (C-99) were synthesized in the same manner as in Synthesis Examples 1 to 11 except for appropriately changing the kind and charge amount of the "compound having an (m+n)-valent linking group $R^1$ and a mercapto group" (corresponding to the above-described "compound having from 3 to 10 mercapto groups per molecule"), the kind and charge amount of the "compound having a substituent $A^1$ and a carbon-carbon double bond" (corresponding to the above-described "compound having an adsorption moiety and having a carbon-carbon double bond"), and the kind and charge amount of the "monomer for forming $P^1$ or $P^2$" (corresponding to the above-described "vinyl monomer"), which are raw materials.

With regard to these Polymer Compounds (C-1) to (C-99) synthesized, the "compound having an (m+n)-valent linking group $R^1$ and a mercapto group" as a raw material, the "compound having a substituent $A^1$ and a carbon-carbon double bond" as a raw material (in the case of using compounds in combination, the molar ratio of respective charge amounts), the "monomer for forming $P^1$ or $P^2$" (in the case of using monomers in combination, the molar ratio of respective charge amounts) as a raw material, in and n in formula (1) or (2), the repetition number k of the repeating unit in $P^1$ of formula (1) or $P^2$ of formula (2), the acid value, and the weight average molecular weight are shown together in Tables 1 and 2 below.

TABLE 1

| Dispersant (Compound (B)) | Compound Having (m + n)-Valent Linking Group $R^1$ and Mercapto Group | Compound Having Substituent $A^1$ and Carbon-Carbon Double Bond, molar ratio in parenthesis | Monomer for Forming $P^1$ or $P^2$, molar ratio in parenthesis | Numeral n | Numeral m | Numeral k | Acid Value of Dispersant (mgKOH/g) | Weight Average Molecular Weight |
|---|---|---|---|---|---|---|---|---|
| C-1 | 33 | A-3 | M-1 | 5.5 | 0.5 | 20 | 241 | 3300 |
| C-2 | 33 | A-3 | M-1 | 5.5 | 0.5 | 30 | 200 | 4100 |
| C-3 | 33 | A-3 | M-1 | 5 | 1 | 20 | 158 | 4800 |
| C-4 | 33 | A-3 | M-1 | 3 | 3 | 7 | 102 | 4100 |
| C-5 | 33 | A-3 | M-1 | 3.5 | 2.5 | 14 | 80 | 6400 |
| C-6 | 33 | A-3 | M-1 | 2 | 4 | 7 | 59 | 4700 |
| C-7 | 33 | A-3 | M-1 | 5 | 1 | 60 | 72 | 11700 |
| C-8 | 33 | A-3 | M-1 | 4 | 2 | 60 | 35 | 17590 |
| C-9 | 33 | A-3 | M-1/M-7 (10/3) | 5.5 | 0.5 | 130 | 152 | 14300 |
| C-10 | 27 | A-3 | M-1 | 3 | 1 | 30 | 82 | 6500 |
| C-11 | 18 | A-3 | M-1 | 2 | 1 | 20 | 81 | 4400 |
| C-12 | 18 | A-3 | M-1 | 1 | 2 | 8 | 52 | 3000 |
| C-13 | 18 | A-3 | M-1 | 1 | 2 | 15 | 31 | 5000 |
| C-14 | 18 | A-3 | M- 2 | 2 | 1 | 20 | 76 | 4700 |
| C-15 | 33 | A-1 | M-1 | 5.5 | 0.5 | 20 | 144 | 4300 |
| C-16 | 33 | A-1 | M-1 | 4 | 2 | 10 | 79 | 4400 |
| C-17 | 33 | A-2 | M-1 | 4 | 2 | 10 | 68 | 4400 |
| C-18 | 33 | A-4 | M-1 | 4 | 2 | 20 | 126 | 6800 |

TABLE 1-continued

| Dispersant (Compound (B)) | Compound Having (m + n)-Valent Linking Group $R^1$ and Mercapto Group | Compound Having Substituent $A^1$ and Carbon-Carbon Double Bond, molar ratio in parenthesis | Monomer for Forming $P^1$ or $P^2$, molar ratio in parenthesis | Numeral n | Numeral m | Numeral k | Acid Value of Dispersant (mgKOH/g) | Weight Average Molecular Weight |
|---|---|---|---|---|---|---|---|---|
| C-19 | 33 | A-5 | M-1 | 5.5 | 0.5 | 30 | 99 | 4200 |
| C-20 | 33 | A-6 | M-1 | 5.5 | 0.5 | 30 | 85 | 4100 |
| C-21 | 33 | A-7/A-3 (1/4) | M-1 | 3 | 3 | 7 | 123 | 4100 |
| C-22 | 33 | A-8/A-3 (1/4) | M-1 | 3 | 3 | 7 | 82 | 4100 |
| C-23 | 33 | A-9 | M-1 | 2 | 4 | 10 | 47 | 7500 |
| C-24 | 33 | A-9/A-3 (1/6) | M-1 | 3.5 | 2.5 | 14 | 80 | 6200 |
| C-25 | 33 | A-10 | M-1 | 2 | 4 | 10 | 40 | 8200 |
| C-26 | 33 | A-11/A-3 (1/6) | M-1 | 3.5 | 2.5 | 14 | 80 | 6300 |
| C-27 | 33 | A-12/A-3 (1/6) | M-1 | 3.5 | 2.5 | 14 | 75 | 6500 |
| C-28 | 33 | A-13/A-3 (1/1) | M-1 | 5 | 1 | 20 | 97 | 4600 |
| C-29 | 33 | A-13/A-3 (1/4) | M-1 | 5 | 1 | 20 | 129 | 4300 |
| C-30 | 33 | A-14/A-3 (1/1) | M-1 | 5 | 1 | 20 | 95 | 4500 |
| C-31 | 33 | A-14/A-3 (1/4) | M-1 | 5 | 1 | 20 | 132 | 4200 |
| C-32 | 33 | A-15/A-3 (1/1) | M-1 | 5 | 1 | 20 | 99 | 4500 |
| C-33 | 33 | A-15/A-3 (1/4) | M-1 | 5 | 1 | 20 | 134 | 4200 |
| C-34 | 33 | A-16/A-3 (1/1) | M-1 | 5 | 1 | 20 | 77 | 4400 |
| C-35 | 33 | A-16/A-3 (1/4) | M-1 | 5 | 1 | 20 | 128 | 4500 |
| C-36 | 33 | A-17/A-3 (1/1) | M-1 | 5 | 1 | 20 | 77 | 4300 |
| C-37 | 33 | A-17/A-3 (1/4) | M-1 | 5 | 1 | 20 | 127 | 5500 |
| C-78 | 33 | A-18/A-3 (1/1) | M-1 | 5 | 1 | 20 | 85 | 4500 |
| C-39 | 33 | A-18/A-3 (1/4) | M-1 | 5 | 1 | 20 | 130 | 6000 |
| C-40 | 33 | A-19/A-3 (1/1) | M-1 | 5 | 1 | 20 | 79 | 4200 |
| C-41 | 33 | A-19/A-3 (1/4) | M-1 | 5 | 1 | 20 | 129 | 5400 |
| C-42 | 33 | A-3 | M-2 | 5 | 1 | 20 | 151 | 5300 |

TABLE 2

| Dispersant (Compound (B)) | Compound Having (m + n)-Valent Linking Group $R^1$ and Mercapto Group | Compound Having Substituent $A^1$ and Carbon-Carbon Double Bond, molar ratio in parenthesis | Monomer for Forming $P^1$ or $P^2$, molar ratio in parenthesis | Numeral n | Numeral m | Numeral k | Acid Value of Dispersant (mgKOH/g) | Weight Average Molecular Weight |
|---|---|---|---|---|---|---|---|---|
| C-43 | 33 | A-3 | M-2 | 3 | 3 | 8.5 | 80 | 5400 |
| C-44 | 33 | A-3 | M-1/M-2 (1/1) | 3.5 | 2.5 | 13 | 82 | 6500 |
| C-45 | 33 | A-3 | M-3 | 3.5 | 2.5 | 11 | 79 | 6400 |
| C-46 | 33 | A-3 | M-4 | 5.5 | 0.5 | 20 | 205 | 4200 |
| C-47 | 33 | A-3 | M-4 | 3 | 3 | 5 | 99 | 4400 |
| C-48 | 33 | A-3 | M-5 | 3 | 3 | 5 | 103 | 4100 |
| C-49 | 33 | A-3 | M-6 | 3 | 3 | 5 | 62 | 6500 |
| C-50 | 33 | A-3 | M-1/M-7 (13/1) | 3.5 | 2.5 | 14 | 110 | 6300 |
| C-51 | 33 | A-3 | M-1/M-7 (11/3) | 3.5 | 2.5 | 14 | 168 | 6500 |
| C-52 | 33 | A-3 | M-1/M-8 (7/3) | 5.5 | 0.5 | 27.5 | 196 | 4400 |
| C-53 | 33 | A-3 | M-1/M-8 (7/3) | 4.5 | 1.5 | 18.3 | 111 | 6800 |
| C-54 | 33 | A-3 | M-1/M-9 (7/3) | 5.5 | 0.5 | 27.5 | 191 | 4500 |
| C-55 | 33 | A-3 | M-1/M-9 (7/3) | 4.5 | 1.5 | 18.3 | 105 | 7000 |
| C-56 | 33 | A-20 | M-1 | 5.5 | 0.5 | 4 | 129 | 3400 |
| C-57 | 33 | A-20 | M-1 | 5 | 1 | 12 | 86 | 4600 |
| C-58 | 33 | A-21 | M-1 | 5.5 | 0.5 | 4 | 131 | 3300 |
| C-59 | 33 | A-21 | M-1 | 5 | 1 | 12 | 87 | 4500 |
| C-60 | 33 | A-22 | M-1 | 5 | 1 | 15 | 162 | 4800 |
| C-61 | 33 | A-22 | M-1 | 3.5 | 2.5 | 12 | 85 | 6500 |
| C-62 | 33 | A-23/A-3 (1/4) | M-1 | 5 | 1 | 20 | 128 | 4700 |
| C-63 | 33 | A-23/A-3 (1/4) | M-1 | 5 | 1 | 30 | 99 | 6400 |
| C-64 | 33 | A-24/A-3 (1/4) | M-1 | 5 | 1 | 20 | 129 | 4900 |
| C-65 | 33 | A-24/A-3 (1/4) | M-1 | 5 | 1 | 30 | 100 | 6300 |
| C-66 | 33 | A-25/A-3 (1/4) | M-1 | 5 | 1 | 20 | 129 | 4900 |
| C-67 | 33 | A-25/A-3 (1/4) | M-1 | 5 | 1 | 30 | 98 | 6700 |
| C-68 | 33 | A-26/A-3 (1/4) | M-1 | 5 | 1 | 20 | 127 | 4900 |
| C-69 | 33 | A-26/A-3 (1/4) | M-1 | 5 | 1 | 30 | 99 | 6600 |
| C-70 | 33 | A-27/A-3 (1/4) | M-1 | 5 | 1 | 20 | 125 | 5000 |
| C-71 | 33 | A-27/A-3 (1/4) | M-1 | 5 | 1 | 30 | 97 | 6600 |
| C-72 | 33 | A-28/A-3 (1/4) | M-1 | 5 | 1 | 20 | 131 | 4800 |
| C-73 | 33 | A-28/A-3 (1/4) | M-1 | 5 | 1 | 30 | 99 | 6400 |
| C-74 | 33 | A-29/A-3 (1/4) | M-1 | 5 | 1 | 20 | 128 | 4900 |
| C-75 | 33 | A-29/A-3 (1/4) | M-1 | 5 | 1 | 30 | 98 | 6500 |
| C-76 | 33 | A-30/A-3 (1/4) | M-1 | 5 | 1 | 20 | 130 | 4800 |
| C-77 | 33 | A-30/A-3 (1/4) | M-1 | 5 | 1 | 30 | 101 | 6200 |
| C-78 | 33 | A-31/A-3 (1/4) | M-1 | 5 | 1 | 20 | 130 | 4900 |
| C-79 | 33 | A-31/A-3 (1/4) | M-1 | 5 | 1 | 30 | 100 | 6300 |
| C-80 | 33 | A-32/A-3 (1/4) | M-1 | 5 | 1 | 20 | 131 | 4800 |

TABLE 2-continued

| Dispersant (Compound (B)) | Compound Having (m + n)-Valent Linking Group $R^1$ and Mercapto Group | Compound Having Substituent $A^1$ and Carbon-Carbon Double Bond, molar ratio in parenthesis | Monomer for Forming $P^1$ or $P^2$, molar ratio in parenthesis | Numeral n | Numeral m | Numeral k | Acid Value of Dispersant (mgKOH/g) | Weight Average Molecular Weight |
|---|---|---|---|---|---|---|---|---|
| C-81 | 33 | A-32/A-3 (1/1) | M-1 | 5 | 1 | 20 | 83 | 5400 |
| C-82 | 33 | A-23/A-9 (1/4) | M-1 | 5 | 1 | 20 | 131 | 4800 |
| C-83 | 33 | A-26/A-10 (1/1) | M-1 | 3 | 3 | 10 | 38 | 6200 |
| C-84 | 33 | A-23/A-11 (1/9) | M-1 | 5.5 | 0.5 | 15 | 128 | 3000 |
| C-85 | 33 | A-26/A-12 (1/4) | M-1 | 3 | 3 | 10 | 30 | 6200 |
| C-86 | 33 | A-3 | M-14 | 5 | 1 | 20 | 178 | 4400 |
| C-87 | 33 | A-3 | M-14 | 3.5 | 2.5 | 14 | 92 | 6000 |
| C-88 | 33 | A-3 | M-15 | 5 | 1 | 20 | 163 | 4800 |
| C-89 | 33 | A-3 | M-15 | 3.5 | 2.5 | 14 | 80 | 6500 |
| C-90 | 33 | A-3 | M-16 | 5 | 1 | 20 | 140 | 5600 |
| C-91 | 33 | A-3 | M-16 | 3 | 3 | 7.8 | 80 | 5100 |
| C-92 | 27 | A-23/A-3 (1/9) | M-1 | 3.5 | 0.5 | 30 | 143 | 3500 |
| C-93 | 27 | A-24/A-3 (1/4) | M-1 | 3 | 1 | 30 | 69 | 5500 |
| C-94 | 18 | A-25/A-3 (1/9) | M-1 | 2.5 | 0.5 | 25 | 127 | 2800 |
| C-95 | 18 | A-26/A-3 (1/4) | M-1 | 2 | 1 | 25 | 56 | 4500 |
| C-96 | 33 | A-27/A-3 (1/4) | M-2 | 5 | 1 | 15 | 136 | 4600 |
| C-97 | 33 | A-23/A-3 (1/4) | M-16 | 5 | 1 | 30 | 84 | 7500 |
| C-98 | 33 | A-24/A-3 (1/4) | M-1/M-7 (9/1) | 5 | 1 | 30 | 139 | 6200 |
| C-99 | 33 | A-25/A-3 (1/4) | M-9 | 5 | 1 | 20 | 102 | 6200 |

In Tables 1 and 2, numeral m and numeral n represent m and n in formula (1) or (2). For example, in the case of using a mixture of Compounds (A-7) and (A-3) as in (C-21) (molar ratio of charge amounts: 1:4), 3 of numeral n indicates the total number of structures derived from Compound (A-7) and structures derived from Compound (A-3).

Numeral k represents the repetition number k of the repeating unit in $P^1$ of formula (1) or $P^2$ of formula (2). For example, in the case of using a mixture of Monomers (M-1) and (M-2) as in (C-44) (molar ratio of charge amounts: 1:1), 13 of numeral k indicates the total repetition number of the repeating unit derived from Monomer (M-1) and the repeating unit derived from Monomer (M-2).

As the "compound having (m+n)-valent linking group $R^1$ and mercapto group" (corresponding to the above-described "compound having from 3 to 10 mercapto groups per molecule") in Tables 1 and 2, the following compounds (18), (27) and (33) were used.

[Chem. 59]

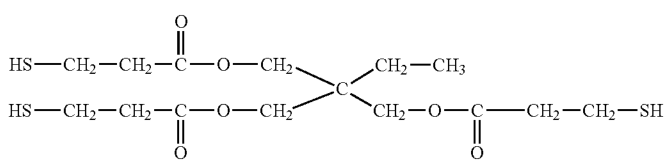

(18)

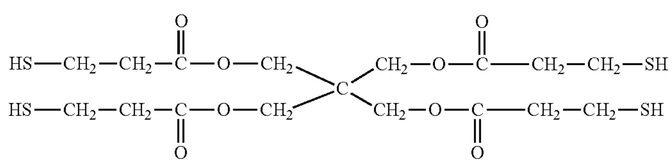

(27)

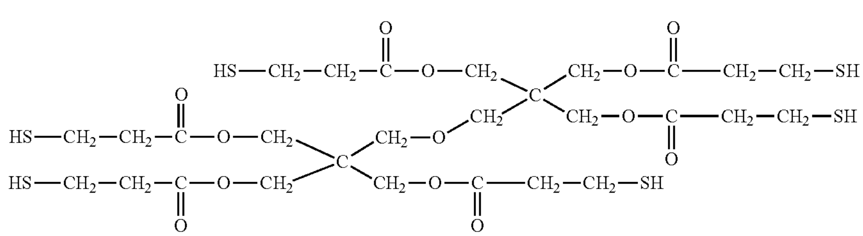

(33)

As the "compound having substituent A[1] and carbon-carbon double bond" (corresponding to the above-described "compound having an adsorption moiety and having a carbon-carbon double bond") in Table 1, the following compounds (A-1) to (A-32) were used.
[Chem. 60]
(A-1)
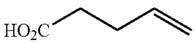
(A-2)
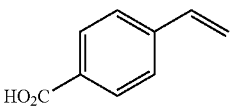
(A-3)
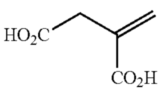
(A-4)
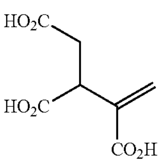
(A-5)
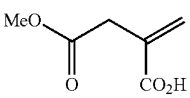
(A-6)
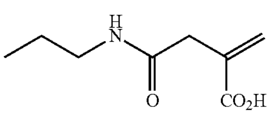
(A-7)
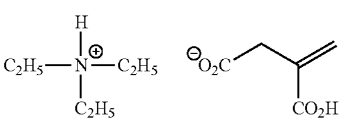
(A-8)
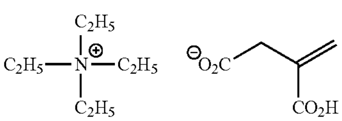
(A-9)
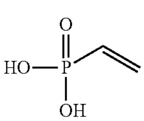
(A-10)
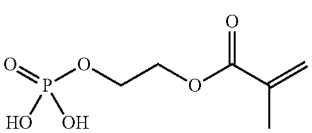
(A-11)
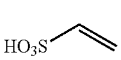
(A-12)
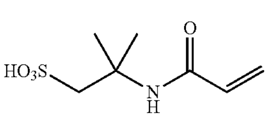
-continued
(A-13)
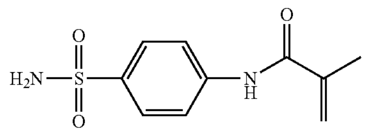
(A-14)
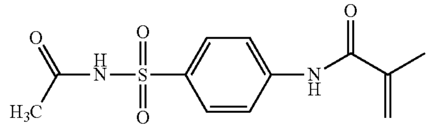
(A-15)
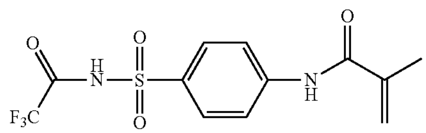
(A-16)
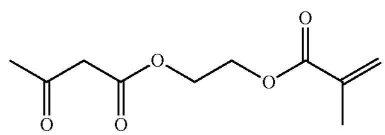
(A-17)
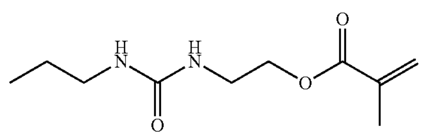
(A-18)
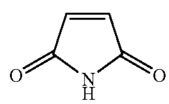
(A-19)
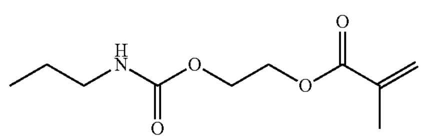
[Chem. 61]
(A-20)
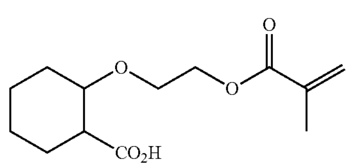
(A-21)
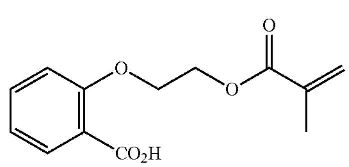
(A-22)
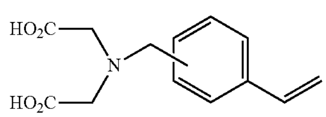
(A-23)
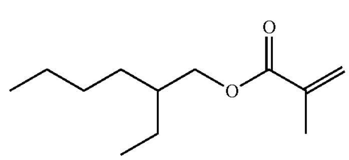

-continued
(A-24)
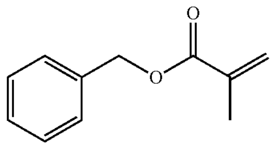
(A-25)
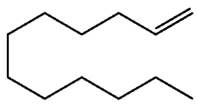
(A-26)
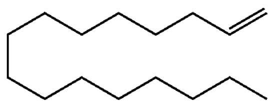
(A-27)
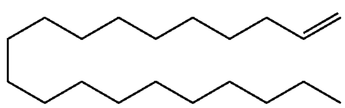
(A-28)
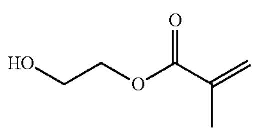
-continued
(A-29)
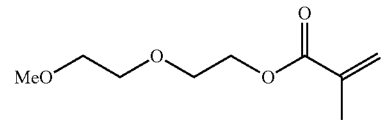
(A-30)
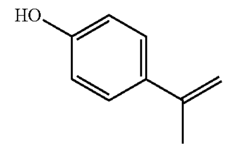
(A-31)
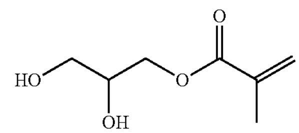
(A-32)
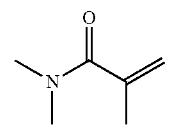
As the "monomer for forming $P^1$ or $P^2$" (corresponding to the above-described "vinyl monomer") in Table 1, those appropriately selected from Monomers (M-1) to (M-9) and (M-14) to (M-16) were used.
Structures of Polymer Compounds (C-1) to (C-99) synthesized are illustrated below.
[Chem. 62]
(C-1)
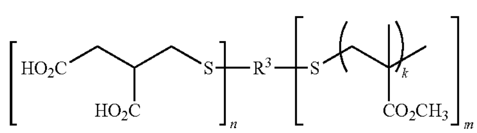
(n = 5.5, m = 0.5, k = 20)
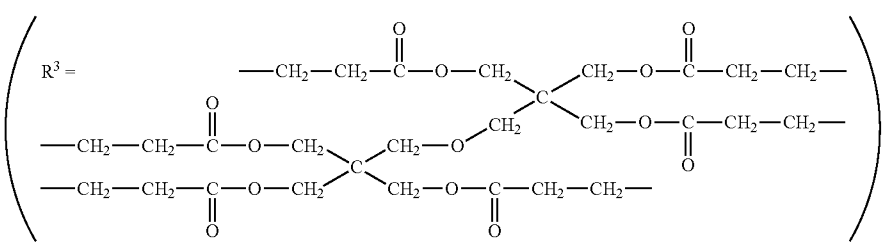
(C-2)
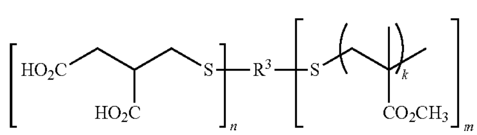
(n = 5.5, m = 0.5, k = 30)
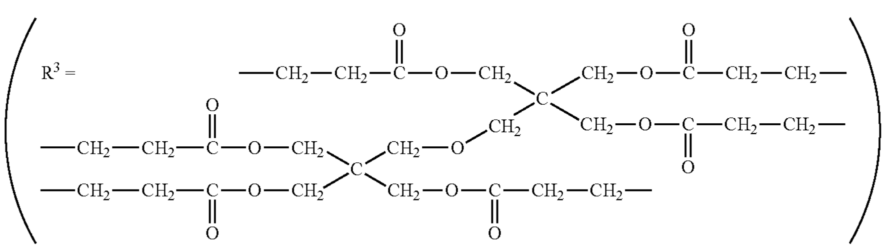

-continued
(C-3)
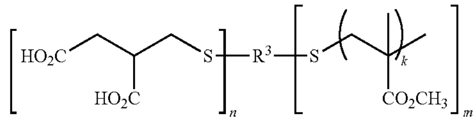
(n = 5, m = 1, k = 20)
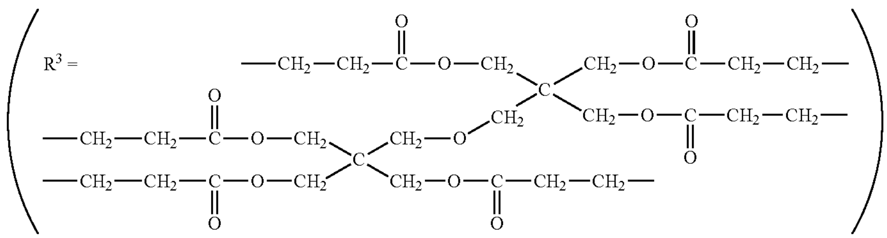
(C-4)
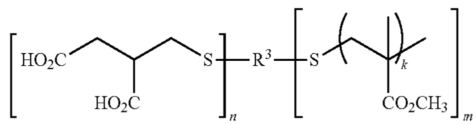
(n = 3, m = 3, k = 7)
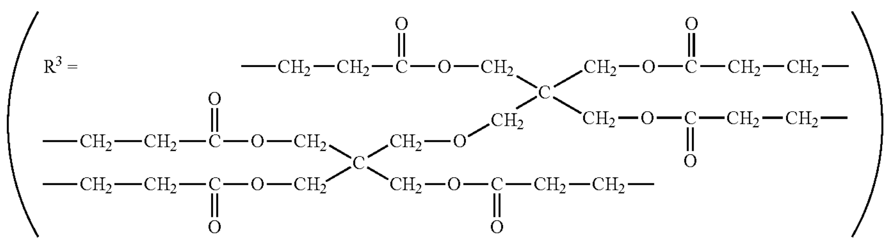
(C-5)
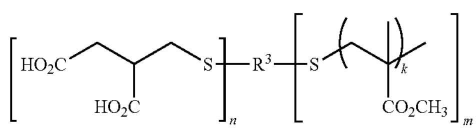
(n = 3.5, m = 2.5, k = 14)
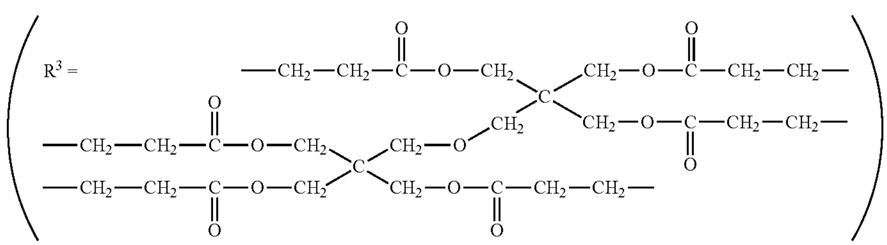
(C-6)
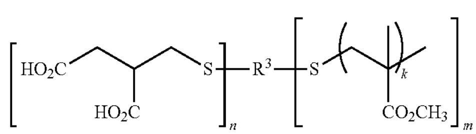
(n = 2, m = 4, k = 7)
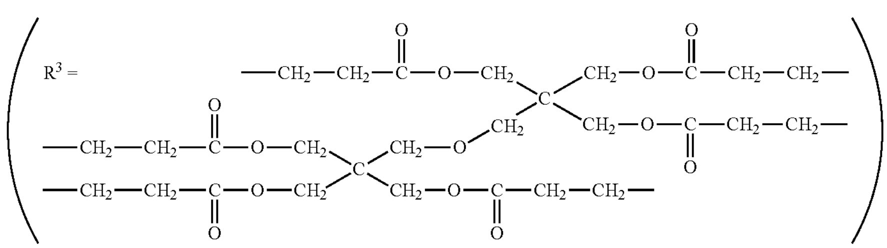

-continued
(C-7)
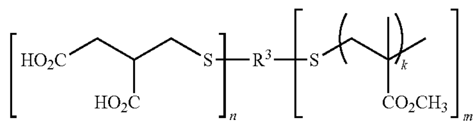
(n = 5, m = 1, k = 60)
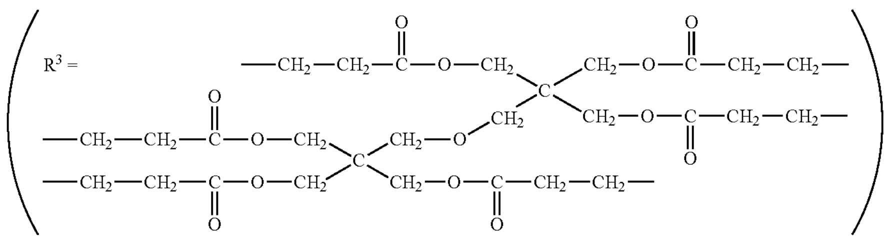
(C-8)
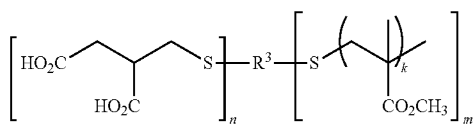
(n = 4, m = 2, k = 60)
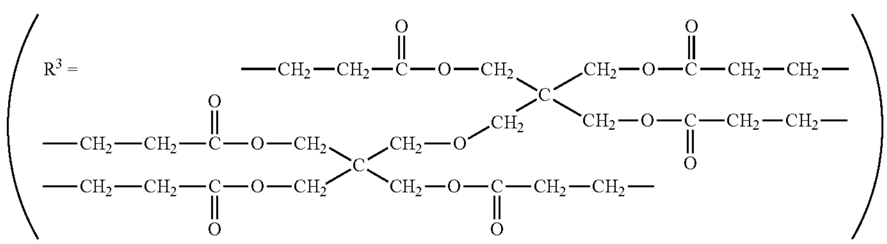
[Chem. 63]
(C-9)
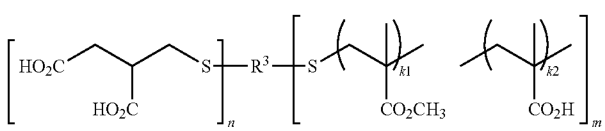
(n = 5.5, m = 0.5, k1 + k2 = 130, k1/k2 = 10/3)
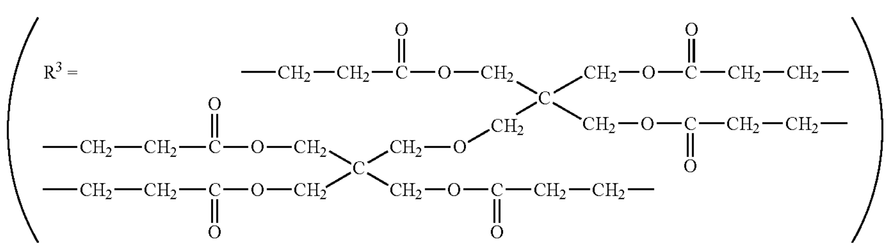
(C-10)
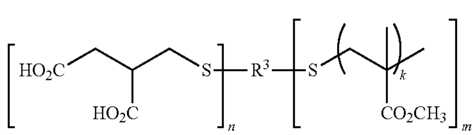
(n = 3, m = 1, k = 30)
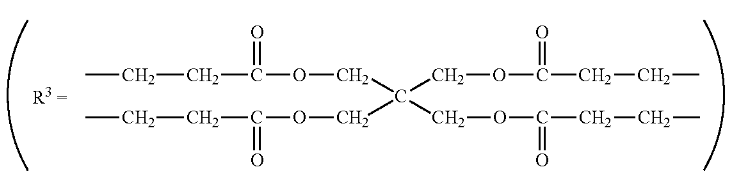

-continued
(C-11)
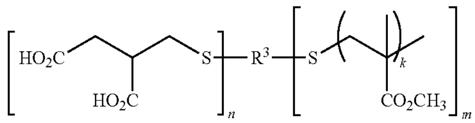
(n = 2, m = 1, k = 20)
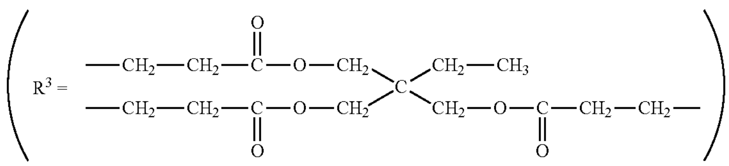
(C-12)
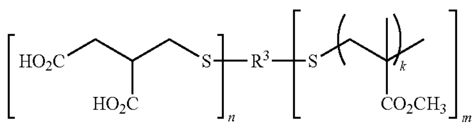
(n = 1, m = 2, k = 8)
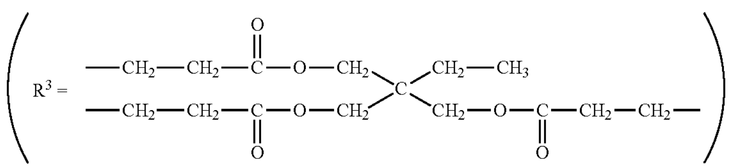
(C-13)
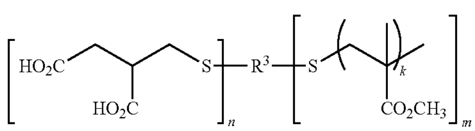
(n = 1, m = 2, k = 15)
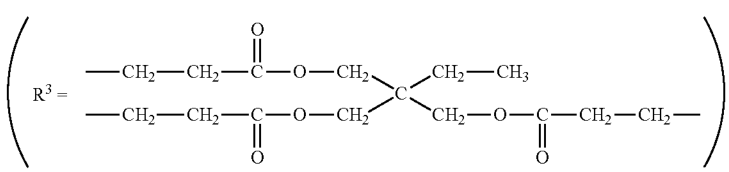
(C-14)
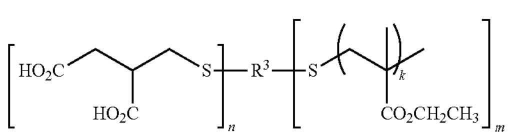
(n = 2, m = 1, k = 20)
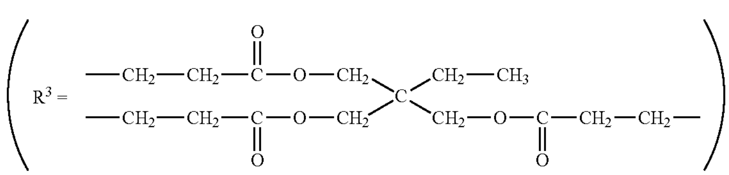

-continued
(C-15)
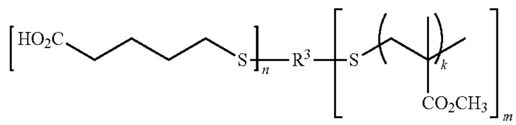
(n = 5.5, m = 0.5, k = 20)
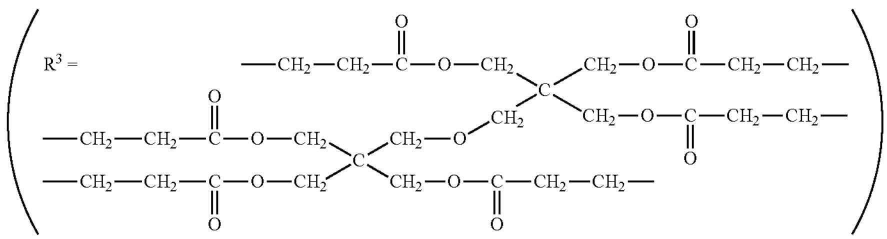
(C-16)
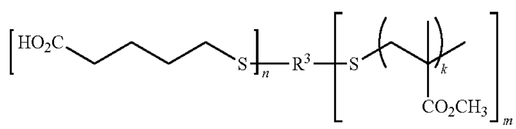
(n = 4, m = 2, k = 10)
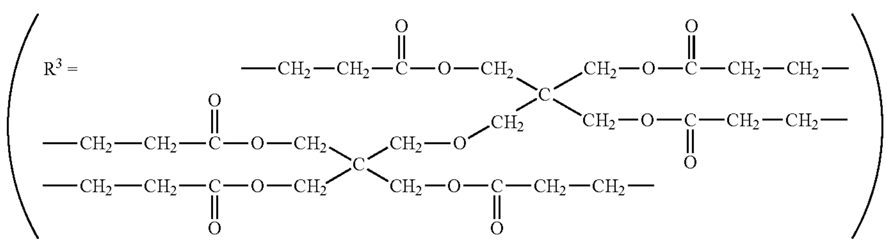
[Chem. 64]
(C-17)
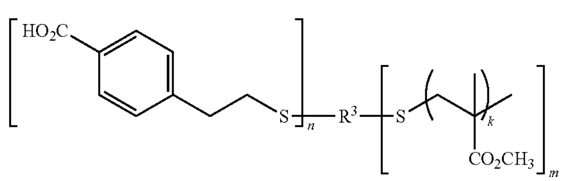
(n = 4, m = 2, k = 10)
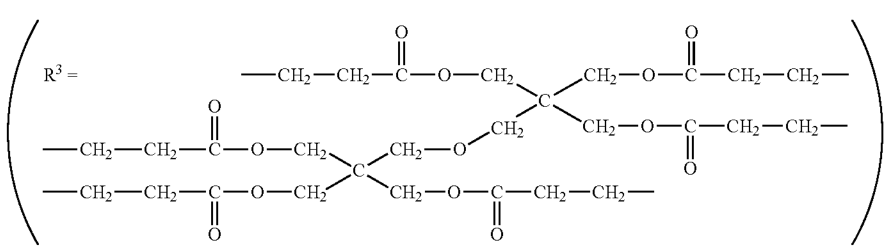

-continued
(C-18)
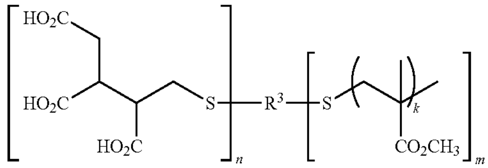
(n = 4, m = 2, k = 20)
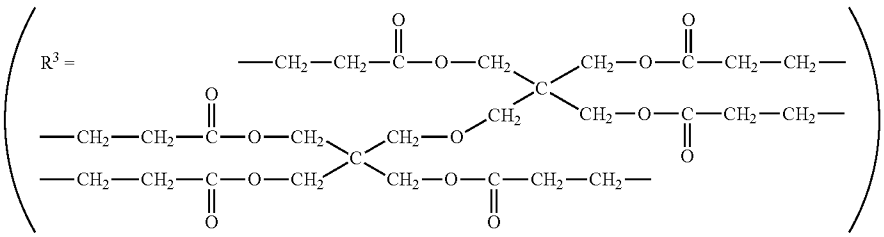
(C-19)
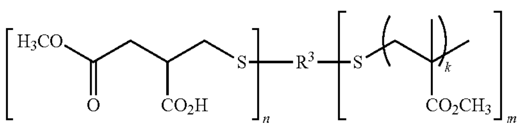
(n = 5.5, m = 0.5, k = 30)
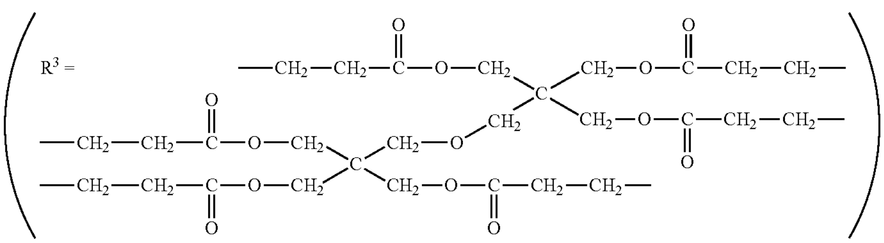
(C-20)
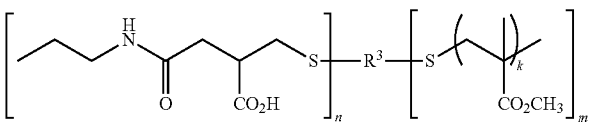
(n = 5.5, m = 0.5, k = 30)
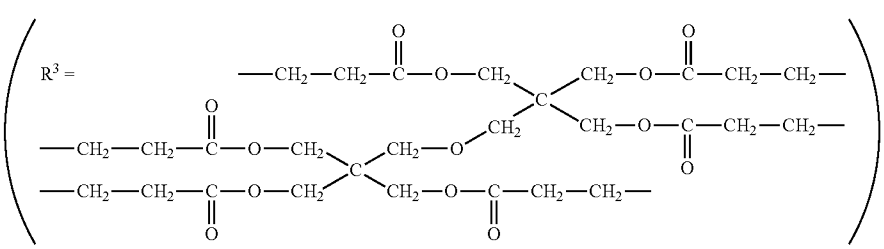

-continued
(C-21)
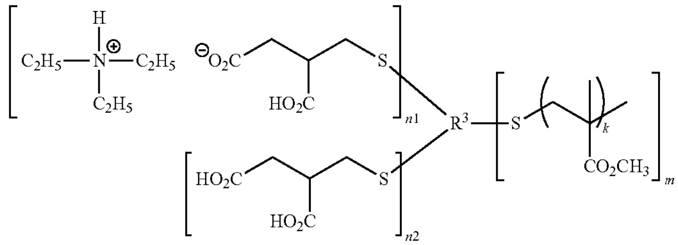
(n1 + n2 = 3, m = 3, k = 7, n1/n2 = 1/4)
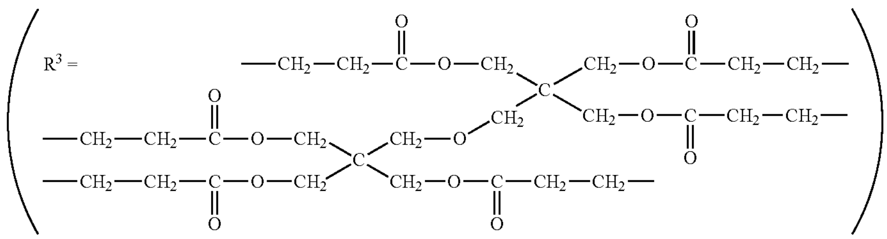
(C-22)
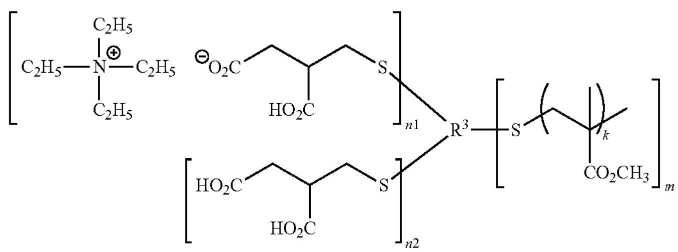
(n1 + n2 = 3, m = 3, k = 7, n1/n2 = 1/4)
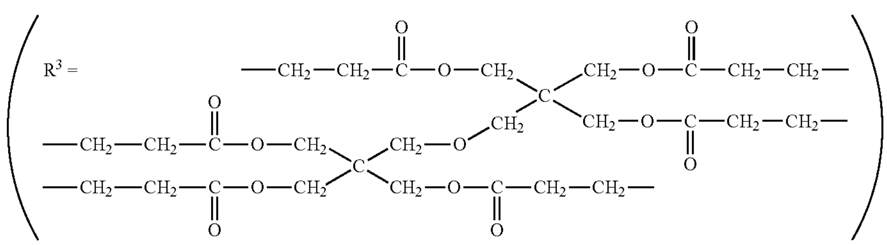
(C-23)
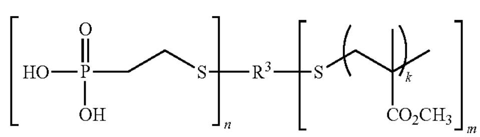
(n = 2, m = 4, k = 10)
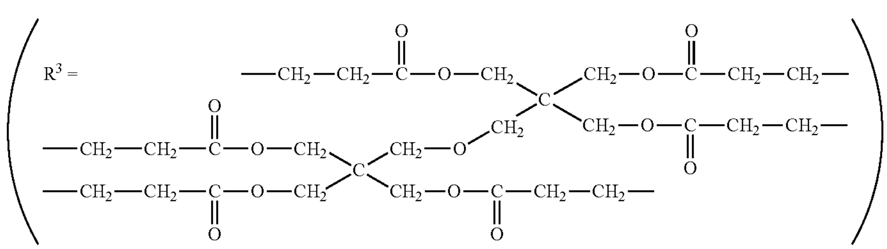

-continued
(C-24)
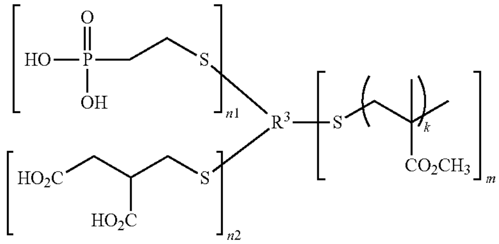
(n1 + n2 = 3.5, m = 2.5, k = 14, n1/n2 = 1/5)
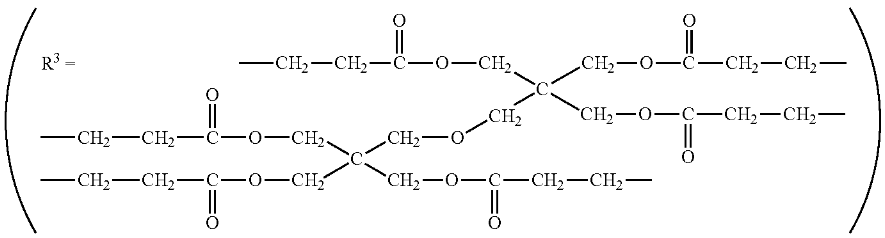
[Chem. 65]
(C-25)
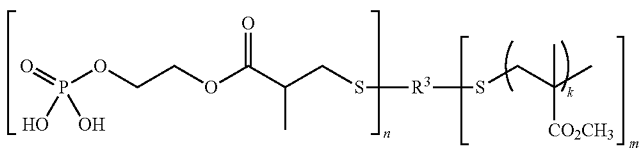
(n = 2, m = 4, k = 10)
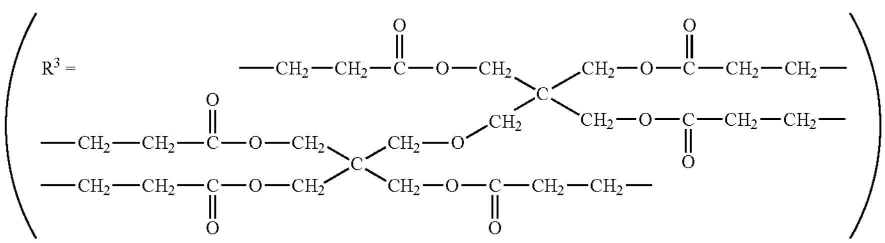
(C-26)
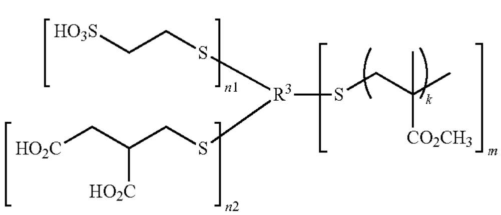
(n1 + n2 = 3.5, m = 2.5, k = 14, n1/n2 = 1/5)
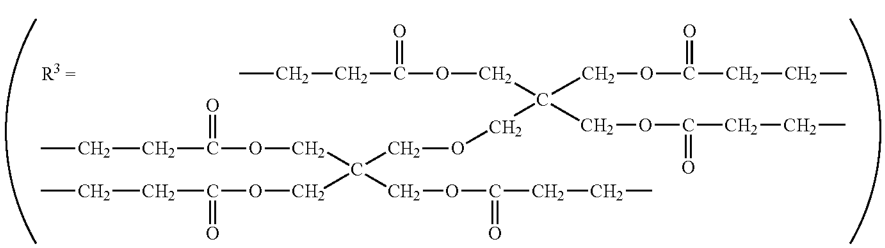

-continued
(C-27)
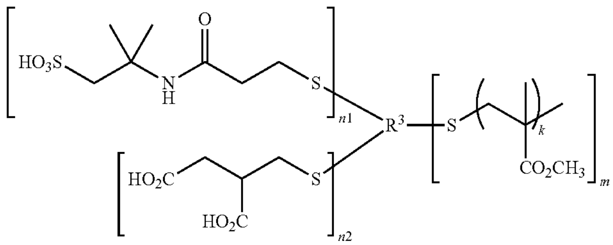
(n1 + n2 = 3.5, m = 2.5, k = 14, n1/n2 = 1/5)
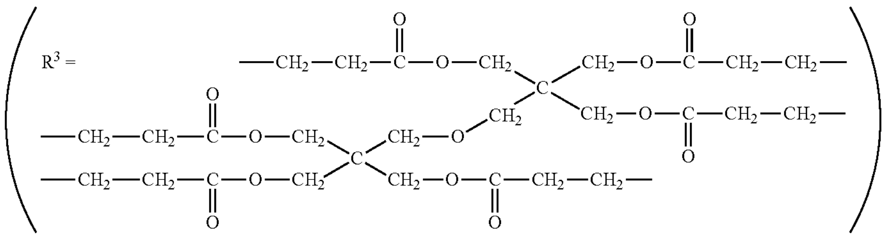
(C-28)
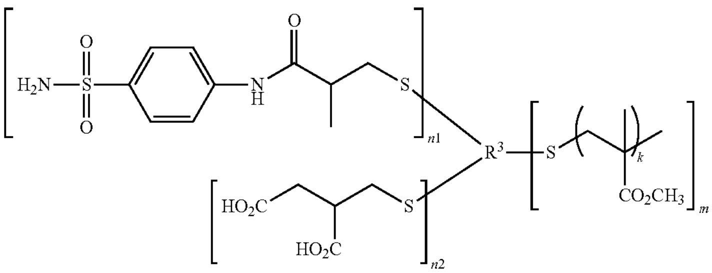
(n1 + n2 = 5, m = 1, k = 20, n1/n2 = 1/1)
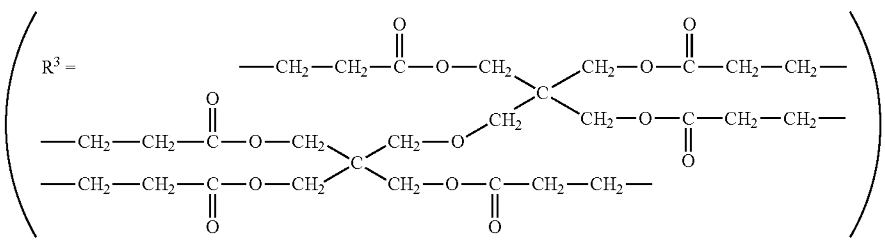
(C-29)
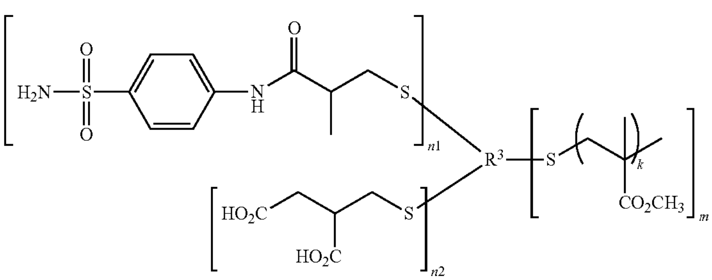
(n1 + n2 = 5, m = 1, k = 20, n1/n2 = 1/4)
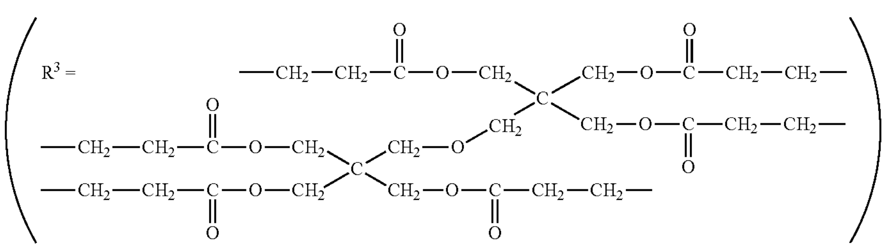

-continued
(C-30)
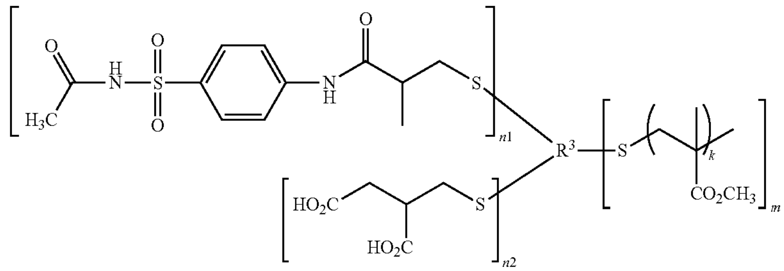
(n1 + n2 = 5, m = 1, k = 20, n1/n2 = 1/1)
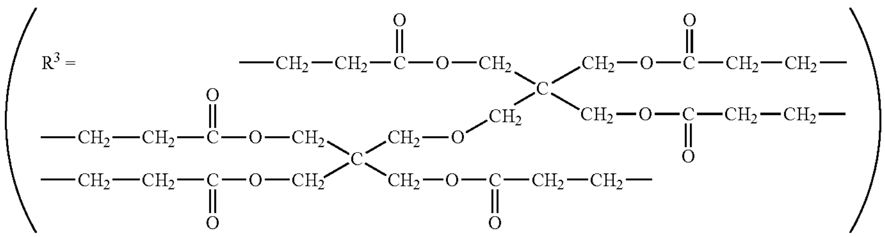
(C-31)
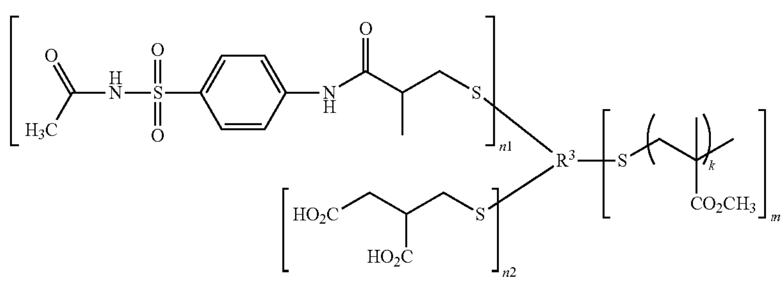
(n1 + n2 = 5, m = 1, k = 20, n1/n2 = 1/4)
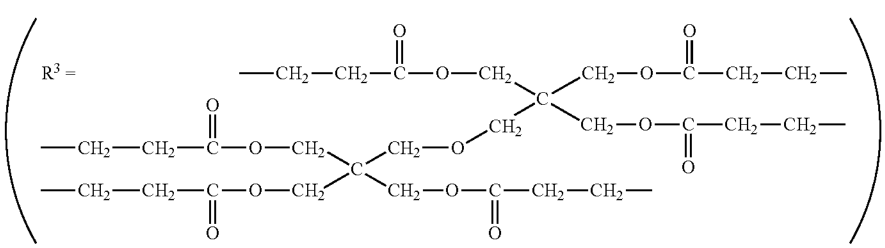

-continued
(C-32)
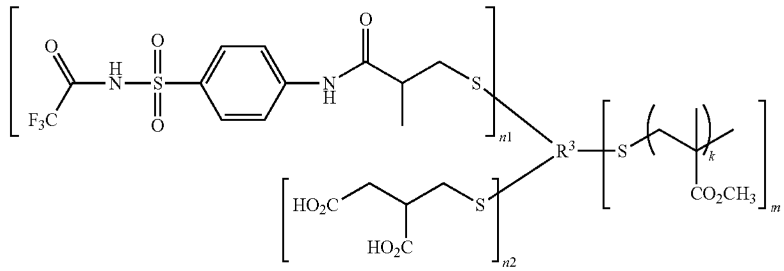
(n1 + n2 = 5, m = 1, k = 20, n1/n2 = 1/1)
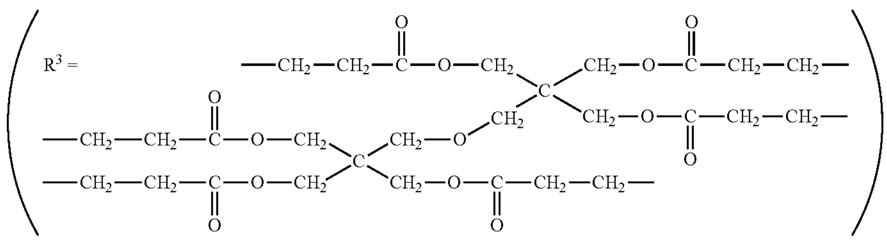
[Chem. 66]
(C-33)
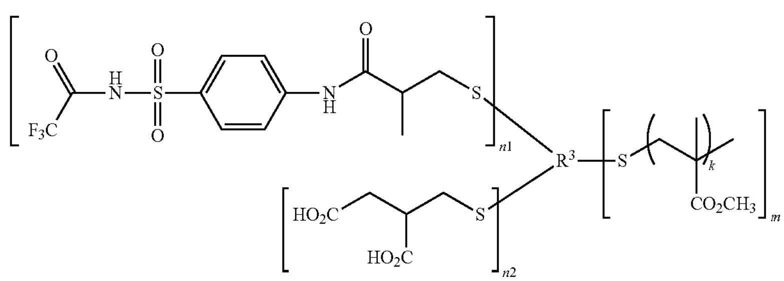
(n1 + n2 = 5, m = 1, k = 20, n1/n2 = 1/4)
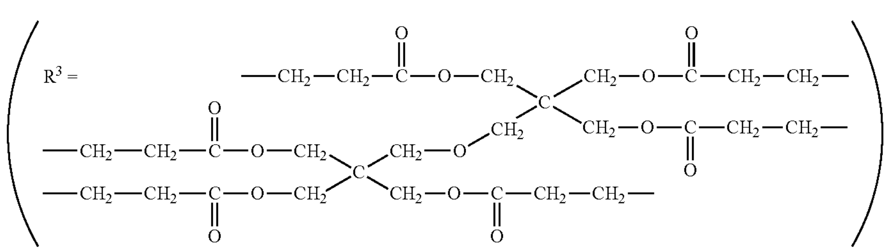

-continued
(C-34)
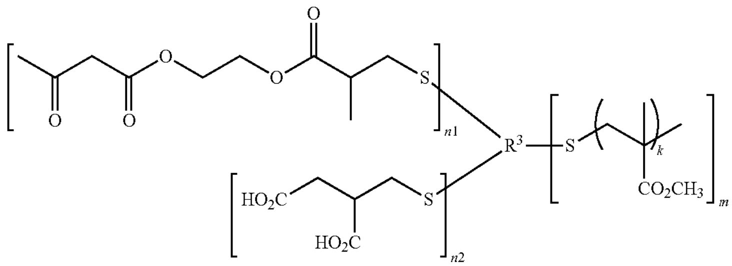
(n1 + n2 = 5, m = 1, k = 20, n1/n2 = 1/1)
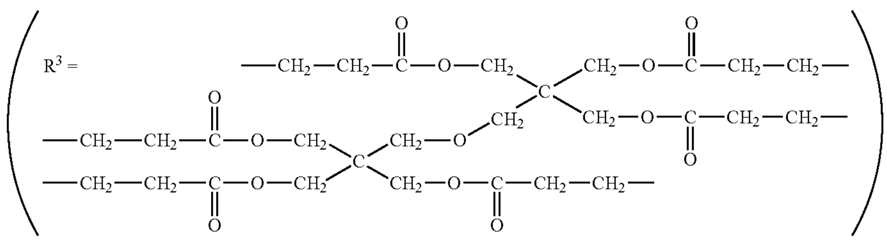
(C-35)
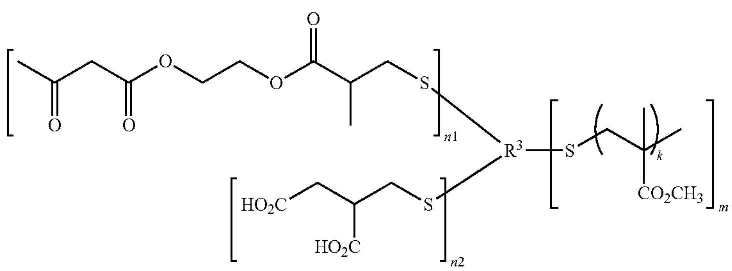
(n1 + n2 = 5, m = 1, k = 20, n1/n2 = 1/4)
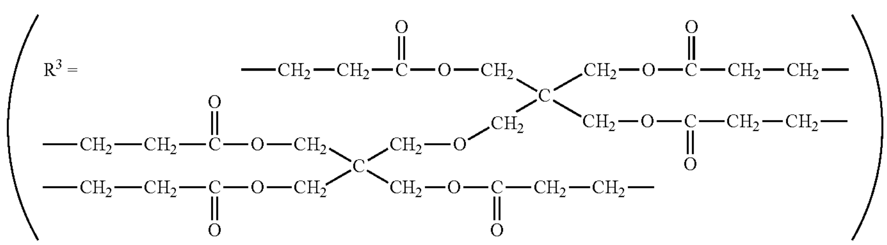
(C-36)
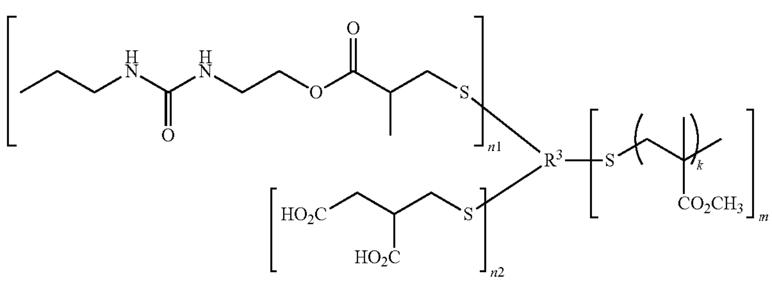
(n1 + n2 = 5, m = 1, k = 20, n1/n2 = 1/1)
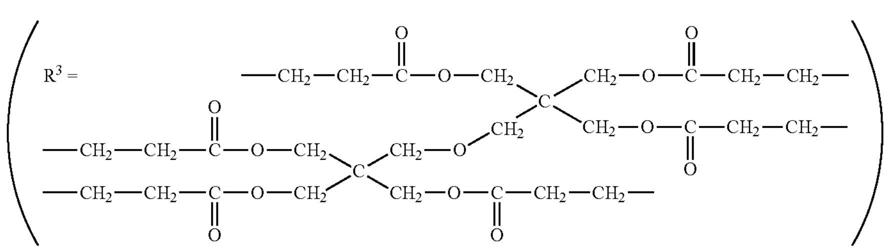

-continued
(C-37)
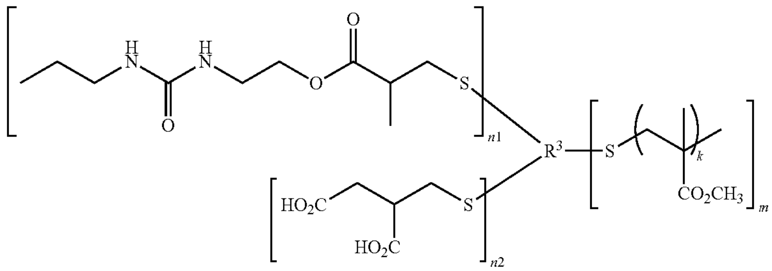
(n1 + n2 = 5, m = 1, k = 20, n1/n2 = 1/4)
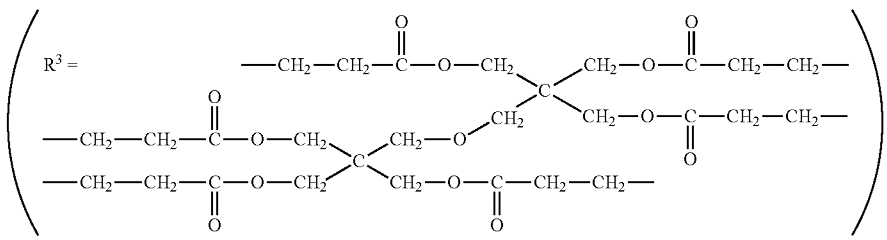
(C-38)
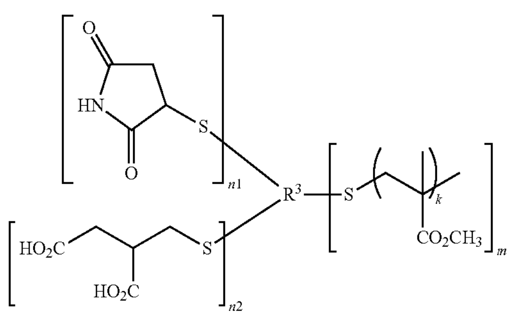
(n1 + n2 = 5, m = 1, k = 20, n1/n2 = 1/1)
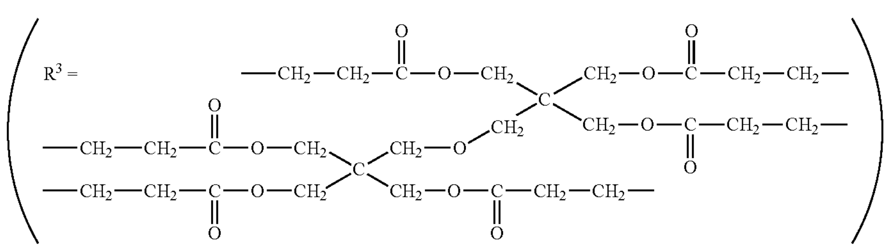

-continued
(C-39)
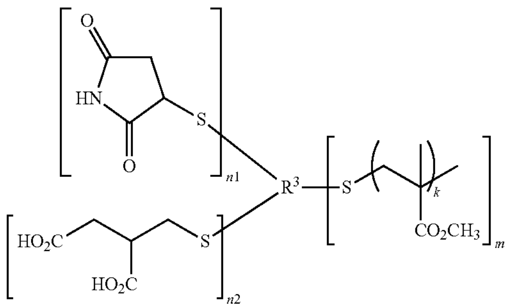
(n1 + n2 = 5, m = 1, k = 20, n1/n2 = 1/4)
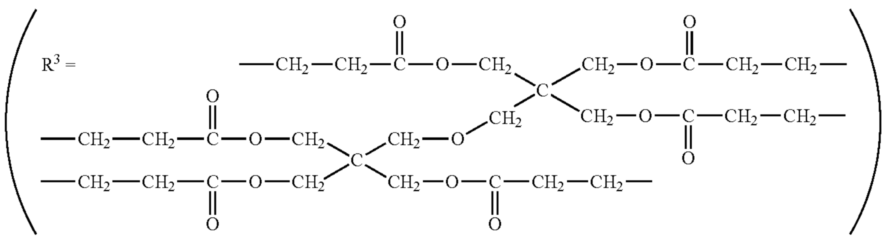
(C-40)
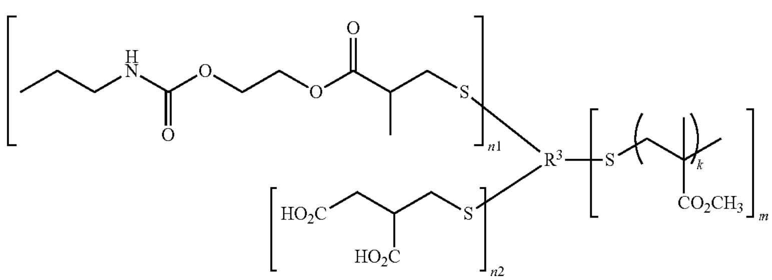
(n1 + n2 = 5, m = 1, k = 20, n1/n2 = 1/1)
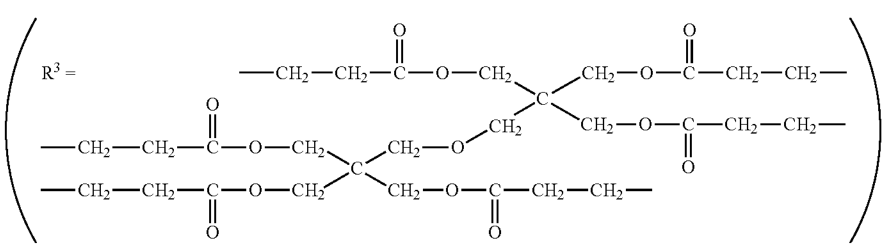

-continued
[Chem. 67]
(C-41)
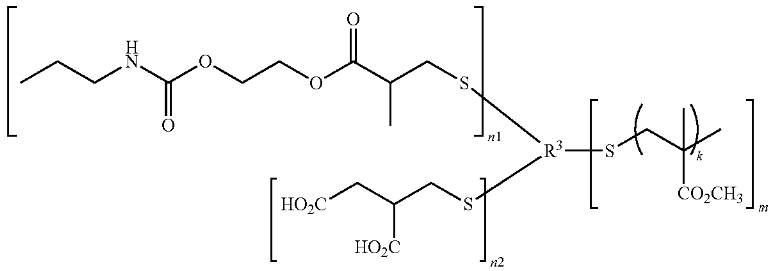
(n1 + n2 = 5, m = 1, k = 20, n1/n2 = 1/4)
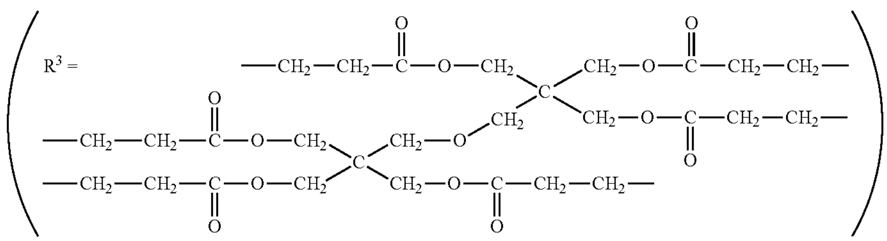
(C-42)
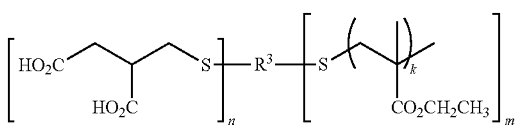
(n = 5, m = 1, k = 20)
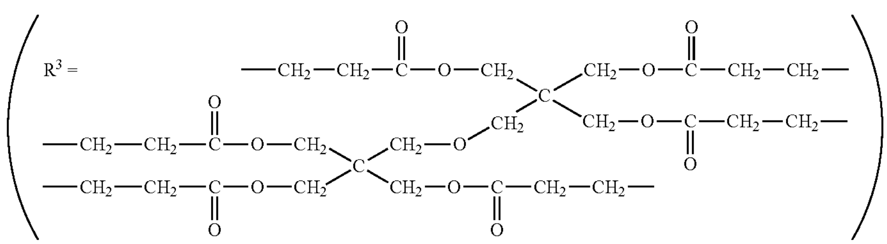
(C-43)
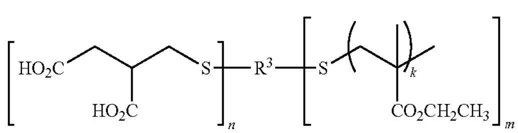
(n = 3, m = 3, k = 8.5)
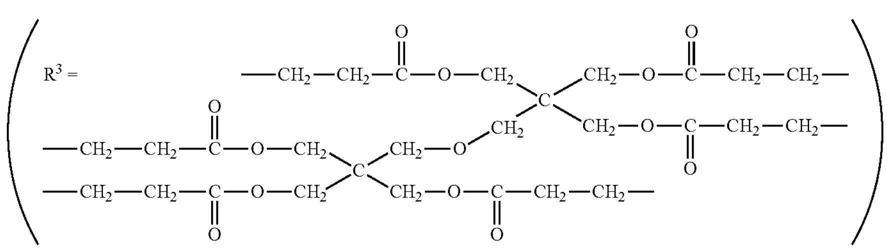

-continued
(C-44)
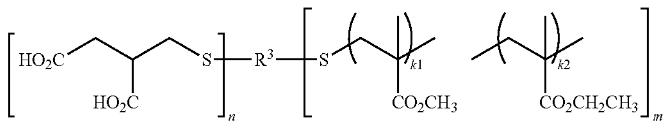
(n = 3.5, m = 2.5, k1 + k2 = 13, k1/k2 = 1/1)
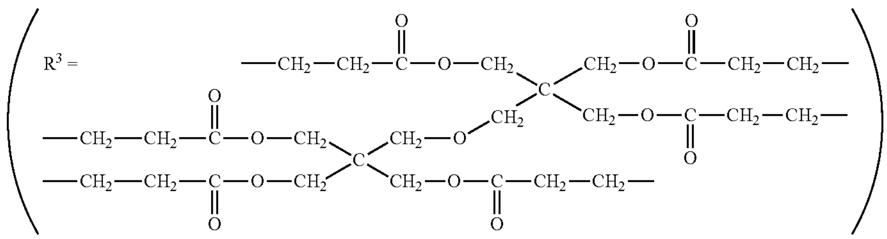
(C-45)
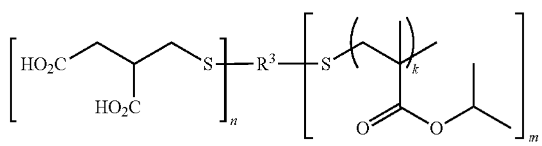
(n = 3.5, m = 2.5, k = 11)
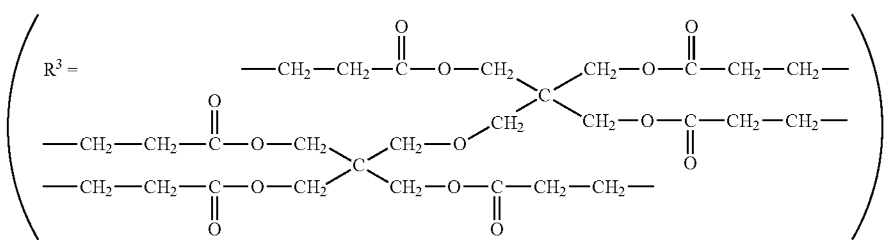
(C-46)
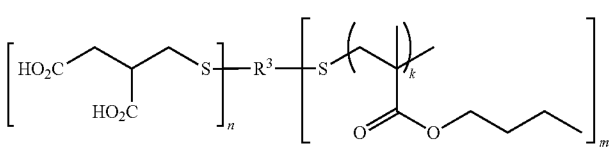
(n = 5.5, m = 0.5, k = 20)
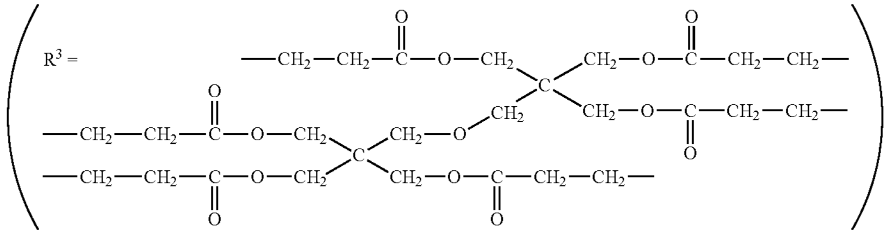

-continued
(C-47)
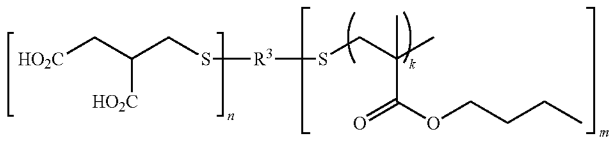
(n = 3, m = 3, k = 5)
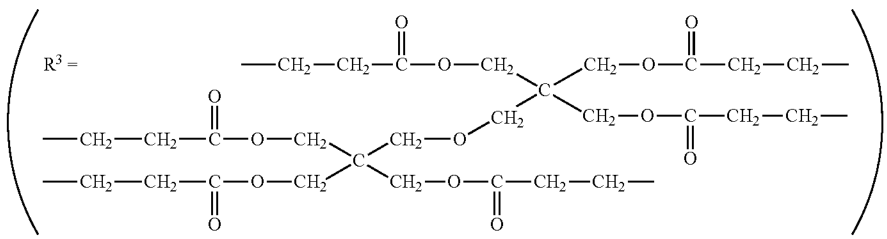
(C-48)
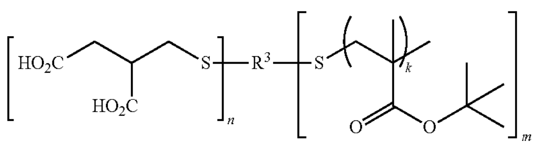
(n = 3, m = 3, k = 5)
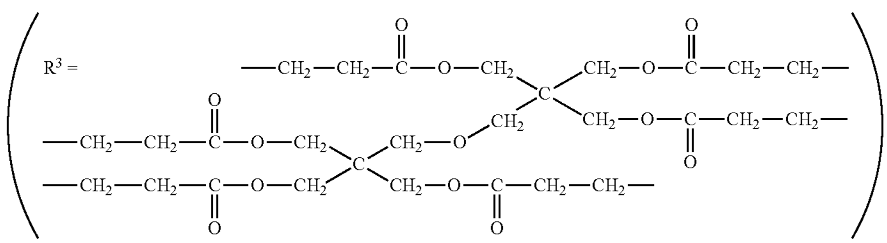
[Chem. 68]
(C-49)
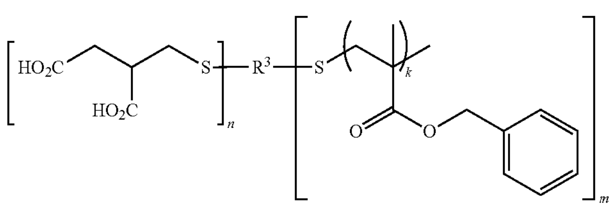
(n = 3, m = 3, k = 5)
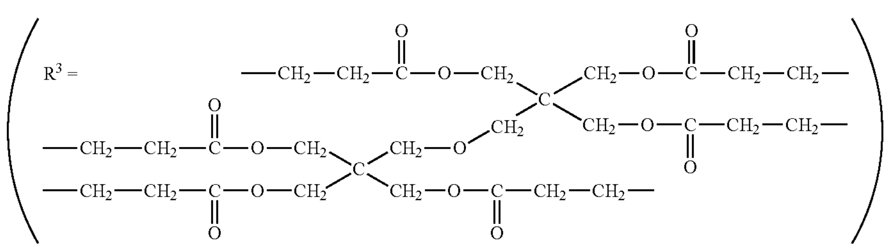

-continued
(C-50)
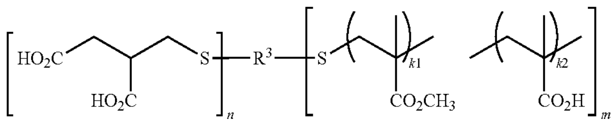
(n = 3.5, m = 2.5, k1 + k2 = 14, k1/k2 = 13/1)
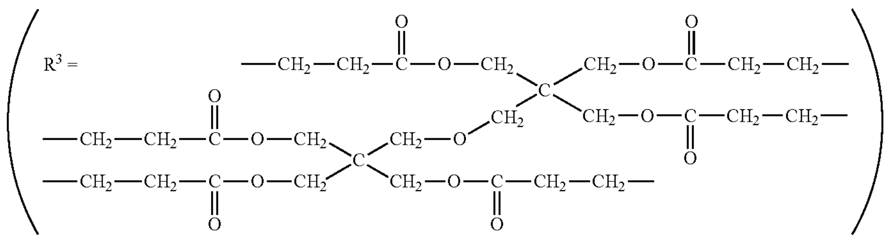
(C-51)
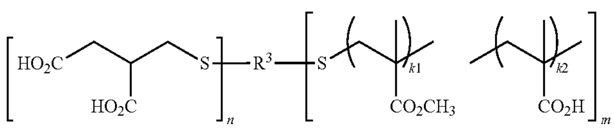
(n = 3.5, m = 2.5, k1 + k2 = 14, k1/k2 = 11/3)
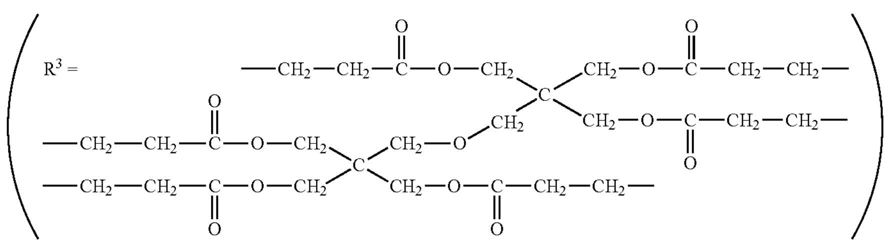
(C-52)
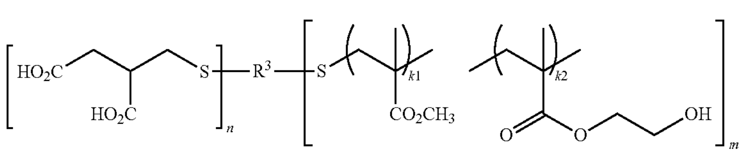
(n = 5.5, m = 0.5, k1 + k2 = 27.5, k1/k2 = 7/3)
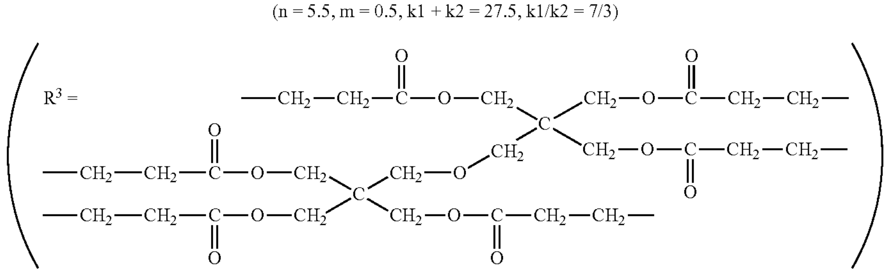

-continued
(C-53)
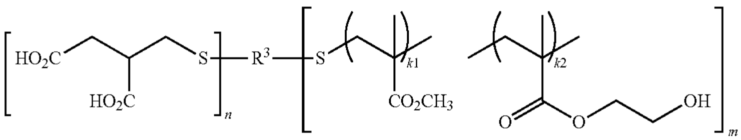
(n = 4.5, m = 1.5, k1 + k2 = 18.3, k1/k2 = 7/3)
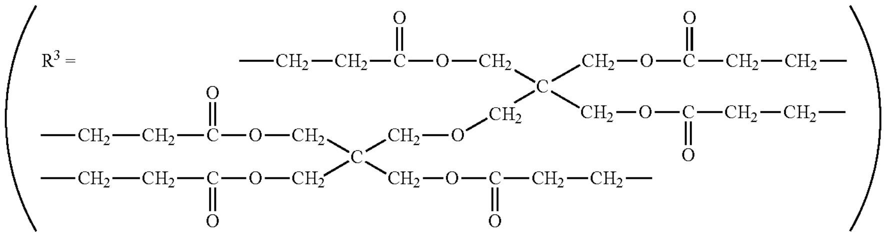
(C-54)
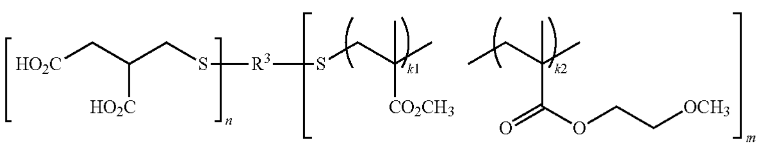
(n = 5.5, m = 0.5, k1 + k2 = 27.5, k1/k2 = 7/3)
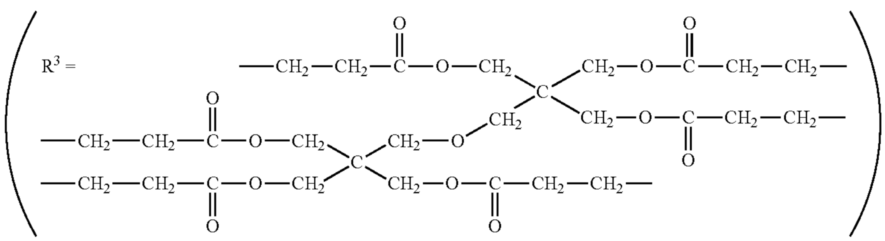
(C-55)
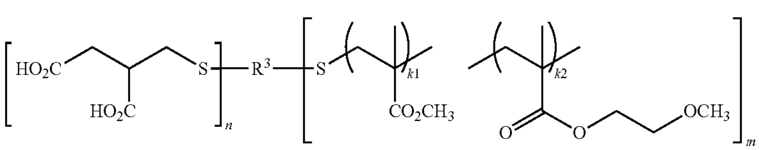
(n = 4.5, m = 1.5, k1 + k2 = 18.3, k1/k2 = 7/3)
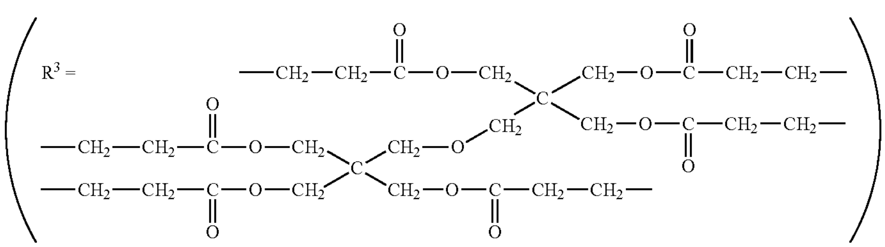

-continued
[Chem. 69]
(C-56)
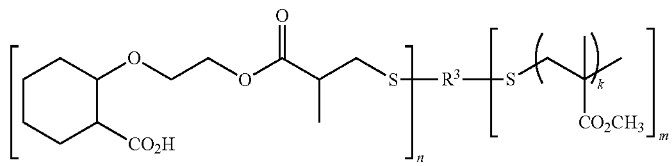
(n = 5.5, m = 0.5, k = 4)
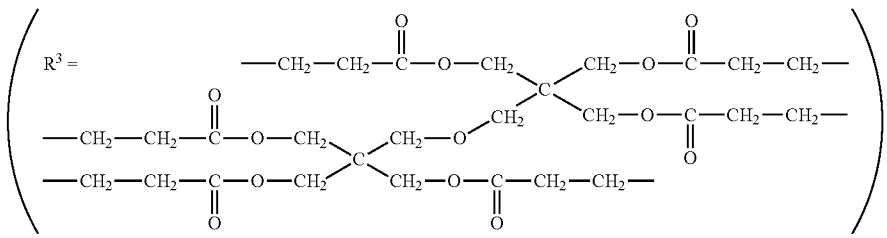
(C-57)
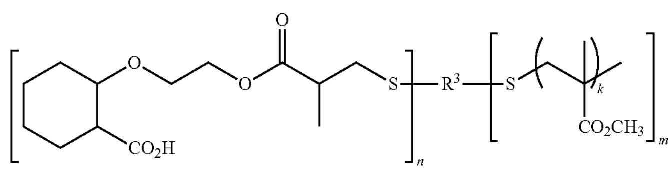
(n = 5, m = 1, k = 12)
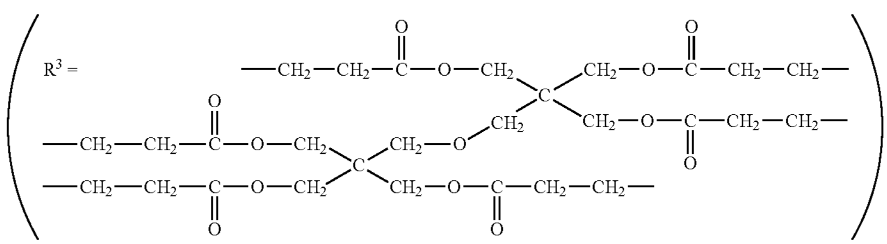
(C-58)
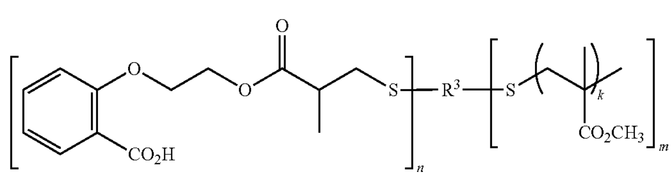
(n = 5.5, m = 0.5, k = 4)
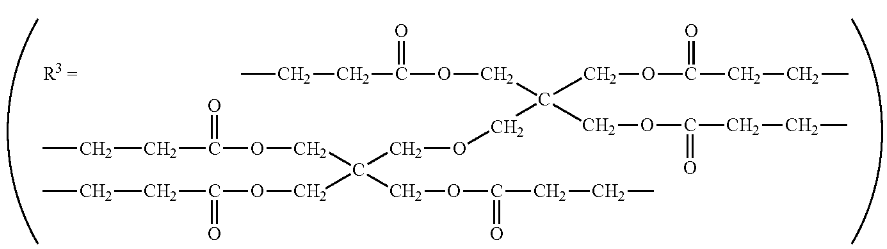

-continued
(C-59)
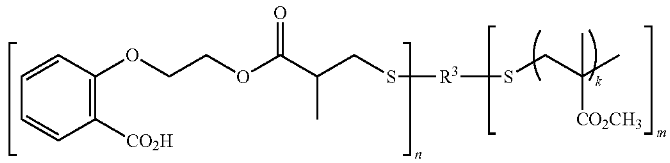
(n = 5, m = 1, k = 12)
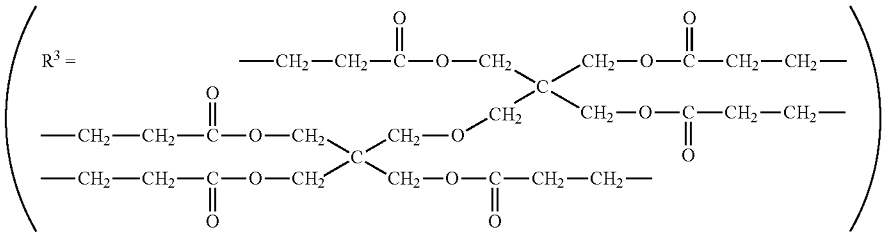
(C-60)
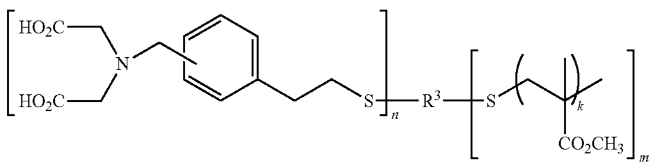
(n = 5, m = 1, k = 15)
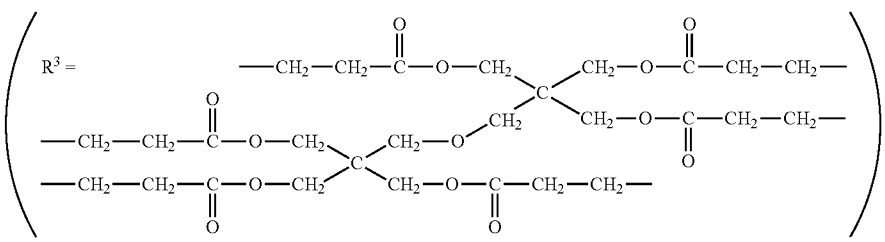
(C-61)
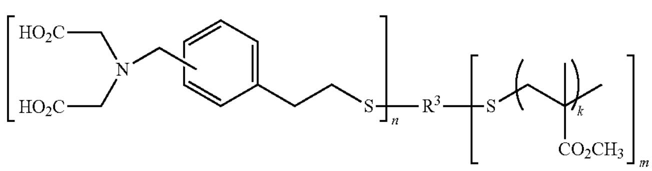
(n = 3.5, m = 2.5, k = 12)
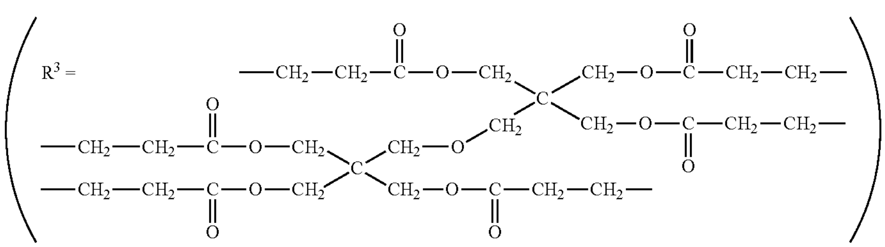

-continued
[Chem. 70]
(C-62)
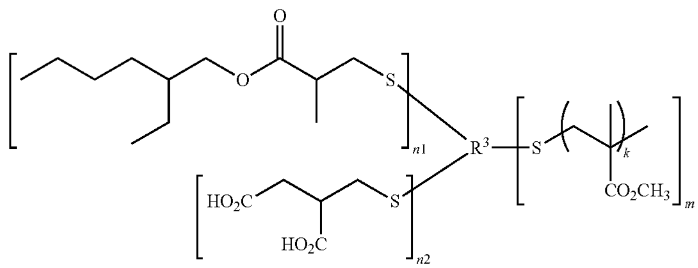
(n1 + n2 = 5, m = 1, k = 20, n1/n2 = 1/4)
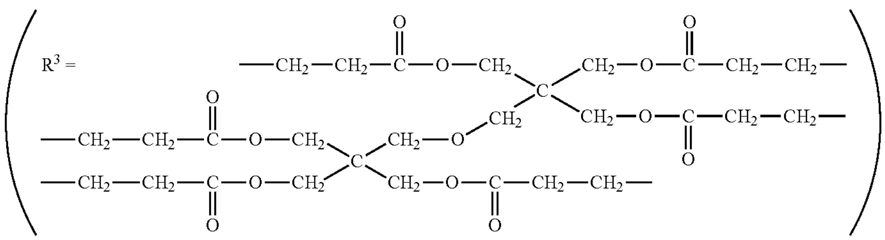
(C-63)
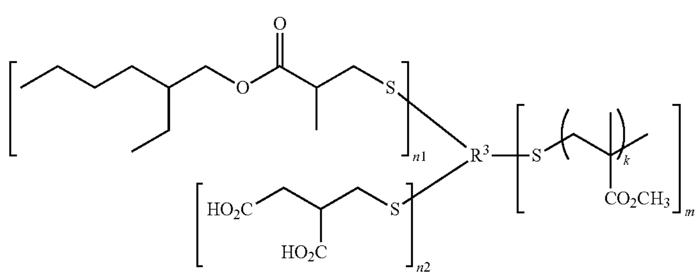
(n1 + n2 = 5, m = 1, k = 30, n1/n2 = 1/4)
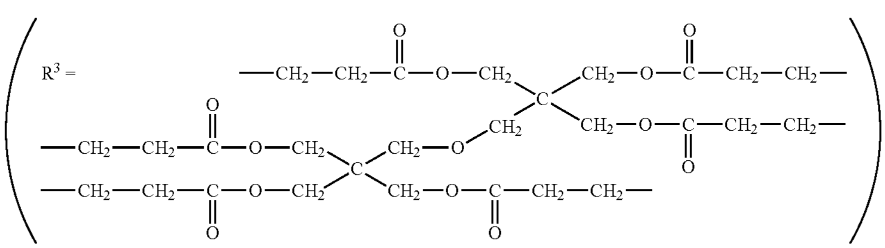

-continued
(C-64)
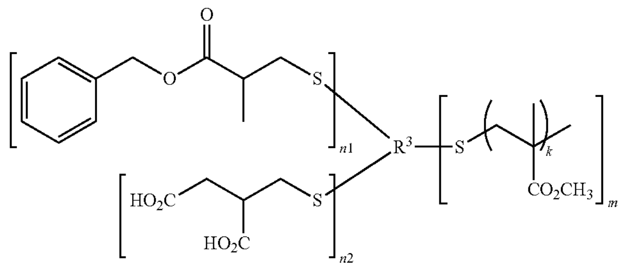
(n1 + n2 = 5, m = 1, k = 20, n1/n2 = 1/4)
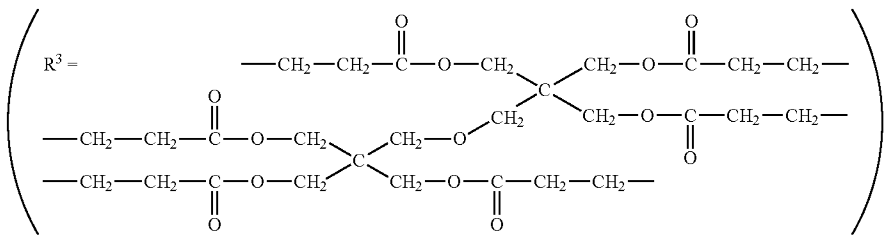
(C-65)
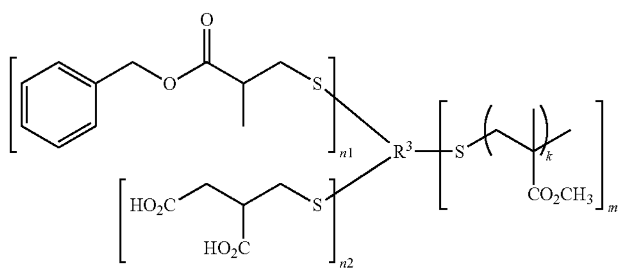
(n1 + n2 = 5, m = 1, k = 30, n1/n2 = 1/4)
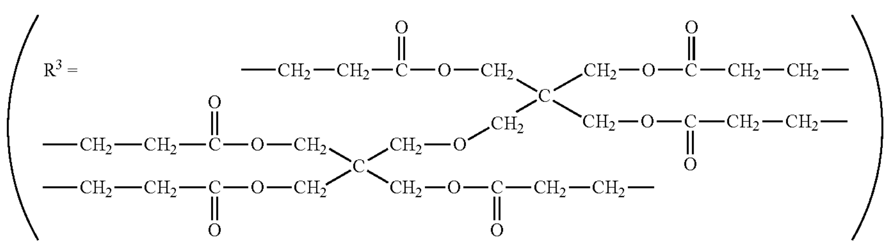
(C-66)
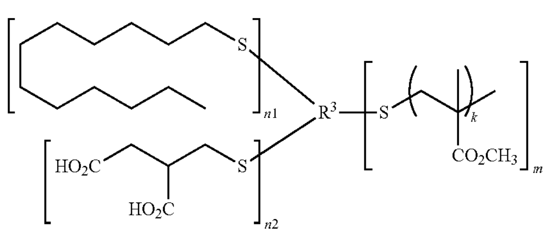
(n1 + n2 = 5, m = 1, k = 20, n1/n2 = 1/4)
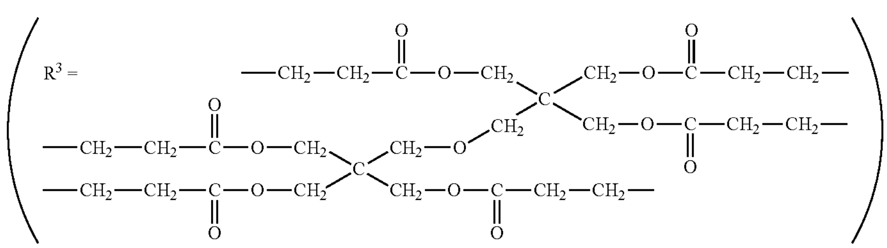

-continued
[Chem. 71]
(C-67)
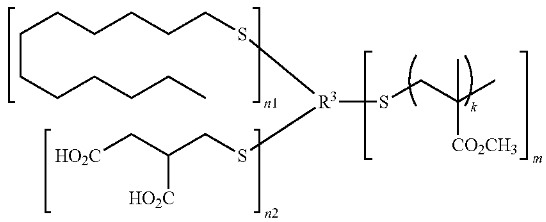
(n1 + n2 = 5, m = 1, k = 30, n1/n2 = 1/4)
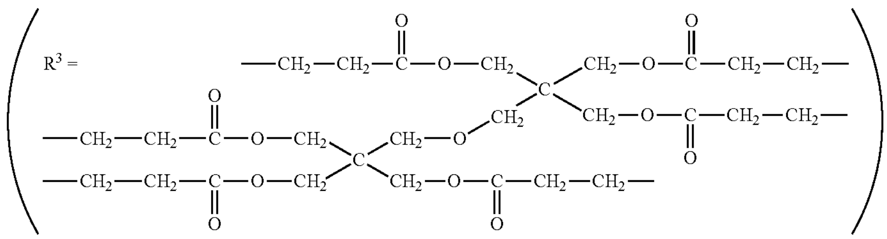
(C-68)
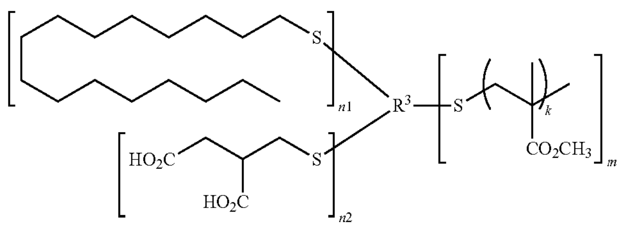
(n1 + n2 = 5, m = 1, k = 20, n1/n2 = 1/4)
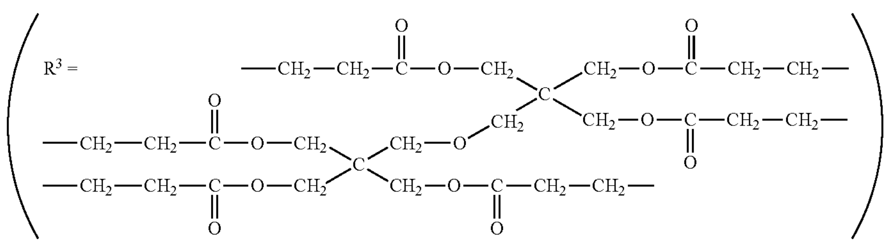
(C-69)
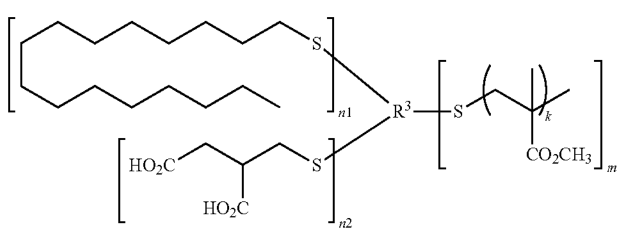
(n1 + n2 = 5, m = 1, k = 30, n1/n2 = 1/4)
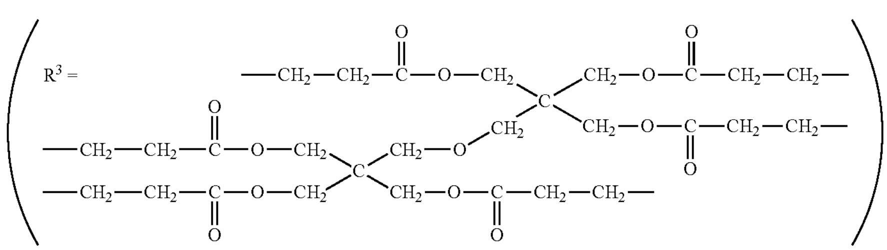

-continued
(C-70)
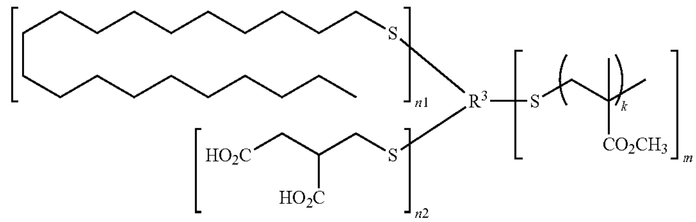
(n1 + n2 = 5, m = 1, k = 20, n1/n2 = 1/4)
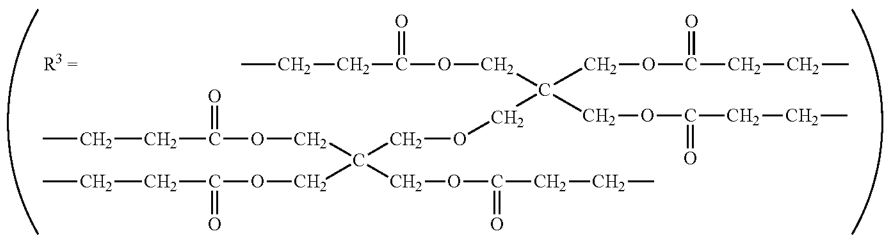
(C-71)
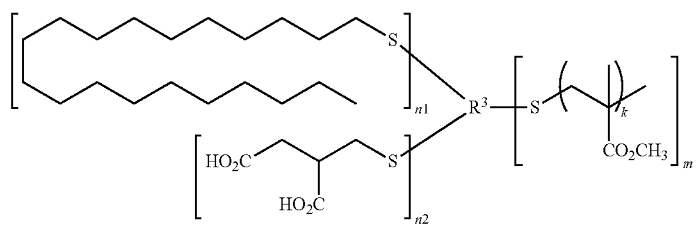
(n1 + n2 = 5, m = 1, k = 30, n1/n2 = 1/4)
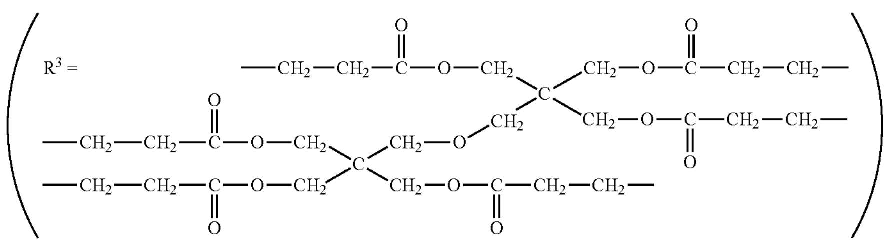
[Chem. 72]
(C-72)
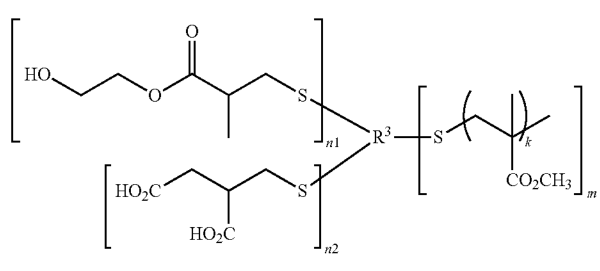
(n1 + n2 = 5, m = 1, k = 20, n1/n2 = 1/4)
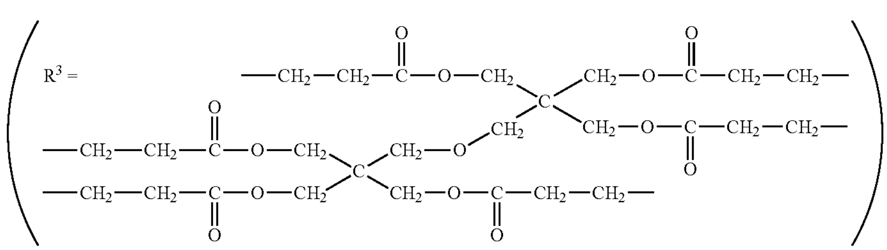

-continued
(C-73)
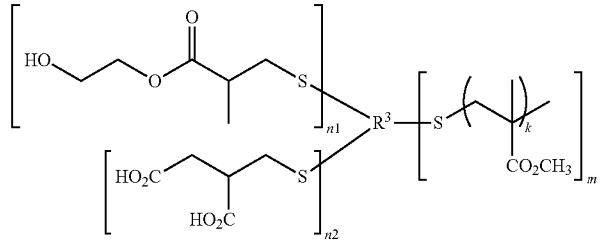
(n1 + n2 = 5, m = 1, k = 30, n1/n2 = 1/4)
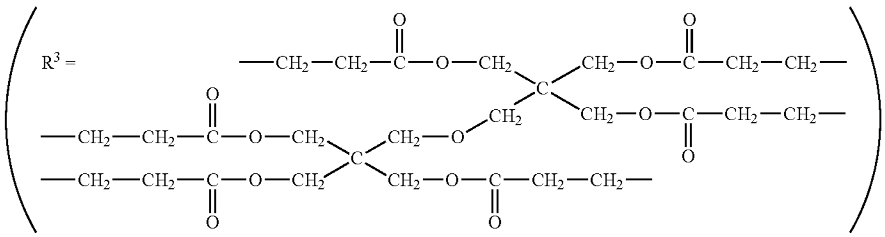
(C-74)
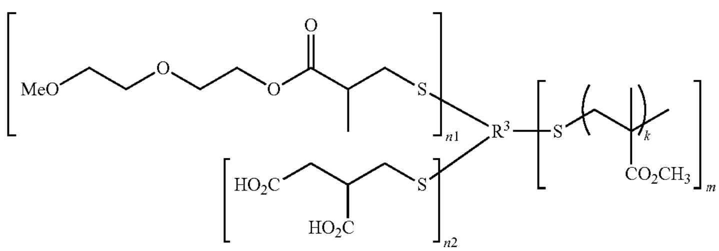
(n1 + n2 = 5, m = 1, k = 20, n1/n2 = 1/4)
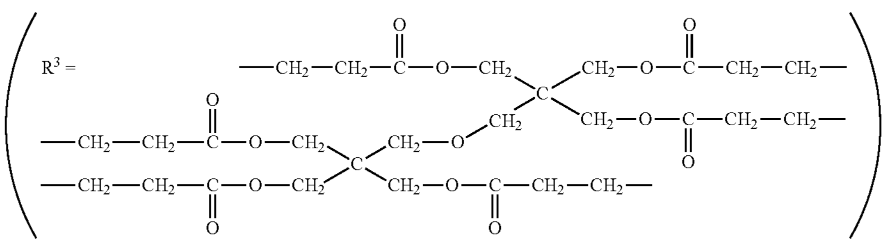
(C-75)
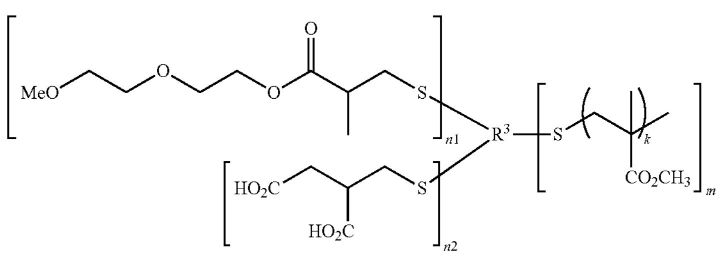
(n1 + n2 = 5, m = 1, k = 30, n1/n2 = 1/4)
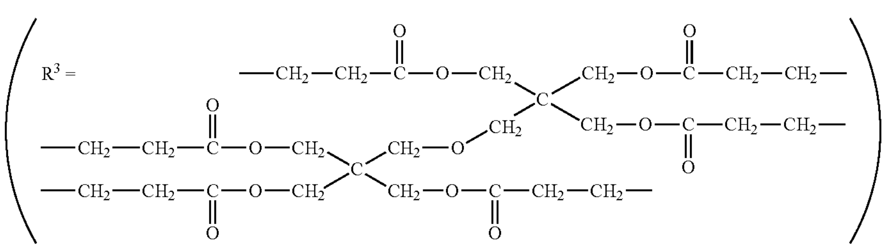

-continued
(C-76)
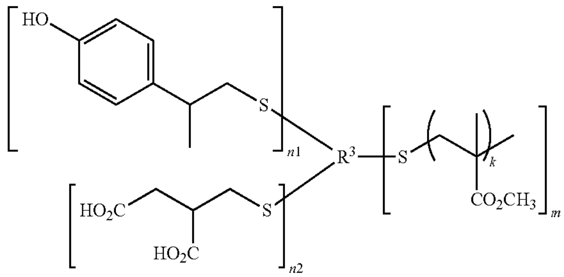
(n1 + n2 = 5, m = 1, k = 20, n1/n2 = 1/4)
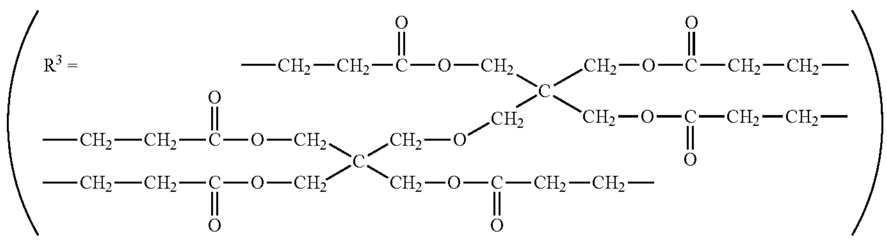
[Chem. 73]
(C-77)
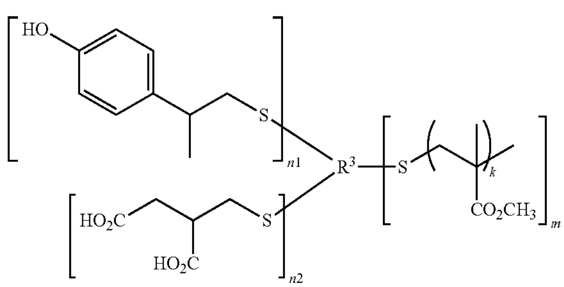
(n1 + n2 = 5, m = 1, k = 30, n1/n2 = 1/4)
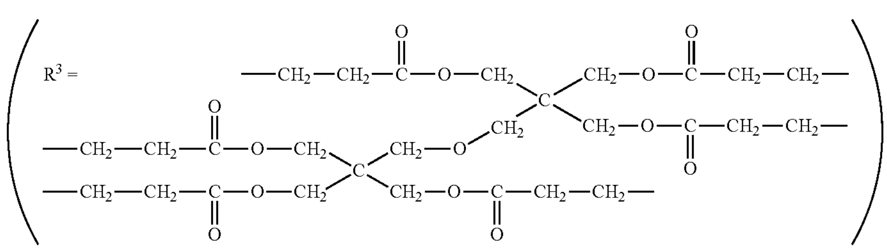

-continued
(C-78)
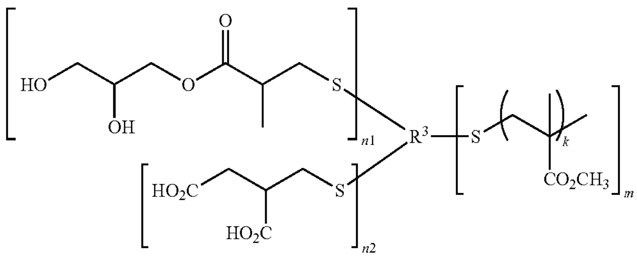
($n1 + n2 = 5$, $m = 1$, $k = 20$, $n1/n2 = 1/4$)
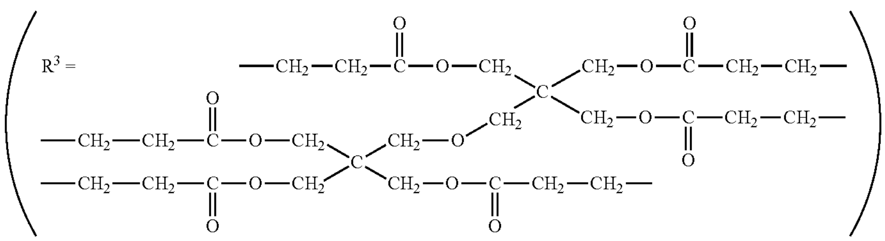
(C-79)
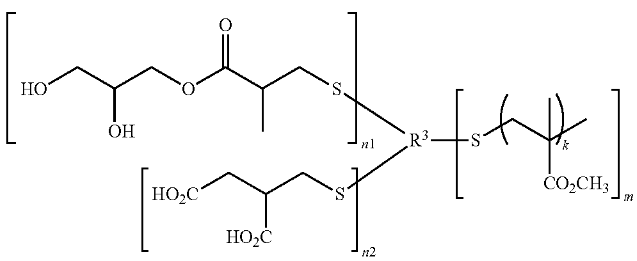
($n1 + n2 = 5$, $m = 1$, $k = 30$, $n1/n2 = 1/4$)
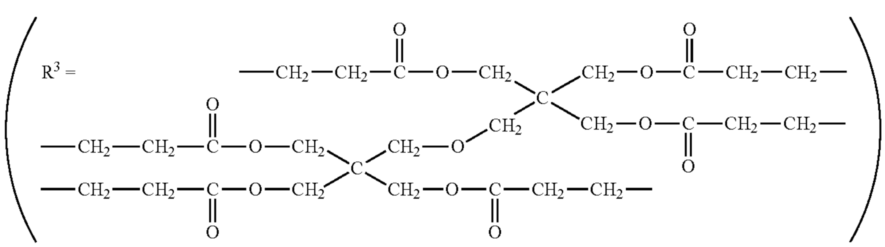
(C-80)
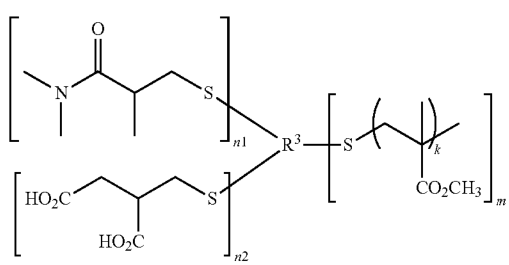
($n1 + n2 = 5$, $m = 1$, $k = 20$, $n1/n2 = 1/4$)
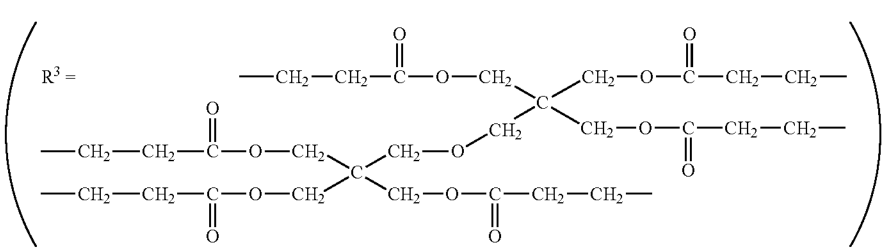

-continued
(C-81)
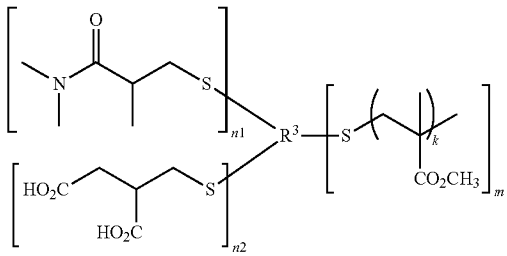
(n1 + n2 = 5, m = 1, k = 20, n1/n2 = 1/1)
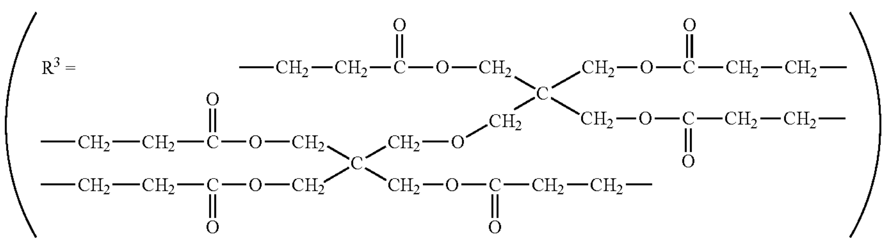
[Chem. 74]
(C-82)
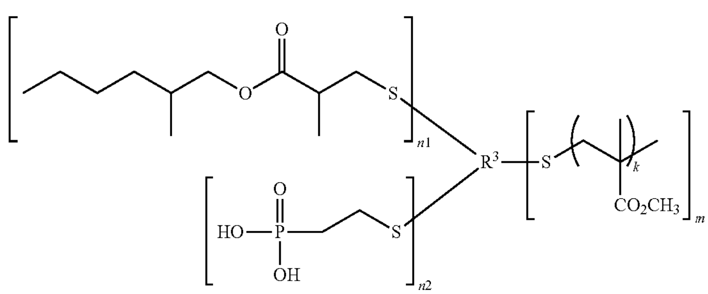
(n1 + n2 = 5, m = 1, k = 20, n1/n2 = 1/4)
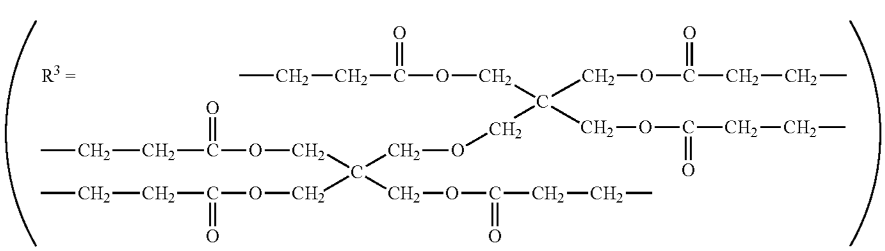

-continued
(C-83)
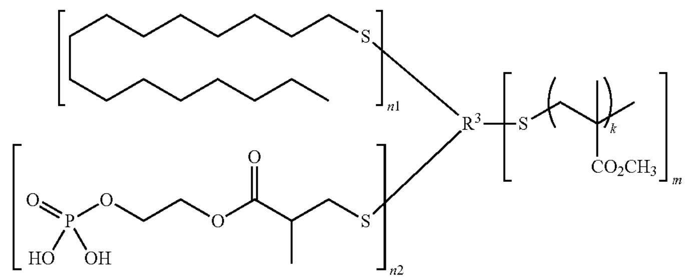
(n1 + n2 = 3, m = 3, k = 10, n1/n2 = 1/1)
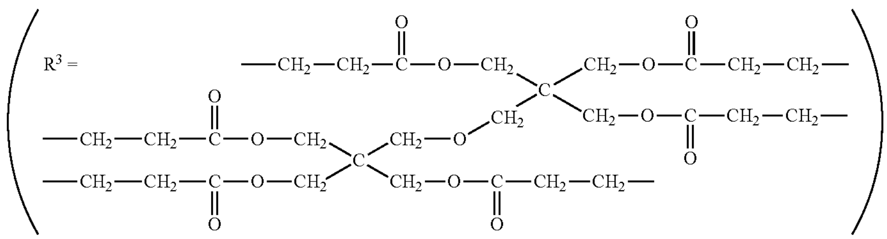
(C-84)
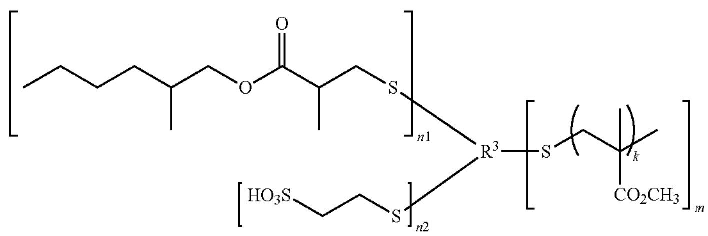
(n1 + n2 = 5.5, m = 0.5, k = 15, n1/n2 = 1/9)
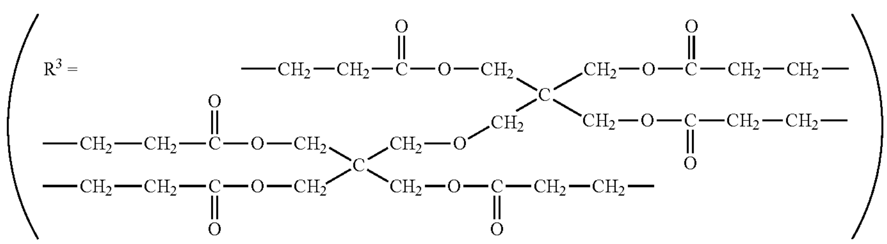
(C-85)
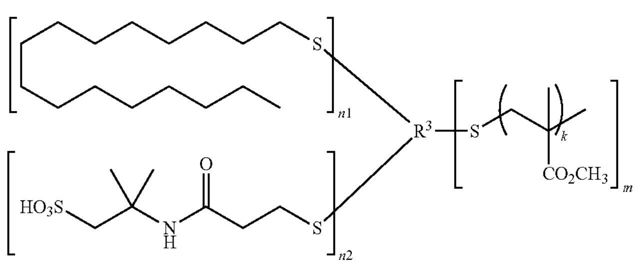
(n1 + n2 = 3, m = 3, k = 10, n1/n2 = 1/4)
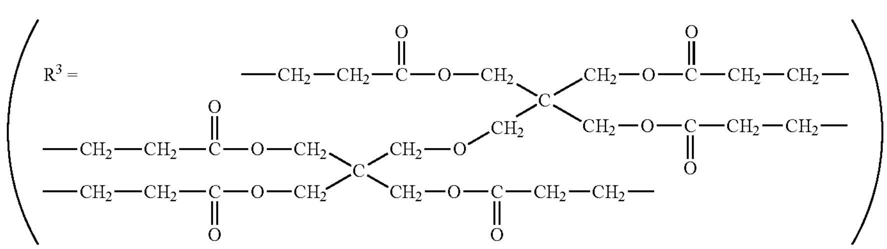

-continued
[Chem. 75]
(C-86)
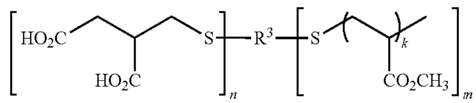
(n = 5, m = 1, k = 20)
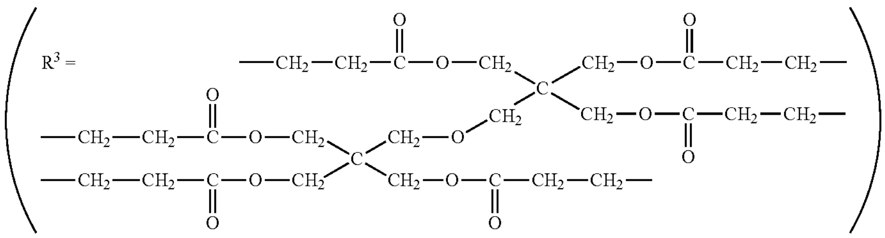
(C-87)
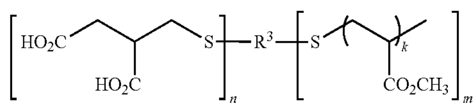
(n = 3.5, m = 2.5, k = 14)
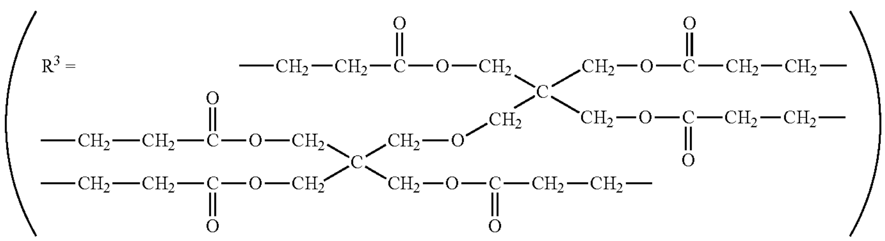
(C-88)
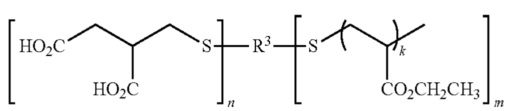
(n = 5, m = 1, k = 20)
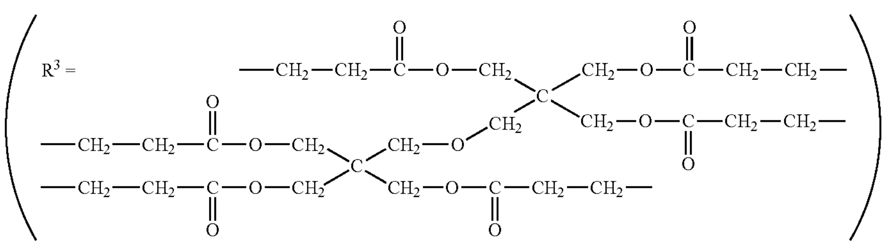
(C-89)
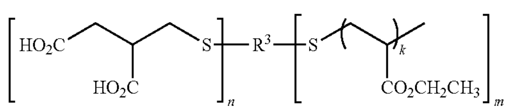
(n = 3.5, m = 2.5, k = 14)
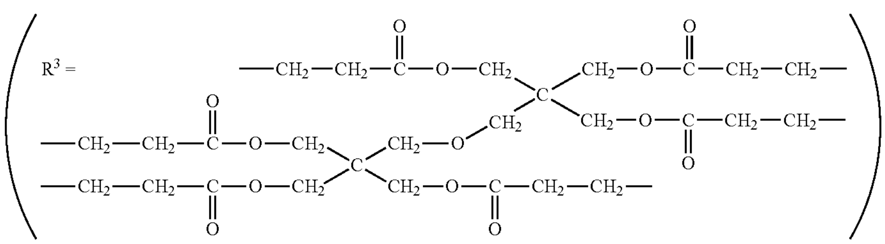

-continued
(C-90)
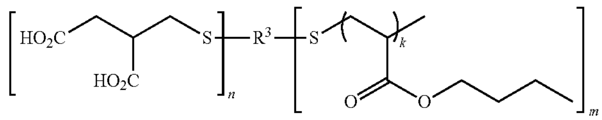
(n = 5, m = 1, k = 20)
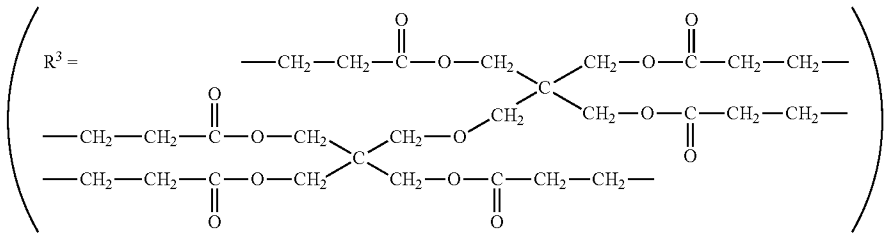
(C-91)
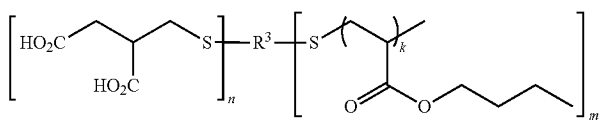
(n = 3, m = 3, k = 7.8)
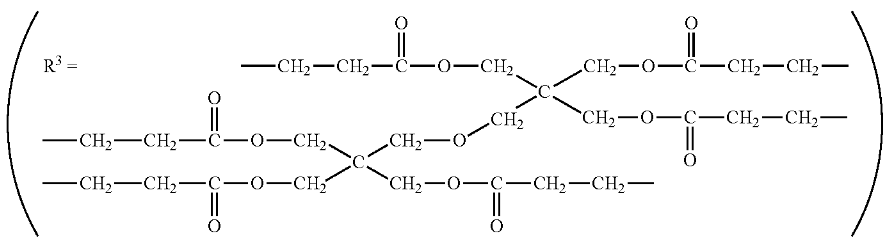
[Chem. 76]
(C-92)
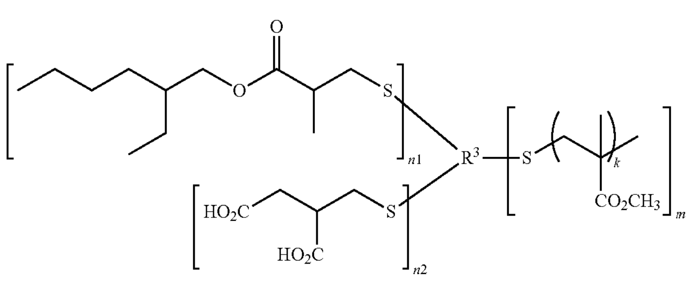
(n1 + n2 = 3.5, m = 0.5, k = 30, n1/n2 = 1/9)
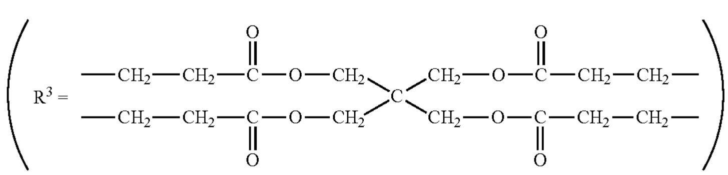

-continued
(C-93)
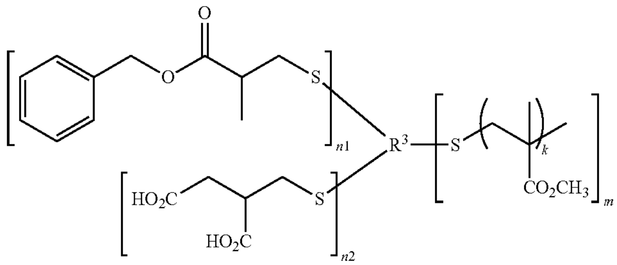
(n1 + n2 = 3, m = 1, k = 30, n1/n2 = 1/4)
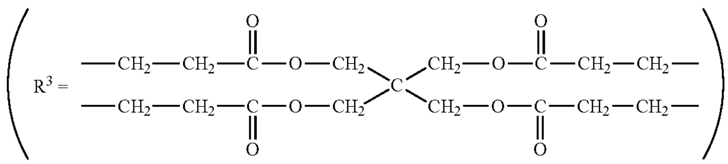
(C-94)
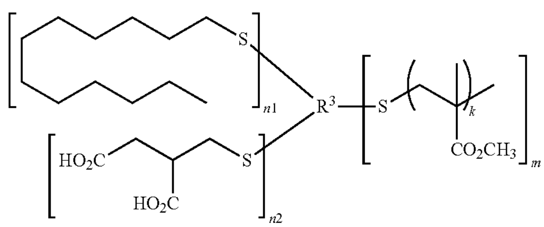
(n1 + n2 = 2.5, m = 0.5, k = 25, n1/n2 = 1/9)
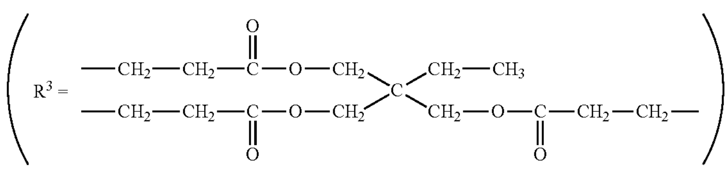
(C-95)
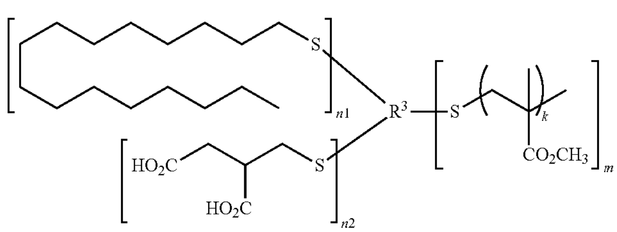
(n1 + n2 = 5, m = 1, k = 20, n1/n2 = 1/4)
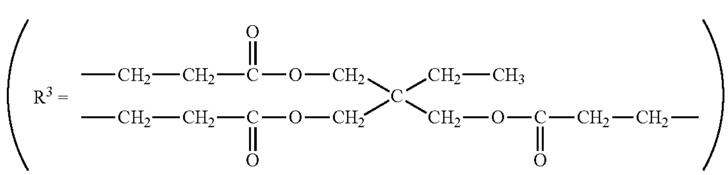

-continued
[Chem. 77]
(C-96)
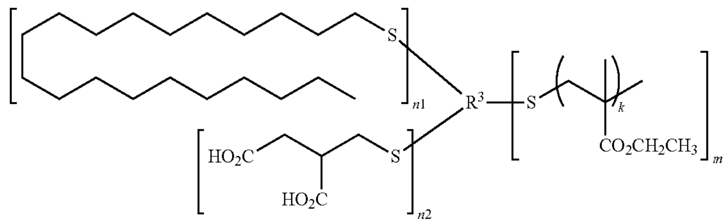
(n1 + n2 = 5, m = 1, k = 15, n1/n2 = 1/4)
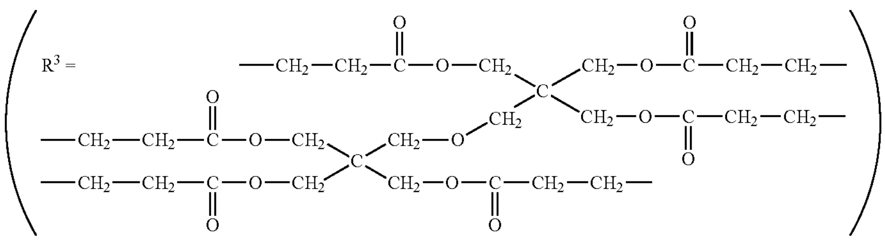
(C-97)
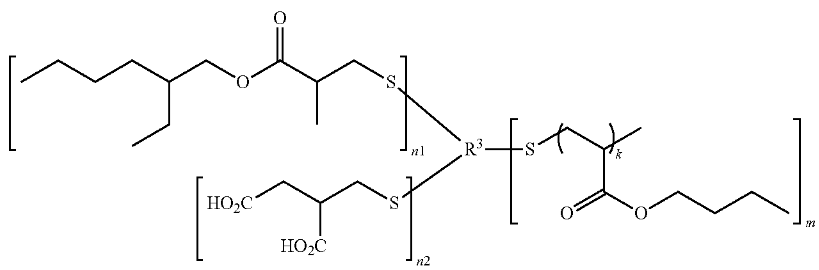
(n1 + n2 = 5, m = 1, k = 30, n1/n2 = 1/4)
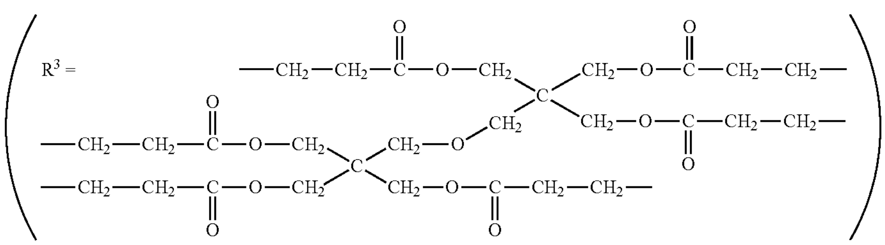
(C-98)
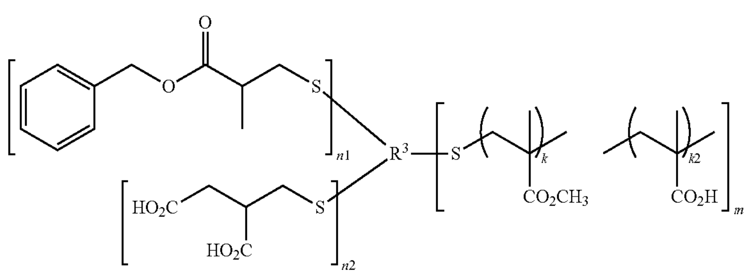
(n1 + n2 = 5, m = 1, k1 + k2 = 30, n1/n2 = 1/4, k1/k2 = 9/1)
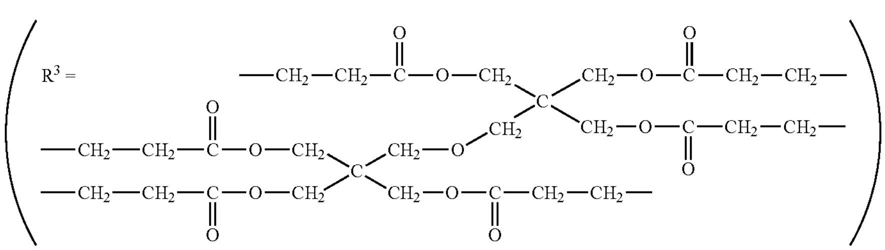

-continued (C-99)

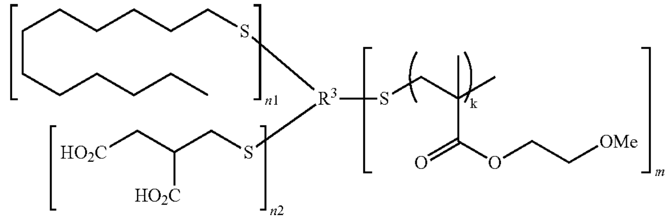

(n1 + n2 = 5, m = 1, k = 20, n1/n2 = 1/4)

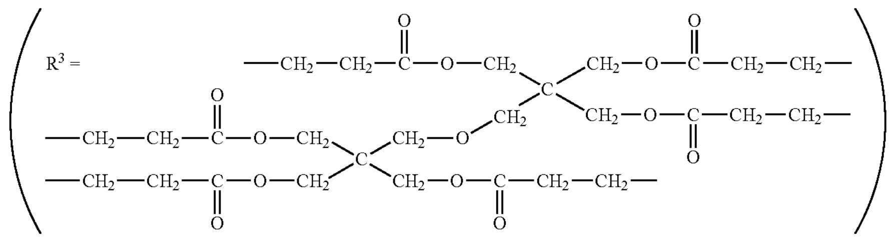

Synthesis Example 12

Synthesis of Macromonomer A5

In a nitrogen atmosphere, 35.0 parts of 2-ethylhexanol, 215.0 parts of ϵ-caprolactone and 0.20 parts of dibutyltin laurate were heated at 90° C. for 5 hours and then at 110° C. for 1 hour to obtain a monohydroxy form of polyester. The termination of reaction was confirmed by measuring the disappearance of ϵ-caprolactone by NMR. After changing the atmosphere to air, 0.071 parts of 2,6-di-tert-butyl-4-methylphenol (BHT) and 37.7 parts of allylsuccinic anhydride were added, and the reaction was performed at 110° C. for 8 hours to obtain Macromonomer A5 shown below. The termination of reaction was confirmed by measuring the disappearance of 95% or more of allylsuccinic anhydride by NMR. In Macromonomer A5, the weight average molecular weight in terms of polystyrene was 1,400, and the acid value was 54 mgKOH/g.

[Chem. 78]

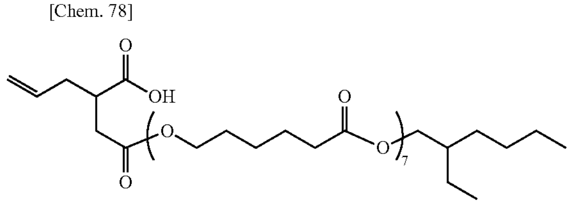

Macromonomer A5

Synthesis Example 13

Synthesis of Macromonomer E5

200 Parts of propylene glycol monomethyl ether acetate was charged into a reaction vessel and heated at 80° C. while injecting a nitrogen gas into the vessel. 40.1 Parts of thioethanol, 360 parts of methyl methacrylate, 200 parts of propylene glycol monomethyl ether acetate, and 35.5 parts of V-601 were added to a separate vessel, stirred and then added dropwise to the reaction vessel under heating and stirring at 80° C. over 2 hours. The reaction was further allowed to proceed at the same temperature for 2 hours, and 35.5 parts of V-601 was added. The reaction was further continued at 90° C. for 1 hour to obtain a monohydroxy form of polymethyl methacrylate. The termination of reaction was confirmed by measuring the disappearance of 99% or more of the double bond moiety of methyl methacrylate by NMR. After changing the atmosphere to air, 0.134 g of 2,6-di-tertiary-butyl-4-methylphenol and 71.2 g of allylsuccinic anhydride were added, and the reaction was performed at 110° C. for 8 hours to obtain Macromonomer E5 shown below (solid content concentration=28.9 mass %). The termination of reaction was confirmed by measuring the disappearance of 95% or more of allylsuccinic anhydride by NMR. In Macromonomer E5, the weight average molecular weight in terms of polystyrene was 1,600, and the acid value was 64 mgKOH/g.

[Chem. 79]

Macromonomer E5

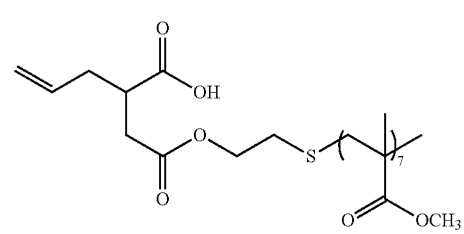

Macromonomers A1 to A4 were synthesized in the same manner as in Synthesis Example 12, and Macromonomers E1 to E4 were synthesized in the same manner as in Synthesis Example 13. The structural formula and physical values of each macromonomer are shown below.

[Chem. 80]

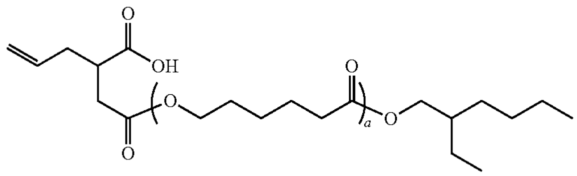

Macromonomer A1: a = 60
Macromonomer A2: a = 30
Macromonomer A3: a = 20
Macromonomer A4: a = 14
Macromonomer A5: a = 7

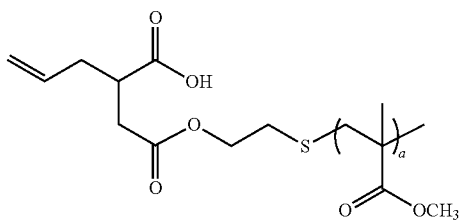

Macromonomer E1: a = 60
Macromonomer E2: a = 30
Macromonomer E3: a = 20
Macromonomer E4: a = 14
Macromonomer E5: a = 7

TABLE 3

| Macromonomer | Repeating Unit a | Weight Average Molecular Weight (Mw) | Acid Value (mgKOH/g) |
|---|---|---|---|
| A1 | 60 | 7300 | 7 |
| A2 | 30 | 3900 | 16 |

TABLE 3-continued

| Macromonomer | Repeating Unit a | Weight Average Molecular Weight (Mw) | Acid Value (mgKOH/g) |
|---|---|---|---|
| A3 | 20 | 2800 | 22 |
| A4 | 14 | 2200 | 31 |
| A5 | 7 | 1400 | 54 |
| E1 | 60 | 6800 | 9 |
| E2 | 30 | 3800 | 18 |
| E3 | 20 | 2900 | 27 |
| E4 | 14 | 2300 | 37 |
| E5 | 7 | 1600 | 64 |

Synthesis Example 14

Synthesis of Polymer Compound (C-106)

20 Parts of dipentaerythritol hexakis(3-mercaptopropionate) [(33): produced by Sakai Chemical Industry Co., Ltd.], 81.9 parts of Macromonomer A5, 7.67 parts of Compound (A-1) having an adsorption moiety and having a carbon-carbon double bond, and 255 parts of propylene glycol monomethyl ether acetate were charged into a reaction vessel and heated at 90° C. while injecting a nitrogen gas into the vessel. After stirring at the same temperature for 15 minutes, 0.71 parts of V-601 was added to initiate the reaction. The reaction was allowed to proceed at the same temperature for 2 hours, and 0.71 parts of V-601 was added. The reaction was further continued at 90° C. for 2 hours to obtain a 30 mass % solution of the polymer compound shown below (C-106: weight average molecular weight: 4,600, acid value: 108 mgKOH/g). The termination of reaction was confirmed by measuring the disappearance of 95% or more of the double bond moiety of Macromonomer A5 and pentenoic acid by NMR.

[Chem. 81]

(C-106)

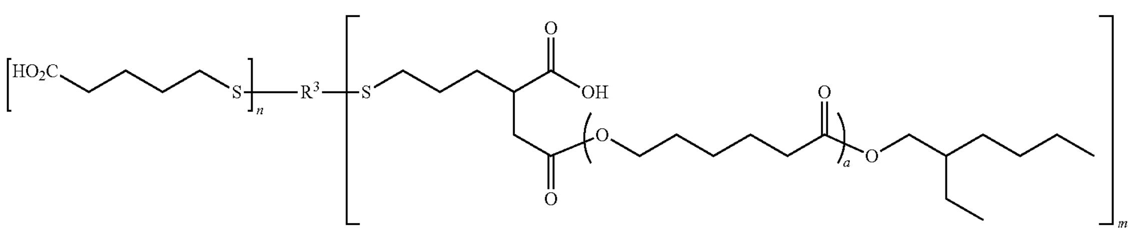

(n = 3, m = 3, a = 7)

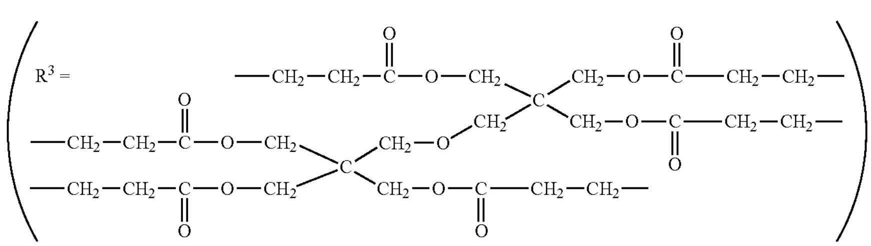

Polymer Compounds (C-101) to (C-105) and (C-107) to (C-136) were also synthesized in the same manner as in "Synthesis of Polymer Compound (C-106)" of Synthesis Example 14 except for appropriately changing the kind and charge amount of the "compound having an (m+n)-valent linking group $R^1$ and a mercapto group" (corresponding to the above-described "compound having from 3 to 10 mercapto groups per molecule"), the kind and charge amount of the "compound having a substituent $A^1$ and a carbon-carbon double bond" (corresponding to the above-described "compound having an adsorption moiety and having a carbon-carbon double bond"), and the kind and charge amount of the "macromonomer" (the compound corresponding to the polymer chain represented by $P^1$, $P^2$ or $P^3$), which are raw materials. The macromonomers used in the synthesis of (C-118) to (C-136) are as follows.

[Chem. 82]

(M-11)

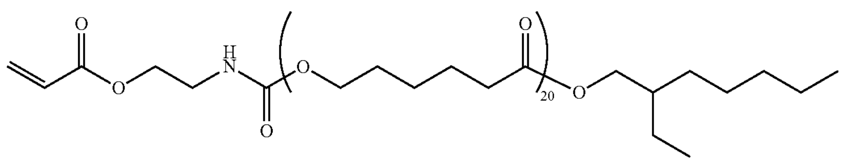

(M-12)

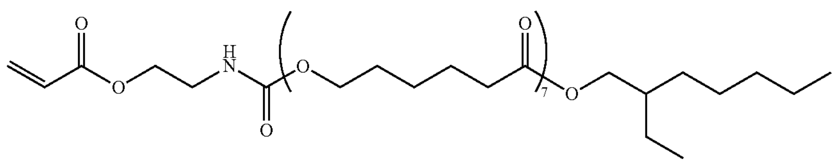

(M-13)

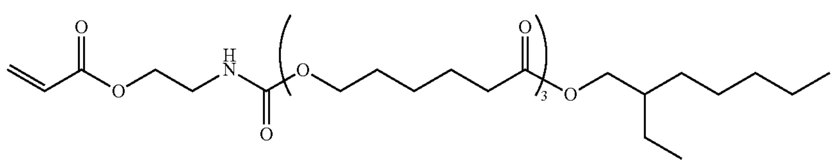

(M-17)

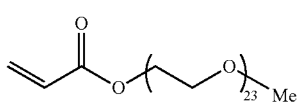

[Chem. 83]

(N-1)

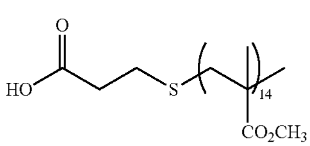

(N-2)

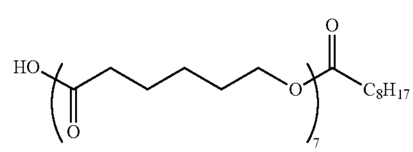

(N-3)

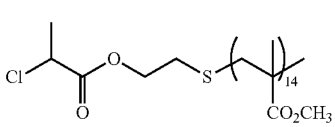

(N-4)

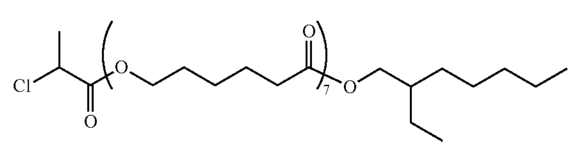

(N-5)

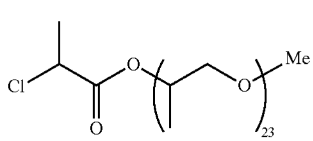

With regard to these Polymer Compounds (C-101) to (C-136) synthesized, the "compound having an (m+n)-valent linking group $R^1$ and a mercapto group" as a raw material, the "compound having a substituent $A^1$ and a carbon-carbon double bond" as a raw material (in the case of using compounds in combination, the molar ratio of respective charge amounts), the "macromonomer" as a raw material, the acid value, and the weight average molecular weight are shown together in Table 4 below.

TABLE 4

| Dispersant (Compound (B)) | Compound Having (m + n)-Valent Linking Group $R^1$ and Mercapto Group | Compound Having Substituent $A^1$ and Carbon-Carbon Double Bond, molar ratio in parenthesis | Macromonomer | Numeral n | Numeral m | Acid Value of Dispersant (mgKOH/g) | Weight Average Molecular Weight |
|---|---|---|---|---|---|---|---|
| C-101 | 33 | A-3 | Macromonomer A3 | 5 | 1 | 245 | 5000 |
| C-102 | 33 | A-3 | Macromonomer A2 | 5 | 1 | 200 | 6500 |
| C-103 | 33 | A-16/A-3 (1/3) | Macromonomer A3 | 4 | 2 | 130 | 8000 |
| C-104 | 33 | A-3 | Macromonomer A5 | 3 | 3 | 150 | 4800 |
| C-105 | 33 | A-3 | Macromonomer A4 | 3 | 3 | 110 | 7200 |
| C-106 | 33 | A-1 | Macromonomer A5 | 3 | 3 | 108 | 4600 |
| C-107 | 33 | A-9/A-3 (1/1) | Macromonomer A4 | 3 | 3 | 80 | 7200 |
| C-108 | 33 | A-1 | Macromonomer A4 | 3 | 3 | 70 | 7000 |
| C-109 | 33 | A-3 | Macromonomer A1 | 4 | 2 | 40 | 16000 |
| C-110 | 27 | A-3 | Macromonomer A4 | 2 | 2 | 110 | 5200 |
| C-111 | 18 | A-3 | Macromonomer A4 | 1 | 2 | 70 | 5000 |
| C-112 | 33 | A-3 | Macromonomer E3 | 5 | 1 | 250 | 4800 |
| C-113 | 33 | A-3 | Macromonomer E2 | 5 | 1 | 200 | 6000 |
| C-114 | 33 | A-14/A-3 (1/3) | Macromonomer E3 | 4 | 2 | 135 | 7500 |
| C-115 | 33 | A-3 | Macromonomer E5 | 3 | 3 | 150 | 4800 |
| C-116 | 33 | A-3 | Macromonomer E4 | 3 | 3 | 115 | 6800 |
| C-117 | 33 | A-3 | Macromonomer E1 | 5 | 1 | 70 | 11000 |
| C-118 | 33 | A-3 | M-11 | 5.5 | 0.5 | 239 | 7400 |
| C-119 | 33 | A-3 | M-12 | 3 | 3 | 77 | 7700 |
| C-120 | 33 | A-3 | M-13 | 2.5 | 3.5 | 85 | 5200 |
| C-121 | 33 | A-3 | M-17 | 4.5 | 1.5 | 146 | 5200 |
| C-122 | 33 | A-3 | M-17 | 3.5 | 2.5 | 82 | 7200 |
| C-123 | 33 | A-3 | N-1 | 4.5 | 1.5 | 140 | 5000 |
| C-124 | 33 | A-3 | N-1 | 3.5 | 2.5 | 79 | 6900 |
| C-125 | 33 | A-3 | N-2 | 4 | 2 | 141 | 4500 |
| C-126 | 33 | A-3 | N-2 | 3 | 3 | 84 | 5600 |
| C-127 | 33 | A-3 | N-3 | 4.5 | 1.5 | 138 | 5100 |
| C-128 | 33 | A-3 | N-3 | 3.5 | 2.5 | 77 | 7100 |
| C-129 | 33 | A-3 | N-4 | 4 | 2 | 136 | 4600 |
| C-130 | 33 | A-3 | N-4 | 3 | 3 | 81 | 5800 |
| C-131 | 33 | A-3 | N-5 | 4.5 | 1.5 | 144 | 4900 |
| C-132 | 33 | A-3 | N-5 | 3.5 | 2.5 | 82 | 6700 |
| C-133 | 33 | A-26/A-3 (1/4) | M-12 | 5 | 1 | 172 | 3700 |
| C-134 | 33 | A-27/A-3 (1/4) | M-11 | 3.5 | 2.5 | 78 | 5700 |
| C-135 | 33 | A-26/A-3 (1/4) | M-17 | 5 | 1 | 171 | 3700 |
| C-136 | 33 | A-27/A-3 (1/4) | N-3 | 4 | 2 | 80 | 6300 |

Structures of Polymer Compounds (C-101) to (C-136) synthesized are illustrated below.

[Chem. 84]

(C-101)

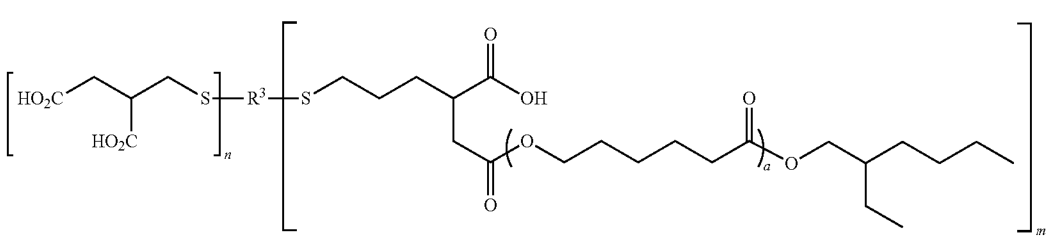

(n = 5, m = 1, a = 20)

-continued
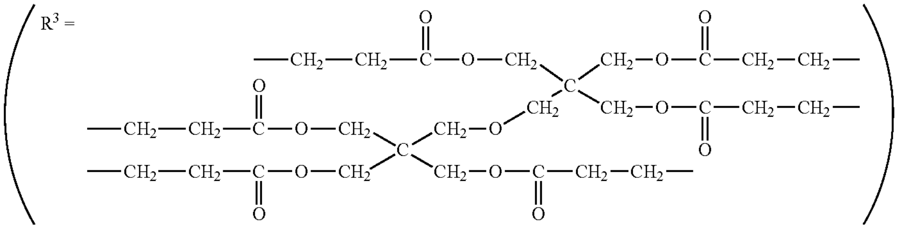
(C-102)
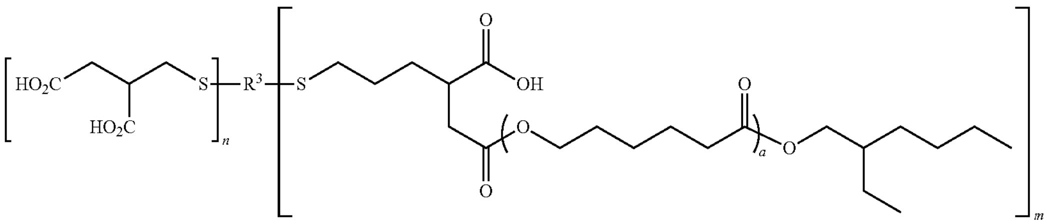
(n = 5, m = 1, a = 30)
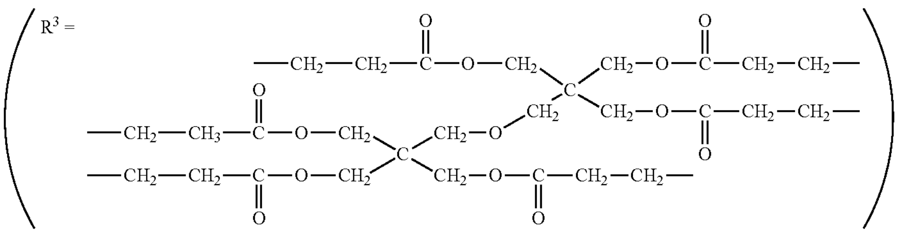
(C-103)
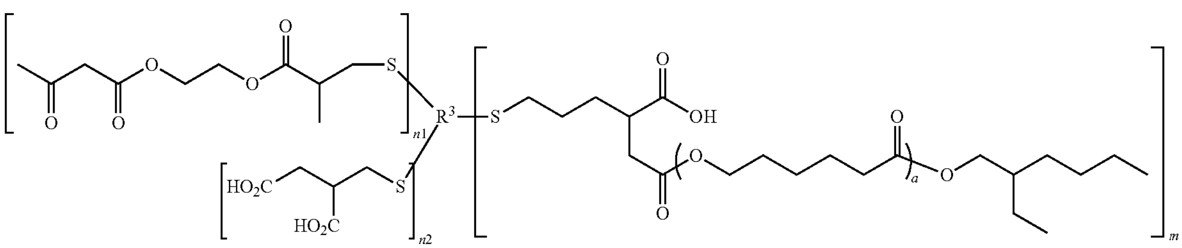
(m + n2 = 4, m = 2, a = 20, n1/n2 = 1/3)
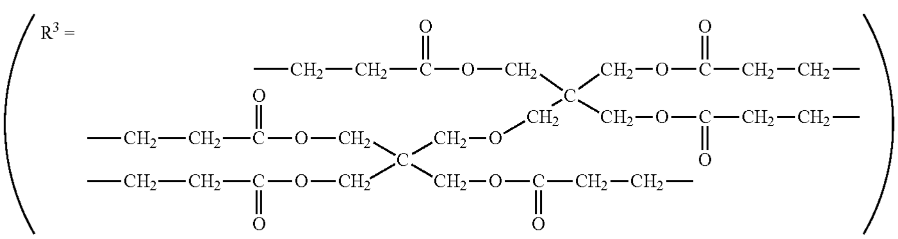
(C-104)
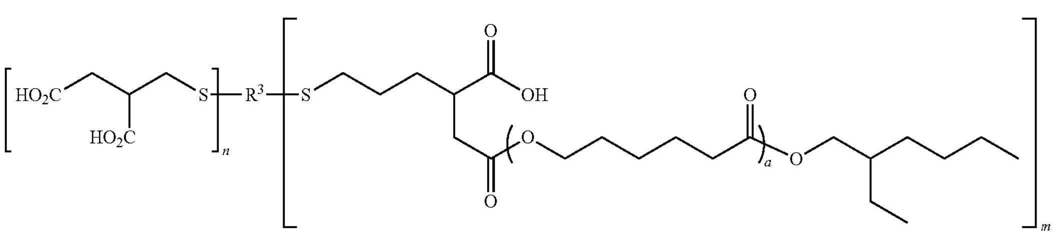
(n = 3, m = 3, a = 7)

-continued
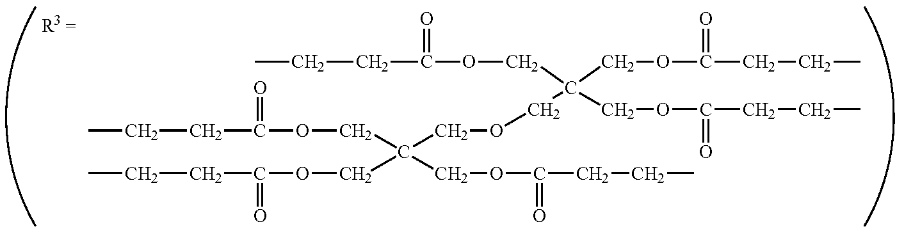
(C-105)
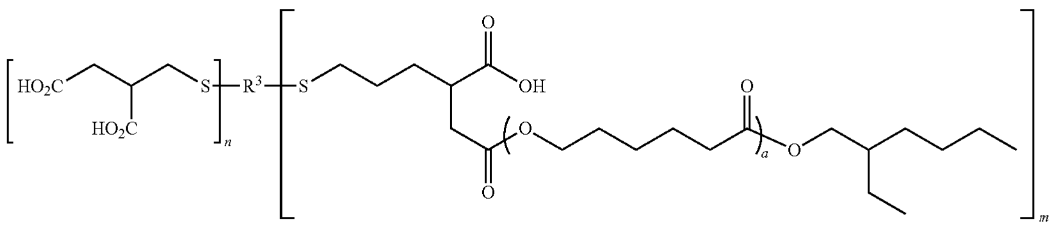
(n = 3, m = 3, a = 14)
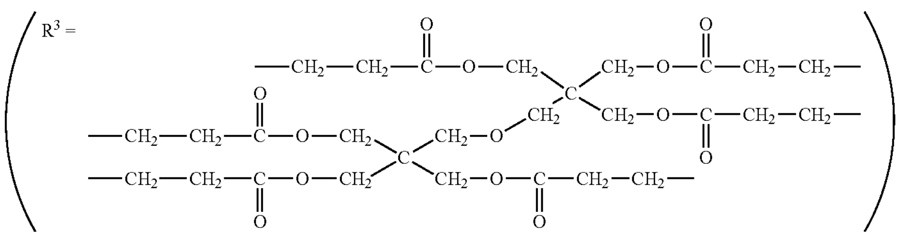
(C-106)
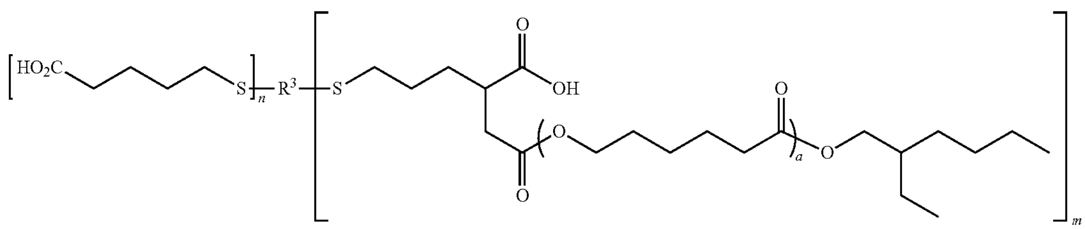
(n = 3, m = 3, a = 7)
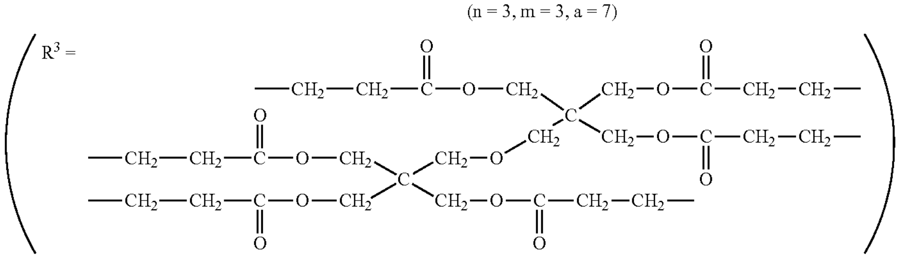
[Chem. 85]
(C-107)
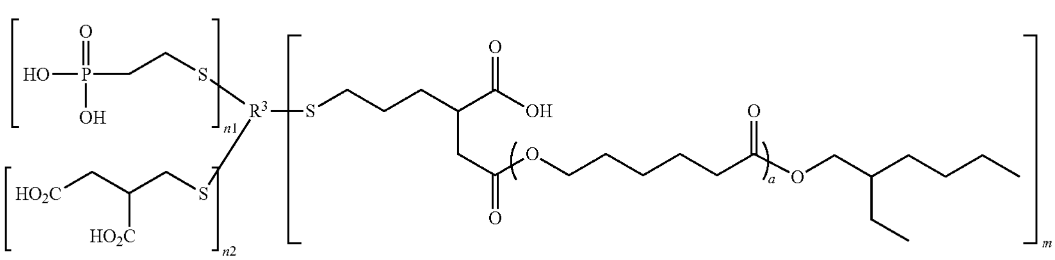
(n1 + n2 = 3, m = 3, a = 14, n1/n2 = 1/1)

-continued
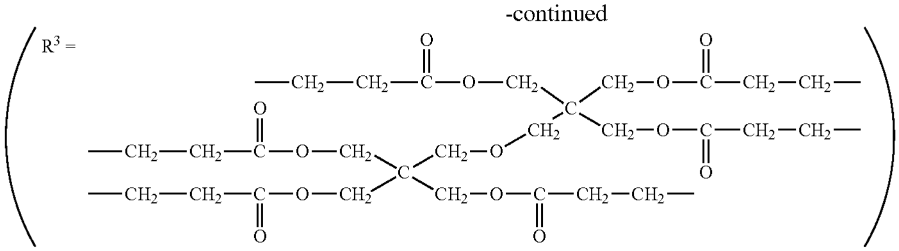
(C-108)
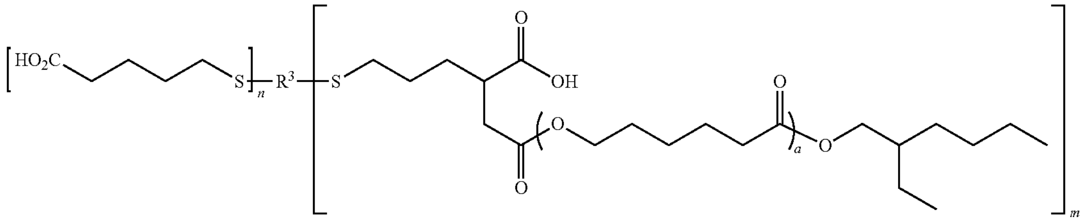
(n = 3, m = 3, a = 14)
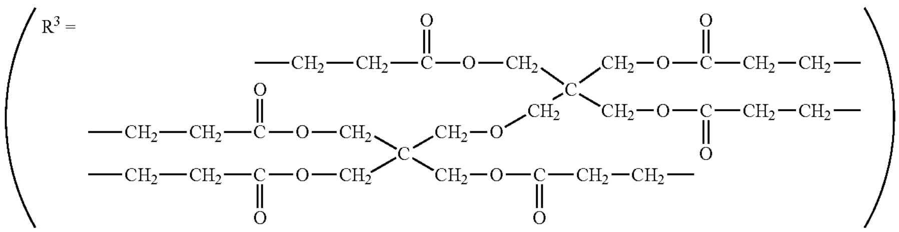
(C-109)
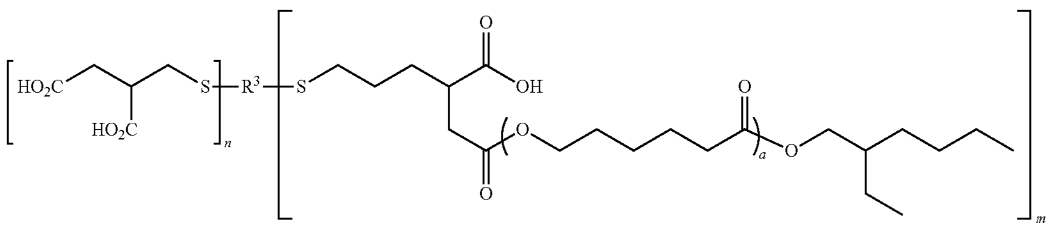
(n = 4, m = 2, a = 60)
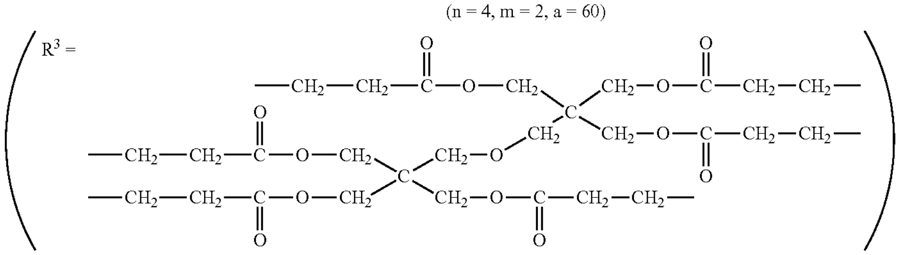
(C-110)
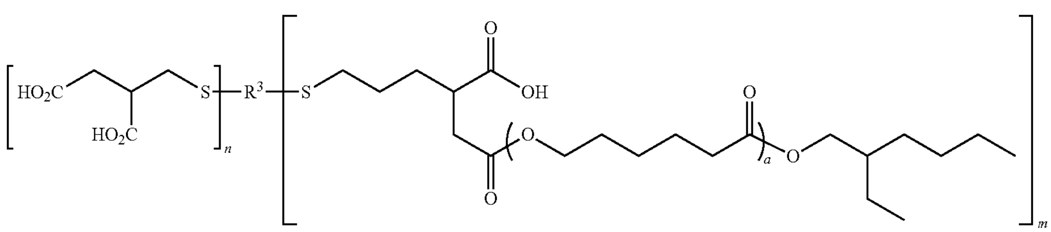
(n = 2, m = 2, a = 14)
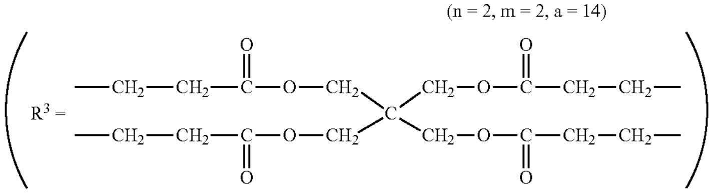

-continued
(C-111)
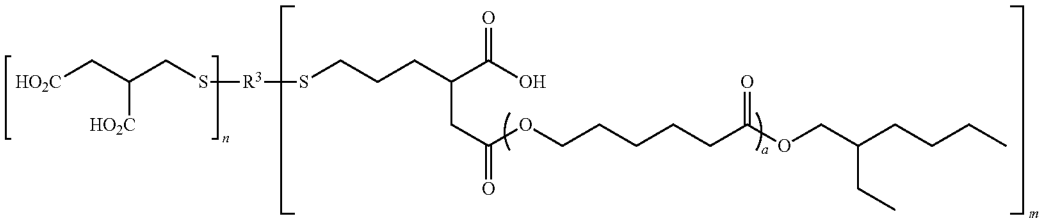
(n = 1, m = 2, a = 14)
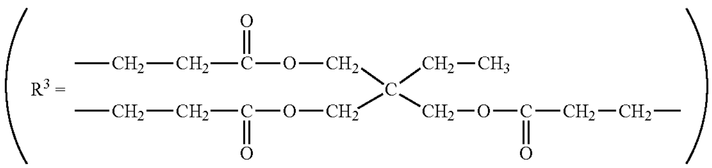
(C-112)
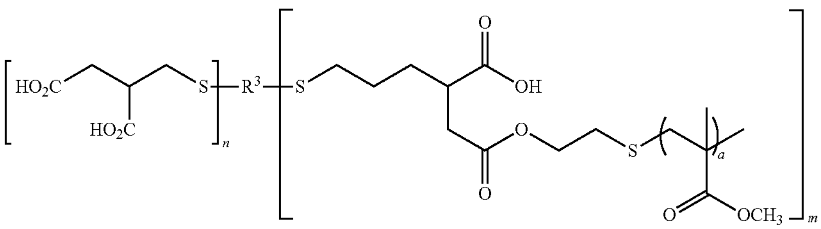
(n = 5, m = 1, a = 20)
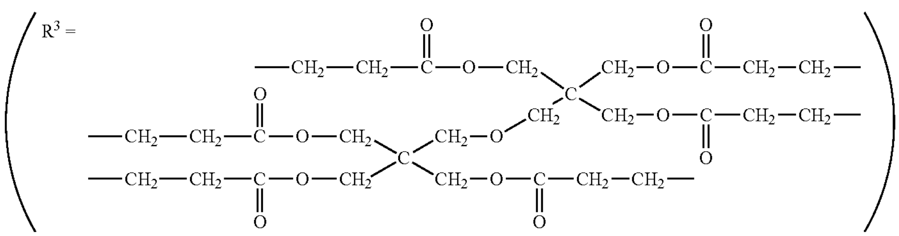
(C-113)
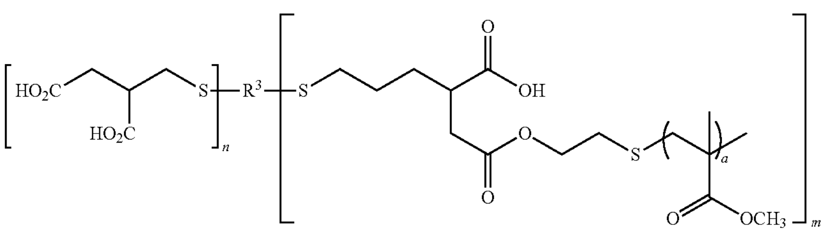
(n = 5, m = 1, a = 30)
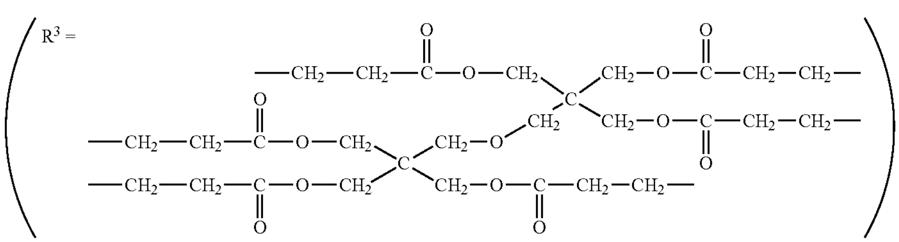

-continued
(C-114)
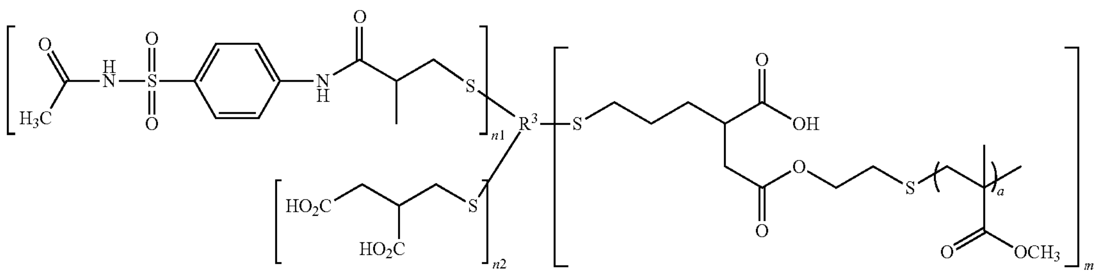
(n1 + n2 = 4, m = 2, a = 20, n1/n2 = 1/3)
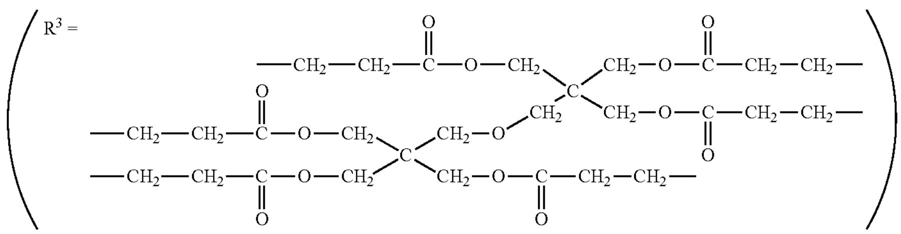
[Chem. 86]
(C-115)
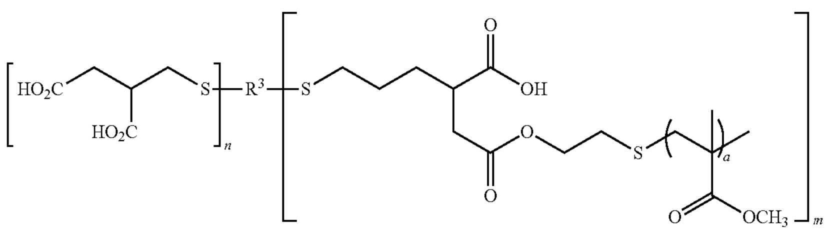
(n = 3, m = 3, a = 7)
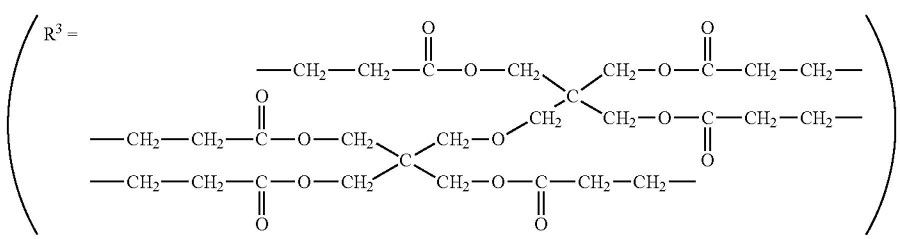
(C-116)
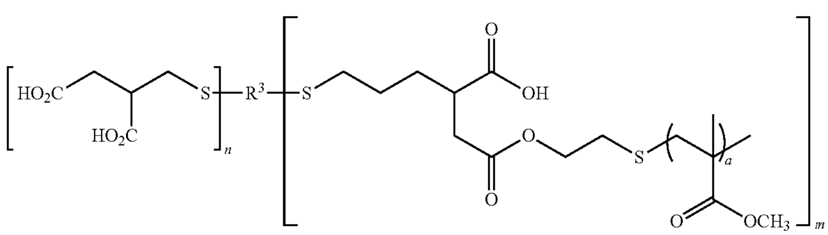
(n = 3, m = 3, a = 14)
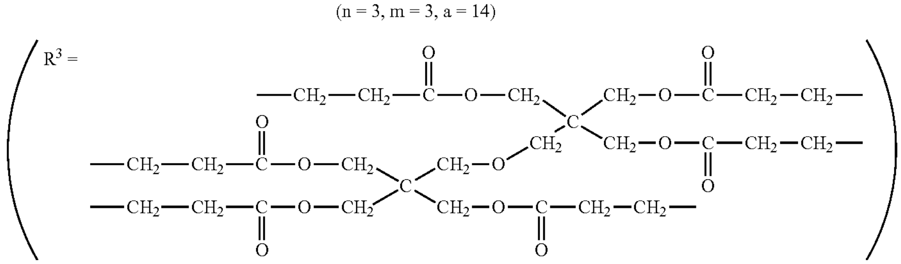

-continued
(C-117)
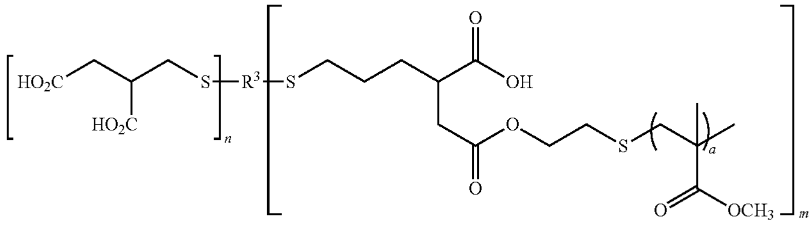
(n = 5, m = 1, a = 60)
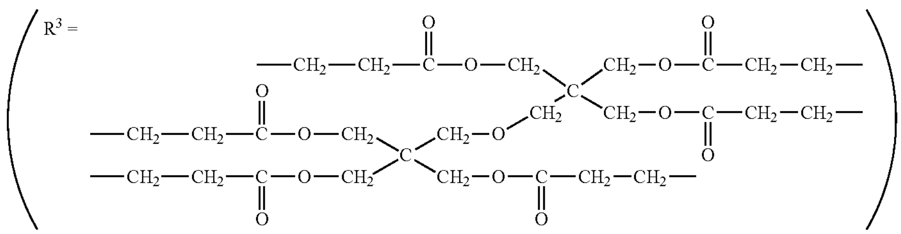
[Chem. 87]
(C-118)
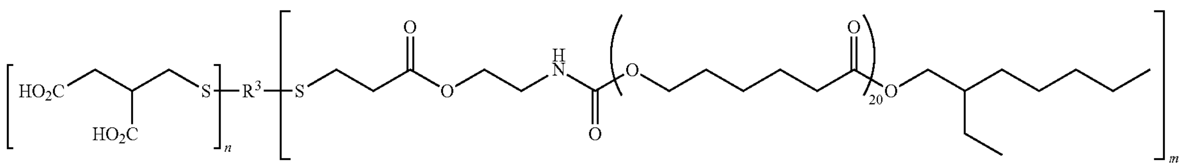
(n = 5.5, m = 0.5)
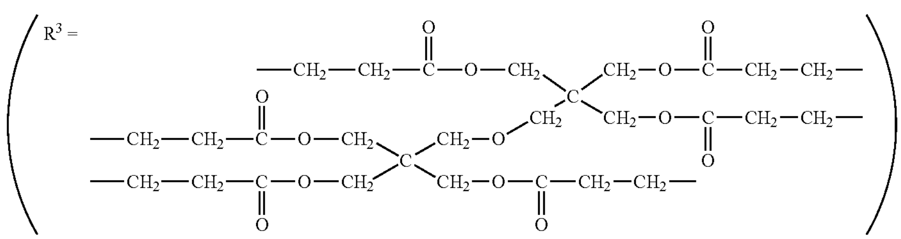
(C-119)
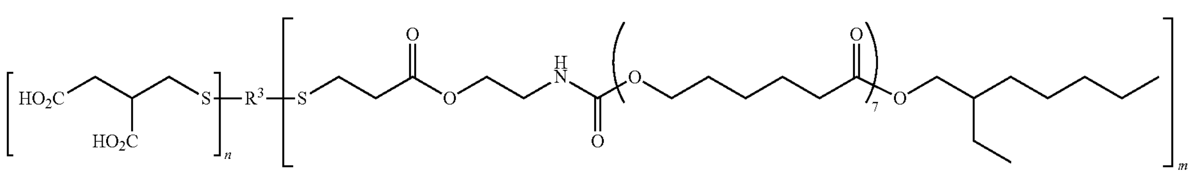
(n = 3, m = 3)
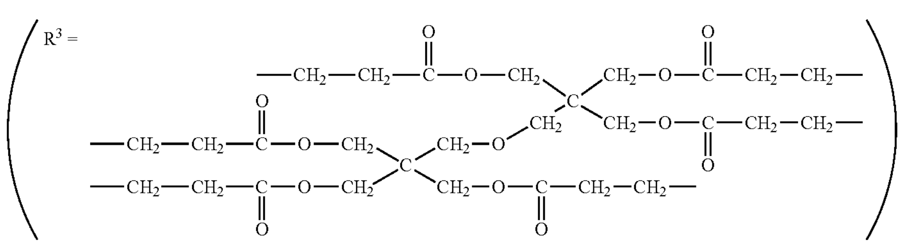

-continued
(C-120)
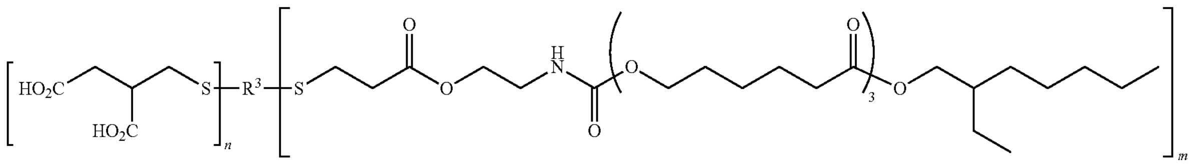
(n = 2.5, m = 3.5)
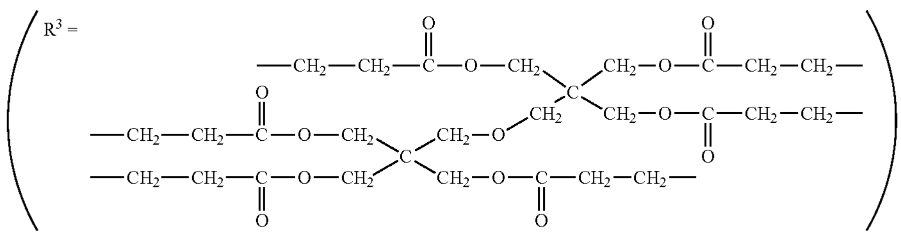
[Chem. 88]
(C-121)
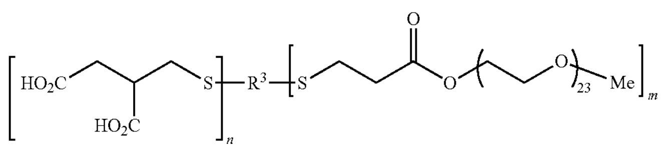
(n = 4.5, m = 1.5)
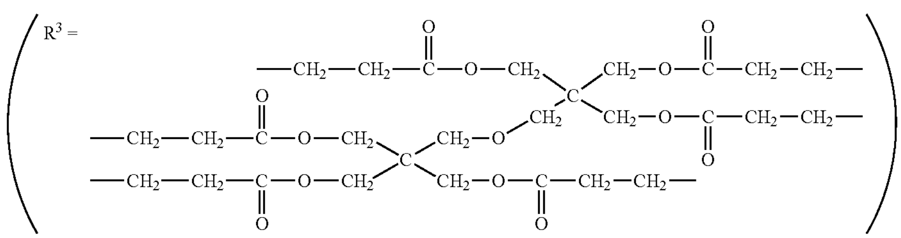
(C-122)
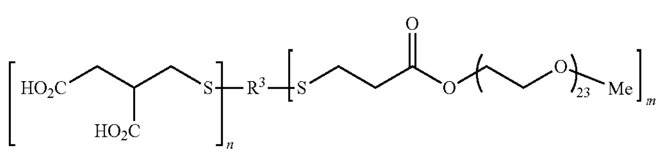
(n = 3.5, m = 2.5)
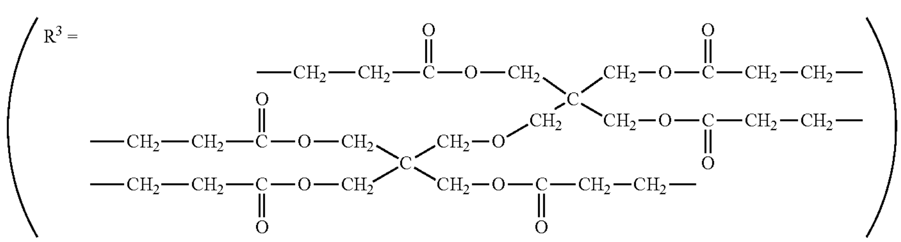
[Chem. 89]
(C-123)
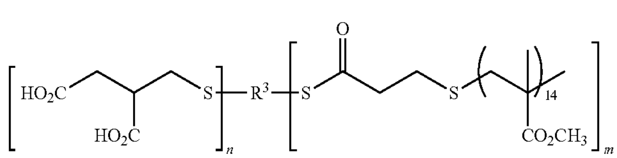
(n = 4.5, m = 1.5)

-continued
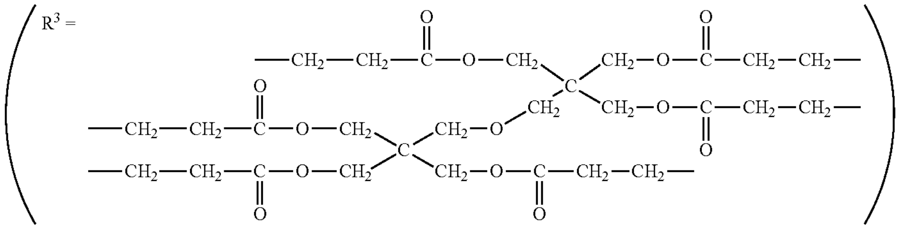
(C-124)
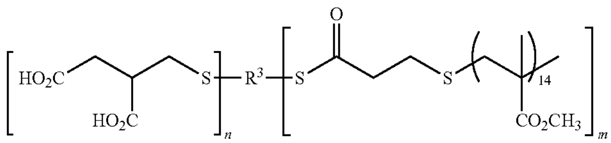
(n = 3.5, m = 2.5)
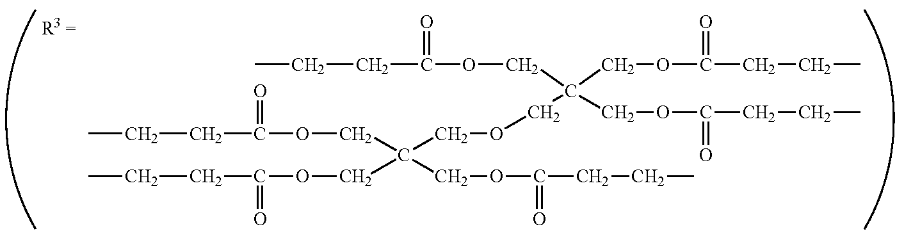
(C-125)
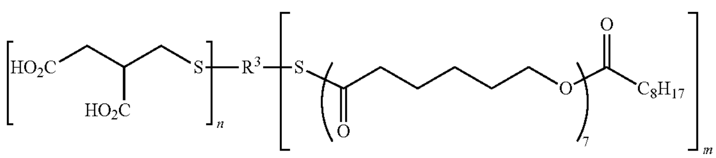
(n = 4, m = 2)
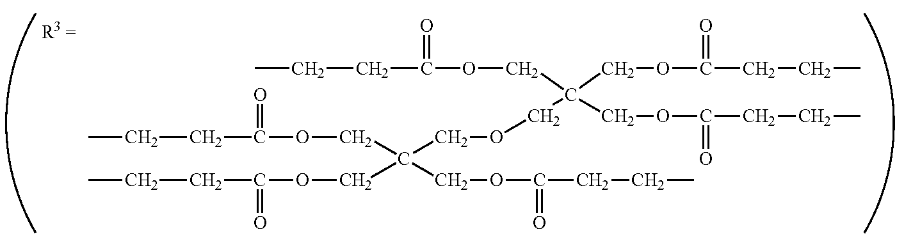
(C-126)
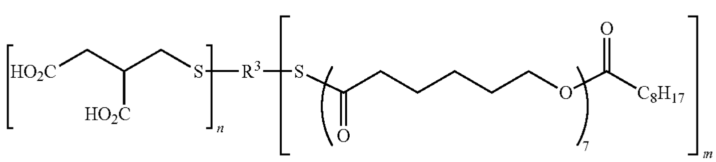
(n = 3, m = 3)
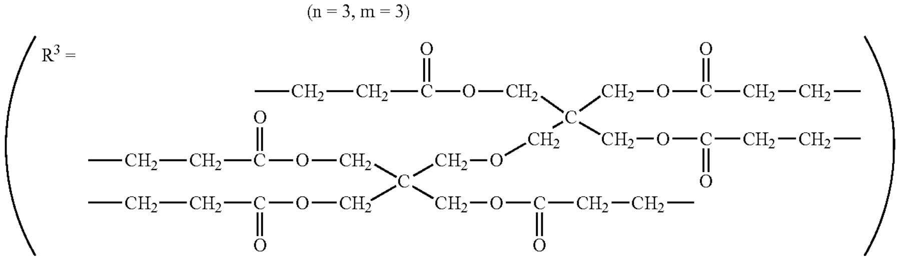

-continued
(C-127)
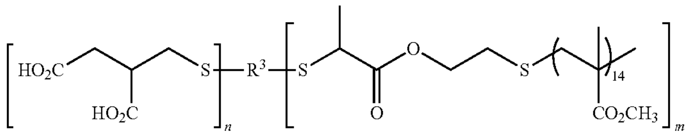
(n = 4.5, m = 1.5)
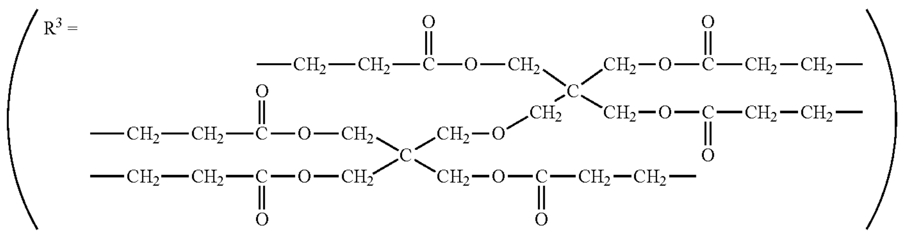
[Chem. 90]
(C-128)
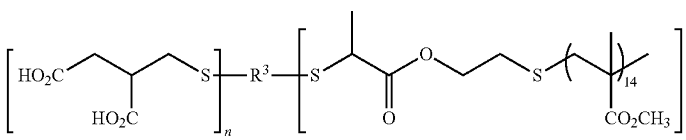
(n = 3.5, m = 2.5)
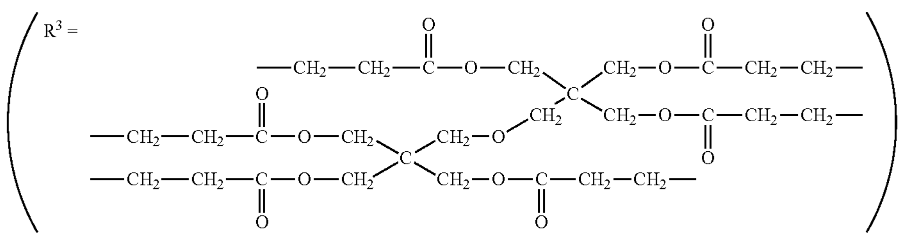
(C-129)
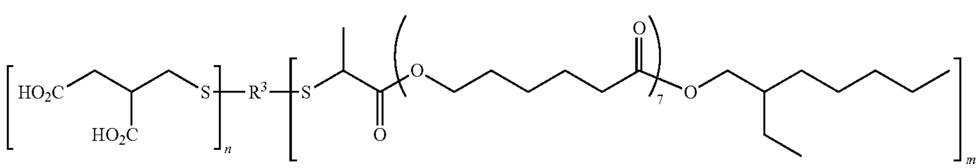
(n =4, m = 2)
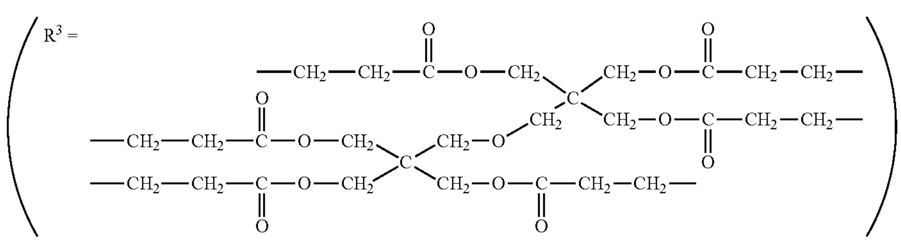
(C-130)
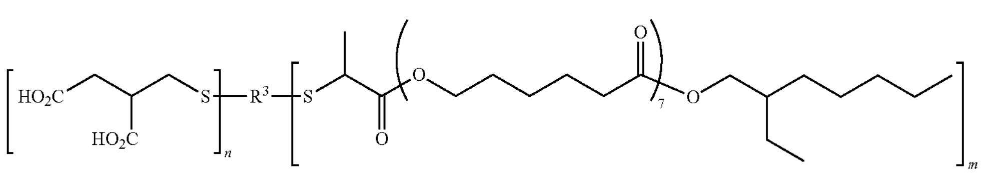
(n =3, m = 3)

-continued
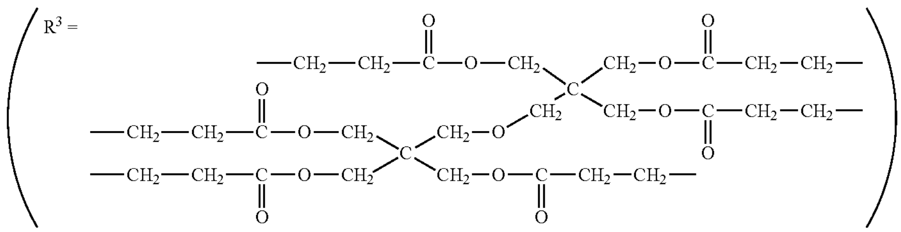
(C-131)
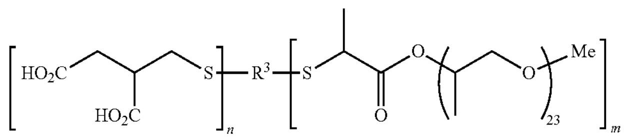
(n = 4.5, m = 1.5)
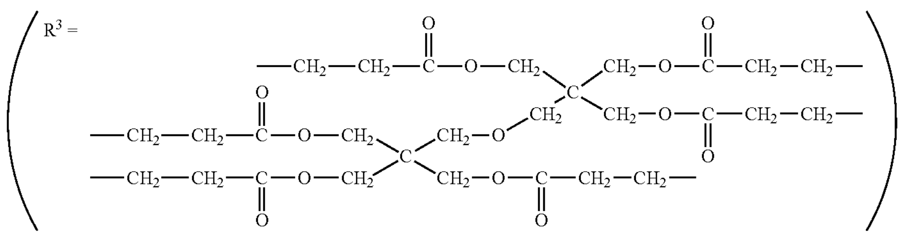
(C-132)
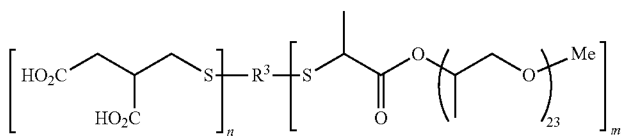
(n = 3.5, m = 2.5)
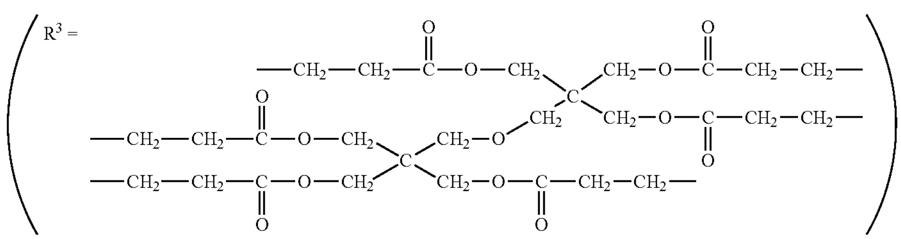
[Chem. 91]
(C-133)
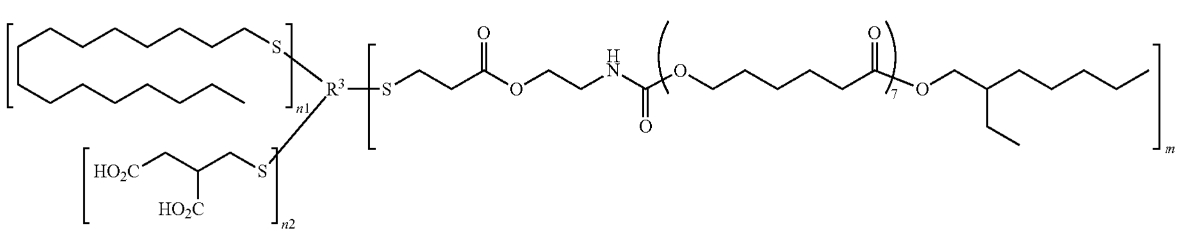
(n1 + n2 = 5, m = 1, n1/n2 = 1/4)
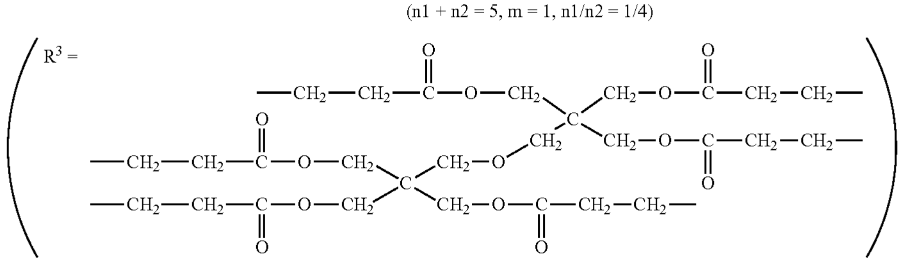

-continued
(C-134)
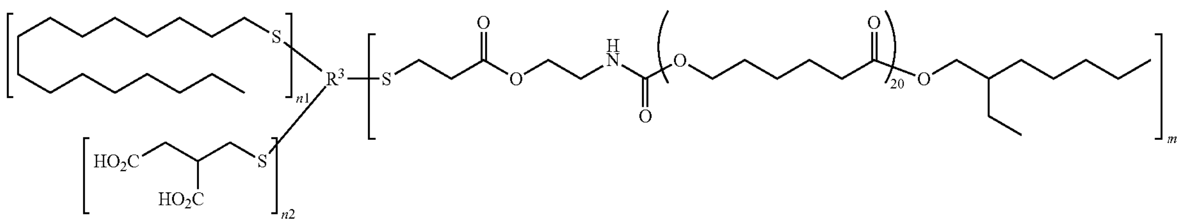
(n1 + n2 = 3.5, m = 2.5, n1/n2 = 1/4)
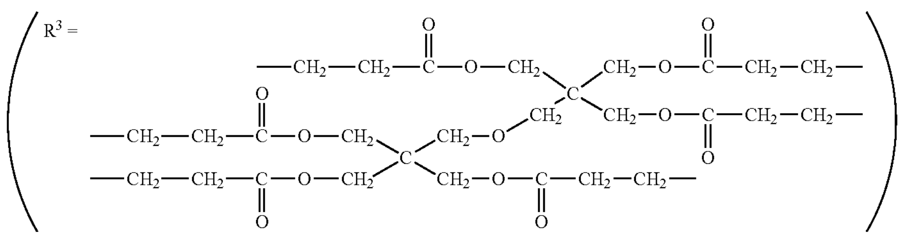
(C-135)
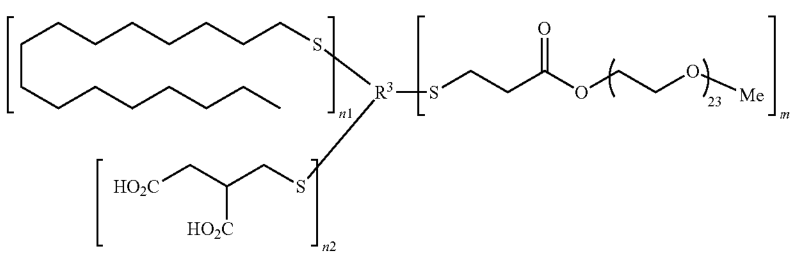
(n1 + n2 = 5, m = 1, n1/n2 = 1/4)
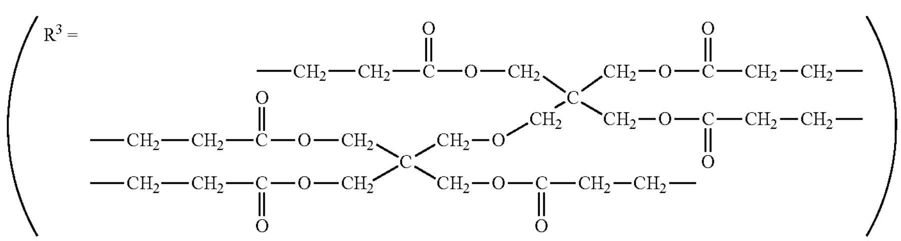
(C-136)
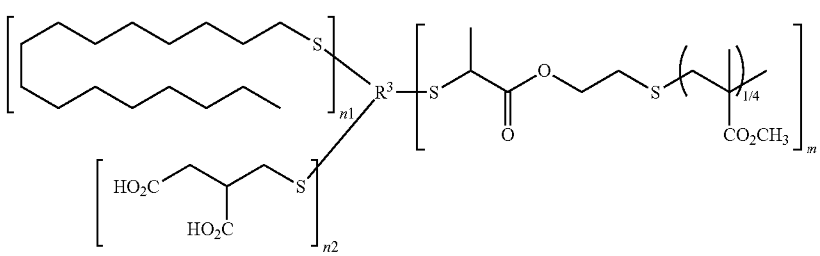
(n1 + n2 = 4, m = 2, n1/n2 = 1/4)
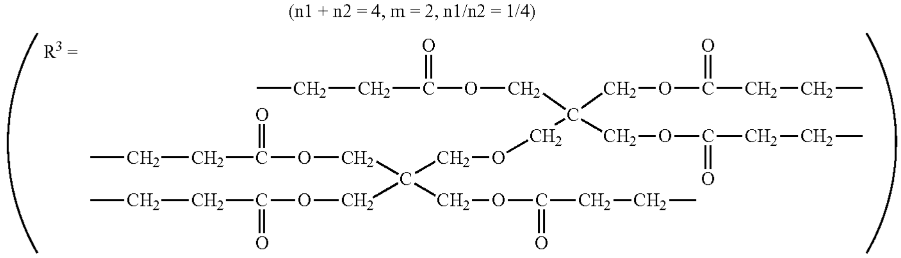

Example 1

Preparation of Titanium Dioxide Dispersion Liquid (Dispersion Composition)

A mixed solution according to the following formulation was subjected to a dispersion treatment by using a circulation-type disperser (bead mill), ULTRA APEX MILL, manufactured by Kotobuki Industries Co., Ltd. to obtain a titanium dioxide dispersion liquid as the dispersion composition.

—Formulation—

| | |
|---|---|
| Titanium dioxide (TTO-51(C), produced by Ishihara Sangyo) (purity: 75% or more): | 181.8 parts |
| Dispersant (polymer compound (B)) C-1 (30 mass % solution): | 133.3 parts |
| Propylene glycol monomethyl ether acetate (PGMEA): | 284.9 parts |

In addition, the disperser was operated under the following conditions:

Bead diameter: Φ0.05 mm
Bead filling volume: 75 vol %
Peripheral speed: 10 m/sec
Pump feed rate: 10 kg/hour
Cooling water: tap water
Inner volume of annular passage of bead mill: 0.15 L
Amount of mixed solution dispersed: 0.44 kg After the start of dispersion, the average particle diameter was measured at an interval of 30 minutes (run time of one pass).

The average particle diameter was reduced with an increase in the dispersion time (the number of passes), but the amount of change in the average particle diameter was gradually decreased. Dispersion was terminated when the dispersion time was extended by 30 minutes and the change in primary particle diameter became 5 nm or less. The primary particle diameter of titanium dioxide particles in the dispersion liquid here was 40 nm.

Incidentally, the primary particle diameter of titanium dioxide in this Example indicates the value obtained by 80-fold diluting a titanium dioxide-containing mixed solution or dispersion liquid with propylene glycol monomethyl ether acetate and then measuring the obtained diluted solution by use of a dynamic light scattering method.

This measurement is measurement performed on the number average particle diameter by using MICROTRACK UPA-EX150 manufactured by Nikkiso Co., Ltd.

[Measurement of Viscosity of Titanium. Dioxide Dispersion Liquid]

The titanium dioxide dispersion liquid obtained above was evaluated for the dispersibility by measuring its viscosity by means of "RE-85L" manufactured by Toki Sangyo Co., Ltd.).

In addition, dispersion compositions corresponding to Examples 2 to 141 and Comparative Examples 1 to 7 prepared in accordance with the dispersion composition of Example 1 except that the titanium dioxide content and the kind of the dispersant (polymer compound (B)) were changed as shown in Tables 5 and 6 below so as to correspond to Examples 2 to 141 and Comparative Examples 1 to 7, were also evaluated for the dispersibility by measuring the viscosity. The results are shown in Tables 5 and 6.

Preparation 1 of Curable Composition

A curable composition was obtained by using the titanium dioxide dispersion liquid (dispersion composition) obtained above and mixing respective components to satisfy the following formulation.

—Formulation of Curable Composition

| | |
|---|---|
| Titanium dioxide dispersion liquid prepared above (dispersion composition): | 81.98 parts |
| JER-157S65 shown below (produced by Mitsubishi Chemical Corp.) (polymerizable compound; T-4 in the Table below) | 3.72 parts |
| Binder polymer (M-1 shown below; weight average molecular weight (Mw) and copolymerization ratio (weight ratio) are as shown below) | 0.44 parts |
| Surfactant: Megaface F-781 (produced by DIC): | 0.03 parts |
| p-Methoxyphenol | 0.01 parts |
| Propylene glycol monomethyl ether acetate: | 13.82 parts |

[Chem. 92]

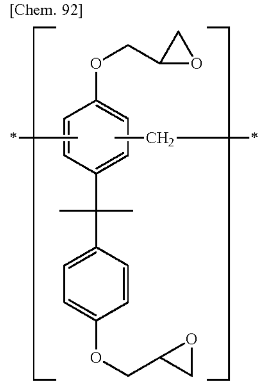

JER-157S65

[Chem. 93]

Binder Polymer. M-1:

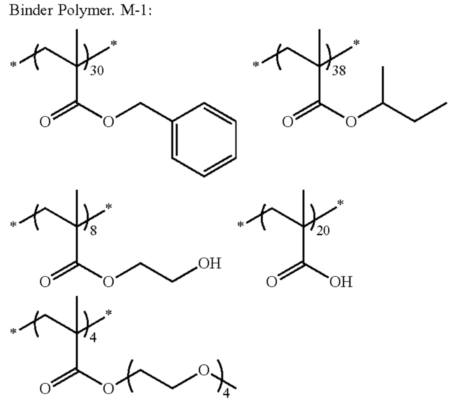

Mw: 10,000

(Production of Cured Film (Transparent Film)

The curable composition obtained above was coated on a 12-inch silicon wafer by a spin coating method and then heated on a hot plate at 100° C. for 2 minutes to obtain a coated film having a thickness of 1.05 μm. This coated film was further heated on a hot plate at 200° C. for 5 minutes to obtain a cured film (thickness: 1.0 μm) as the transparent film.

[Measurement of Refractive Index of Transparent Film]

With regard to the substrate above, the refractive index of the transparent film for light at a wavelength of 635 nm was measured using an ellipsometry manufactured by J. A. Woollam Japan.

The results are shown in Tables 5 and 6 below.

[Evaluation of Solvent Solubility of Cured Film]

The cured film formed above was immersed in PGMEA for 5 minutes, and the refractive index of the transparent film (cured film) after immersion was measured according to the method described above. The value of change in the refractive index after treatment was calculated from [refractive index after immersion in solvent]−[refractive index before immersion in solvent] and used as an indicator of solvent resistance.

The results are shown in Tables 5 and 6 below.

Examples 2 to 135 and Comparative Examples 1 to 7

Curable compositions of Examples 2 to 135 and Comparative Examples 1 to 7 were prepared in accordance with Example 1 except that the titanium dioxide content relative to the total solid content of the curable composition and the kinds of the dispersant (polymer compound (B)) and polymerizable compound were changed as shown in Tables 5 and 6 below.

That is, in Examples where the dispersant (polymer compound (B)) was changed from C-1 used in Example 1, a titanium dioxide dispersion liquid obtained using the dispersant (polymer compound (B)) shown in Table 5 or 6 in place of C-1 in the preparation of the titanium dioxide dispersion liquid of Example 1 was used.

In Comparative Examples 1 and 2, SOLPERSE 5000 produced by The Lubrizol Corporation and DISPERBYK 180 produced by BYK Chemie were used, respectively, as a dispersant different from the polymer compound (B) of the present invention.

In addition, in Examples (Examples 134 and 135) where the polymerizable compound was changed from T-4 used in Example 1, the following polymerizable compound (T-2, T-3) was used in place of T-4 in the preparation of the curable composition of Example 1.

T-2: JER-1031S shown below (produced by Mitsubishi Chemical Corp.)

T-3: EHPE-3150 shown below (produced by Daicel Corp.; 1,2-epoxy-4-(2-oxiranyl)cyclohexane adduct of 2,2-bis(hydroxymethyl)-1-butanol)

[Chem. 94]

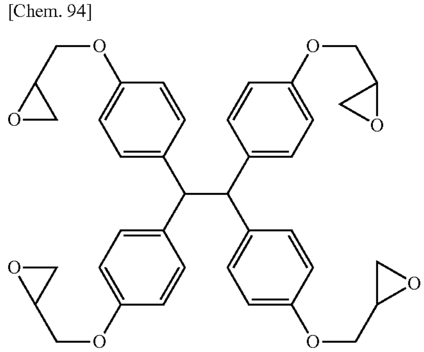

JER-1031S

-continued

[Chem. 95]

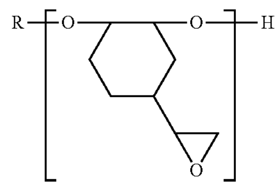

EHPE-3150

The change in the titanium dioxide content (concentration) relative to the total solid content of the curable composition was performed by preparing a titanium dioxide dispersion liquid in such a manner that while the total amount of titanium dioxide and dispersant relative to the total solid content of the curable composition was kept the same as in "Preparation of Titanium Dioxide Dispersion Liquid (dispersion Composition)] of Example 1, the increase or decrease in the titanium dioxide content was compensated for by increasing or decreasing the dispersant content.

In addition, transparent films were produced in the same manner as in Example 1 by using the curable compositions obtained, and evaluated in the same manner as in Example 1. The results are shown in Tables 5 and 6.

Example 136

Preparation 2 of Curable Composition

A curable composition was obtained by using a titanium dioxide dispersion liquid (dispersion composition) obtained in the same manner as above except for using C-6 as the dispersant (polymer compound (B)), and mixing respective components to satisfy the following formulation.

—Formulation of Curable Composition

| | |
|---|---|
| Titanium dioxide dispersion liquid above (dispersion composition): | 81.98 parts |
| Dipentaerythritol hexaacrylate (KAYARAD DPHA, produced by Nippon Kayaku Co., Ltd.) (polymerizable compound; T-1 in the Table below) | 3.48 parts |
| Oxime-based photopolymerization initiator (polymerization initiator, K-1 shown below) | 0.24 parts |
| Binder polymer (M-1; weight average molecular weight (Mw) and copolymerization ratio (weight ratio) are as shown above) | 0.44 parts |
| Surfactant: Megaface F-781 (produced by DIC): | 0.03 parts |
| p-Methoxyphenol | 0.01 parts |
| Propylene glycol monomethyl ether acetate: | 13.82 parts |

[Chem. 96]

K-1

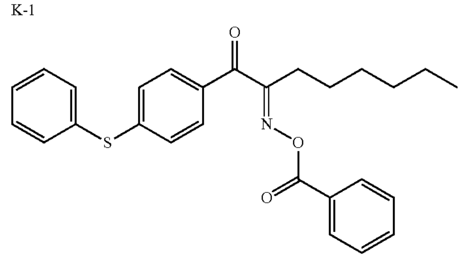

IRGACURE OXE01
(produced by BASF)

-continued

K-2

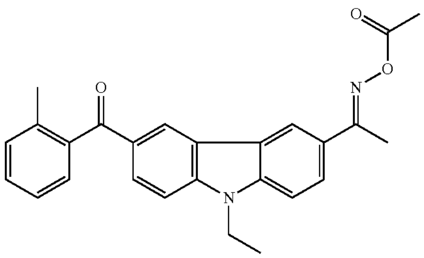

IRGACURE OXE02
(produced by BASF)

K-3

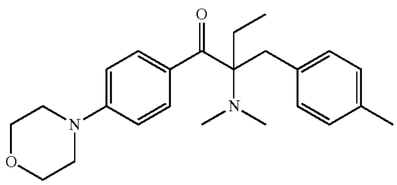

IRGACURE 379
(produced by BASF)

K-4

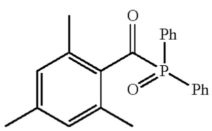

DAROCURE TPO
(produced by BASF)

K-5

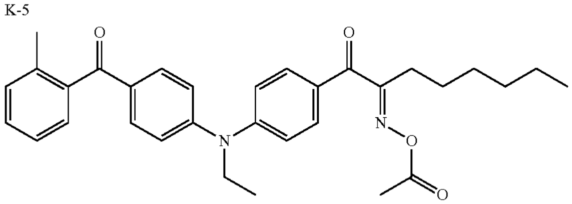

-continued

K-6

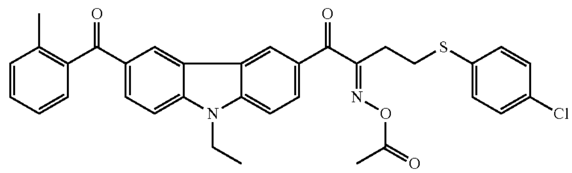 [SMILES: CCn1c2ccc(C(=O)/C(CCSc3ccc(Cl)cc3)=N/OC(C)=O)cc2c2cc(C(=O)c3ccccc3C)ccc21]

A transparent film was produced in the same manner as in Example 1 by using the curable compositions obtained, and evaluated in the same manner as in Example 1. The results are shown in Table 6.

Examples 137 to 141

Curable compositions of Examples 137 to 141 were prepared in accordance with Example 136 except that the kinds of the dispersant (polymer compound (B)) and polymerizable compound were changed as shown in Table 6 below.

That is, in Examples where the dispersant (polymer compound (B)) was changed from C-6 used in Example 136, a titanium dioxide dispersion liquid obtained using the dispersant (polymer compound (B)) shown in Table 6 in place of C-6 in the preparation of the titanium dioxide dispersion liquid of Example 136 was used.

In Examples where the polymerization initiator was changed from K-1 used in Example 136, the polymerization initiator shown in Table 6 was used in place of K-1 in the preparation of the curable composition of Example 136.

In addition, transparent films were produced in the same manner as in Example 1 by using the curable compositions obtained, and evaluated in the same manner as in Example 1. The results are shown in Table 6.

TABLE 5

| | Titanium Dioxide Content in Total Solid Content of Composition | Dispersant | Weight Average Molecular Weight | Polymerizable Compound | Polymerization Initiator | Refractive Index | Viscosity of Dispersion Liquid (mPa · s) | Solvent Resistance (change in refractive index after immersion in solvent) |
|---|---|---|---|---|---|---|---|---|
| Example 1 | 70% | C-1 | 3300 | T-4 | — | 1.91 | 9.0 | −0.005 |
| Example 2 | 70% | C-2 | 4100 | T-4 | — | 1.90 | 4.4 | −0.006 |
| Example 3 | 70% | C-3 | 4800 | T-4 | — | 1.91 | 4.7 | −0.004 |
| Example 4 | 70% | C-4 | 4100 | T-4 | — | 1.91 | 6.1 | −0.005 |
| Example 5 | 70% | C-5 | 6400 | T-4 | — | 1.92 | 7.2 | −0.004 |
| Example 6 | 70% | C-6 | 4700 | T-4 | — | 1.90 | 10.7 | −0.004 |
| Example 7 | 70% | C-10 | 6500 | T-4 | — | 1.90 | 5.8 | −0.005 |
| Example 8 | 70% | C-11 | 4400 | T-4 | — | 1.90 | 6.8 | −0.005 |
| Example 9 | 70% | C-12 | 3000 | T-4 | — | 1.91 | 9.0 | −0.004 |
| Example 10 | 70% | C-13 | 5000 | T-4 | — | 1.90 | 8.2 | −0.005 |
| Example 11 | 70% | C-14 | 4700 | T-4 | — | 1.92 | 6.5 | −0.018 |
| Example 12 | 70% | C-15 | 4300 | T-4 | — | 1.91 | 10.1 | −0.004 |
| Example 13 | 70% | C-16 | 4400 | T-4 | — | 1.90 | 12.0 | −0.004 |
| Example 14 | 70% | C-17 | 4400 | T-4 | — | 1.91 | 8.9 | −0.005 |
| Example 15 | 70% | C-18 | 6800 | T-4 | — | 1.92 | 6.6 | −0.006 |
| Example 16 | 70% | C-19 | 4200 | T-4 | — | 1.91 | 7.7 | −0.005 |
| Example 17 | 70% | C-20 | 4100 | T-4 | — | 1.91 | 6.4 | −0.006 |
| Example 18 | 70% | C-21 | 4100 | T-4 | — | 1.92 | 6.7 | −0.005 |
| Example 19 | 70% | C-22 | 4100 | T-4 | — | 1.92 | 9.2 | −0.004 |
| Example 20 | 70% | C-23 | 7500 | T-4 | — | 1.89 | 15.2 | −0.003 |
| Example 21 | 70% | C-24 | 6200 | T-4 | — | 1.90 | 12.3 | −0.003 |
| Example 22 | 70% | C-25 | 8200 | T-4 | — | 1.89 | 14.2 | −0.003 |
| Example 23 | 70% | C-26 | 6300 | T-4 | — | 1.89 | 15.8 | −0.006 |
| Example 24 | 70% | C-27 | 6500 | T-4 | — | 1.89 | 16.0 | −0.005 |

TABLE 5-continued

| | Titanium Dioxide Content in Total Solid Content of Composition | Dispersant | Weight Average Molecular Weight | Polymerizable Compound | Polymerization Initiator | Refractive Index | Viscosity of Dispersion Liquid (mPa · s) | Solvent Resistance (change in refractive index after immersion in solvent) |
|---|---|---|---|---|---|---|---|---|
| Example 25 | 70% | C-28 | 4600 | T-4 | — | 1.94 | 9.2 | −0.007 |
| Example 26 | 70% | C-29 | 4300 | T-4 | — | 1.94 | 5.7 | −0.007 |
| Example 27 | 70% | C-30 | 4500 | T-4 | — | 1.93 | 6.8 | −0.008 |
| Example 28 | 70% | C-31 | 4200 | T-4 | — | 1.93 | 7.9 | −0.008 |
| Example 29 | 70% | C-32 | 4500 | T-4 | — | 1.92 | 6.4 | −0.003 |
| Example 30 | 70% | C-33 | 4200 | T-4 | — | 1.92 | 7.8 | −0.003 |
| Example 31 | 70% | C-34 | 4400 | T-4 | — | 1.94 | 6.3 | −0.007 |
| Example 32 | 70% | C-35 | 4500 | T-4 | — | 1.94 | 6.0 | −0.007 |
| Example 33 | 70% | C-36 | 4300 | T-4 | — | 1.94 | 7.7 | −0.009 |
| Example 34 | 70% | C-37 | 5500 | T-4 | — | 1.94 | 5.6 | −0.009 |
| Example 35 | 70% | C-38 | 4500 | T-4 | — | 1.93 | 8.7 | −0.005 |
| Example 36 | 70% | C-39 | 6000 | T-4 | — | 1.93 | 6.7 | −0.005 |
| Example 37 | 70% | C-40 | 4200 | T-4 | — | 1.94 | 8.3 | −0.007 |
| Example 38 | 70% | C-41 | 5400 | T-4 | — | 1.94 | 6.1 | −0.007 |
| Example 39 | 70% | C-42 | 5300 | T-4 | — | 1.92 | 5.3 | −0.022 |
| Example 40 | 70% | C-43 | 5400 | T-4 | — | 1.92 | 6.2 | −0.022 |
| Example 41 | 70% | C-44 | 6500 | T-4 | — | 1.92 | 6.6 | −0.010 |
| Example 42 | 70% | C-45 | 6400 | T-4 | — | 1.92 | 7.1 | −0.011 |
| Example 43 | 70% | C-46 | 4200 | T-4 | — | 1.91 | 8.3 | −0.008 |
| Example 44 | 70% | C-47 | 4400 | T-4 | — | 1.91 | 9.3 | −0.008 |
| Example 45 | 70% | C-48 | 4100 | T-4 | — | 1.90 | 10.4 | −0.009 |
| Example 46 | 70% | C-49 | 6500 | T-4 | — | 1.90 | 11.0 | −0.012 |
| Example 47 | 70% | C-50 | 6300 | T-4 | — | 1.91 | 9.7 | −0.005 |
| Example 48 | 70% | C-51 | 6500 | T-4 | — | 1.91 | 9.8 | −0.005 |
| Example 49 | 70% | C-52 | 4400 | T-4 | — | 1.91 | 12.4 | −0.006 |
| Example 50 | 70% | C-53 | 6800 | T-4 | — | 1.91 | 13.2 | −0.006 |
| Example 51 | 70% | C-54 | 4500 | T-4 | — | 1.91 | 11.7 | −0.008 |
| Example 52 | 70% | C-55 | 7000 | T-4 | — | 1.91 | 9.5 | −0.008 |
| Example 53 | 70% | C-118 | 7400 | T-4 | — | 1.92 | 6.7 | −0.004 |
| Example 54 | 70% | C-119 | 7700 | T-4 | — | 1.91 | 4.8 | −0.005 |
| Example 55 | 70% | C-120 | 5200 | T-4 | — | 1.92 | 4.9 | −0.004 |
| Example 56 | 70% | C-101 | 5000 | T-4 | — | 1.90 | 11.2 | −0.004 |
| Example 57 | 70% | C-102 | 6500 | T-4 | — | 1.91 | 13.4 | −0.005 |
| Example 58 | 70% | C-103 | 8000 | T-4 | — | 1.93 | 17.0 | −0.007 |
| Example 59 | 70% | C-104 | 4800 | T-4 | — | 1.91 | 12.7 | −0.007 |
| Example 60 | 70% | C-105 | 7200 | T-4 | — | 1.90 | 16.5 | −0.005 |
| Example 61 | 70% | C-106 | 4600 | T-4 | — | 1.91 | 10.7 | −0.005 |
| Example 62 | 70% | C-107 | 7200 | T-4 | — | 1.89 | 17.5 | −0.007 |
| Example 63 | 70% | C-108 | 7000 | T-4 | — | 1.90 | 16.4 | −0.009 |
| Example 64 | 70% | C-110 | 5200 | T-4 | — | 1.91 | 14.2 | −0.005 |
| Example 65 | 70% | C-111 | 5000 | T-4 | — | 1.90 | 13.7 | −0.008 |
| Example 66 | 70% | C-112 | 4800 | T-4 | — | 1.90 | 13.8 | −0.005 |
| Example 67 | 70% | C-113 | 6000 | T-4 | — | 1.90 | 14.2 | −0.005 |

TABLE 6

| | Titanium Dioxide Content in Total Solid Content of Composition | Dispersant | Weight Average Molecular Weight | Polymerizable Compound | Polymerization Initiator | Refractive Index | Viscosity of Dispersion Liquid (mPa · s) | Solvent Resistance (change in refractive index after immersion in solvent) |
|---|---|---|---|---|---|---|---|---|
| Example 68 | 70% | C-114 | 7500 | T-4 | — | 1.92 | 16.2 | −0.008 |
| Example 69 | 70% | C-115 | 4800 | T-4 | — | 1.91 | 12.3 | −0.007 |
| Example 70 | 70% | C-116 | 6800 | T-4 | — | 1.91 | 15.7 | −0.006 |
| Example 71 | 70% | C-56 | 3400 | T-4 | — | 1.92 | 8.5 | −0.001 |
| Example 72 | 70% | C-57 | 4600 | T-4 | — | 1.90 | 12.3 | −0.005 |
| Example 73 | 70% | C-58 | 3300 | T-4 | — | 1.92 | 7.8 | −0.002 |
| Example 74 | 70% | C-59 | 4500 | T-4 | — | 1.90 | 12.7 | −0.007 |
| Example 75 | 70% | C-60 | 4800 | T-4 | — | 1.93 | 7.0 | −0.002 |
| Example 76 | 70% | C-61 | 6500 | T-4 | — | 1.90 | 11.4 | −0.007 |
| Example 77 | 70% | C-62 | 4700 | T-4 | — | 1.92 | 6.3 | −0.001 |
| Example 78 | 70% | C-63 | 6400 | T-4 | — | 1.93 | 10.1 | −0.005 |
| Example 79 | 70% | C-64 | 4900 | T-4 | — | 1.92 | 7.9 | −0.002 |
| Example 80 | 70% | C-65 | 6300 | T-4 | — | 1.91 | 11.2 | −0.007 |
| Example 81 | 70% | C-66 | 4900 | T-4 | — | 1.92 | 6.8 | −0.004 |
| Example 82 | 70% | C-67 | 6700 | T-4 | — | 1.91 | 10.9 | −0.005 |
| Example 83 | 70% | C-68 | 4900 | T-4 | — | 1.93 | 6.9 | −0.003 |
| Example 84 | 70% | C-69 | 6600 | T-4 | — | 1.91 | 10.2 | −0.004 |
| Example 85 | 70% | C-70 | 5000 | T-4 | — | 1.93 | 8.2 | −0.003 |
| Example 86 | 70% | C-71 | 6600 | T-4 | — | 1.92 | 11.1 | −0.009 |
| Example 87 | 70% | C-72 | 4800 | T-4 | — | 1.93 | 8.5 | −0.005 |
| Example 88 | 70% | C-73 | 6400 | T-4 | — | 1.93 | 9.8 | −0.012 |

TABLE 6-continued

| | Titanium Dioxide Content in Total Solid Content of Composition | Dispersant | Weight Average Molecular Weight | Polymerizable Compound | Polymerization Initiator | Refractive Index | Viscosity of Dispersion Liquid (mPa · s) | Solvent Resistance (change in refractive index after immersion in solvent) |
|---|---|---|---|---|---|---|---|---|
| Example 89 | 70% | C-74 | 4900 | T-4 | — | 1.92 | 7.3 | −0.006 |
| Example 90 | 70% | C-75 | 6500 | T-4 | — | 1.91 | 11.0 | −0.009 |
| Example 91 | 70% | C-76 | 4800 | T-4 | — | 1.93 | 7.2 | −0.004 |
| Example 92 | 70% | C-77 | 6200 | T-4 | — | 1.91 | 10.4 | −0.008 |
| Example 93 | 70% | C-78 | 4900 | T-4 | — | 1.93 | 8.1 | −0.002 |
| Example 94 | 70% | C-79 | 6300 | T-4 | — | 1.92 | 9.9 | −0.008 |
| Example 95 | 70% | C-80 | 4800 | T-4 | — | 1.92 | 8.7 | −0.003 |
| Example 96 | 70% | C-81 | 5400 | T-4 | — | 1.91 | 12.1 | −0.003 |
| Example 97 | 70% | C-82 | 4800 | T-4 | — | 1.89 | 18.6 | −0.001 |
| Example 98 | 70% | C-83 | 6200 | T-4 | — | 1.90 | 11.4 | −0.006 |
| Example 99 | 70% | C-84 | 3000 | T-4 | — | 1.88 | 19.4 | −0.001 |
| Example 100 | 70% | C-85 | 6200 | T-4 | — | 1.89 | 12.3 | −0.006 |
| Example 101 | 70% | C-86 | 4400 | T-4 | — | 1.93 | 4.4 | −0.003 |
| Example 102 | 70% | C-87 | 6000 | T-4 | — | 1.92 | 9.7 | −0.004 |
| Example 103 | 70% | C-88 | 4800 | T-4 | — | 1.92 | 5.7 | −0.012 |
| Example 104 | 70% | C-89 | 6500 | T-4 | — | 1.92 | 8.9 | −0.019 |
| Example 105 | 70% | C-90 | 5600 | T-4 | — | 1.92 | 6.6 | −0.013 |
| Example 106 | 70% | C-91 | 5100 | T-4 | — | 1.91 | 11.3 | −0.016 |
| Example 107 | 70% | C-121 | 5200 | T-4 | — | 1.92 | 5.2 | 0.002 |
| Example 108 | 70% | C-122 | 7200 | T-4 | — | 1.91 | 11.2 | 0.008 |
| Example 109 | 70% | C-123 | 5000 | T-4 | — | 1.92 | 4.9 | −0.003 |
| Example 110 | 70% | C-124 | 6900 | T-4 | — | 1.92 | 10.2 | −0.006 |
| Example 111 | 70% | C-125 | 4500 | T-4 | — | 1.92 | 6.4 | −0.007 |
| Example 112 | 70% | C-126 | 5600 | T-4 | — | 1.92 | 10.8 | −0.011 |
| Example 113 | 70% | C-127 | 5100 | T-4 | — | 1.93 | 5.2 | −0.005 |
| Example 114 | 70% | C-128 | 7100 | T-4 | — | 1.92 | 12.7 | −0.008 |
| Example 115 | 70% | C-129 | 4600 | T-4 | — | 1.92 | 5.6 | −0.008 |
| Example 116 | 70% | C-130 | 5800 | T-4 | — | 1.92 | 11.3 | −0.013 |
| Example 117 | 70% | C-131 | 4900 | T-4 | — | 1.92 | 6.2 | −0.001 |
| Example 118 | 70% | C-132 | 6700 | T-4 | — | 1.91 | 13.0 | 0.004 |
| Example 119 | 70% | C-92 | 3500 | T-4 | — | 1.90 | 8.2 | −0.004 |
| Example 120 | 70% | C-93 | 5500 | T-4 | — | 1.90 | 14.3 | −0.009 |
| Example 121 | 70% | C-94 | 2800 | T-4 | — | 1.89 | 7.9 | −0.004 |
| Example 122 | 70% | C-95 | 4500 | T-4 | — | 1.90 | 16.4 | −0.011 |
| Example 123 | 70% | C-96 | 4600 | T-4 | — | 1.93 | 7.7 | −0.003 |
| Example 124 | 70% | C-97 | 7500 | T-4 | — | 1.92 | 12.0 | −0.010 |
| Example 125 | 70% | C-98 | 6200 | T-4 | — | 1.90 | 10.4 | −0.005 |
| Example 126 | 70% | C-99 | 6200 | T-4 | — | 1.92 | 11.5 | −0.011 |
| Example 127 | 70% | C-133 | 3700 | T-4 | — | 1.92 | 7.7 | −0.002 |
| Example 128 | 70% | C-134 | 5700 | T-4 | — | 1.91 | 13.4 | −0.008 |
| Example 129 | 70% | C-135 | 3700 | T-4 | — | 1.92 | 7.6 | −0.003 |
| Example 130 | 70% | C-136 | 6300 | T-4 | — | 1.92 | 14.0 | −0.005 |
| Example 131 | 80% | C-1 | 3300 | T-4 | — | 2.01 | 9.0 | −0.006 |
| Example 132 | 60% | C-2 | 4100 | T-4 | — | 1.81 | 4.4 | −0.007 |
| Example 133 | 50% | C-3 | 4800 | T-4 | — | 1.69 | 4.7 | −0.005 |
| Example 134 | 70% | C-4 | 4100 | T-2 | — | 1.92 | 6.1 | −0.004 |
| Example 135 | 70% | C-5 | 6400 | T-3 | — | 1.91 | 7.2 | −0.007 |
| Example 136 | 70% | C-6 | 4700 | T-1 | K-1 | 1.90 | 10.7 | −0.035 |
| Example 137 | 70% | C-34 | 4400 | T-1 | K-2 | 1.94 | 6.3 | −0.032 |
| Example 138 | 70% | C-35 | 4500 | T-1 | K-5 | 1.94 | 6.0 | −0.030 |
| Example 139 | 70% | C-36 | 4300 | T-1 | K-6 | 1.94 | 7.7 | −0.025 |
| Example 140 | 70% | C-37 | 5500 | T-1 | K-3 | 1.94 | 5.6 | −0.049 |
| Example 141 | 70% | C-51 | 6500 | T-1 | K-4 | 1.92 | 9.8 | −0.058 |
| Comparative Example 1 | 70% | SOLSPERSE 5000 | — | T-4 | — | 1.81 | 21.2 | −0.058 |
| Comparative Example 2 | 70% | DISPERBYK 180 | — | T-4 | — | 1.83 | 36.4 | −0.064 |
| Comparative Example 3 | 70% | C-7 | 11700 | T-4 | — | 1.88 | 38.4 | −0.006 |
| Comparative Example 4 | 70% | C-8 | 17590 | T-4 | — | 1.87 | 55.9 | −0.007 |
| Comparative Example 5 | 70% | C-9 | 14300 | T-4 | — | 1.87 | 41.7 | −0.007 |
| Comparative Example 6 | 70% | C-109 | 16000 | T-4 | — | 1.88 | 46.2 | −0.010 |
| Comparative Example 7 | 70% | C-117 | 11000 | T-4 | — | 1.88 | 32.5 | −0.008 |

As apparent from Tables 5 and 6, in Comparative Examples 1 and 2 where the polymer compound (B) is not used, the refractive index is slightly low and the viscosity is high.

On the other hand, in Examples 1 to 141 where the polymer compound (B) is used, the viscosity is low.

In Comparative Examples 3 to 7 where the dispersant satisfies formula (1) but the weight average molecular weight exceeds 10,000, the refractive index is high and the viscosity is also high.

Particularly, it is seen that in Examples 1 to 135 where an epoxy-based compound is used as the polymerizable compound and in Examples 136 to 139 where an oxime-based compound is used as the polymerization initiator, the solvent resistance is excellent, and among others, in Examples 1 to 135 where an epoxy-based compound is used as the polymerizable compound, the solvent resistance is high.

Furthermore, in the curable compositions of Examples 5, 7, 21, 23, 24, 40~42, 54, 55, 62, 63, 65, 76, 96, 104, 106, 108, 110, 112, 114, 116, 118, 124, 128 and 130 using dispersants C-5, C-10, C-24, C-26, C-27, C-43~C-45, C-61, C-81, C-89, C-91, C-97, C-107, C-108, C-111, C-119, C-120, C-122, C-124, C-126, C-128, C-130, C-132, C-134 and C-136 having a weight average molecular weight of 5,000 to 8,000 and an acid value of 70 to 90 mgKOH/g, the transmittance of the cured film at a wavelength of 400 tun is 90% or more, and it can be confirmed that, among others, the transmittance of the cured film for visible light is excellent.

In Examples above, an example of forming a transparent film on a silicon wafer is described and in the case of producing a solid-state imaging device, the silicon wafer has to be replaced by a solid-state imaging device substrate having formed thereon a photodiode, a light-shielding film, a device protective film, etc.

A light-shielding film composed of tungsten and opened only at the light-receiving part of a photodiode is formed on a silicon wafer having formed thereon a photodiode and a transfer electrode, and a device protective layer composed of silicon nitride is formed to cover the entire surface of the light-shielding film formed and the light-receiving part of a photodiode (the opening in the light-shielding film).

On the device protective layer formed, the curable composition of Examples prepared as above was coated as an undercoat layer to have a film thickness of 0.50 μm and then heated on a hot plate at 100° C. for 2 minutes. Subsequently, the coating was heated on a hot plate at 230° C. for 10 minutes and thereby cured. A red pixel, a blue pixel and a green pixel each having a one-side length of 1.4 μm were formed thereon by the method described in Example 16 of JP-A-2010-210702 to produce a color filter.

The curable composition of Examples prepared as above was coated thereon to have a film thickness of 1.5 μm, heated on a hot plate at 100° C. for 2 minutes, then heated on a hot plate at 230° C. for 10 minutes, and thereby cured.

Furthermore, HPR-204ESZ-9-5 mPa·S (resist solution produced by Fujifilm Electronics Materials Corp.) was coated thereon and heated on a hot plate at 90° C. for 1 minute. This coated film was exposed by means of an i-line stepper (product name: FPA-3000i5+, manufactured by Canon Inc.) at 100 mJ/cm$^2$ through a mask having a large number of square patterns with one side of 1.4 μm. The mask was arranged such that the large number of square patterns in the mask are located at positions corresponding to red pixel, blue pixel and green pixel in the color filter, respectively.

The exposed film was puddle-developed at room temperature for 60 seconds by using an alkaline developer HPRD-429E (produced by Fujifilm Electronics Materials Corp.) and then rinsed with pure water for 20 seconds by spin shower. Washing was further preformed with pure water, and the substrate was dried by high-speed spinning to form a resist pattern. The resist was subjected to a post-baking treatment on a hot plate at 200° C. for 300 seconds and thereby shaped in a lens shape.

The thus-obtained substrate was subjected to a dry etching treatment under the following conditions by using a dry etching apparatus (U-621, manufactured by Hitachi High-Technologies Corp.) and thereby processed so that the transparent film with a high refractive index of the present invention can be used as a microlens.

RF Power: 800 W

Antenna bias: 100 W

Wafer bias: 500 W

In-chamber pressure: 0.5 Pa

Substrate temperature: 50° C.

Species and flow rate of mixed gas: $CF_4/C_4F_6/O_2/Ar$=175/25/50/200 ml/min

Photoresist etching rate: 140 nm/min

An image was photographed using the obtained device, as a result, a good image could be obtained.

INDUSTRIAL APPLICABILITY

According to the present invention, a dispersion composition having a high refractive index and a low viscosity, and a curable composition, a transparent film, a microlens and a solid-state imaging device each using the dispersion composition, can be provided.

In addition, according to the present invention, a compound able to afford a dispersion composition having a high refractive index and giving an excellent surface state to a film after coating and drying and maintain the dispersion stability of particles can be provided.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2012-192557) filed on Aug. 31, 2012, Japanese Patent Application (Patent Application No. 2012-221610) filed on Oct. 3, 2012, Japanese Patent Application (Patent Application No. 2013-026066) filed on Feb. 13, 2013, and Japanese Patent Application (Patent Application No. 2013-026069) filed on Feb. 13, 2013, the contents of which are incorporated herein by way of reference.

DESCRIPTION OF REFERENCE NUMERALS AND SIGNS

1: TFT (Thin-film transistor), 2: wiring, 3: insulating film, 4: flattening film, 5: first electrode, 6: glass substrate, 7: contact hole, 8: insulating film, 10: liquid crystal display device, 12: backlight unit, 14,15: glass substrate, 16: TFT, 17: cured film, 18: contact hole, 19: ITO transparent electrode, 20: liquid crystal, 22: color filter, 30: capacitance-type input device, 31: front plate, 32: mask layer, 33: first transparent electrode pattern, 33*a*: pad portion, 33*b*: connecting portion, 34: second transparent electrode pattern, 35: insulating layer, 36: electroconductive element, 37: transparent protective layer, and 38: opening.

The invention claimed is:

1. A dispersion composition containing:

(A) a metal oxide particle having a primary particle diameter of 1 nm to 100 nm, (B) a polymer compound represented by the following formula (5) having a weight average molecular weight of 5,000 to 8,000 and an acid value of 70 to 90 mgKOH/g, and (C) a solvent:

(5)

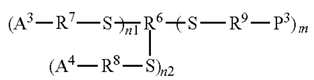

in formula (5), $R^6$ represents an (m+n1+n2)-valent linking group represented by any one of the following formulae (1) to (17), each of $R^7$ to $R^9$ independently represents a single bond or a divalent linking group, $A^3$ represents a monovalent substituent having at least one acid group with a pKa of less than 5, $A^4$ represents a monovalent substituent different from $A^3$ and having at least one functional group with a pKa of 5 or more, the monovalent substituent being selected from the group consisting of a phenol group, an alkyl group not having a substituent, an alkyleneoxy chain-containing group, a carboxylate group, and a hydroxyl group, n1 number of $A^3$ or $R^7$ may be the same or different from each other, n2 number of $A^4$ or $R^8$ may be the same or different from each other, m represents a positive number of 8 or less, n1 represents from 1 to 8, n2 represents from 1 to 8, m+n1+n2 satisfies the range of 3 to 10, $P^3$ represents a polymer chain, and m number of $P^3$ or $R^9$ may be the same or different from each other:

(1)

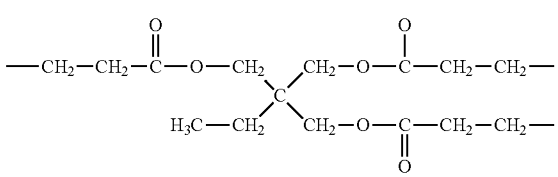

(2)

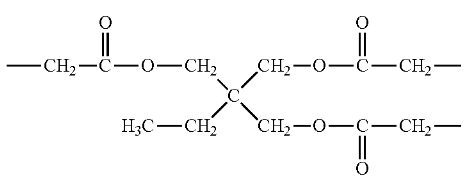

(3)

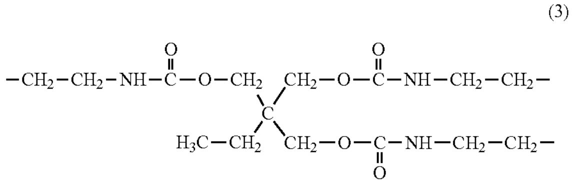

-continued (4)

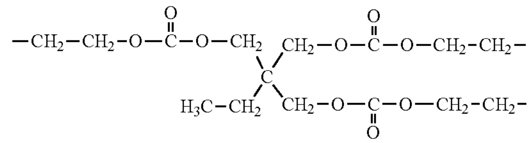

(5)

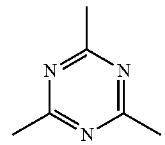

(6)

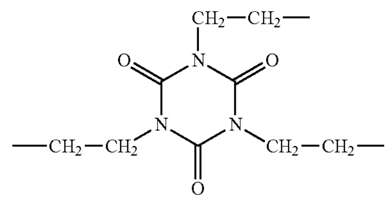

(7)

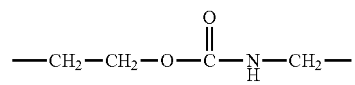

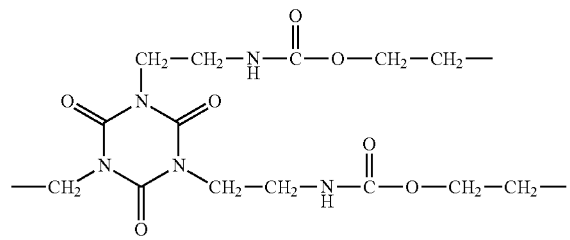

(8)

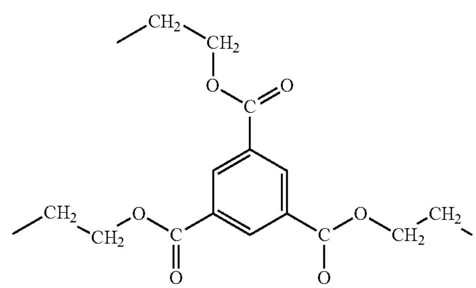

(9)

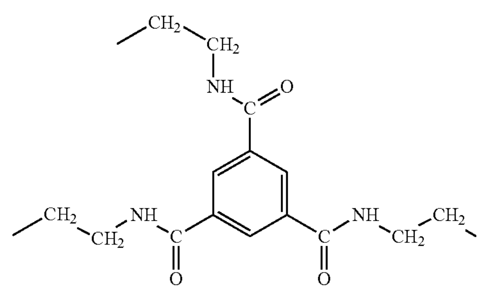

(10)

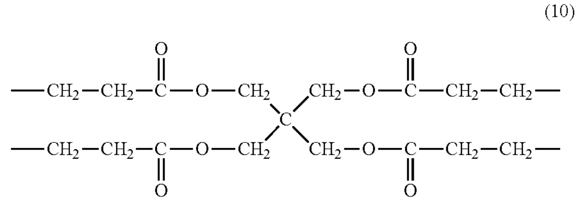

-continued (11)

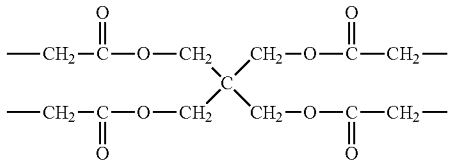

(12)

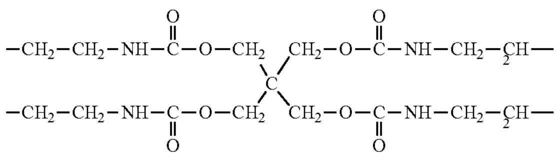

(13)

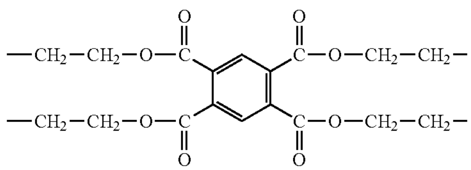

(14)

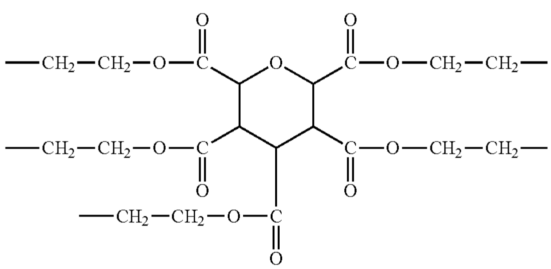

(15)

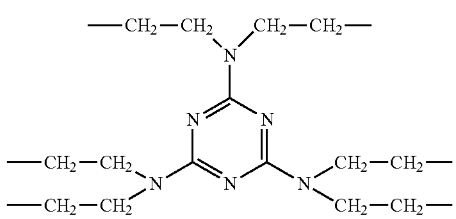

(16)

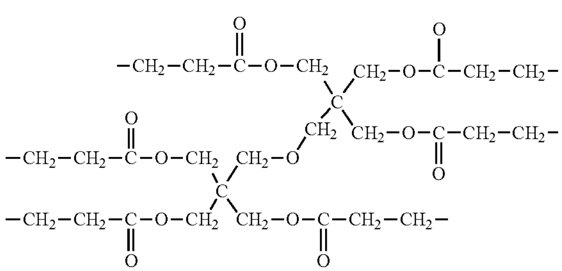

-continued (17)

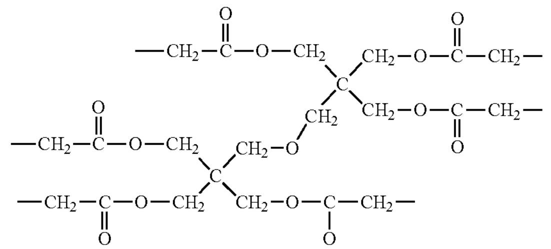

2. The dispersion composition as claimed in claim 1, wherein the metal oxide particle (A) is a particle surface-treated with an organic compound.

3. The dispersion composition as claimed in claim 2, wherein the organic compound is a fatty acid.

4. The dispersion composition as claimed in claim 1, wherein the content of the metal oxide particle (A) is 65 mass % or more based on the total solid content of the dispersion composition.

5. The dispersion composition as claimed in claim 1, wherein the polymer chain represented by $P^3$ is a polymer chain derived from at least one member selected from a polymer or copolymer of a vinyl monomer, an ester-based polymer, an ether-based polymer, a urethane-based polymer, an amide-based polymer, an epoxy-based polymer, a silicone-based polymer, and a modification product or copolymer thereof.

6. The dispersion composition as claimed in claim 1, wherein the polymer chain represented by $P^3$ contains at least one repeating unit and the repetition number k of the at least one repeating unit is from 3 to 50.

7. A curable composition containing:

the dispersion composition claimed in claim 1 and (D) a polymerizable compound.

8. The curable composition as claimed in claim 7, wherein the polymerizable compound (D) is at least one member selected from the group consisting of a compound having two or more epoxy groups or oxetanyl groups in the molecule and a compound having two or more terminal ethylenically unsaturated bonds.

9. The curable composition as claimed in claim 7, further containing at least one member selected from the group consisting of (E) a polymerization initiator and a binder polymer.

10. The curable composition as claimed in claim 9, wherein the polymerization initiator (E) is an oxime-based polymerization initiator.

11. The curable composition as claimed in claim 7, which is used for the formation of a microlens or for the formation of an undercoat film of a color filter.

12. A transparent film formed using the curable composition claimed in claim 7.

13. A microlens formed using a transparent film obtained from the curable composition claimed in claim 11.

14. A solid-state imaging device having the microlens claimed in claim 13.

15. A method for producing the dispersion composition claimed in claim 1.

16. A polymer compound represented by the following formula (5):

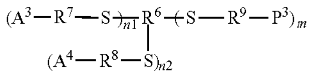

(5)

in formula (5), $R^6$ represents an (m+n1+n2)-valent linking group represented by any one of the following formulae (1) to (17), each of $R^7$ to $R^9$ independently represents a single bond or a divalent linking group, $A^3$ represents a monovalent substituent having at least one acid group with a pKa of less than 5, $A^4$ represents a monovalent substituent different from $A^3$ and having at least one functional group with a pKa of 5 or more,wherein the monovalent substituent being selected from the group consisting of a phenol group, an alkyl group not having a substituent, and alkyleneoxy chain-containing group, a carboxylate group, and a hydroxyl group, n1 number of $A^3$ or $R^7$ may be the same or different from each other, n2 number of $A^4$ or $R^8$ may be the same or different from each other, m represents a positive number of 8 or less, n1 represents from 1 to 8, n2 represents from 1 to 8, m+n1+n2 satisfies the range of 3 to 10, $P^3$ represents a polymer chain, and m number of $P^3$ or $R^9$ may be the same or different from each other:

(1)

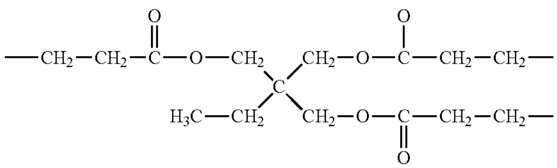

(2)

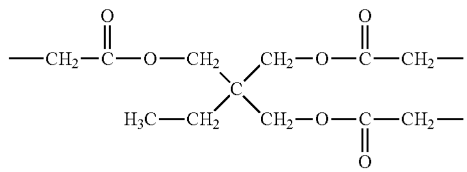

(3)

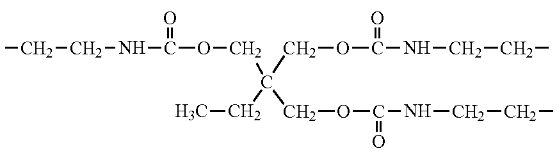

(4)

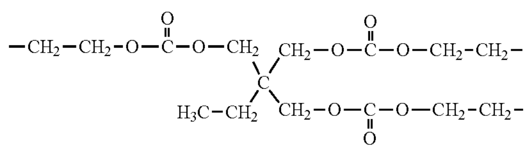

(5)

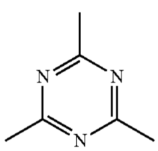

(6)

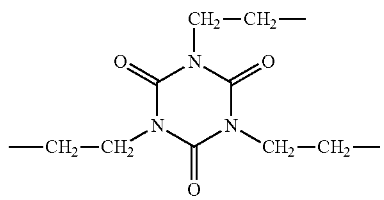

(7)

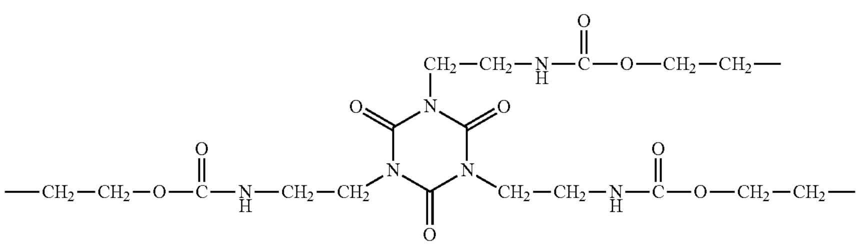

(8)

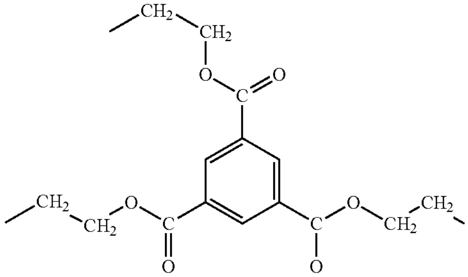

(9)

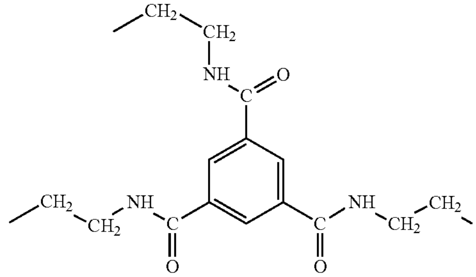

-continued (10)

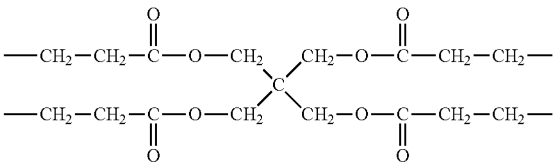

(11)

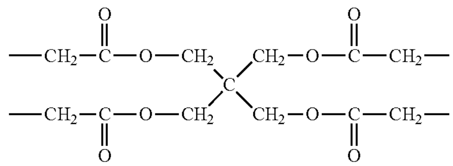

(12)

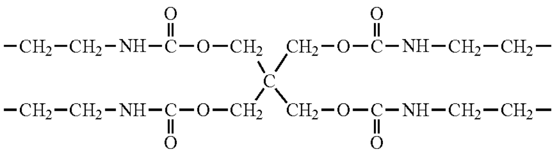

(13)

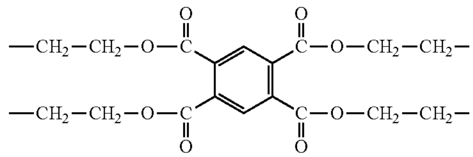

(14)

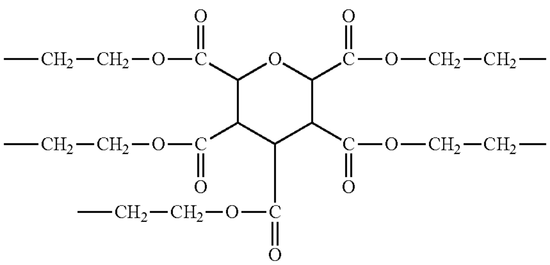

(15)

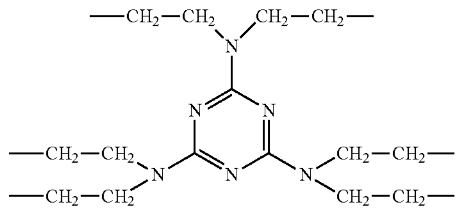

(16)

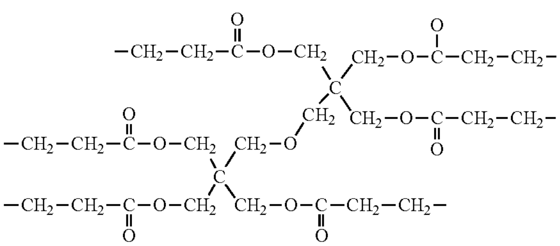

(17)

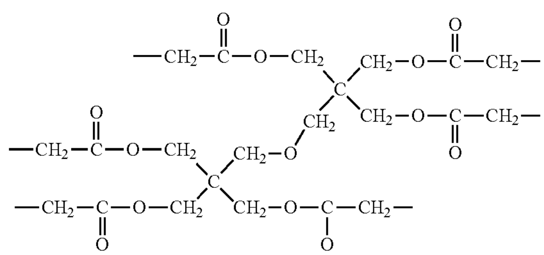

17. A polymer compound represented by the following formula (5) having a weight average molecular weight of 5,000 to 8,000 and an acid value of 70 to 90 mgKOH/g:

(5)

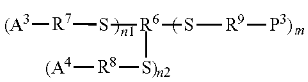

in formula (5), $R^6$ represents an (m+n1+n2)-valent linking group represented by any one of the following formulae (1) to (17), each of $R^7$ to $R^9$ independently represents a single bond or a divalent linking group, $A^3$ represents a monovalent substituent having at least one acid group, $A^4$ represents a monovalent substituent different from $A^3$, wherein the monovalent substituent being selected from the group consisting of a phenol group, an alkyl group not having a substituent, and alkyleneoxy chain-containing group, a carboxylate group, and a hydroxyl group, n1 number of $A^3$ or $R^7$ may be the same or different from each other, n2 number of $A^4$ or $R^8$ may be the same or different from each other, m represents a positive number of 8 or less, n1 represents from 1 to 8, n2 represents from 1 to 8, m+n1+n2 satisfies the range of 3 to 10, $P^3$ represents a polymer chain, and m number of $P^3$ or $R^9$ may be the same or different from each other:

(1)

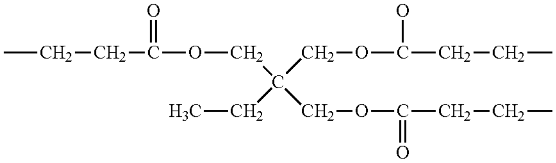

(2)

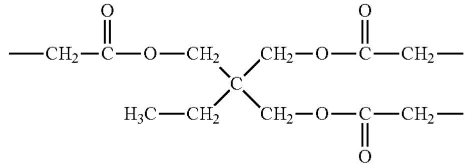

-continued
(3)
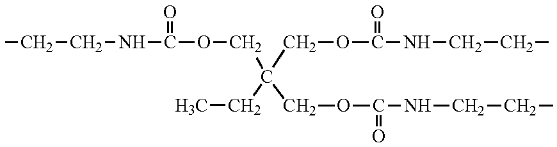
(4)
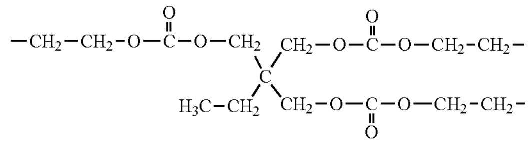
(5)
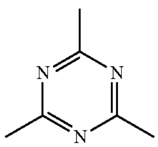
(6)
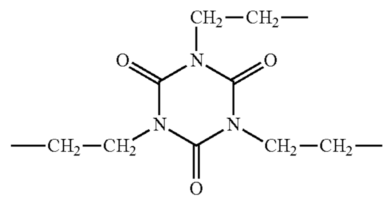
(7)
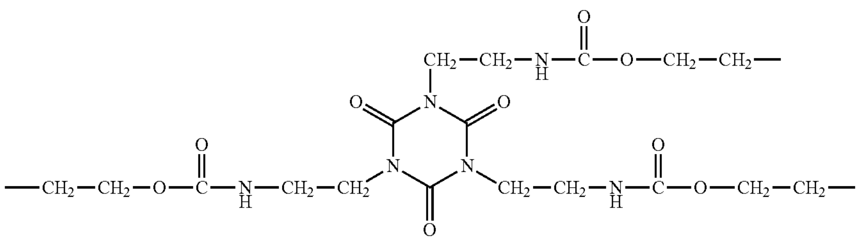
(8)
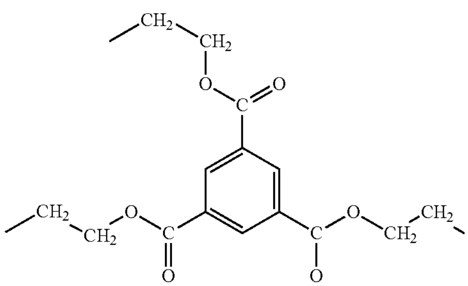
(9)
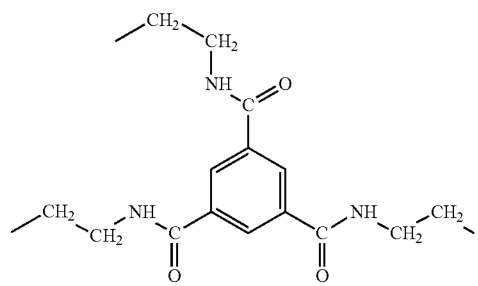
(10)
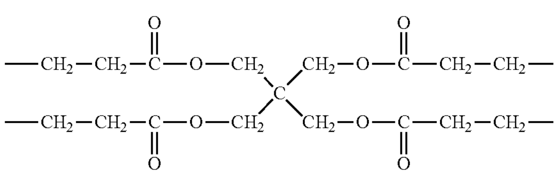
(11)
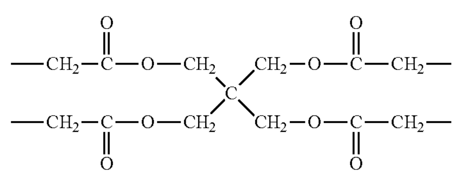
(12)
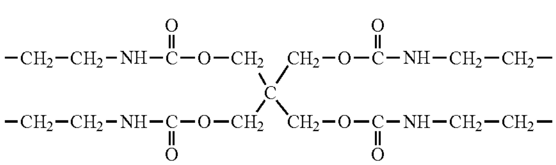
(13)
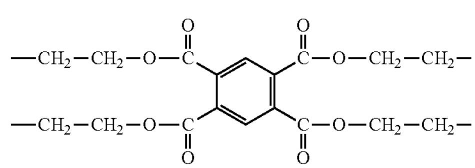
(14)
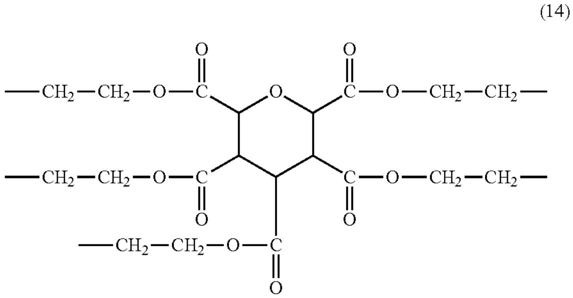
(15)
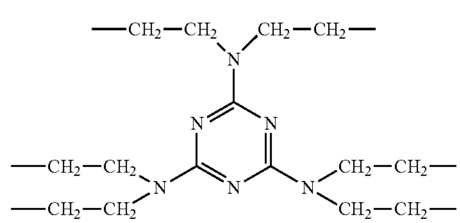

-continued (16)

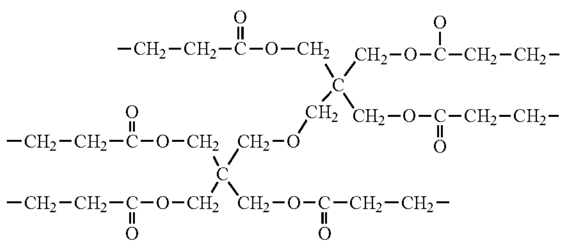

(17)

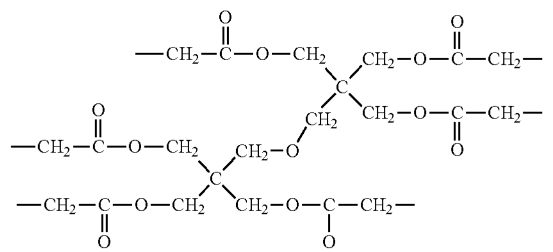

18. The polymer compound as claimed in claim 17, wherein the substituent $A^3$ is a monovalent substituent having at least one acid group with a pKa of less than 5, and the substituent $A^4$ is a monovalent substituent having at least one functional group with a pKa of 5 or more.

19. The polymer compound as claimed in claim 16, wherein the substituent $A^3$ is a monovalent substituent having at least one group selected from the group consisting of a carboxylic acid group, a sulfonic acid group, a phosphoric acid group, a phosphonic acid group and a phosphinic acid group, and the substituent $A^4$ different from $A^3$ is a monovalent substituent having at least one group selected from the group consisting of a coordinating oxygen atom-containing group, a basic nitrogen atom-containing group, a phenol group, a urea group, a urethane group, an alkyl group, an aryl group, an alkyloxycarbonyl group, an alkylaminocarbonyl group, an alkyleneoxy chain-containing group, an imide group, a carboxylate group, a sulfonamide group, a hydroxyl group and a heterocyclic group.

20. The polymer compound as claimed in claim 16, wherein the substituent $A^3$ is a carboxylic acid group.

21. The polymer compound as claimed in claim 16, wherein the polymer chain represented by $P^3$ is a polymer chain derived from at least one member selected from a polymer or copolymer of a vinyl monomer, an ester-based polymer, an ether-based polymer, a urethane-based polymer, an amide-based polymer, an epoxy-based polymer, a silicone-based polymer, and a modification product or copolymer thereof.

22. The polymer compound as claimed in claim 16, wherein the polymer chain represented by $P^3$ contains at least one repeating unit and the repetition number k of said at least one repeating unit is from 3 to 50.

23. The polymer compound as claimed in claim 16, wherein the weight average molecular weight is 10,000 or less.

24. The dispersion composition as claimed in claim 1, wherein $A^3$ is a carboxylic acid group, a sulfonic acid group, a phosphoric acid group, a phosphonic acid group or a phosphinic acid group.

25. The dispersion composition as claimed in claim 1, wherein $A^3$ is a carboxylic acid group.

26. The dispersion composition as claimed in claim 1, wherein $A^4$ is an alkyl group not having a substituent.

27. The dispersion composition as claimed in claim 1, wherein $A^3$ is a carboxylic acid group and $A^4$ is an alkyl group not having a substituent.

28. The dispersion composition as claimed in claim 1, wherein the metal oxide particle (A) is colorless, white or transparent.

29. The dispersion composition as claimed in claim 1, wherein the metal oxide particle (A) is a titanium dioxide ($TiO_2$) particle, a zirconium dioxide ($ZrO_2$) particle or a silicon dioxide ($SiO_2$) particle.

30. The dispersion composition as claimed in claim 1, wherein $R^6$ represents an (m+n1+n2)-valent linking group represented by any one of the formulae (1), (2), (10), (11), (16) and (17).

* * * * *